(12) United States Patent
Yamazaki

(10) Patent No.: US 10,229,934 B2
(45) Date of Patent: Mar. 12, 2019

(54) RESISTOR, DISPLAY DEVICE, AND ELECTRONIC DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 163 days.

(21) Appl. No.: 14/137,484

(22) Filed: Dec. 20, 2013

(65) Prior Publication Data

US 2014/0175436 A1 Jun. 26, 2014

(30) Foreign Application Priority Data

Dec. 25, 2012 (JP) ................................. 2012-281873

(51) Int. Cl.
*H01L 27/12* (2006.01)

(52) U.S. Cl.
CPC ...... *H01L 27/1225* (2013.01); *H01L 27/1255* (2013.01); *H01L 2924/0002* (2013.01)

(58) Field of Classification Search
CPC .............. H01L 27/12; H01L 27/1225; H01L 27/13244; H01L 2924/0002; H01L 27/3276; H01L 29/04
USPC ...................... 257/43, 57, 369, 77, 538, 410
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,140,198 | A | 10/2000 | Liou |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |

(Continued)

FOREIGN PATENT DOCUMENTS

| | | |
|---|---|---|
| CN | 101794791 A | 8/2010 |
| CN | 102668062 A | 9/2012 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Bo Fan
(74) *Attorney, Agent, or Firm* — Fish & Richardson P.C.

(57) ABSTRACT

To provide a novel resistor. To provide a display device having a novel structure that can improve its reliability. To provide a display device having a novel structure that can reduce electrostatic discharge damages. The resistor includes a semiconductor layer and an insulating layer formed over the semiconductor layer, and the semiconductor layer is an oxide represented by an In-M-Zn oxide that contains at least indium (In), zinc (Zn), and M (M is a metal such as Al, Ga, Ge, Y, Zr, Sn, La, Ce, or Hf) and the insulating layer contains at least hydrogen.

21 Claims, 77 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,602,456 B2 | 10/2009 | Tanaka et al. |
| 7,626,669 B2 | 12/2009 | Lim |
| 7,674,650 B2 | 3/2010 | Akimoto |
| 7,732,819 B2 | 6/2010 | Akimoto et al. |
| 7,989,815 B2 | 8/2011 | Yamazaki |
| 8,003,981 B2 | 8/2011 | Iwasaki et al. |
| 8,102,476 B2 | 1/2012 | Son |
| 8,324,027 B2 | 12/2012 | Yamazaki |
| 8,338,827 B2 | 12/2012 | Yamazaki et al. |
| 8,368,066 B2 | 2/2013 | Yamazaki |
| 8,384,078 B2 | 2/2013 | Kang et al. |
| 8,389,988 B2 | 3/2013 | Yamazaki |
| 8,395,158 B2 * | 3/2013 | Yamazaki .............. H01L 29/04 257/347 |
| 8,420,553 B2 | 4/2013 | Yamazaki |
| 8,441,011 B2 | 5/2013 | Yamazaki |
| 8,502,217 B2 | 8/2013 | Sato et al. |
| 8,604,473 B2 | 12/2013 | Saito et al. |
| 8,669,556 B2 | 3/2014 | Yamazaki et al. |
| 8,680,522 B2 | 3/2014 | Yamazaki et al. |
| 8,680,529 B2 | 3/2014 | Kimura |
| 8,766,338 B2 | 7/2014 | Kurokawa et al. |
| 8,797,142 B2 | 8/2014 | Koyama et al. |
| 8,803,142 B2 | 8/2014 | Yamazaki et al. |
| 8,816,469 B2 | 8/2014 | Kamata et al. |
| 8,946,097 B2 | 2/2015 | Yamazaki |
| 8,994,021 B2 | 3/2015 | Yamazaki et al. |
| 9,202,827 B2 | 12/2015 | Koyama et al. |
| 9,236,385 B2 | 1/2016 | Yamazaki et al. |
| 9,331,208 B2 | 5/2016 | Yamazaki et al. |
| 9,443,888 B2 | 9/2016 | Koyama et al. |
| 9,478,564 B2 | 10/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166475 A1 | 7/2008 | Jeong et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0141203 A1 | 7/2009 | Son et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0065837 A1 | 3/2010 | Omura et al. |
| 2010/0065839 A1 | 3/2010 | Yamazaki |
| 2010/0065840 A1 | 3/2010 | Yamazaki |
| 2010/0065844 A1 | 3/2010 | Tokunaga |
| 2010/0072470 A1 | 3/2010 | Yamazaki |
| 2010/0072471 A1 | 3/2010 | Yamazaki |
| 2010/0092800 A1 | 4/2010 | Itagaki et al. |
| 2010/0109002 A1 | 5/2010 | Itagaki et al. |
| 2010/0163874 A1 * | 7/2010 | Koyama ................ H01L 27/12 257/57 |
| 2010/0295042 A1 | 11/2010 | Yano et al. |
| 2011/0006297 A1 | 1/2011 | Inoue et al. |
| 2011/0057918 A1 | 3/2011 | Kimura et al. |
| 2011/0068336 A1 * | 3/2011 | Yamazaki ........... H01L 27/1225 257/43 |
| 2011/0127519 A1 * | 6/2011 | Kang .................. H01L 27/3244 257/43 |
| 2011/0140205 A1 | 6/2011 | Sakata |
| 2011/0187688 A1 | 8/2011 | Yamazaki et al. |
| 2011/0256684 A1 | 10/2011 | Iwasaki et al. |
| 2011/0259420 A1 | 10/2011 | Yamazaki et al. |
| 2011/0303953 A1 | 12/2011 | Kamata |
| 2012/0062811 A1 | 3/2012 | Miyake |
| 2012/0241750 A1 | 9/2012 | Chikama |
| 2012/0298988 A1 | 11/2012 | Hara |
| 2012/0319107 A1 | 12/2012 | Miyake |
| 2014/0175432 A1 | 6/2014 | Yamazaki et al. |
| 2016/0240694 A1 | 8/2016 | Yamazaki et al. |
| 2016/0358950 A1 | 12/2016 | Koyama et al. |

(56) References Cited

U.S. PATENT DOCUMENTS

| | | | |
|---|---|---|---|
| 2017/0025448 A1 | 1/2017 | Koyama et al. | |
| 2017/0040459 A1 | 2/2017 | Yamazaki et al. | |

FOREIGN PATENT DOCUMENTS

| | | | | |
|---|---|---|---|---|
| EP | 1 737 044 A1 | 12/2006 | | |
| EP | 2202802 A | 6/2010 | | |
| EP | 2 226 847 A2 | 9/2010 | | |
| EP | 2515337 A | 10/2012 | | |
| JP | 60-198861 A | 10/1985 | | |
| JP | 63-210022 A | 8/1988 | | |
| JP | 63-210023 A | 8/1988 | | |
| JP | 63-210024 A | 8/1988 | | |
| JP | 63-215519 A | 9/1988 | | |
| JP | 63-239117 A | 10/1988 | | |
| JP | 63-265818 A | 11/1988 | | |
| JP | 05-251705 A | 9/1993 | | |
| JP | 08-264794 A | 10/1996 | | |
| JP | 11-505377 A | 5/1999 | | |
| JP | 2000-044236 A | 2/2000 | | |
| JP | 2000-150900 A | 5/2000 | | |
| JP | 2002-076356 A | 3/2002 | | |
| JP | 2002-289859 A | 10/2002 | | |
| JP | 2003-086000 A | 3/2003 | | |
| JP | 2003-086808 A | 3/2003 | | |
| JP | 2004-103957 A | 4/2004 | | |
| JP | 2004-273614 A | 9/2004 | | |
| JP | 2004-273732 A | 9/2004 | | |
| JP | 2007-096055 A | 4/2007 | | |
| JP | 2007-123861 A | 5/2007 | | |
| JP | 2007-250983 A | 9/2007 | | |
| JP | 2009-141002 A | 6/2009 | | |
| JP | 2010058135 A | * | 3/2010 | .............. B22C 9/08 |
| JP | 2010058135 A | * | 3/2010 | .............. B22C 9/06 |
| JP | 2010058135 A | * | 3/2010 | ............. B22D 17/22 |
| JP | 2010-092036 A | 4/2010 | | |
| JP | 2010-092037 A | 4/2010 | | |
| JP | 2010-097203 A | 4/2010 | | |
| JP | 2010-097204 A | 4/2010 | | |
| JP | 2010-107976 A | 5/2010 | | |
| JP | 2010-107977 A | 5/2010 | | |
| JP | 2010-113346 A | 5/2010 | | |
| JP | 2010-171394 A | 8/2010 | | |
| JP | 2011-109084 A | 6/2011 | | |
| JP | 2011-142309 A | 7/2011 | | |
| JP | 2012-134475 A | 7/2012 | | |
| TW | 201119027 | 6/2011 | | |
| WO | 2004/114391 A1 | 12/2004 | | |
| WO | WO-2007/119386 | 10/2007 | | |
| WO | WO-2009/072532 | 6/2009 | | |
| WO | WO-2009/075161 | 6/2009 | | |
| WO | WO-2009/093625 | 7/2009 | | |
| WO | WO-2011/048968 | 4/2011 | | |
| WO | WO-2011/070892 | 6/2011 | | |
| WO | WO-2012/073844 | 6/2012 | | |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

(56) References Cited

OTHER PUBLICATIONS

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor" Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

(56) References Cited

OTHER PUBLICATIONS

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Chinese Office Action (Application No. 201310724080.0) dated Jul. 12, 2017.

\* cited by examiner

X1  315  Y1

X2  315  Y2

X3  315  Y3

316a

316b

X1        348        Y1

X2        348        Y2

X3        348        Y3

315

315

315

316a

316b

382a

382b

382c

316a

316b

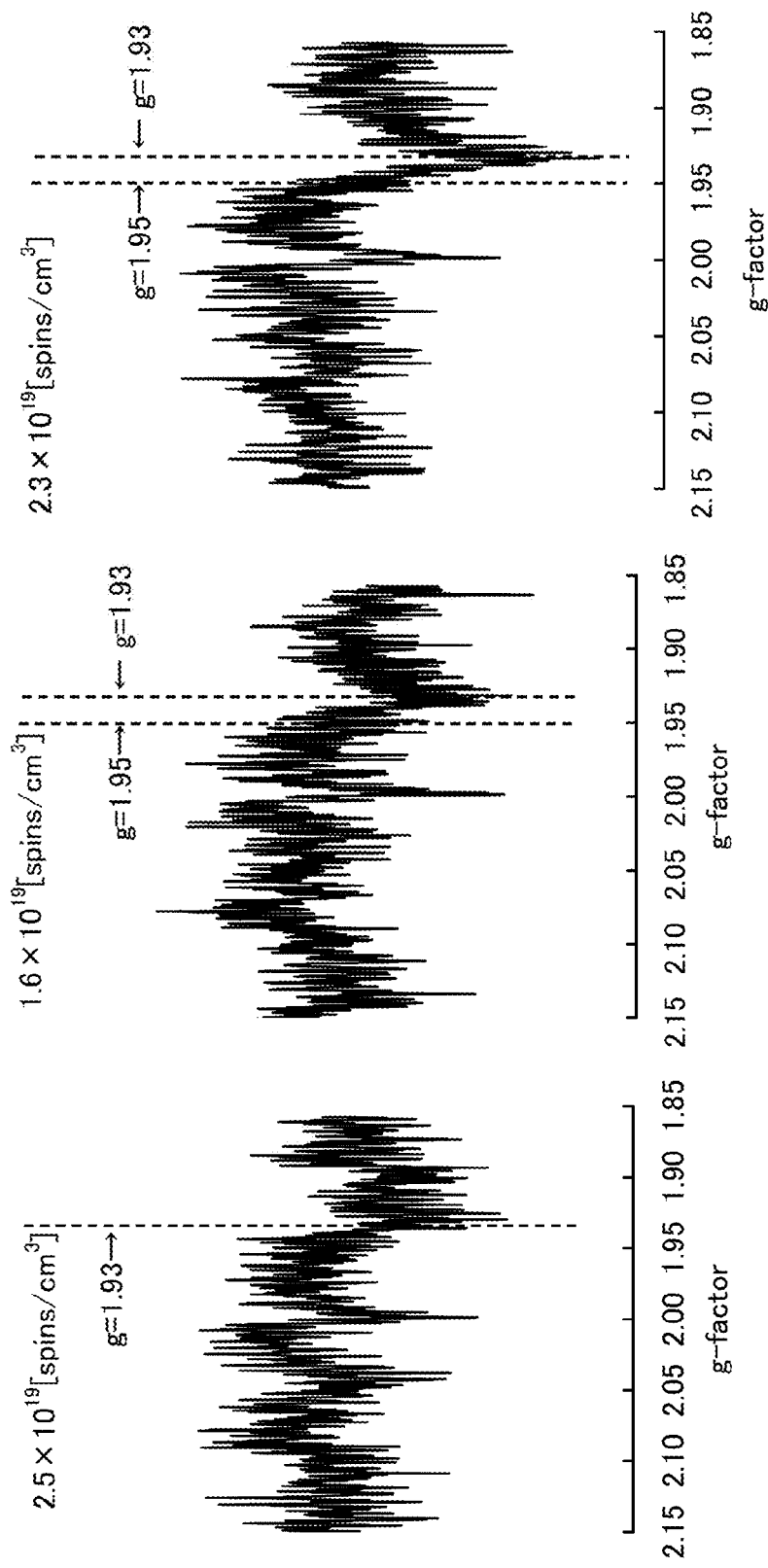

Point 1

Point 2

Point 3

Point 4

RESISTOR, DISPLAY DEVICE, AND ELECTRONIC DEVICE

BACKGROUND OF THE INVENTION

1. Field of the Invention

One embodiment of the present invention relates to an object, a method, a manufacturing method, a process, a machine, manufacture, or a composition of matter. In particular, one embodiment of the present invention relates to, for example, a semiconductor device, a display device, a light-emitting device, an electronic device, a driving method thereof, or a manufacturing method thereof. In particular, for example, one embodiment of the present invention relates to a resistor, a semiconductor device, a display device, an electronic device or a light-emitting device each including an oxide semiconductor.

Note that the term "display device" means a device including a display element. In addition, the display device also includes a driver circuit for driving a plurality of pixels, and the like. Further, the display device includes a control circuit, a power supply circuit, a signal generation circuit, or the like formed over another substrate.

2. Description of the Related Art

For display devices typified by liquid crystal display devices, elements and wirings have been downsized with recent technological innovation and mass production technology has also been improved greatly. Improvement in fabrication yield is required to achieve lower cost in the future.

If a surge voltage due to static electricity or the like is applied to a display device, an element is broken to produce abnormal display. Thus, fabrication yield is likely to be decreased. To overcome that, a protection circuit for releasing a surge voltage to another wiring is provided in a display device (see Patent Documents 1 to 7, for example).

REFERENCE

[Patent Document 1] Japanese Published Patent Application No. 2010-92036
[Patent Document 2] Japanese Published Patent Application No. 2010-92037
[Patent Document 3] Japanese Published Patent Application No. 2010-97203
[Patent Document 4] Japanese Published Patent Application No. 2010-97204
[Patent Document 5] Japanese Published Patent Application No. 2010-107976
[Patent Document 6] Japanese Published Patent Application No. 2010-107977
[Patent Document 7] Japanese Published Patent Application No. 2010-113346

SUMMARY OF THE INVENTION

A structure aiming at improvement in reliability, such as a protection circuit, is important for display devices.

It is an object of one embodiment of the present invention to provide a resistor or the like having a novel structure. Alternatively, it is an object of one embodiment of the present invention to provide a display device or the like having a novel structure that can improve reliability. Alternatively, it is another object of one embodiment of the present invention to provide a display device or the like having a novel structure that can reduce electrostatic discharge damages. Alternatively, it is another object of one embodiment of the present invention to provide a display device or the like having a novel structure that can reduce adverse effects of static electricity. Alternatively, it is another object of one embodiment of the present invention to provide a display device or the like having a novel structure that can reduce adverse effects on a transistor in a rubbing process. Alternatively, it is another object of one embodiment of the present invention to provide a display device or the like having a novel structure that can reduce adverse effects on a transistor in an inspecting step. Alternatively, it is another object of one embodiment of the present invention to provide a display device or the like having a novel structure that can reduce adverse effects of a trouble when a touch sensor is used. Alternatively, it is another object of one embodiment of the present invention to provide a display device or the like having a novel structure that can reduce fluctuation or deterioration of transistor characteristics. Alternatively, it is another object of one embodiment of the present invention to provide a display device or the like having a novel structure that can reduce fluctuation in a threshold voltage or deterioration of a transistor. Alternatively, it is another object of one embodiment of the present invention to provide a display device or the like having a novel structure that can increase fabrication yield of a transistor. Alternatively, it is another object of one embodiment of the present invention to provide a display device or the like having a novel structure that has an oxide semiconductor layer having increased conductivity. Alternatively, it is another object of one embodiment of the present invention to provide a display device or the like having a novel structure that can control the conductivity of an oxide semiconductor layer.

Note that the descriptions of these objects do not disturb the existence of other objects. Note that in one embodiment of the present invention, there is no need to achieve all the objects. Objects other than the above objects will be apparent from and can be derived from the descriptions of the specification, the drawings, the claims, and the like.

One embodiment of the present invention is a resistor including a semiconductor layer and an insulating layer over the semiconductor layer, and the semiconductor layer is an oxide represented by an In-M-Zn oxide containing at least indium (In), zinc (Zn) and M (M is such as Al, Ga, Ge, Y, Zr, Sn, La, Ce, or Hf), and the insulating layer contains at least hydrogen.

Another embodiment of the present invention is a display device including a pixel portion, a driver circuit portion outside the pixel portion, and a protection circuit portion electrically connected to one or both of the pixel portion and the driver circuit portion. The pixel portion includes pixel electrodes arranged in matrix and first transistors electrically connected to the pixel electrodes, the driver circuit portion includes second transistors configured to control ON/OFF of the first transistors, the first transistors and the second transistors each include a first oxide semiconductor layer in a channel formation region, the protection circuit portion includes a second oxide semiconductor layer formed in the same process where the first oxide semiconductor layer is formed, and the concentration of hydrogen in the first oxide semiconductor layer is different from the concentration of hydrogen in the second oxide semiconductor layer.

In accordance with one embodiment of the present invention, a resistor having a novel structure can be provided. Further, in accordance with one embodiment of the present invention, the reliability of a display device can be improved.

BRIEF DESCRIPTION OF THE DRAWINGS

FIGS. 58A to 58C are graphs showing ESR measurement results in Example 3.

DETAILED DESCRIPTION OF THE INVENTION

Figure 1A:
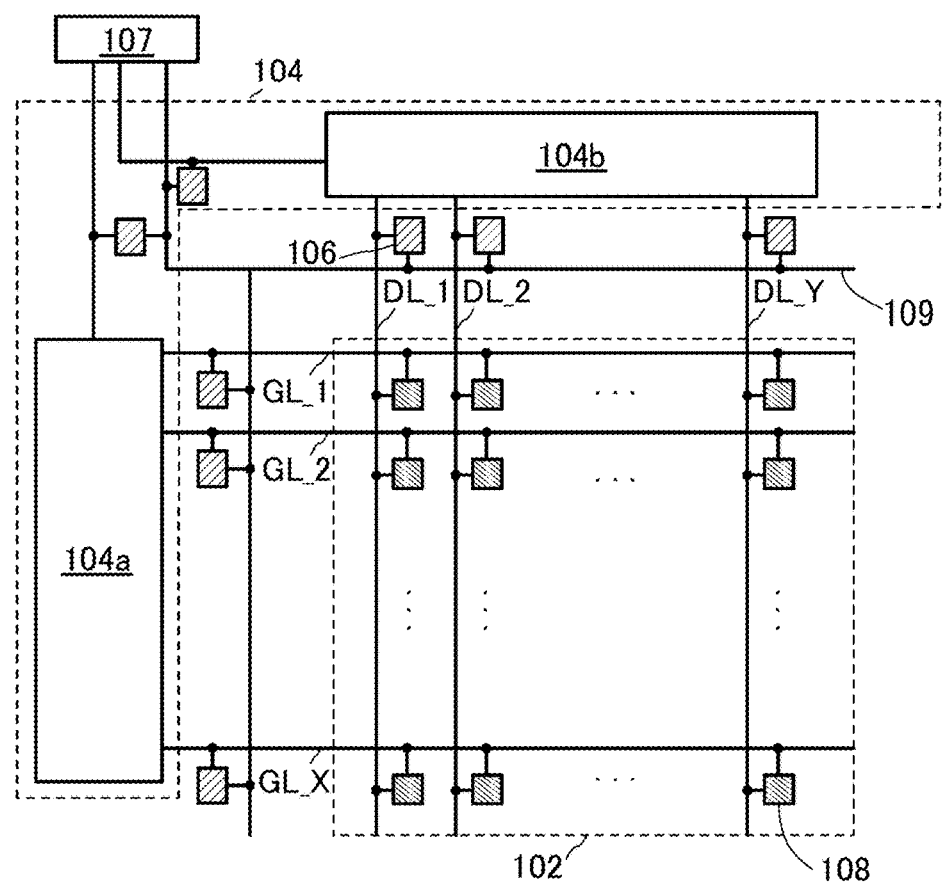
FIGS. 1A and 1B are a planar schematic view of a display device and a circuit diagram of a protection circuit portion.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the thickness of layers, and/or regions may be exaggerated for clarity in some cases. Therefore, embodiments of the present invention are not limited to such scales. Note that drawings are schematic views of ideal examples, and the embodiments of the present invention are not limited to the shape or the value illustrated in the drawings. For example, variation in signal, voltage, or current due to noise or difference in timing can be included.

Note that in this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region.

Here, since the source and the drain of the transistor is interchangeable depending on the structure, the operating condition, and the like of the transistor, it is difficult to define which is a source or a drain. Thus, a portion which functions as the source and a portion which functions as the drain are not called a source and a drain and one of the source and the drain is referred to as a first electrode and the other thereof is referred to as a second electrode in some cases.

Note that in this specification, ordinal numbers such as "first", "second", and "third" are used in order to avoid confusion among components, and the terms do not limit the components numerically.

Note that in this specification, the phrase "A and B are connected" or "A is connected to B" means the case where A and B are electrically connected to each other as well as the case where A and B are directly connected to each other. Here, the description "A and B are electrically connected to each other" or "A is electrically connected to B" means the following case: when an object having any electrical function exists between A and B, an electric signal can be transmitted and received between A and B.

Note that in this specification, terms for describing arrangement, such as "over" "above", "under", and "below", are used for convenience in describing positions of components with reference to drawings. Further, positions of components can be changed as appropriate depending on which direction the components are illustrated from. Thus, there is no limitation to terms used in this specification, and description can be made appropriately depending on the situation.

Note that the layout of circuit blocks in a block diagram in a drawing specifies the positional relation for description. Thus, even when a drawing shows that different functions are achieved in different circuit blocks, an actual circuit or region may be configured so that the different functions are achieved in the same circuit or region. Functions of circuit blocks in block diagrams are specified for description, and even in the case where one circuit block is illustrated, blocks may be provided in an actual circuit or region so that processing performed by one circuit block is performed by a plurality of circuit blocks.

Note that a pixel corresponds to a display unit that can control the luminance of one color component (e.g., any one of R (red), G (green), and B (blue)). Therefore, in a color display device, the minimum display unit of a color image is composed of three pixels of an R pixel, a G pixel and a B pixel. Note that the color elements for displaying a color image are not limited to the three colors, and color elements more than three colors may be used or a color other than RGB may be used.

In this specification, embodiments of the present invention will be described with reference to the drawings. Embodiments will be described in this order.

1. Embodiment 1 (Basic structure of one embodiment of the present invention)
2. Embodiment 2 (One embodiment of display device)
3. Embodiment 3 (Manufacturing method of display device)
4. Embodiment 4 (Variation and manufacturing method of display device)
5. Embodiment 5 (Variation and manufacturing method of display device)
6. Embodiment 6 (Variation and manufacturing method of display device)
7. Embodiment 7 (Variation of display device)
8. Embodiment 8 (Structure of transistor)
9. Embodiment 9 (Electron diffraction pattern of oxide semiconductor film)
10. Embodiment 10 (Formation methods of metal film, semiconductor film, and inorganic insulating film. etc.)
11. Embodiment 11 (Apparatus for forming and heating oxide semiconductor film)
12. Embodiment 12 (Touch sensor and display module)
13. Embodiment 13 (Electronic devices)
14. Example 1 (Resistances of oxide semiconductor layer and oxide stack)
15. Example 2 (Impurity analysis of oxide semiconductor layer)
16. Example 3 (ESR of oxide semiconductor film and oxide stack)

Embodiment 1

In this embodiment, a display device of one embodiment of the present invention will be described with reference to FIGS. 1A and 1B, FIGS. 2A to 2C, FIGS. 3A to 3C, FIG. 4, and FIG. 5.

The display device illustrated in FIG. 1A includes a region including display elements in pixels (hereinafter referred to as a pixel portion 102), a circuit portion including a circuit for driving the pixels (hereinafter referred to as a driver circuit portion 104), circuit portions each having a protective function for an element (hereinafter referred to as protection circuit portions 106), and a terminal portion 107.

The pixel portion 102 includes circuits for driving the plurality of display elements in X (X is a natural number of 2 or more) rows and Y columns (Y is a natural number of 2 or more) (hereinafter, such circuits are referred to as protection circuit portions 108). The driver circuit portion 104 includes driver circuits such as a circuit for supplying a signal (scan signal) to select a pixel (hereinafter the circuit is referred to as a gate driver 104a) and a circuit for supplying a signal (data signal) to drive a display element in a pixel (hereinafter, the circuit is referred to as a source driver 104b). Note that the pixel circuit portions 108 are arranged in matrix and each pixel circuit portion 108 includes a pixel electrode.

The gate driver 104a includes a shifter register or the like. The gate driver gate driver 104a receives a signal for driving the shift register through the terminal portion 107 and outputs a signal. For example, the gate driver 104a receives a start pulse signal, a clock signal, or the like and outputs a pulse signal. The gate driver 104a has a function of controlling the potentials of wirings supplied with scan signals (hereinafter, such wirings are referred to as gate signal lines GL_1 to GL_X. Note that the plurality of gate drivers 104a may be provided to separately control the gate signal lines GL_1 to GL_X. Alternatively, the gate driver 104a has, but is not limited to, a function of supplying an initialization signal. The gate driver 104a can supply another signal.

The source driver 104b includes a shift register or the like. The source driver 104b receives a signal (video signal) from which a data signal is derived, as well as a signal for driving the shift register, through the terminal portion 107. The source driver 104b has a function of generating a data signal to be written in the pixel circuit portions 108 based on the video signal. In addition, the source driver 104b has a function of controlling output of a data signal in response to a pulse signal produced by input of a start pulse, a clock signal, or the like. Further, the source driver 104b has a function of controlling the potentials of wirings supplied with data signals (hereinafter such wirings are referred to as data lines DL_1 to DL_Y). Alternatively, the source driver 104b has, but is not limited to, a function of supplying an initialization signal. The source driver 104b can supply another signal.

Alternatively, the source driver 104b is formed using a plurality of analog switches or the like, for example. The source driver 104b can output signals obtained by time-dividing an image signal as the data signals by sequentially turning on the plurality of analog switches. The source driver 104b may be formed using a shift register or the like.

A pulse signal and a data signal are input to each of the plurality of the pixel circuit portions 108 through one of the plurality of wirings supplied with scan signals (hereinafter data signal lines GL) and one of the plurality of wirings supplied with data signals (hereinafter data lines DL), respectively. Writing and holding of the data signal in each of the plurality of pixel circuit portions 108 are performed by the gate driver 104a. For example, to the pixel circuit portion 108 in the m-th row and the n-th column (m is a natural number of less than or equal to X, and n is a natural number of less than or equal to Y), a pulse signal is input from the gate driver 104a through the gate signal line GL_m, and a data signal is input from the source driver 104b through the data line DL_n in accordance with the potential of the gate signal line GL_m.

The protection circuit portion 106 is connected to the gate signal line GL making a connection between the gate driver 104a and the pixel circuit portion 108. Alternatively, the protection circuit portion 106 is connected to a data line DL making a connection between the source driver 104b and the pixel circuit portion 108. Alternatively, the protection circuit portion 106 can be connected to a wiring making a connection between the gate driver 104a and the terminal portion 107. Alternatively, the protection circuit portion 106 can be connected to a wiring making a connection between the source driver 104b and the terminal portion 107. Note that the terminal portion 107 means a portion having terminals for inputting power, control signals, and video signals to the display device from external circuits.

The protection circuit portion 106 is a circuit which electrically connects a wiring connected to the protection circuit to another wiring when a potential out of a certain range is applied to the wiring connected to the protection circuit. However, without being limited thereto, the protection circuit portion 106 can supply another signal.

As illustrated in FIG. 1A, the protection circuit portions 106 are provided for the pixel portion 102, the driver circuit portion 104, and the terminal portion 107, so that the tolerance of the display device to overcurrent generated by electrostatic discharge (ESD) or the like can be improved. Note that the configuration of the protection circuit portions 106 is not limited to that, and for example, the protection circuit portion 106 may be configured to be connected to only the gate driver 104a or the protection circuit portion 106 may be configured to be connected to only the source driver 104b. Alternatively, the protection circuit portion 106 may be configured to be connected to only the terminal portion 107.

Thus, the protection circuit portion 106 is electrically connected to at least one of the pixel portion 102, the driver circuit portion 104, and the terminal portion 107.

In the non-limiting example illustrated in FIG. 1A, the driver circuit portion 104 includes the gate driver 104a and the source driver 104b. For example, only the gate driver 104a may be formed and a separately prepared substrate where a source driver circuit is formed (e.g., a driver circuit substrate formed with a single crystal semiconductor film or a polycrystalline semiconductor film) may be mounted.

Figure 1B:
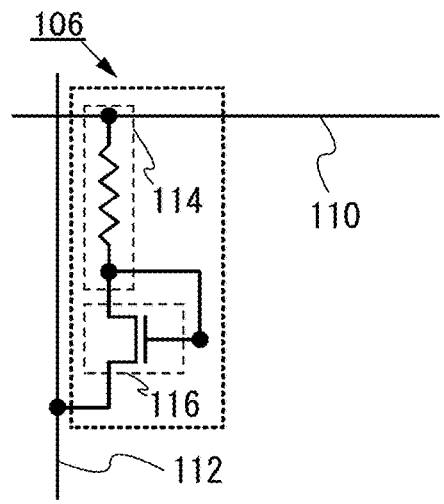

The protection circuit portion 106 can include a diode and a resistor in combination, for example. FIG. 1B illustrates a specific example of the protection circuit portion 106.

The protection circuit portion 106 illustrated in FIG. 1B include a resistor 114 connected between a wiring 110 and a wiring 112, and a transistor 116 that is diode-connected.

The resistor 114 is connected to the transistor 116 in series, so that the resistor 114 can control the value of current flowing through the transistor 116 or can function as a protective resistor of the transistor 116 itself.

The wiring 110 is, for example, a lead wiring led out from the gate signal line GL, the data line DL, or the terminal portion 107 to the driver circuit portion 104 in FIG. 1A. The wiring 112 is, for example, a wiring that is supplied with the potential (VDD, VSS, or GND) of a power supply line for supplying power to the gate driver 104a or the source driver 104b illustrated in FIG. 1A. Alternatively, the wiring 112 is a wiring that is supplied with a common potential (common line).

For example, the wiring 112 is preferably connected to the power supply line for supplying power to the gate driver 104a, in particular, to a wiring for supplying a low potential. This is because the gate signal line GL has a low potential in most periods, and thus, when the wiring 112 also has a low potential, current leaked from the gate signal line GL to the wiring 112 can be reduced in a normal operation.

A structural example of the resistor 114 that can be used for the protection circuit portion 106 will be described with reference to FIGS. 2A to 2C and FIGS. 3A to 3C.

Figure 2A:
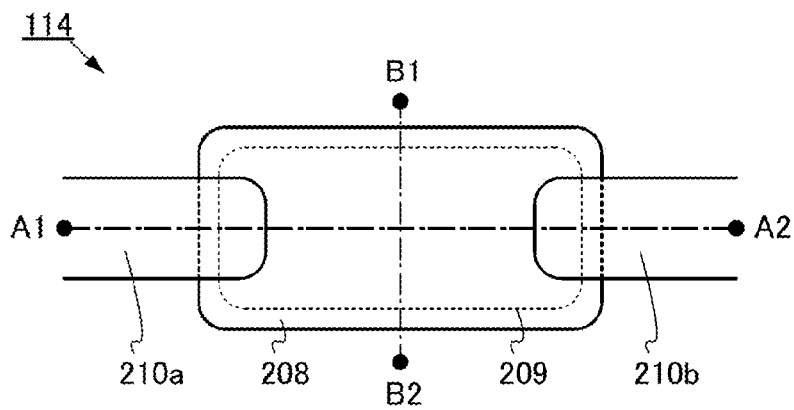
FIG. 2A is a top view of a resistor and FIGS. 2B and 2C are cross-sectional views of the resistors.
Figure 2B:
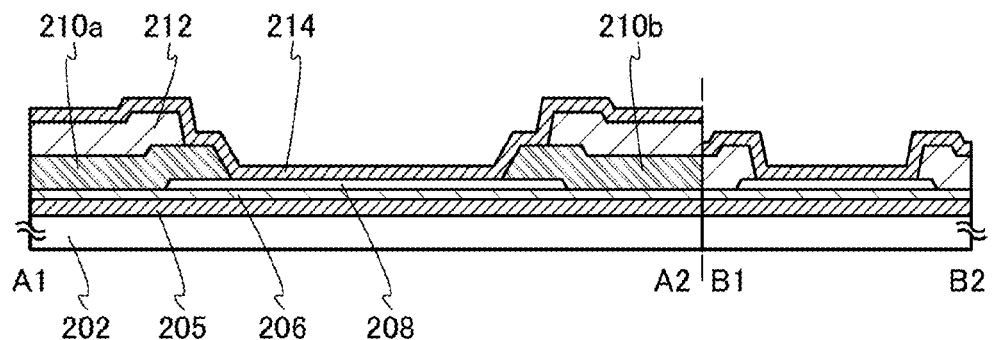
Figure 2C:
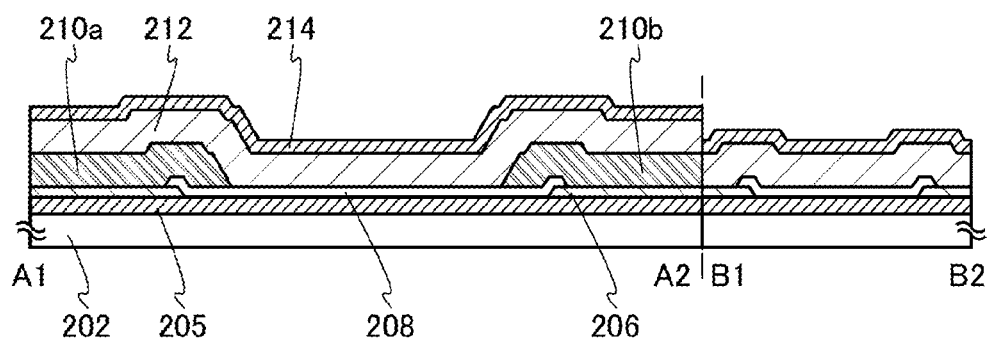

The resistor 114 illustrated in FIGS. 2A to 2C is described first.

FIG. 2A is a top view of the resistor 114, FIG. 2B is a cross-sectional view taken along the dashed-dotted lines A1-A2 and B1-B2 in FIG. 2A, and FIG. 2C is a cross-sectional view taken along the dashed-dotted lines A1-A2 and B1-B2 in FIG. 2A. In FIG. 1A, some of components are omitted to avoid complexity.

The resistors 114 illustrated in FIGS. 2A to 2C each include a substrate 202, a layer having an insulating property (hereinafter referred to as an insulating layer 205) over the substrate 202, a layer having an insulating property (hereinafter referred to as an insulating layer 206) over the insulating layer 205, a semiconductor layer 208 over the insulating layer 206, a layer having a conductive property (hereinafter referred to as a conductive layer 210a) that is electrically connected to the semiconductor layer 208, a layer having a conductive property (hereinafter referred to as a conductive layer 210b) that is electrically connected to the semiconductor layer 208, a layer having an insulating property (hereinafter referred to as an insulating layer 212) over the conductive layer 210a and the conductive layer 210b, and a layer having an insulating property (hereinafter referred to as an insulating layer 214) over the insulating layer 212.

The resistor 114 illustrated in FIG. 2B is different from the resistor 114 illustrated in FIG. 2C in the shapes of the insulating layer 206 and an opening portion 209 in the insulating layer 212. The structure of the insulating layers in contact with the upper side and the lower side of the semiconductor layer 208 can be changed because the formation process of the opening portion 209 is made different.

Specifically, the resistor illustrated in FIG. 2B includes the insulating layer 205, the insulating layer 206 formed over the insulating layer 205, the semiconductor layer 208 formed over the insulating layer 206, and the insulating layer 214 formed over the semiconductor layer 208. The resistor illustrated in FIG. 2C, on the other hand, includes the insulating layer 205, the semiconductor layer 208 formed over the insulating layer 205, the insulating layer 212 formed over the semiconductor layer 208, and the insulating layer 214 formed over the insulating layer 212.

The structure of the insulating layers in contact with the upper side and the lower side of the semiconductor layer 208 are made different as illustrated in FIGS. 2B and 2C, so that the resistance of the semiconductor layer 208 can be controlled. Specifically, for example, when an oxide semiconductor is used as a material used for the semiconductor layer 208, the resistance of the oxide semiconductor can be controlled with oxygen vacancies in the oxide semiconductor or an impurity (such as hydrogen or water) in the oxide semiconductor. The resistivity of the semiconductor layer 208 is preferably $1\times10^{-3}$ Ωcm or higher and lower than $1\times10^{4}$ Ωcm, further preferably $1\times10^{-3}$ Ωcm or higher and lower than $1\times10^{-1}$ Ωcm.

In addition, in order to control the resistance of the oxide semiconductor, an ion implantation method, an ion doping method, a plasma immersion ion implantation method, or the like can be employed to inject hydrogen, boron, phosphorus, or nitrogen into the oxide semiconductor.

For example, an insulating film containing hydrogen, that is, an insulating film that can release hydrogen, typically, a silicon nitride film, is used as each of the insulating layers 205 and 214, and thereby hydrogen can be supplied to the semiconductor layer 208. The silicon nitride film preferably has a hydrogen concentration of $1\times10^{22}$ atoms/cm$^3$ or higher. With such an insulating layer, hydrogen can be supplied to the semiconductor layer 208. When hydrogen as the impurity is supplied to the semiconductor layer 208, the resistance of the semiconductor layer 208 is lowered. In addition, an insulating film containing oxygen, that is, an insulating film that can release oxygen, typically, a silicon oxide film or a silicon oxynitride film, is used as each of the insulating layers 206 and 212, and thereby oxygen can be supplied to the semiconductor layer 208. When oxygen is supplied to the semiconductor layer 208 to fill the oxygen vacancies in the semiconductor layer 208, the resistance of the semiconductor layer 208 can be increased.

For the semiconductor layer 208, for example, an oxide semiconductor can be used. An oxide semiconductor that can be used for the semiconductor layer 307 preferably includes a layer represented by an In-M-Zn-based oxide containing at least indium (In), zinc (Zn), and M (M is a metal such as Al, Ga, Ge, Y, Zr, Sn, La, Ce, or Hf). Alternatively, the semiconductor layer 307 preferably contains both In and Zn. In order to reduce fluctuations in electrical characteristics of the transistors including the oxide semiconductor, the oxide semiconductor preferably contains a stabilizer in addition to In and Zn.

Further, the semiconductor layer 208 preferably includes an oxide including a microcrystalline region, and in the microcrystalline region, a plurality of spots that are distributed circumferentially are observed in an electron diffraction pattern with a beam diameter of from 5 nmφ to 10 nmφ but no spots are observed in an electron diffraction pattern with a beam diameter of 300 nmφ or larger.

As described above, the oxide semiconductor is used for the resistor 114 and the insulating layers in contact with the upper side and the lower side of the oxide semiconductor are changed, so that the resistance of the oxide semiconductor can be controlled. Accordingly, the resistance of the resistor 114 can be controlled. Thus, a novel resistor can be provided.

Note that there is no particular limitation on the substrate 202 in the resistor 114, as long as a substrate that can support the resistor 114 is used. For example, a glass substrate can be used. In addition, the conductive layers 210a and 210b included in the resistor 114 should connect the resistor to another wiring or lead a wiring, and preferably has at least a conductive property.

Figure 3A:
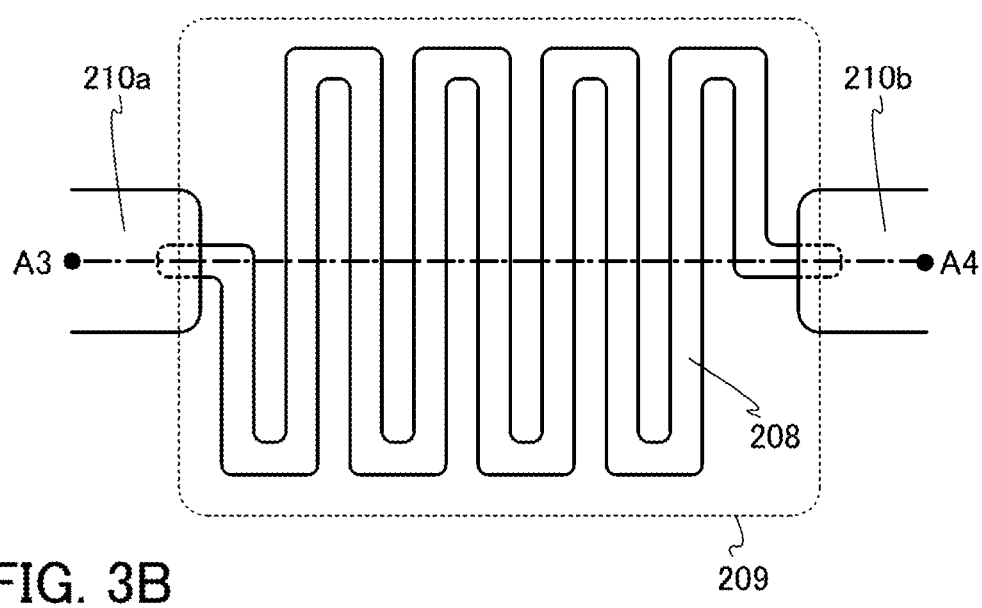
FIG. 3A is a top view of a resistor and FIGS. 3B and 3C are cross-sectional views of the resistors.
Figure 3B:
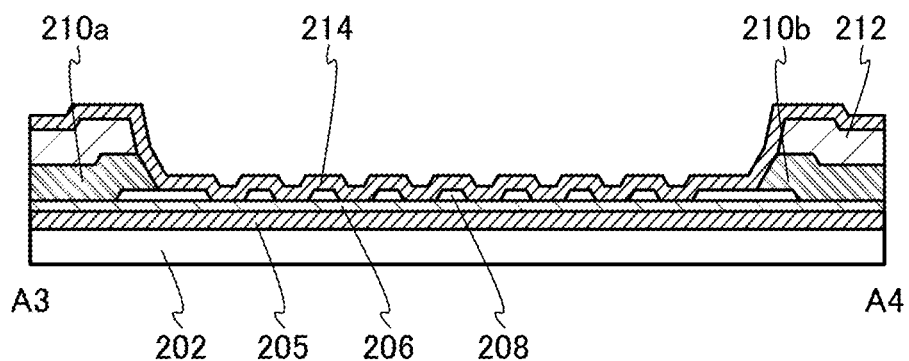
Figure 3C:
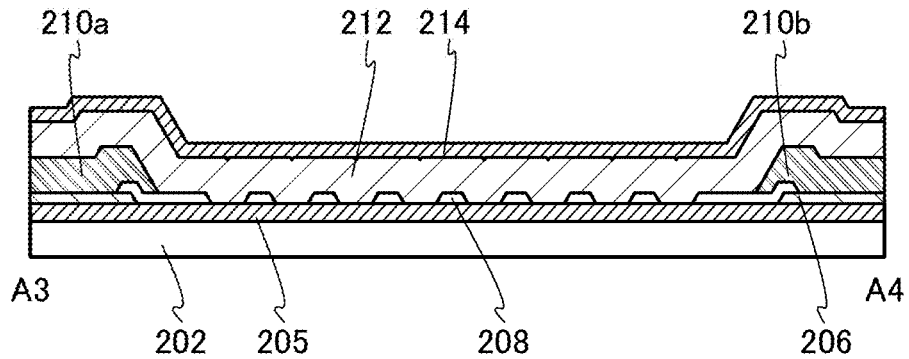

Resistors illustrated in FIGS. 3A to 3C are described.

The resistors illustrated in FIGS. 3A to 3C are variations of the resistors illustrated in FIGS. 2A to 2C. FIG. 3A is a top view of the resistor 114, FIG. 3B is a cross-sectional view taken along the dashed-dotted line A3-A4 in FIG. 3A, and FIG. 3C a cross-sectional view taken along the dashed-dotted line A3-A4 in FIG. 3A. In FIG. 3A, some of components are omitted to avoid complexity.

The resistors 114 illustrated in FIGS. 3A to 3C each include the substrate 202, the insulating layer 205 formed over the substrate 202, the insulating layer 206 formed over the insulating layer 205, the semiconductor layer 208 formed over the insulating layer 206, the conductive layer 210a electrically connected to the semiconductor layer 208, the conductive layer 210b electrically connected to the semiconductor layer 208, the insulating layer 212 over the conductive layer 210a and the conductive layer 210b, and the insulating layer 214 over the insulating layer 212.

The resistor 114 illustrated in FIG. 3B is different from the resistor 114 illustrated in FIG. 3C in the shapes of the insulating layer 206 and the opening portion 209 in the insulating layer 212. The structure of the insulating layers in contact with the upper side and the lower side of the semiconductor layer 208 can be changed because the formation process of the opening portion 209 is made different.

The structure of the insulating layers in contact with the upper side and the lower side of the semiconductor layer 208 are similar to those of the resistors 114 illustrated in FIGS. 2A to 2C.

The resistors 114 illustrated in FIGS. 2A to 2C are different from the resistors 114 illustrated in FIGS. 3A to 3C in the shape of the semiconductor layer 208. As illustrated in FIGS. 3A to 3C, the shape, typically, the length or width of the semiconductor layer 208 is adjusted as appropriate so that the resistor can have a given resistance.

The resistors 114 illustrated in FIGS. 2A to 2C and FIGS. 3A to 3C can be formed at the same time as the fabrication process of the transistors included in the driver circuit portion 104 and the pixel circuit portion 108 in the display device illustrated in FIG. 1A.

Specifically, the insulating layer 205 and 206 can be formed in the same process where the a gate insulating layer of a transistor is formed, the semiconductor layer 208 can be formed in the same process where a semiconductor layer of the transistor is formed, the conductive layers 210a and 210b can be formed in the same process where a source electrode layer and a drain electrode layer of the transistor is formed, and the insulating layers 212 and 214 can be formed in the same process where an insulating layer serving as a protective insulating layer of the transistor is formed, for example.

In addition, as for the resistors 114 illustrated in FIGS. 2A to 2C and FIGS. 3A to 3C, the resistor 114 can be connected in series to the diode-connected transistor as in the example in FIG. 1B, but the resistor 114 can be connected in parallel to the diode-connected transistor without being limited to the example in FIG. 1B.

Further, the resistors 114 illustrated in FIGS. 2A to 2C and FIGS. 3A to 3C can be provided independently as the protection circuit portion 106 in the display device. The resistors 114 illustrated in FIGS. 2A to 2C and FIGS. 3A to 3C can each have a plurality of transistors and a plurality of resistors in combination and can be provided in the display device. A structure illustrated in FIG. 4 can be employed, specifically.

Figure 4:
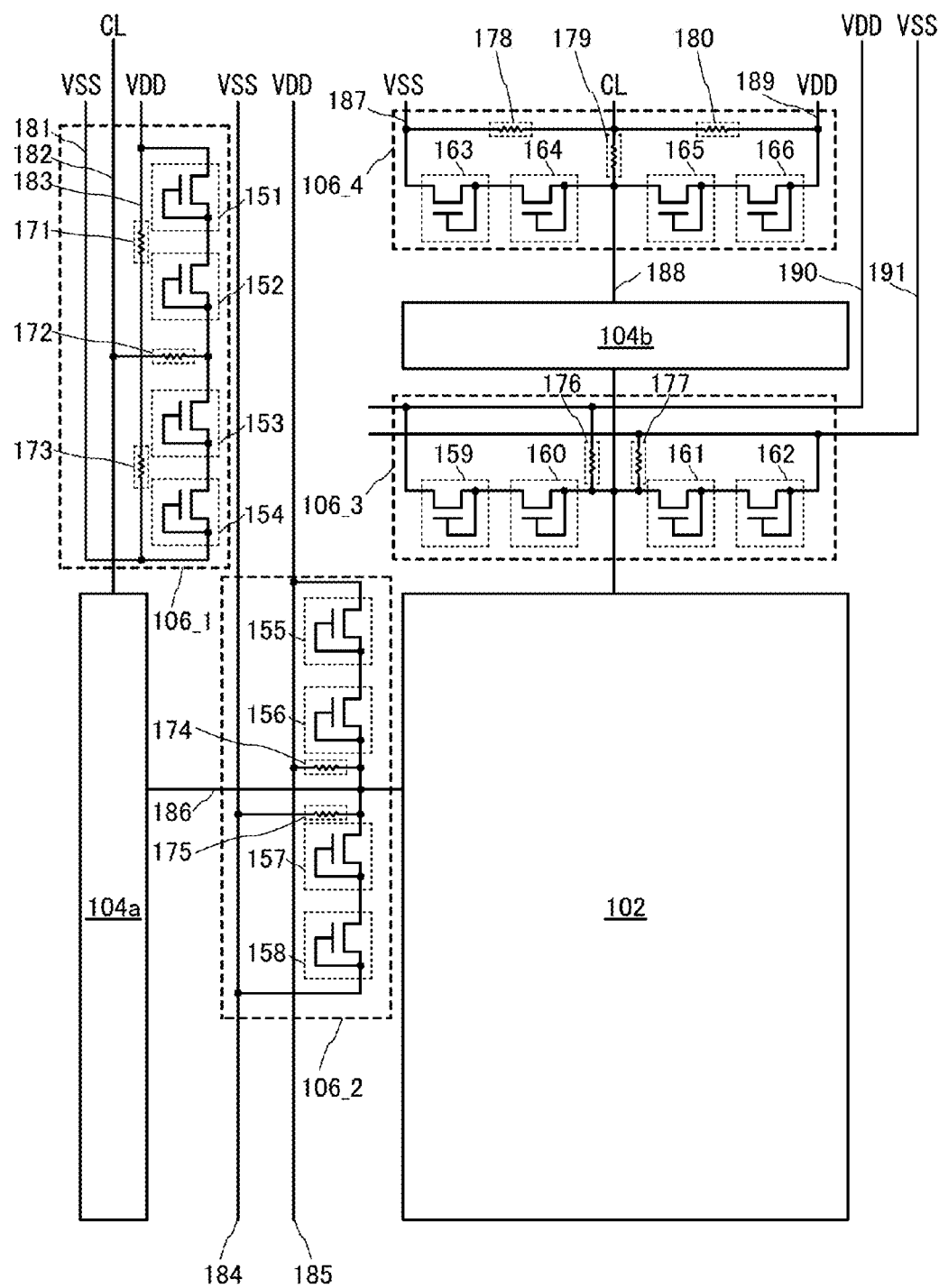
FIG. 4 is a schematic plan view of a display device, including a circuit diagram of a protection circuit portion.

A display device illustrated in FIG. 4 includes the pixel portion 102, the gate driver 104a in the driver circuit portion, the source driver 104b in the driver circuit portion, a protection circuit portion 106_1, a protection circuit portion 106_2, a protection circuit portion 106_3, and a protection circuit portion 106_4.

Note that the pixel portion 102, the gate driver 104a, and the source driver 104b have the same structures as those illustrated in FIG. 1A.

The protection circuit portion 106_1 includes transistors 151, 152, 153, and 154 and resistors 171, 172, and 173. In addition, the protection circuit portion 106_1 is provided between the gate driver 104a and wirings 181, 182, and 183 connected to the gate driver 104a. In addition, a first terminal serving as a source electrode of the transistor 151 is connected to a second terminal serving as a gate electrode of the transistor 151, and a third terminal serving as a drain electrode of the transistor 151 is connected to the wiring 183. A first terminal serving as a source electrode of the transistor 152 is connected to a second terminal serving as a gate electrode of the transistor 152, and a third terminal serving as a drain electrode of the transistor 152 is connected to the first terminal of the transistor 151. A first terminal serving as a source electrode of the transistor 153 is connected to a second terminal serving as a gate electrode of the transistor 153, and a third terminal serving as a drain electrode of the transistor 153 is connected to the first terminal of the transistor 152. A first terminal serving as a source electrode of the transistor 154 is connected to a second terminal serving as a gate electrode of the transistor 154, and a third terminal serving as a drain electrode of the transistor 154 is connected to the first terminal of the transistor 153. The first terminal of the transistor 154 is connected to the wiring 183 and the wiring 181. In addition, the resistors 171 and 173 are provided for the wiring 183. In addition, the resistor 172 is provided between the wiring 182 and the first terminal of the transistor 152 and the third terminal of the transistor 153.

Note that for example, the wiring 181 can be used as a power source line supplied with the low power source potential VSS; the wiring 182 can be used as a common line; and the wiring 183 can be used as a power source line supplied with the high power source potential VDD.

The protection circuit 106_2 includes transistors 155, 156, 157, and 158 and resistors 174 and 175. In addition, the protection circuit 106_2 is provided between the gate driver 104a and the pixel portion 102. In addition, a first terminal serving as a source electrode of the transistor 155 is connected to a second terminal serving as a gate electrode of the transistor 155, and a third terminal serving as a drain electrode of the transistor 155 is connected to the wiring 185. A first terminal serving as a source electrode of the transistor 156 is connected to a second terminal serving as a gate electrode of the transistor 156, and a third terminal serving as a drain electrode of the transistor 156 is connected to the first terminal of the transistor 155. A first terminal serving as a source electrode of the transistor 157 is connected to a second terminal serving as a gate electrode of the transistor 157, and a third terminal serving as a drain electrode of the transistor 157 is connected to the first terminal of the transistor 156. A first terminal serving as a source electrode of the transistor 158 is connected to a second terminal serving as a gate electrode of the transistor 158, and a third terminal serving as a drain electrode of the transistor 158 is connected to the first terminal of the transistor 157. The first terminal of the transistor 158 is connected to the wiring 184. In addition, the resistor 174 is provided between the wiring 185, the first terminal of the transistor 156 and the third terminal of the transistor 157, and the resistor 175 is provided between the wiring 184, the first terminal of the transistor 156 and the third terminal of the transistor 157.

Note that for example, the wiring 184 can be used as a power source line supplied with the low power source potential VSS; the wiring 185 can be used as a power source line supplied with the high power source potential VDD; and the wiring 186 can be used as a gate line.

The protection circuit 106_3 includes transistors 159, 160, 161, and 162 and resistors 176 and 177. In addition, the protection circuit 106_3 is provided between the source driver 104b and the pixel portion 102. In addition, a first terminal serving as a source electrode of the transistor 159 is connected to a second terminal serving as a gate electrode of the transistor 159, and a third terminal serving as a drain electrode of the transistor 159 is connected to a wiring 190.

A first terminal serving as a source electrode of the transistor 160 is connected to a second terminal serving as a gate electrode of the transistor 160, and a third terminal serving as a drain electrode of the transistor 160 is connected to the first terminal of the transistor 159. A first terminal serving as a source electrode of the transistor 161 is connected to a second terminal serving as a gate electrode of the transistor 161, and a third terminal serving as a drain electrode of the transistor 161 is connected to the first terminal of the transistor 160. A first terminal serving as a source electrode of the transistor 162 is connected to a second terminal serving as a gate electrode of the transistor 162, and a third terminal serving as a drain electrode of the transistor 162 is connected to the first terminal of the transistor 161. In addition, the first terminal of the transistor 162 is connected to a wiring 191. Further, the resistor 176 is provided between the wiring 190, the first terminal of the transistor 160 and the third terminal of the transistor 161, and the resistor 177 is provided between the wiring 191, the first terminal of the transistor 160 and the third terminal of the transistor 161.

Note that for example, the wiring 188 can be used as a common line or a source line; the wirings 189 and 190 can be used as power source lines supplied with the high power source potential VDD; and the wiring 191 can be used as a power source line supplied with the low power source potential VSS.

The protection circuit 106_4 includes transistors 163, 164, 165, and 166 and resistors 178, 179, and 180. In addition, the protection circuit 106_4 is provided between the source driver 104b and wirings 187, 188, 189, 190, and 191 connected to the source driver 104b. In addition, a first terminal serving as a source electrode of the transistor 163 is connected to a second terminal serving as a gate electrode of the transistor 163, and a third terminal serving as a drain electrode of the transistor 163 is connected to the wiring 187. A first terminal serving as a source electrode of the transistor 164 is connected to a second terminal serving as a gate electrode of the transistor 164, and a third terminal serving as a drain electrode of the transistor 164 is connected to the first terminal of the transistor 163. A first terminal serving as a source electrode of the transistor 165 is connected to a second terminal serving as a gate electrode of the transistor 165, and a third terminal serving as a drain electrode of the transistor 165 is connected to the first terminal of the transistor 164. A first terminal serving as a source electrode of the transistor 166 is connected to a second terminal serving as a gate electrode of the transistor 166, and a third terminal serving as a drain electrode of the transistor 166 is connected to the first terminal of the transistor 165. In addition, the first terminal of the transistor 166 is connected to the wiring 189. Further, the resistor 178 is provided between the wiring 187 and the wiring 188 and the resistor 179 is provided for the wiring 188, and is connected to the first terminal of the transistor 164 and the third terminal of the transistor 165. The resistor 180 is provided between the wiring 188 and the wiring 189.

Note that for example, the wirings 187 and 191 can be used as power source lines supplied with the low power source potential VSS; the wiring 188 can be used as a common line or a source line; the wirings 189 and 190 can be used as power source lines supplied with the high power source potential VDD.

Note that the functions of the wirings 181 to 191 are not limited to functions of being supplied with the high power source potential VDD and the low power source potential VSS, and a function of the common line CL illustrated in FIG. 4, and the wirings 181 to 191 can have functions of a gate signal line, a signal line, a power source line, a ground line, a capacitor line, a common line, and the like, independently.

The resistors 114 illustrated in FIGS. 2A to 2C and FIGS. 3A to 3C can be applied to the resistors 171 to 180 illustrated in FIG. 4.

In this manner, the protection circuits 106_1 to 106_4 each include the plurality of transistors that are diode-connected and the plurality of resistors. In other words, the protection circuits 106_1 to 106_4 can include diode-connected transistors and resistors that are combined in parallel.

In addition, the protection circuits 106_1 to 106_4 illustrated in FIG. 4 can be provided between the gate driver 104a and wirings connected to the gate driver 104a, between the pixel portion 102 and the gate driver 104a, between the pixel portion 102 and the source driver 104b, and between the source driver 104b and wirings connected to the source driver 104b.

Figure 5:
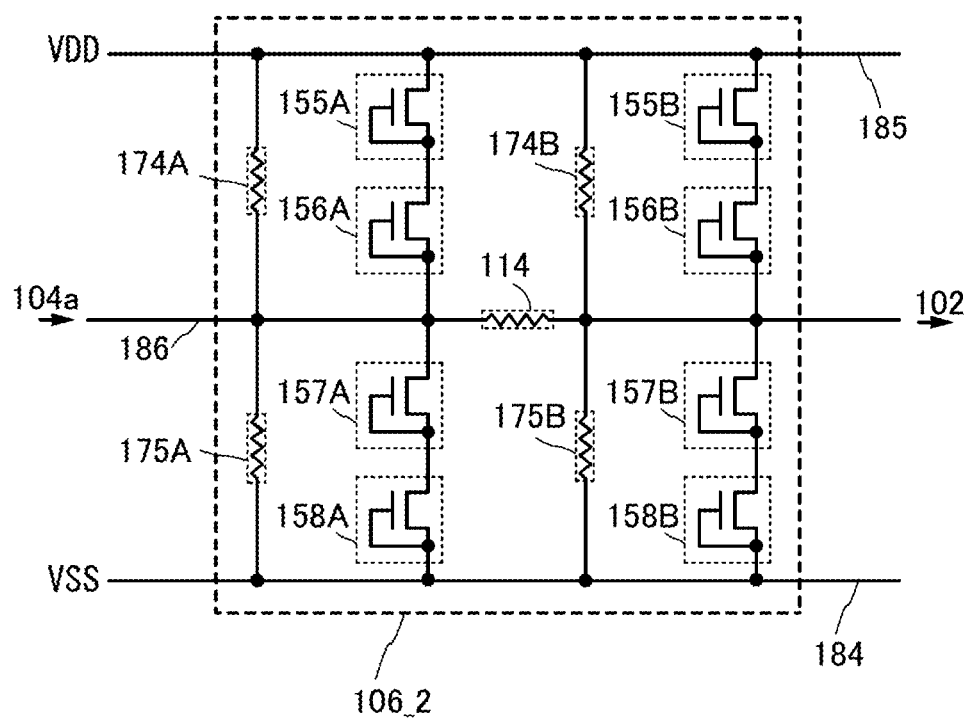
FIG. 5 is a circuit diagram of a protection circuit portion.

Further, the resistors 114 illustrated in FIGS. 2A to 2C and FIGS. 3A to 3C can be applied to a protection circuit portion illustrated in FIG. 5.

In the circuit diagram of the protection circuit portion illustrated in FIG. 5, transistors 155A to 158A, transistors 155B to 158B, resistors 174A and 175A, resistors 174B and 175B, a resistor 199, the wiring 184, the wiring 185 and the wiring 186 are illustrated. The reference numerals in the circuit diagram of FIG. 5 correspond to the reference numerals used for the protection circuit portion 106_2 in FIG. 4 for the components common in FIG. 5 and FIG. 4. The protection circuit portion 106_2 in FIG. 5 is different from that in FIG. 4 in that circuits in the protection circuit portion 106_2 in FIG. 4 are placed side by side and the resistor 114 is placed between wirings.

In addition, the resistors 114 illustrated in FIGS. 2A to 2C and FIGS. 3A to 3C can be applied to the resistors 174A, 174B, 175A, and 175B illustrated in FIG. 5.

By the protection circuit portion 106 provided in the display device illustrated in FIG. 1A in this manner, the pixel portion 102 (typically the pixel circuit portion 108) and the driver circuit portion 104 can have an increased tolerance to overcurrent generated by ESD or the like. Therefore, a novel display device with improved reliability can be provided.

Further, because the resistor can be used as the protection circuit portion 106 and the resistance of the resistor can be controlled arbitrarily, the diode-connected transistor or the like that is used as the protection circuit portion 106 can also be protected.

Note that the pixel portion 102 is preferably formed over the same substrate where the protection circuit portion 106 is formed, and thereby the number of components and wirings can be reduced. Part or the whole of the driver circuit portion 104 is preferably formed over the same substrate where the pixel portion 102 is formed, for example, in which case the number of components and the number of terminals can be reduced. When part or the whole of the driver circuit portion 104 is not formed over the same substrate where the pixel portion 102 is formed, part or the whole of the driver circuit portion 104 is often mounted by COG or TAB.

By the plurality of protection circuit portions 106 provided in the display device in such a manner, the tolerances of the pixel portion 102 and the driver circuit portion 104 (the gate driver 104a and the source driver 104b) to overcurrent due to ESD or the like can be further improved. Therefore, a novel display device with improved reliability can be provided.

The structure described in this embodiment can be used in appropriate combination with any structure in the other embodiments.

Embodiment 2

In this embodiment, a display device of one embodiment of the present invention will be described with reference to FIGS. 6A and 6B, FIGS. 7A to 7C, FIG. 8, and FIGS. 9A to 9C.

Figure 6A:
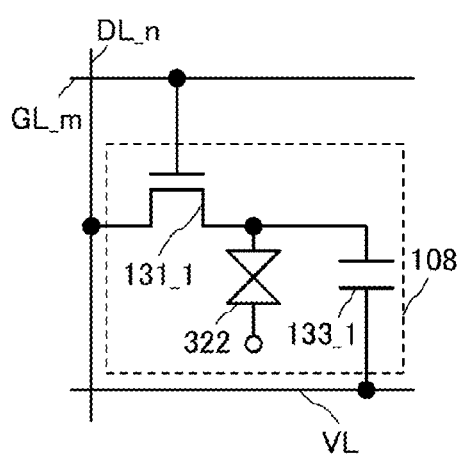
FIGS. 6A and 6B are diagrams of pixel circuits that can be used in a display device.
Figure 6B:
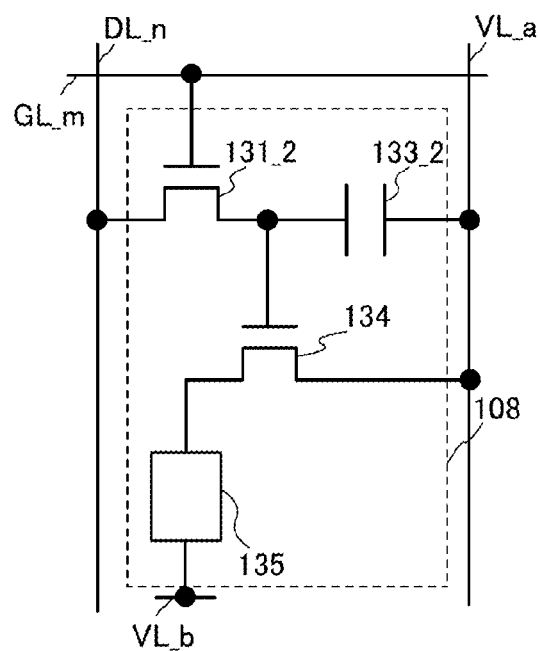

FIGS. 6A and 6B illustrate circuit configurations that can be used for the pixel circuit portion 108 in the display device illustrated in FIG. 1A.

The pixel circuit portion 108 illustrated in FIG. 6A includes a liquid crystal element 322, a transistor 131_1, and a capacitor 133_1.

The potential of one of a pair of electrodes of the liquid crystal element 322 is set in accordance with the specifications of the pixel circuit portion 108 as appropriate. The alignment state of the liquid crystal element 322 depends on written data. A common potential may be supplied to one of the pair of electrodes of the liquid crystal element 322 included in each of a plurality of pixel circuit portions 108. Further, the potential supplied to one of a pair of electrodes of the liquid crystal element 322 in the pixel circuit portion 108 in one row may be different from the potential supplied to one of a pair of electrodes of the liquid crystal element 322 in the pixel circuit portion 108 in another row.

As examples of a driving method of the display device including the liquid crystal element 322, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA (multi-domain vertical alignment) mode, a PVA (patterned vertical alignment) mode, an IPS mode, an FFS mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel circuit portion 108 in the m-th row and the n-th column, one of a source and a drain of the transistor 131_1 is electrically connected to the data line DL_n, and the other is electrically connected to the other of a pair of electrodes of the liquid crystal element 322. A gate of the transistor 131_1 is electrically connected to the gate signal line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a potential supply line VL), and the other is electrically connected to the other of the pair of electrodes of the liquid crystal element 322. The potential of the potential supply line VL is set in accordance with the specifications of the pixel circuit portion 108 as appropriate. The capacitor 133_1 functions as a storage capacitor for storing written data.

For example, in the display device including the pixel circuit portion 108 in FIG. 6A, the pixel circuit portions 108 are sequentially selected row by row by the gate driver 104a, whereby the transistors 131_1 are turned on and a data signal is written.

When the transistors 131_1 are turned off, the pixel circuit portions 108 in which the data has been written are brought into a holding state. This operation is sequentially performed row by row; thus, an image is displayed.

The pixel circuit portion 108 illustrated in FIG. 6B includes a transistor 131_2, a capacitor 133_2, a transistor 134, and a light-emitting element 135.

One of a source and a drain of the transistor 131_2 is electrically connected to a wiring to which a data signal is supplied (hereinafter referred to as a data line DL_n). A gate of the transistor 131_2 is electrically connected to a wiring to which a gate signal is supplied (hereinafter referred to as a gate signal line GL_m).

The transistor 131_2 has a function of controlling whether to write a data signal by being turned on or off.

One of a pair of electrodes of the capacitor 133_2 is electrically connected to a wiring to which power is supplied (power supply line VL_a), and the other is electrically connected to the other of the source and the drain of the transistor 131_2.

The capacitor 133_2 functions as a storage capacitor for storing written data.

One of a source and a drain of the transistor 134 is electrically connected to the power supply line VL_a. Further, a gate of the transistor 134 is electrically connected to the other of the source and the drain of the transistor 131_2.

One of an anode and a cathode of the light-emitting element 135 is electrically connected to a power supply line VL_b, and the other is electrically connected to the other of the source and the drain of the transistor 134.

As the light-emitting element 135, an organic electroluminescent element (also referred to as an organic EL element) or the like can be used, for example. Note that the light-emitting element 135 is not limited to organic EL elements; an inorganic EL element including an inorganic material can be used.

A high power supply potential VDD is supplied to one of the power supply line VL_a and the power supply line VL_b, and a low power supply potential VSS is supplied to the other.

In the display device including the pixel circuit portion 108 in FIG. 6B, the pixel circuit portions 108 are sequentially selected row by row by the gate driver 104a, whereby the transistors 131_2 are turned on and a data signal is written.

When the transistors 131_2 are turned off, the pixel circuit portions 108 in which the data has been written are brought into a holding state. Further, the amount of current flowing between the source and the drain of the transistor 134 is controlled in accordance with the potential of the written data signal. The light-emitting element 135 emits light with a luminance corresponding to the amount of flowing current. This operation is sequentially performed row by row; thus, an image is displayed.

Note that in this specification and the like, a display element, a display device which is a device including a display element, a light-emitting element, and a light-emitting device which is a device including a light-emitting element can employ various modes or can include various elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, an electrowetting element, a grating light valve (GLV), a plasma display panel (PDP), a display device using a micro electro mechanical system (MEMS), a digital micromirror device (DMD), a digital micro shutter (DMS), an interferometic modulator display (IMOD), a piezoelectric ceramic display, or a carbon nanotube, which are display media whose contrast, luminance, reflectivity, transmittance, or the like is changed by electromagnetic action. Note that examples of a display device having an EL element include an EL display and the like. Examples of a display device having an electron emitter include a field emission display (FED), an SED-type flat panel display (SED: surface-conduction electron-emitter display), and the like. Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display) and the like. Examples of a display device having an electronic ink or an electrophoretic element include electronic paper.

Examples of an EL element are an element including an anode, a cathode, and an EL layer interposed between the anode and the cathode, and the like. Examples of an EL layer include, but are not limited to, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer including an organic material, a layer including an inorganic material, a layer including an organic material and an inorganic material, a layer including a high-molecular material, a layer including a low-molecular material, a layer including a high-molecular material and a low-molecular material, and the like. Further, various types of EL elements can be used as well as these examples.

An example of liquid crystal elements is an element where transmission and non-transmission of light is controlled by optical modulation action of liquid crystals. The element can be configured to include a pair of electrodes and a liquid crystal layer. The optical modulation action of liquid crystal is controlled by an electric field applied to the liquid crystal (including a lateral electric field, a vertical electric field and a diagonal electric field). Note that specifically, the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

For example, display of electronic paper can be performed using molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specifically, examples of a display method of electronic paper are microcapsule electrophoresis, horizontal electrophoresis, vertical electrophoresis, a spherical twisting ball, a magnetic twisting ball, a columnar twisting ball, a charged toner, an electron powder and granular material, magnetic electrophoresis, a magnetic thermosensitive type, electro wetting, light-scattering (transparent-opaque change), a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, flexible organic EL, and the like. Note that the present invention is not limited to these examples, and various electronic paper and display methods can be used as electronic paper and a display method thereof. Here, with the use of microcapsule electrophoresis, aggregation and precipitation of phoresis particles can be prevented. Electro liquid powder has advantages such as high-speed response, high reflectivity, wide viewing angle, low power consumption, and memory properties.

Figure 7A:
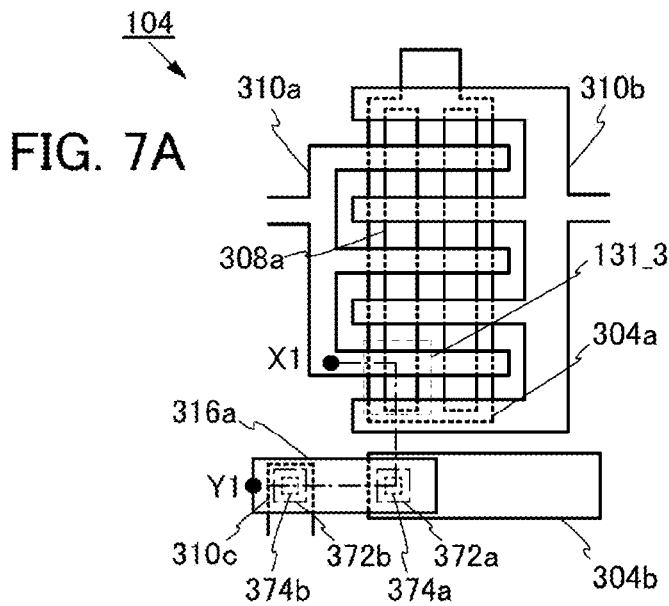
FIGS. 7A to 7C are top views of a display device.
Figure 7B:
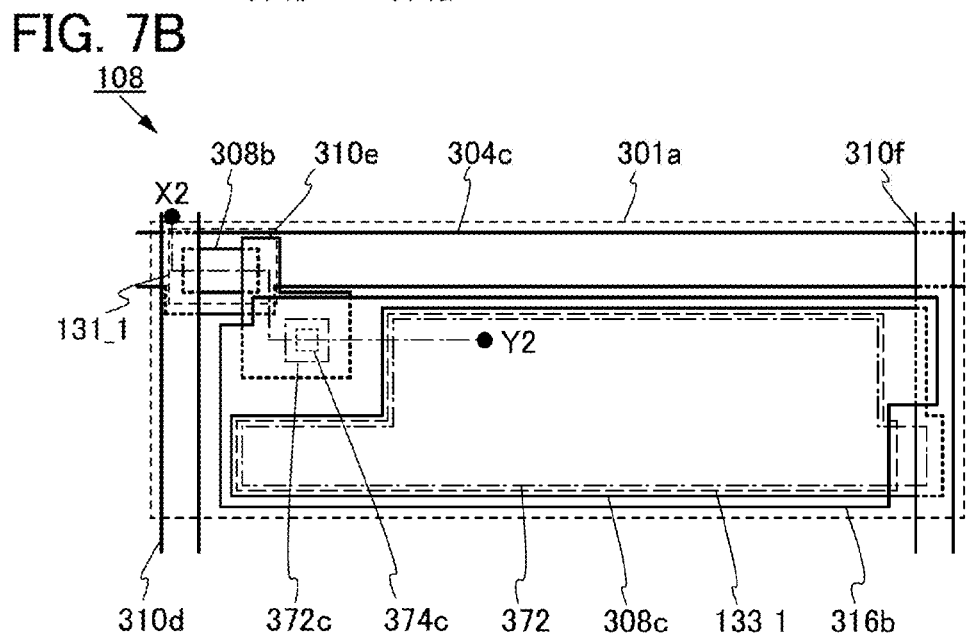
Figure 7C:
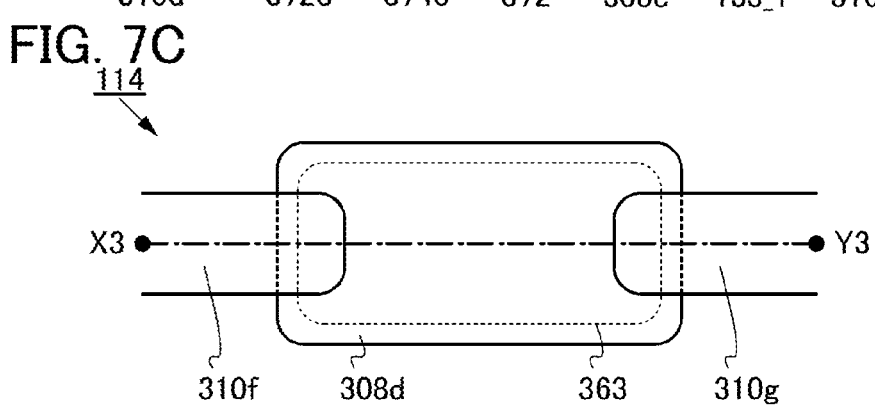

Next, a display device illustrated in FIGS. 7A to 7C is described.

The display device illustrated in FIGS. 7A to 7C is a concrete one of the display device illustrated in FIG. 1A, and includes the driver circuit portion 104, the pixel circuit portion 108, and the resistor 114. Note that a structure of a display device having a liquid crystal element (also referred to as a liquid crystal display device) is described as the display device described in this embodiment. In addition, as for the structure used for the pixel circuit portion 108, components having functions similar to those in the circuit configuration illustrated in FIG. 6A are described with the same reference numerals as those in FIG. 6A.

FIG. 7A is a top view of the driver circuit portion 104, FIG. 7B is a top view of a pixel portion 102, and FIG. 7C is a top view of the resistor 114. In FIGS. 7A to 7C, some of components such as a liquid crystal element are omitted to avoid complexity.

In FIG. 7A, a conductive layer 304a serving as a gate, a gate insulating layer (not illustrated in FIG. 7A), a semiconductor layer 308a where a channel region is formed, and conductive layers 310a and 310b serving as a source and a drain constitute a transistor 131_3. The semiconductor layer 308a is formed over the gate insulating layer. In addition, a conductive layer 304b formed at the same time as the conductive layer 304a, a conductive layer 310c formed at the same time as the conductive layers 310a and 310b, a conductive layer 316a having a light-transmitting property that connects the conductive layer 304b to the conductive layer 310c are provided. The conductive layer 316a having a light-transmitting property is connected to the conductive layer 304b in opening portions 372a and 374a and is connected to the conductive layer 310c in opening portions 372b and 374b.

In FIG. 7B, the conductive layer 304c serving as a gate signal line extends substantially perpendicularly to a signal line (in the horizontal direction in the drawing). The conductive layer 310d serving as a signal line extends substantially perpendicularly to the gate signal line (in the vertical direction in the drawing). A conductive layer 310f serving as a capacitor line extends in parallel to the signal line. Note that the conductive layer 304c serving as a gate signal line is electrically connected to the gate driver 104a (see FIG. 1A), and the conductive layer 310d serving as a signal line and the conductive layer 310f serving as a capacitor line are electrically connected to the source driver 104b (see FIG. 1A).

In FIG. 7B, the transistor 131_1 is provided at a region where the gate signal line and the signal line cross each other. The transistor 131_1 includes the conductive layer 304c serving as a gate; the gate insulating layer (not illustrated in FIG. 7B); the semiconductor layer 308b where a channel region is formed, over the gate insulating layer; and the conductive layers 310d and 310e serving as a source and a drain. The conductive layer 304c also serves as a gate signal line, and a region of the conductive layer 304c that overlaps with the semiconductor layer 308b serves as the gate of the transistor 131_1. In addition, the conductive layer 310d also serves as a signal line, and a region of the conductive layer 310d that overlaps with the semiconductor layer 308b serves as the source or drain of the transistor 131_1.

Further, in the top view of FIG. 7B, an end portion of the gate signal line is located on the outer side than an end portion of the semiconductor layer 308b. Thus, the gate signal line functions as a light-blocking film for blocking light from a light source such as a backlight. For this reason, the semiconductor layer 308b included in the transistor is not subjected to light, so that a variation in the electrical characteristics of the transistor can be suppressed.

In FIG. 7B, the conductive layer 310e is electrically connected to the conductive layer 316b having a light-transmitting property that serves as a pixel electrode, in the opening portions 372c and 374c.

Further in FIG. 7B, the capacitor 133_1 is connected to the conductive layer 310f serving as a capacitor line in the opening portion 372. The capacitor 133_1 includes the semiconductor layer 308c having a light-transmitting property, formed over the gate insulating layer, a conductive layer 316b having a light-transmitting property that serves as a pixel electrode, and a dielectric film formed of a nitride insulating film formed over the transistor 131_1. That is to say, the capacitor 133_1 has a light-transmitting property.

Owing to the light-transmitting property of the capacitor 133_1, the large capacitor 133_1 can be formed (covers a large area) in the pixel circuit portion 108. Thus, a display device having an increased charge capacity as well as the aperture ratio increased to typically 55% or more, preferably 60% or more can be provided. For example, in a high-resolution display device such as a liquid crystal display device, the area of a pixel is small and accordingly the area of a capacitor is also small. For this reason, the capacity of charge stored in the capacitor is small in the high-resolution display device. However, since the capacitor 133_1 in this embodiment transmits light, when it is provided in a pixel, a sufficient charge capacity can be obtained in the pixel and the aperture ratio can be improved. Typically, the capacitor 133_1 can be favorably used for a high-resolution display device with a pixel density of 200 pixels per inch (ppi) or more, or furthermore, 300 ppi or more.

In addition, the pixel circuit portion 108 in FIG. 7B has a shape in which a side parallel to the conductive layer 304c serving as a gate signal line is longer than a side parallel to the conductive layer 310d serving as a signal line, and the conductive layer 310f serving as a capacitor line extends in parallel to the conductive layer 310d serving as a signal line. This can decrease the area where the conductive layer 310f occupies the pixel circuit portion 108, thereby increasing the aperture ratio. In addition, the conductive layer 310f serving as a capacitor line is in direct contact with the semiconductor layer 308c having a light-transmitting property and serving as a conductive layer, instead of using a connection electrode and thereby the aperture ratio can be further increased.

Further, the resistor 114 illustrated in FIG. 7C has a structure similar to that of the resistor 114 illustrated in FIG. 2A: the conductive layer 210a, the semiconductor layer 208, the opening portion 209, and the conductive layer 210b in FIG. 2A correspond to the conductive layer 310f, the semiconductor layer 308d, the opening portion 363, and the conductive layer 310g in FIG. 7C, respectively. For that reason, the detail of the resistor 114 in FIG. 7C is not described here.

Further, according to one embodiment of the present invention, the aperture ratio can be improved even in a display device with a high resolution, which makes it possible to use light from a light source such as a backlight efficiently, so that power consumption of the display device can be reduced.

A variation of the pixel circuit portion 108 illustrated in FIG. 7B is described with reference to FIG. 8.

Figure 8:
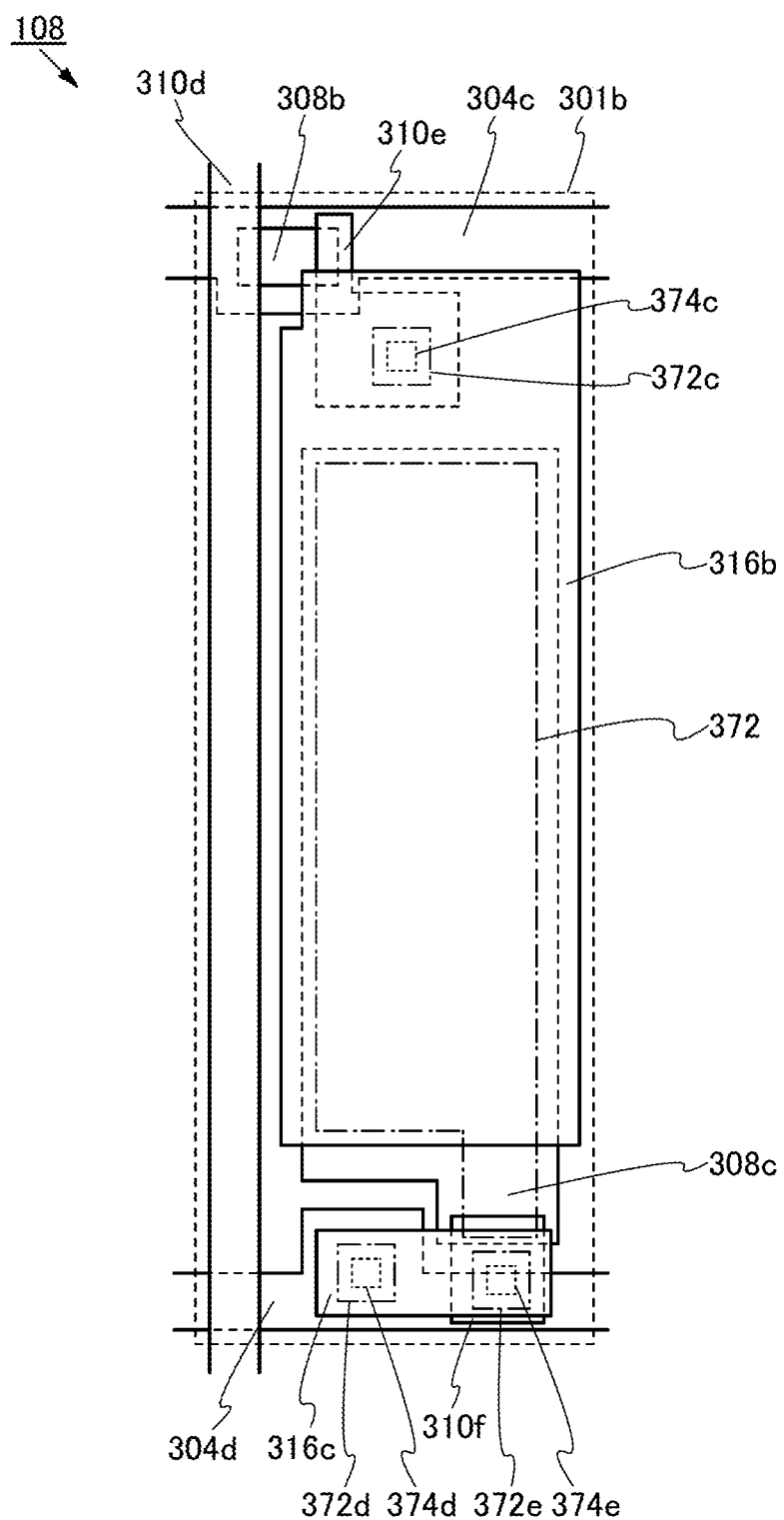
FIG. 8 is a top view of a display device.

In FIG. 8, the conductive layer 304c serving as a gate signal line is provided so as to extend perpendicularly or substantially perpendicularly to the signal line (in the horizontal direction in the drawing). The conductive layer 310d serving as a signal line extends substantially perpendicularly to the gate signal line (in the vertical direction in the drawing). The conductive layer 304d serving as a capacitor line is provided so as to extend in parallel with the gate signal line. The differences between the pixel circuit portion 108 illustrated in FIG. 7B and the pixel circuit portion 108 illustrated in FIG. 8 are as follows: in the pixel circuit portion 108 illustrated in FIG. 8, a side parallel to the conductive layer 304c serving as a gate signal line is shorter than a side parallel to the conductive layer 310d serving as a signal line; the conductive layer 304d serving as a capacitor line extends in parallel to the gate signal line; and the conductive layer 304d serving as a capacitor line is formed at the same time as the conductive layer 304c serving as a gate signal line.

In addition, the semiconductor layer 308c is connected to the conductive layer 310f. Note that the conductive layer 316c having a light-transmitting property is formed at the same time as the conductive layer 316b having a light-transmitting property. The conductive layer 310f is formed at the same time as the conductive layers 310d and 310e.

Further, an opening portion 372d formed at the same time as the opening portion 372c and an opening portion 374d formed at the same time as the opening portion 374c are formed over the conductive layer 304d. In addition, an opening portion 372e formed at the same time as the opening portion 372c and an opening portion 374e formed at the same time as the opening portion 374c are formed over the conductive layer 310f. The opening portions 374d and 374e are located on inner side than the opening portions 372d and 372e, respectively.

In the opening portion 374d, the conductive layer 304d is connected to the conductive layer 316c having a light-transmitting property. In the opening portion 374e, the conductive layer 310f is connected to the conductive layer 316c having a light-transmitting property. In other words, the conductive layer 304d and the conductive layer 310f are connected to each other through the conductive layer 316c having a light-transmitting property, as in the case where the conductive layer 304b and the conductive layer 310c are connected to each other through the conductive layer 316a having a light-transmitting property. In other words, through the conductive layer 310f and the conductive layer 316c having a light-transmitting property, the semiconductor layer 308c having a light-transmitting property and serving as a conductive layer is connected to the conductive layer 304d serving as a capacitor line.

The pixel circuit portion 108 illustrated in FIG. 8 has a shape in which a side parallel to the conductive layer 304c serving as a gate signal line is shorter than a side parallel to the conductive layer 310d serving as a signal line and the conductive layer 304d serving as a capacitor line extends in parallel to the conductive layer 304c serving as a gate signal line. This can decrease the area where the conductive layer 304d occupies the pixel circuit portion 108, thereby increasing the aperture ratio.

Next, cross-sectional structures of the display device illustrated in FIGS. 7A to 7C will be described with reference to FIGS. 9A to 9C.

Figure 9A:
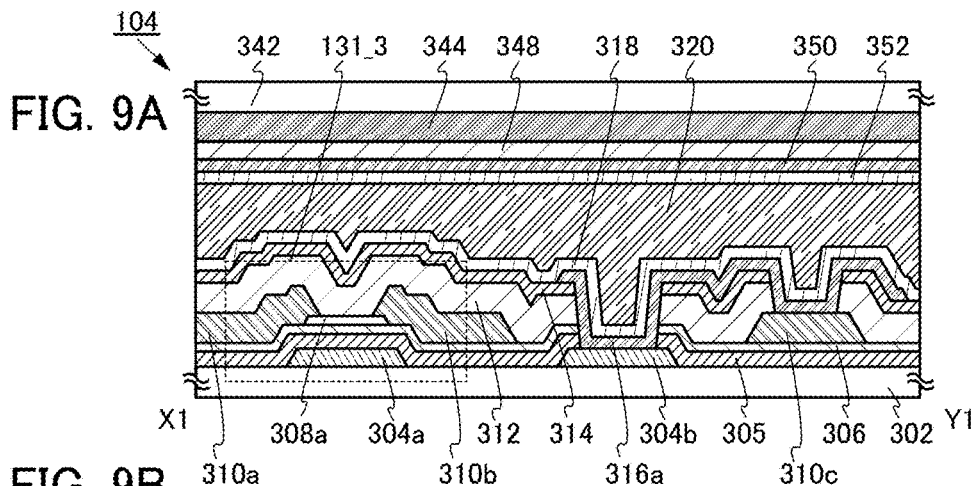
FIGS. 9A to 9C are cross-sectional views of a display device.
Figure 9B:
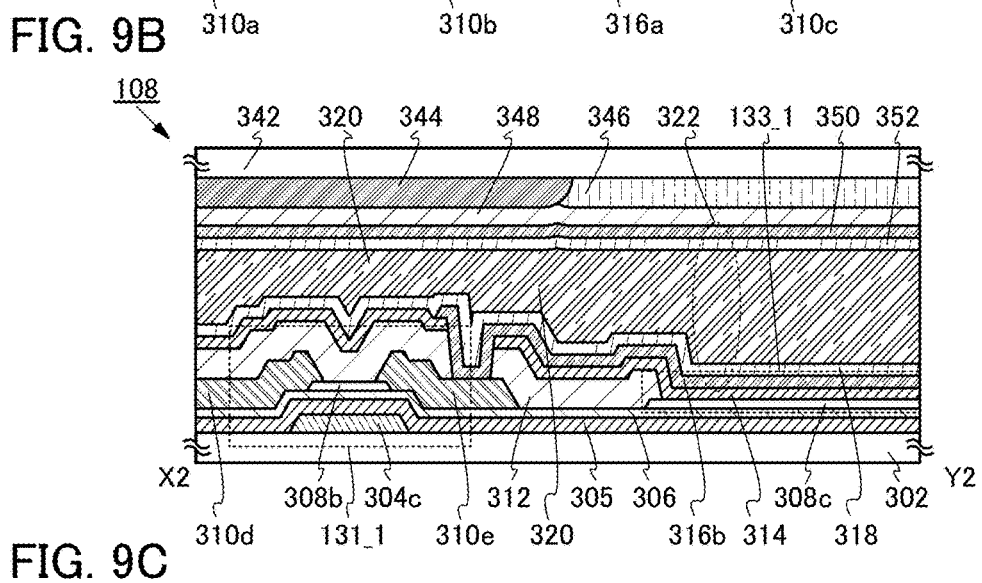
Figure 9C:
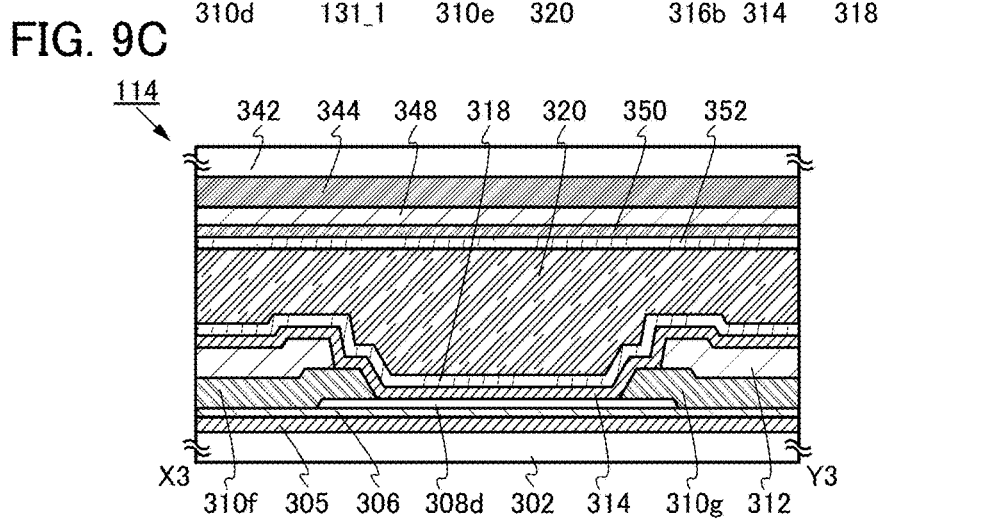

FIG. 9A is a cross-sectional view taken along the dashed-dotted line X1-Y1 in FIG. 7A, FIG. 9B is a cross-sectional view taken along the dashed-dotted line X2-Y2 in FIG. 7B, and FIG. 9C is a cross-sectional view taken along the dashed-dotted line X3-Y3 in FIG. 7C.

The display device illustrated in FIGS. 9A to 9C includes a liquid crystal element 322 between a pair of substrates (a substrate 302 and a substrate 342) (see FIG. 9B).

The liquid crystal element 322 includes a layer having a conductive property (hereinafter referred to as a conductive layer 316b) above the substrate 302, a layer having an alignment property (hereinafter referred to as alignment films 318 and 352), a liquid crystal layer 320, and a layer having a conductive property (hereinafter referred to as a conductive layer 350). The conductive layer 316b functions as one electrode of the liquid crystal element 322, and the conductive layer 350 functions as the other electrode of the liquid crystal element 322.

In FIGS. 9A to 9C, the liquid crystal element 322 is a vertical electric field mode liquid crystal element. Typical examples of the vertical electric field mode liquid crystal element include a twisted nematic (TN) liquid crystal element, a super twisted nematic (STN) liquid crystal element, a vertical alignment (VA) liquid crystal element, and a multi-domain vertical alignment (MVA) liquid crystal element. However, the liquid crystal element is not limited thereto and, for example, an in-plane-switching (IPS) liquid crystal element, a fringe field switching (FFS) liquid crystal element, or the like, which are transverse electric field mode liquid crystal elements, may alternatively be used.

Thus, "liquid crystal display device" refers to a device including a liquid crystal element. The liquid crystal display device includes a driver circuit for driving a plurality of pixels, and the like. The liquid crystal display device may also referred to as a liquid crystal module including a control circuit, a power supply circuit, a signal generation circuit, a backlight module, and the like provided over another substrate.

When the resistor 114 is provided for each of the driver circuit portion 104 and the pixel circuit portion 108 as described in this embodiment, transistors provided in the driver circuit portion 104 and the pixel circuit portion 108 of the liquid crystal display device can have an increased tolerance to overcurrent from the outside.

Although the resistor 114 is illustrated in FIG. 9C, the resistor 114 can be connected to a transistor in series as illustrated in FIG. 1B.

For example, static electricity is likely to be caused by rubbing treatment performed in forming the liquid crystal element. However, the resistor 114 prevents or suppresses the flow of overcurrent due to the static electricity through the transistors provided in the pixel circuit portion 108 and the driver circuit portion 104. Therefore, electrostatic breakdown of the transistors can be inhibited, so that the display device can have high reliability.

Next, a detailed structure of the driver circuit portion 104 illustrated in FIG. 9A is described below.

(Driver Circuit Portion)

The driver circuit portion 104 includes the substrate 302; layers having a conductive property (hereinafter referred to as the conductive layers 304a and 304b) formed over the substrate 302; a layer having an insulating property (hereinafter referred to as an insulating layer 305) formed over the substrate 302 and the conductive layers 304a and 304b; a layer having an insulating property (hereinafter referred to as an insulating layer 306) formed over the insulating layer 305; the semiconductor layer 308a formed over the insulating layer 306 and overlapping with the conductive layer 304a; layers having a conductive property (hereinafter referred to as the conductive layers 310a and 310b) formed over the insulating layer 306 and the semiconductor layer 308a; a layer having a conductive property (hereinafter referred to as the conductive layer 310c) formed over the insulating layer 306; a layer having an insulating property (hereinafter referred to as an insulating layer 312) formed so as to cover the semiconductor layer 308a and the conductive layers 310a, 310b, and 310c; a layer having an insulating property (hereinafter referred to as an insulating layer 314) formed over the insulating layer 312; and a layer having a conductive property (hereinafter referred to as the conductive layer 316a) formed over the insulating layer 314.

Note that the conductive layer 316a serves as a wiring that connects the conductive layer 304b to the conductive layer 310c. The conductive layer 304b is connected to the conductive layer 316a in an opening portion formed in the insulating layers 305, 306, 312, and 314, and the conductive layer 310c is connected to the conductive layer 316a in an opening portion formed in the insulating layers 312 and 314.

In addition, the driver circuit portion 104 includes the substrate 342; a layer having a light-shielding property (hereinafter referred to as a light-shielding layer 344) formed over the substrate 342; a layer having an insulating property (hereinafter referred to as an insulating layer 348) formed over the light-shielding layer 344; and a layer having a conductive property (hereinafter referred to as the conductive layer 350) formed over the insulating layer 348.

Further, in the driver circuit portion 104, the liquid crystal layer 320 is interposed between the substrate 302 and the substrate 342, and the alignment films 318 and 352 are provided for the substrate 302 and the substrate 342, respectively, so as to be in contact with the liquid crystal layer 320. The liquid crystal layer 320 can be sealed in between the substrate 302 and the substrate 342 with a sealant (not illustrated). The sealant is preferably in contact with an inorganic material to prevent entry of moisture and the like from the outside. In addition, the thickness (also referred to as a cell gap) of the liquid crystal layer 320 can be maintained with use of a spacer (not illustrated).

Next, a detailed structure of the pixel circuit portion 108 illustrated in FIG. 9B is described below.

(Pixel Circuit Portion)

The pixel circuit portion 108 includes the substrate 302; a layer having a conductive property (hereinafter referred to as the conductive layer 304c) formed over the substrate 302; the insulating layer 305 formed over the substrate 302 and the conductive layer 304c; the insulating layer 306 formed over the insulating layer 305; the semiconductor layer 308b formed over the insulating layer 306 and overlapping with the conductive layer 304c; the semiconductor layer 308c formed over the insulating layer 306; layers having a conductive property (hereinafter referred to as the conductive layers 310d and 310e) formed over the insulating layer 306 and the semiconductor layer 308b; the insulating layer 312 formed so as to cover the semiconductor layer 308b, the conductive layers 310d and 310e and a part of the semiconductor layer 308c; the insulating layer 314 formed over the insulating layer 312 and the semiconductor layer 308c; and the conductive layer 316b formed over the insulating layer 314 and connected to the conductive layer 310e.

Figure 18A:
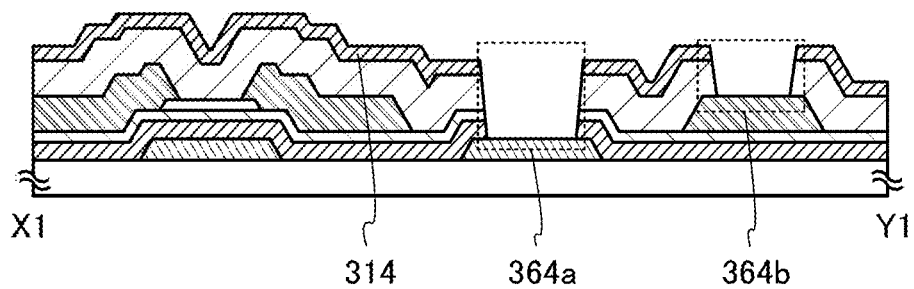
FIGS. 18A to 18C are cross-sectional views illustrating a method for manufacturing the display device.
Figure 18B:
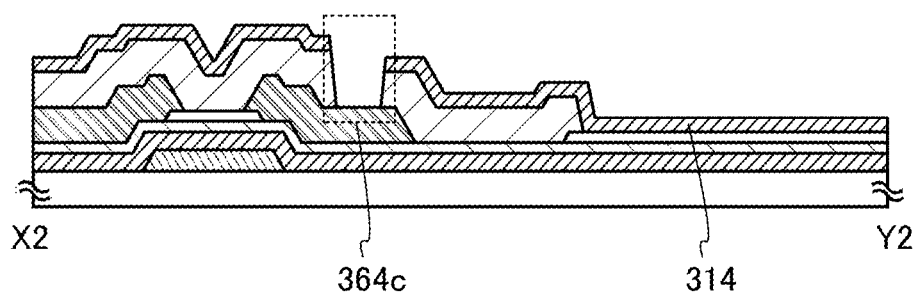
Figure 18C:
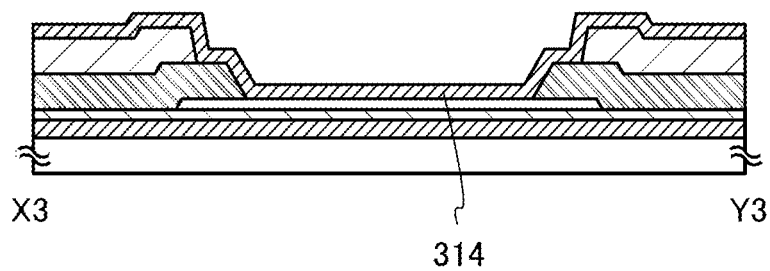
Figure 25A:
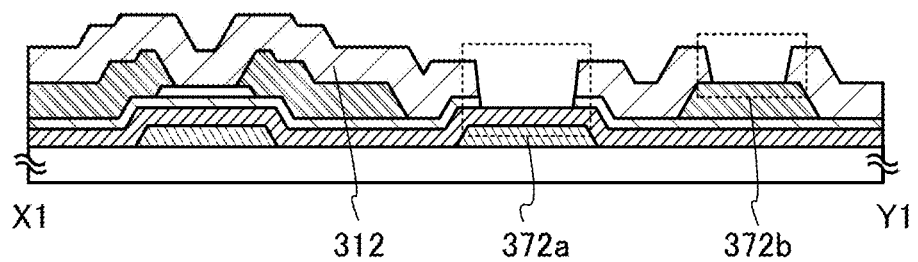
FIGS. 25A to 25C are cross-sectional views illustrating a method for manufacturing the display device.
Figure 25B:
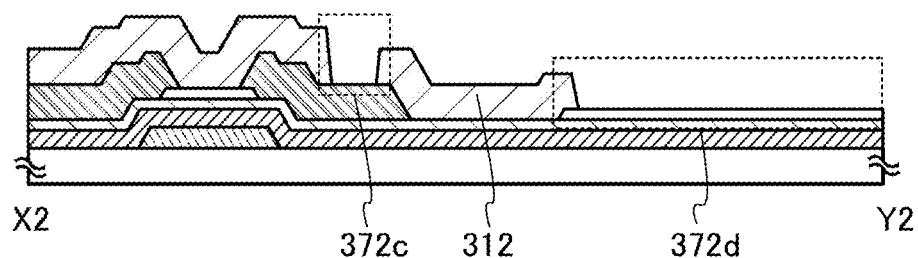
Figure 25C:
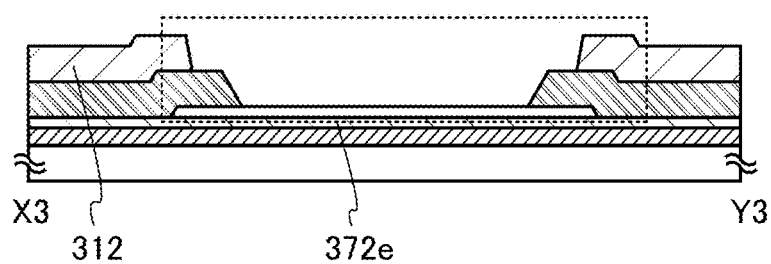
Figure 27A:
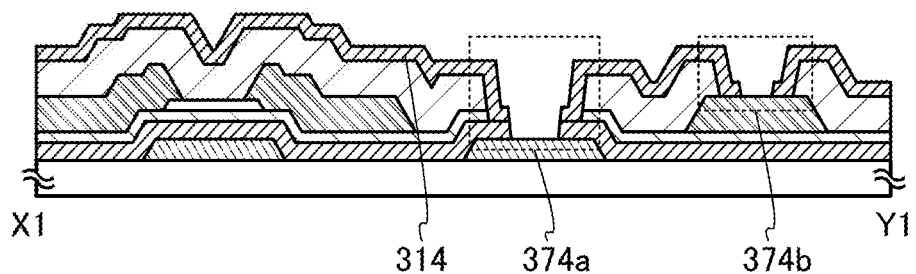
FIGS. 27A to 27C are cross-sectional views illustrating a method for manufacturing the display device.
Figure 27B:
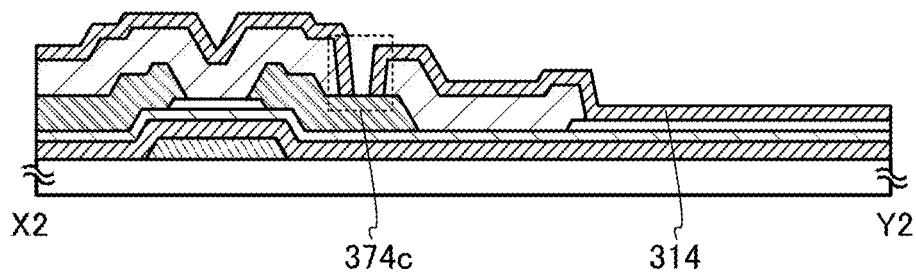
Figure 27C:
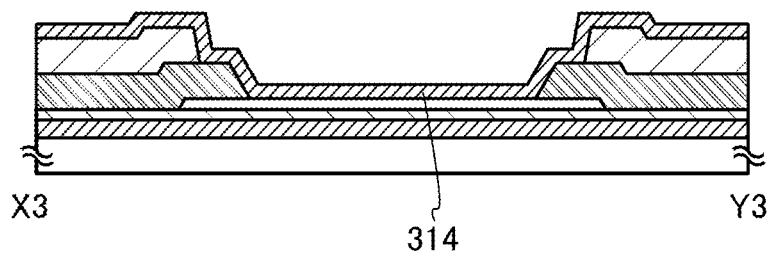

The conductive layer 316b is connected to the conductive layer 310e in the opening portion formed in the insulating layers 312 and 314. In the top view of FIG. 7B, the connection between the conductive layer 316b and the conductive layer 310e is made in the opening portions 372c and 374c, while in the cross-sectional view of FIG. 9B, the connection between the conductive layer 316b and the conductive layer 310e is made in one opening portion (the opening portion 364c in FIG. 18A). The connection method between the conductive layer 316b and the conductive layer 310e is described below with reference to FIG. 25B and FIG. 27B.

The pixel circuit portion 108 includes the substrate 342; the light-shielding layer 344 formed over the substrate 342; a layer having a coloring property (hereinafter referred to as a coloring layer 346) formed over the substrate 342; the light-shielding layer 344; the insulating layer 348 formed over the coloring layer 346; and the conductive layer 350 formed over the insulating layer 348.

In the pixel circuit portion 108, the liquid crystal layer 320 is interposed between the substrate 302 and the substrate 342, and the alignment films 318 and 352 are provided for the substrate 302 and the substrate 342, respectively, so as to be in contact with the liquid crystal layer 320.

Next, a detailed structure of the resistor 114 illustrated in FIG. 9C is described below.
(Resistor)

The resistor 114 includes the substrate 302; the insulating layer 305 formed over the substrate 302; the insulating layer 306 formed over the insulating layer 305; the semiconductor layer 308d formed over the insulating layer 306; layers having a conductive property (hereinafter referred to as the conductive layers 310f and 310g) formed over the insulating layer 306 and the semiconductor layer 308d; the insulating layer 312 formed over the conductive layers 310f and 310g; and the insulating layer 314 formed over the insulating layer 312, the conductive layers 310f and 310g, and the semiconductor layer 308d.

The resistors 114 illustrated in FIG. 7C and FIG. 9C have structures similar to that of the resistor 114 illustrated in FIGS. 2A and 2B. In this embodiment, components (such as the liquid crystal layer 320) above the resistor 114 are also illustrated.

Further, the resistor 114 includes the substrate 342; the light-shielding layer 344 formed over the substrate 342; the insulating layer 348 formed over the light-shielding layer 344; and the conductive layer 350 formed over the insulating layer 348.

In the resistor 114, the liquid crystal layer 320 is interposed between the substrate 302 and the substrate 342, and the alignment films 318 and 352 are provided for the substrate 302 and the substrate 342, respectively, so as to be in contact with the liquid crystal layer 320.

In the display device in this embodiment, transistors included in the driver circuit portion 104 and the pixel circuit portion 108 and the resistor 114 can be formed over the same substrate at the same time. Thus, the resistor 114 can be formed without increasing the manufacturing cost and the like.

In particular, the semiconductor layers serving as channel formation regions of transistors included in the driver circuit portion 104 and the pixel circuit portion 108, the semiconductor layer serving as one electrode of a capacitor included in pixel circuit portion 108, and the semiconductor layer of the resistor 114 can be formed at the same time. In addition, the insulating layers in contact with the semiconductor layers are changed, and thereby the semiconductor layers of the transistors, the capacitor, and the resistor can have resistances that are different from each other. Note that in this specification and the like, the semiconductor layer serving as one electrode of the capacitor can be referred to as a conductive layer in some cases, since it can have a lower resistance owing to the increased conductivity.

In the description of this embodiment, an oxide semiconductor is used as the semiconductor layer.

Here, the characteristics of a transistor including an oxide semiconductor are described. The transistor using an oxide semiconductor illustrated in this embodiment is an n-channel transistor. Further, oxygen vacancies in the oxide semiconductor are likely to generate carriers, which might degrade the electrical characteristics and reliability of the transistor. For example, in some cases, the threshold voltage of the transistor is shifted to the negative side, and thus, drain current flows when the gate voltage is 0 V. A transistor in which drain current flows when the gate voltage is 0 V is referred to as a normally-on transistor, and a transistor having such characteristics is referred to as a depletion-type transistor. The characteristics of a transistor in which substantially no drain current flows when the gate voltage is 0 V are referred to as normally-off characteristics, and a transistor having such characteristics is referred to as an enhancement-type transistor.

Defects typified by oxygen vacancies in the oxide semiconductor where a channel region is formed, of the transistor, are preferably reduced as much as possible. For example, it is preferable that the spin density of the oxide semiconductor film (the density of defects in the oxide semiconductor) at a g-value of 1.93 in electron spin resonance spectroscopy in which a magnetic field is applied in parallel to the film surface be reduced to the lower detection limit of measurement equipment or lower. When the defects, typically the oxygen vacancies in the oxide semiconductor film are reduced as much as possible, the transistor can be prevented from being normally on, leading to an improvement in the electrical characteristics and reliability of the display device. Moreover, power consumption of the display device can be reduced.

The shift of the threshold voltage of a transistor to the negative side is caused by hydrogen (including a hydrogen compound such as water) contained in an oxide semiconductor in some cases as well as by oxygen vacancies. Hydrogen contained in the oxide semiconductor is reacted with oxygen bonded to a metal atom to become water, and in addition, vacancies (also referred to as oxygen vacancies) are formed in a lattice from which oxygen is released (or a portion from which oxygen is removed). In addition, the reaction of part of hydrogen and oxygen causes generation of electrons serving as carriers. Thus, a transistor including an oxide semiconductor which contains hydrogen is easily normally on.

Thus, hydrogen in the oxide semiconductor where a channel region is formed, of the transistor, is preferably reduced as much as possible. Specifically, in the oxide semiconductor, the concentration of hydrogen which is measured by secondary ion mass spectrometry (SIMS) is set to lower than $5\times10^{19}$ atoms/cm$^3$, preferably lower than $5\times10^{18}$ atoms/cm$^3$, preferably $1\times10^{18}$ atoms/cm$^3$ or lower, more preferably $5\times10^{17}$ atoms/cm$^3$ or lower, still more preferably $1\times10^{16}$ atoms/cm$^3$ or lower.

Further, the concentration of alkali metals or alkaline earth metals in the oxide semiconductor where a channel region of the transistor is formed, which is measured by SIMS, is $1\times10^{18}$ atoms/cm$^3$ or lower, preferably $2\times10^{16}$ atoms/cm$^3$ or lower. When an alkali metal or an alkaline earth metal is bonded to an oxide semiconductor, carriers are generated in some cases. This might lead to an increase in off-state current of the transistor.

When such an oxide semiconductor film highly purified by reducing impurities (such as hydrogen, nitrogen, an alkali metal, and an alkaline earth metal) as much as possible is used as the oxide semiconductor film where a channel region of the transistor is formed, the transistor becomes an enhancement-type transistor and can be prevented from having normally-on characteristics, so that the off-state current of the transistor can be significantly reduced. Thus, a display device having favorable electrical characteristics can be manufactured. Further, a display device with improved reliability can be manufactured.

Various experiments can prove the low off-state current of a transistor including a highly-purified oxide semiconductor film. For example, even when an element has a channel width of $1\times10^6$ µm and a channel length L of 10 µm, off-state current can be less than or equal to the measurement limit of a semiconductor parameter analyzer, i.e., less than or equal to $1\times10^{-13}$ A, at voltage (drain voltage) between a source and a drain of from 1 V to 10 V. In that case, it can be found that a value obtained by dividing the off-state current by the channel width of the transistor is less than or equal to 100 zA/µm. Further, the off-state current is measured with the use of a circuit in which a capacitor and a transistor are connected to each other and charge that flows in or out from the capacitor is controlled by the transistor. In the measurement, a purified oxide semiconductor film is used for a channel formation region of the transistor, and the off-state current of the transistor is measured from a change in the amount of charge of the capacitor per unit time. As a result, it is found that, in the case where the voltage between the source and the drain of the transistor is 3 V, a smaller off-state current density of several tens of yoctoamperes per micrometer is obtained. Thus, the transistor including the highly purified oxide semiconductor film has a significantly low off-state current.

Next, the insulating layers formed above and below the semiconductor layer, that is, the oxide semiconductor, are described in detail below.

For the insulating layers 305 and 314, it is preferable to use a material by which impurities from the outside, such as moisture, alkali metal, or alkaline earth metal are prevented from diffusing into the oxide semiconductor layer, and which preferably includes further hydrogen; typically, an inorganic insulating material containing nitrogen, e.g., a nitride insulating film, can be used. The insulating layer 305 and the insulating layer 314 are formed using silicon nitride, silicon nitride oxide, aluminum nitride, aluminum nitride oxide, or the like, typically.

For the insulating layers 306 and 312, a material that can improve interface characteristics with the oxide semiconductor film is preferred, typically, an inorganic insulating material containing oxygen is preferably used, for example an oxide insulating film can be used. As the insulating layers 306 and 312, typically, silicon oxide, silicon oxynitride, aluminum oxide, aluminum oxynitride, or the like can be used.

The structures of the insulating layers in contact with the oxide semiconductor layer and the oxide semiconductor layer are changed, and thereby the following structure can be obtained.

In the driver circuit portion 104 illustrated in FIG. 9A, the semiconductor layer 308a serves as a channel formation region of the transistor. Thus, the insulating layers in contact with the semiconductor layer 308a are the insulating layers 306 and 312. In addition, in the pixel circuit portion 108 illustrated in FIG. 9B, the semiconductor layer 308b serves as a channel formation region of the transistor. Thus, the insulating layers in contact with the semiconductor layer 308b are the insulating layers 306 and 312. On the other hand, in the pixel circuit portion 108 illustrated in FIG. 9B, the semiconductor layer 308c serves as one electrode of the capacitor 133_1. Thus, the insulating layers in contact with the semiconductor layer 308c are the insulating layers 306 and 314. At this time, because the insulating layer 314 is not in a direct contact with the semiconductor layer 308b, the semiconductor layer 308b can have a resistivity different from that of the semiconductor layer 308c. The semiconductor layer 308b can serve as a channel formation region and the semiconductor layer 308c can serve as a resistor. In addition, in the resistor 114 illustrated in FIG. 9C, the semiconductor layer 308d serves as a resistor. Thus, the insulating layers in contact with the semiconductor layer 308d are the insulating layers 306 and 314.

The insulating layer 314 is an insulating layer containing hydrogen. For this reason, when hydrogen contained in the insulating layer 314 diffuses or moves into the semiconductor layers 308c and 308d, hydrogen is bonded to oxygen to generate an electron serving as a carrier in the oxide semiconductor layers as the semiconductor layers 308c and 308d. Thus, the oxide semiconductor layer can have an increased conductivity and serves as a conductor. In addition, because the oxide semiconductor layers are materials having a light-transmitting property, the semiconductor layers 308c and 308d have a light-transmitting property and can be used as conductive layers.

In the display device illustrated in this embodiment, one electrode of the capacitor and the semiconductor layer in the resistor can be formed at the same time as the oxide semiconductor layer of the transistor. In addition, the conductive layer having a light-transmitting property that serves as a pixel electrode is used as the other electrode of the capacitor. Thus, a step of forming another conductive layer is not needed to form the capacitor, and thereby the number of steps of manufacturing the display device can be reduced. Further, since the capacitor has one electrode formed with the conductive layer having a light-transmitting property, it can have a light-transmitting property. As a result, the area occupied by the capacitor can be increased and the aperture ratio in a pixel can be increased.

Details of other components are described later in description of a manufacturing method of the display device below.

The structures described in this embodiment can be used in appropriate combination with any structure in the other embodiments.

Embodiment 3

In this embodiment, a manufacturing method of the display device described in Embodiment 2 will be described with reference to FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, and FIGS. 23A to 23C.

In the display device described in Embodiment 2, the driver circuit portion 104, the pixel circuit portion 108, and the resistor 114 are formed at the same time. Therefore, in this embodiment, methods for forming the driver circuit portion 104, the pixel circuit portion 108, and the resistor 114 are described.

The method for forming the driver circuit portion 104 is illustrated in FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, and FIG. 23A; the method for forming the pixel circuit portion 108 is illustrated in FIG. 10B, FIG. 11B, FIG. 12B, FIG. 13B, FIG. 14B, FIG. 15B, FIG. 16B, FIG. 17B, FIG. 18B, FIG. 19B, FIG. 20B, FIG. 21B, FIG. 22B, and FIG. 23B; and the method for forming the resistor 114 is illustrated in FIG. 10C, FIG. 11C, FIG. 12C, FIG. 13C, FIG. 14C, FIG. 15C, FIG. 16C, FIG. 17C, FIG. 18C, FIG. 19C, FIG. 20C, FIG. 21C, FIG. 22C, and FIG. 23C.

First, the substrate 302 is prepared. As the substrate 302, a substrate of a glass material such as aluminosilicate glass, aluminoborosilicate glass, barium borosilicate glass, or the like is used. In terms of mass production, a mother glass with the following size is preferably used for the substrate 302: the 8th generation (2160 mm×2460 mm); the 9th generation (2400 mm×2800 mm, or 2450 mm×3050 mm); the 10th generation (2950 mm×3400 mm); or the like. High process temperature and a long period of process time drastically shrink the mother glass. Thus, in the case where mass production is performed with the use of the mother glass, it is preferable that the heat process in the manufacturing process be preferably performed at a temperature of 600° C. or lower, further preferably 450° C. or lower, still further preferably 350° C. or lower.

Then, a conductive film is formed over the substrate 302 and processed into desired regions, so that the conductive layers 304a, 304b, and 304c are formed. The conductive layers 304a, 304b, and 304c can be formed in such a manner that a mask is formed in a desired region by first patterning and regions not covered with the mask are etched.

For the conductive layers 304a, 304b, and 304c, a metal element selected from aluminum, chromium, copper, tantalum, titanium, molybdenum, and tungsten, an alloy containing any of these metal elements as a component, an alloy containing these metal elements in combination, or the like can be used. In addition, the conductive layers 304a, 304b, and 304c may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used. The conductive layers 304a, 304b, and 304c can be formed by a sputtering method, for example.

Figure 10A:
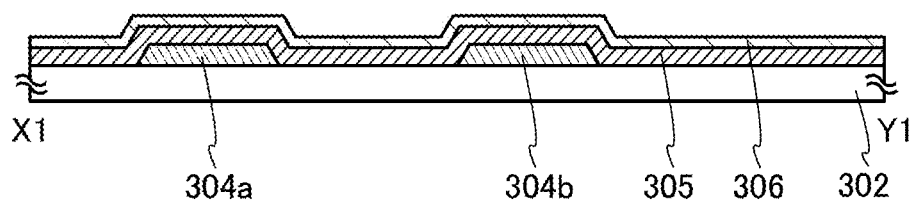
FIGS. 10A to 10C are cross-sectional views illustrating a method for manufacturing a display device.
Figure 10B:
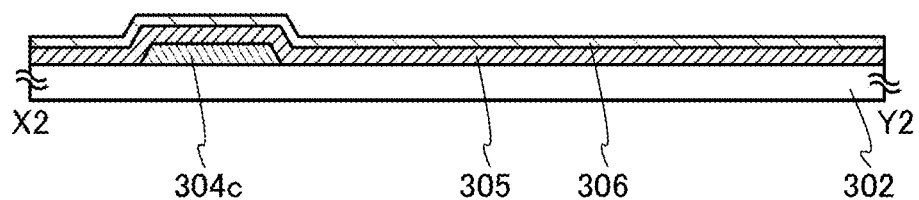
Figure 10C:
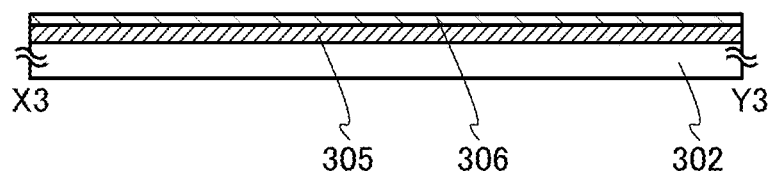

Next, the insulating layers 305 and 306 are formed over the substrate 302 and the conductive layers 304a, 304b, and 304c (see FIGS. 10A to 10C).

The insulating layer 305 is formed to have a single-layer structure or a layered structure using, for example, any of a silicon nitride oxide film, a silicon nitride film, an aluminum oxide film, and the like with a PE-CVD apparatus. When the insulating layer 306 has a layered structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating layer 305 can be prevented from moving or diffusing into the semiconductor layers 308a, 308b, and 308c.

The insulating layer 306 is formed to have a single-layer structure or a layered structure using any of a silicon oxide film, a silicon oxynitride film, and the like with a PE-CVD apparatus.

As for the insulating layers 305 and 306, for example, a 300-nm-thick silicon nitride film can be formed as the insulating layer 305, and then a 50-nm-thick silicon oxynitride film can be formed as the insulating layer 306. The silicon nitride film and the silicon oxynitride film are preferably formed in succession in a vacuum such that fewer impurities are mixed into the films. In addition, portions of the insulating layers 305 and 306 overlapping with the conductive layers 304a and 304c can serve as gate insulating layers of transistors.

Note that silicon nitride oxide refers to an insulating material that contains more nitrogen than oxygen, whereas silicon oxynitride refers to an insulating material that contains more oxygen than nitrogen.

For example, effects obtained when the gate insulating layer has the above structure are as follows: the silicon nitride film has a higher relative permittivity than that of a silicon oxide film and thus needs a large thickness to give an electrostatic capacity that is nearly equal to an electrostatic capacity given by the silicon oxide film. Thus, the physical thickness of the gate insulating film can be increased. From the above, the electrostatic breakdown of the transistor can be prevented by inhibiting a reduction in the withstand voltage of the transistor and further improving the withstand voltage of the transistor.

Figure 11A:
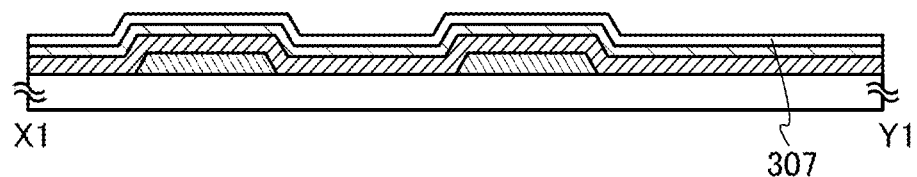
FIGS. 11A to 11C are cross-sectional views illustrating a method for manufacturing the display device.
Figure 11B:
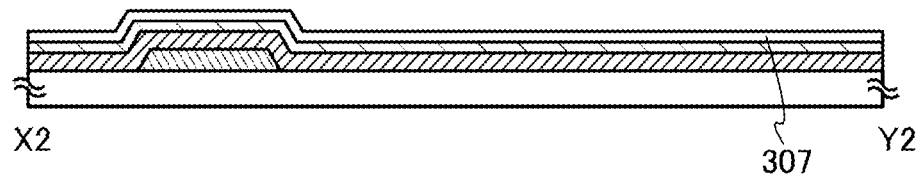
Figure 11C:
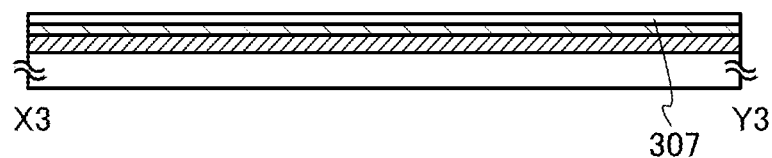
Figure 12A:
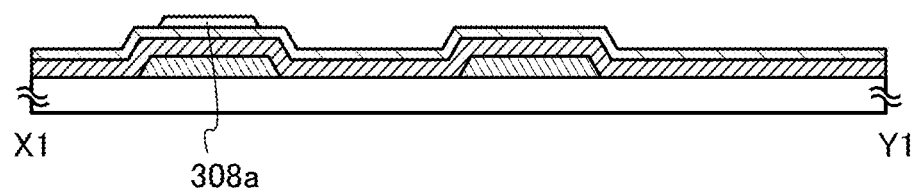
FIGS. 12A to 12C are cross-sectional views illustrating a method for manufacturing the display device.
Figure 12B:
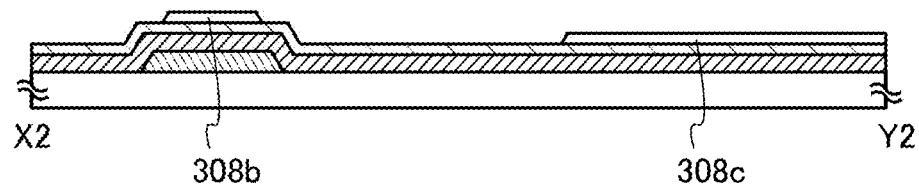
Figure 12C:
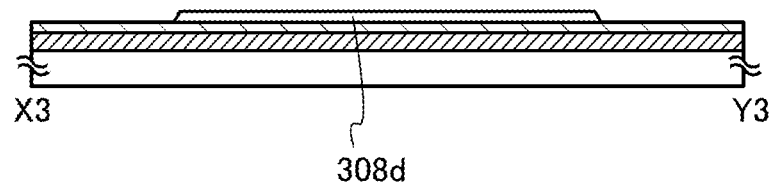

Next, the semiconductor layer 307 over the insulating layer 306 (see FIGS. 11A to 11C).

For the semiconductor layer 307, for example, an oxide semiconductor can be used. An oxide semiconductor that can be used for the semiconductor layer 307 preferably includes a layer represented by an In-M-Zn-based oxide containing at least indium (In), zinc (Zn), and M (M is a metal such as Al, Ga, Ge, Y, Zr, Sn, La, Ce, or Hf). Alternatively, the semiconductor layer 307 preferably contains both In and Zn. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), or the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn as its main components and there is no particular limitation on the ratio of In, Ga, and Zn. The In—Ga—Zn-based oxide may contain a metal element other than In, Ga, and Zn. Further, in this specification and the like, a film formed using an In—Ga—Zn-based oxide is also referred to as an IGZO film.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is an integer) may be used.

An oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In this specification, a term "parallel" indicates that the angle formed between two straight lines is from −10° to 10°, and accordingly, also includes a state where the angle is from −5° to 5°. In addition, a term "perpendicular" indicates that the angle formed between two straight lines is from 80° to 100°, and accordingly includes a state where the angle is from 85° to 95°.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, if a shape of the CAAC-OS film is changed by etching or the like, the c-axis may not be parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, the region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ might also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than that of a metal element, e.g., silicon, included in the oxide semiconductor film disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge captured by the carrier traps in the oxide semiconductor film takes a long time to be released, and may behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In a TEM image of the microcrystalline oxide semiconductor film, crystal parts cannot be found clearly sometimes. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image of the nc-OS film, a crystal grain cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation is not observed in the whole film. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film having more regularity than that of an amorphous oxide semiconductor film; thus, the nc-OS film has a lower density of defect levels than that of an amorphous oxide semiconductor film. However, there is no regularity of crystal orientation between different crystal parts in the nc-OS film; hence, the nc-OS film has a higher density of defect states than that of a CAAC-OS film.

Note that the oxide semiconductor film may be a stacked film including two or more films of an amorphous oxide semiconductor film, a microcrystalline oxide semiconductor film, and a CAAC-OS film, for example.

Then, the semiconductor layer 307 is processed into desired shapes to form the island-shaped semiconductor layers 308*a*, 308*b*, 308*c*, and 308*d*. The semiconductor layers 308*a*, 308*b*, 308*c*, and 308*d* can be formed in such a manner that a mask is formed in a desired region by second patterning and regions not covered with the mask are etched. For the etching, dry etching, wet etching, or a combination of both can be employed (see FIGS. 12A to 12C).

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more in order to compensate released oxygen. By the first heat treatment, the crystallinity of the oxide semiconductor that is used for the semiconductor layers 308*a*, 308*b*, 308*c*, and 308*d* can be improved, and in addition, impurities such as hydrogen and water can be removed from the insulating layer 305 and 306 and the semiconductor layers 308*a*, 308*b*, 308*c*, and 308*d*. The first heat treatment may be performed before the oxide semiconductor is processed into island shapes.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor, hydrogen, nitrogen, carbon, silicon, and metal elements except for main components are impurities. For example, hydrogen and nitrogen form donor levels to increase the carrier density. Silicon forms impurity levels in an oxide semiconductor. The impurity level becomes a trap, which might deteriorate the electric characteristics of the transistor.

Note that in order to make the oxide semiconductor intrinsic or substantially intrinsic, the concentration of silicon in the oxide semiconductor, which is measured by SIMS, is set to lower than $1\times10^{19}$ atoms/cm$^3$, preferably lower than $5\times10^{18}$ atoms/cm$^3$, further preferably lower than $1\times10^{18}$ atoms/cm$^3$. The concentration of hydrogen in the oxide semiconductor is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in a case where the oxide semiconductor layer includes a crystal, the crystallinity of the oxide semiconductor layer might be decreased if silicon or carbon is included at high concentration. In order not to lower the crystallinity of the oxide semiconductor, the concentration of silicon in the oxide semiconductor can be set to lower than $1\times10^{19}$ atoms/cm$^3$, preferably lower than $5\times10^{18}$ atoms/cm$^3$, more preferably lower than $1\times10^{18}$ atoms/cm$^3$. Moreover, the concentration of carbon can be set to lower than $1\times10^{19}$ atoms/cm$^3$, preferably lower than $5\times10^{18}$ atoms/cm$^3$, more preferably lower than $1\times10^{18}$ atoms/cm$^3$.

A transistor in which a highly purified oxide semiconductor film is used for a channel formation region as described above has extremely low off-state current, and the off-state current standardized on the channel width of the transistor can be as low as several yoctoamperes per micrometer to several zeptoamperes per micrometer.

When the density of localized levels in an oxide semiconductor is reduced, stable electrical characteristics can be imparted to a transistor including the oxide semiconductor. To impart stable electrical characteristics to the transistor, the absorption coefficient due to the localized levels in the oxide semiconductor, which is obtained in measurement by a constant photocurrent method (CPM), is set to lower than $1\times10^{-3}/cm$, preferably lower than $1\times10^{-4}/cm$.

A localized level of an oxide semiconductor film is described.

Measurement results of a nanocrystalline oxide semiconductor film by a CPM are described first.

First, a structure of a measurement sample is described.

The measurement sample includes an oxide semiconductor film provided over a glass substrate, a pair of electrodes in contact with the oxide semiconductor film, and an insulating film covering the oxide semiconductor film and the pair of electrodes.

Next, a method for forming the oxide semiconductor film included in the measurement sample is described.

A first oxide semiconductor film is formed by a sputtering method under the following conditions: a target which is an In—Ga—Zn-oxide (In:Ga:Zn=1:1:1 [atomic ratio]) is used; an argon gas with a flow rate of 30 sccm and an oxygen gas with a flow rate of 15 sccm are used as a deposition gas; the pressure is 0.4 Pa; the substrate temperature is a room temperature; and a DC power of 0.5 kW is supplied. Note that the first oxide semiconductor film is a nanocrystalline oxide semiconductor film.

The first oxide semiconductor film is heated at 450° C. in a nitrogen atmosphere for one hour and then heated at 450° C. in an oxygen atmosphere for one hour to release hydrogen contained in the first oxide semiconductor film and supply oxygen to the first oxide semiconductor film, so that a second oxide semiconductor film is formed. Note that the second oxide semiconductor film is a nanocrystalline oxide semiconductor film.

Next, the measurement sample including the first oxide semiconductor film and the measurement sample including the second oxide semiconductor film are subjected to CPM measurement. Specifically, the amount of light with which a surface of the measurement sample between terminals is irradiated is adjusted so that a photocurrent value is kept constant in the state where voltage is applied between a first electrode and a second electrode provided in contact with the oxide semiconductor film, and then an absorption coefficient is calculated from the amount of the irradiation light in an intended wavelength range.

Figure 60A:
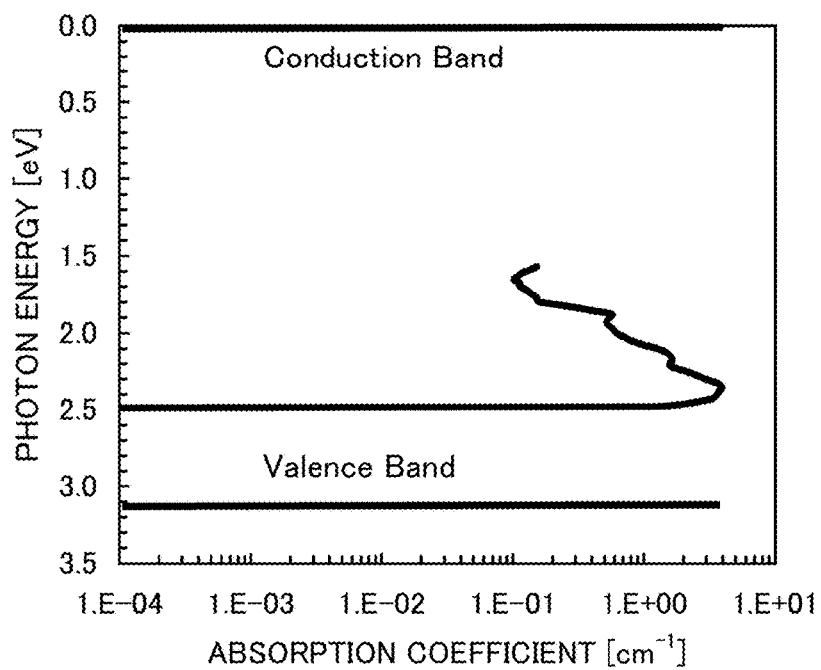
FIGS. 60A and 60B are graphs showing CPM measurement results of oxide semiconductor films.
Figure 60B:
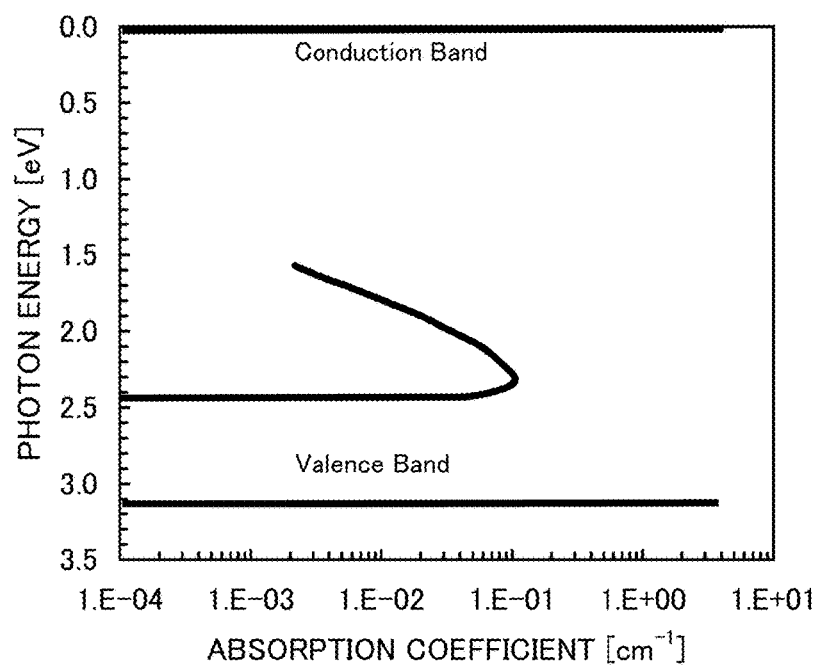

An absorption coefficient shown in each of FIGS. 60A and 60B is obtained by removing an absorption coefficient due to the band tail from an absorption coefficient obtained by CPM measurement of the measurement samples. That is, an absorption coefficient due to defects is shown in FIGS. 60A and 60B. In FIGS. 60A and 60B, the horizontal axis indicates the absorption coefficient, and the vertical axis indicates the photon energy. The bottom of the conduction band and the top of the valence band of the oxide semiconductor film are set to 0 eV and 3.15 eV, respectively, on the vertical axis in FIGS. 60A and 60B. Each curve in FIGS. 60A and 60B represents a relation between the absorption coefficient and photon energy, which corresponds to defect levels.

FIG. 60A shows measurement results of the measurement sample including the first oxide semiconductor film, and an absorption coefficient due to defect levels is $5.28\times10^{-1}$ cm$^{-1}$. FIG. 60B shows measurement results of the measurement sample including the second oxide semiconductor film, and an absorption coefficient due to defect levels is $1.75\times10^{-2}$ cm$^{-1}$.

Thus, by the heat treatment, the defects included in the oxide semiconductor film can be reduced.

The film densities of the first oxide semiconductor film and the second oxide semiconductor film are measured by X-ray reflectometry (XRR). The film density of the first oxide semiconductor film is 5.9 g/cm$^3$, and the film density of the second oxide semiconductor film is 6.1 g/cm$^3$.

Thus, the heat treatment can increase the film density of the oxide semiconductor film.

That is, in the oxide semiconductor film, as the film density is increased, the defects in the film are reduced.

Next, results of CAAC-OS evaluated by CPM measurement are described.

First, a structure of a sample subjected to the CPM measurement is described.

The measurement sample includes an oxide semiconductor film provided over a glass substrate, a pair of electrodes in contact with the oxide semiconductor film, and an insulating film covering the oxide semiconductor film and the pair of electrodes.

Next, a method for forming the oxide semiconductor film included in the measurement sample is described.

The oxide semiconductor film is formed by a sputtering method under the following conditions: a target which is an In—Ga—Zn-oxide (In:Ga:Zn=1:1:1 [atomic ratio]) is used; an argon gas with a flow rate of 30 sccm and an oxygen gas with a flow rate of 15 sccm are used as a deposition gas; the pressure is 0.4 Pa; the substrate temperature is 400° C.; and a DC power of 0.5 kW is supplied. Then, heat treatment at 450° C. in a nitrogen atmosphere for one hour is performed and then heat treatment at 450° C. in an oxygen atmosphere for one hour is performed to release hydrogen contained in the oxide semiconductor film and supply oxygen to the oxide semiconductor film. Note that the oxide semiconductor film is a CAAC-OS film.

Next, the measurement sample including the oxide semiconductor film is subjected to CPM measurement. Specifically, the amount of light with which a surface of the sample between terminals is irradiated is adjusted so that a photocurrent value is kept constant in the state where voltage is applied between a first electrode and a second electrode provided in contact with the oxide semiconductor film, and then an absorption coefficient is calculated from the amount of the irradiation light in an intended wavelength range.

Figure 61:
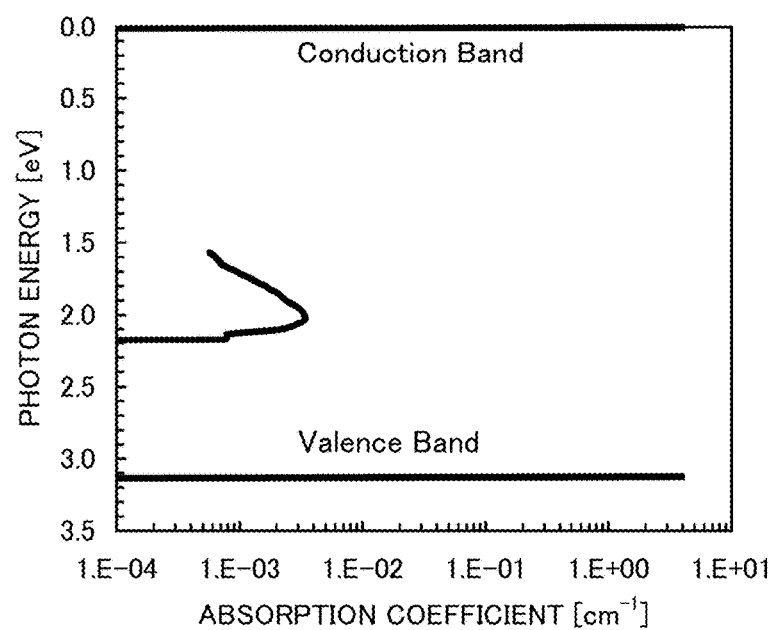
FIG. 61 is a graph showing CPM measurement results of an oxide semiconductor film.

An absorption coefficient shown in FIG. 61 is obtained by removing an absorption coefficient due to the band tail from an absorption coefficient obtained by CPM measurement of the measurement sample. That is, an absorption coefficient due to defects is shown in FIG. 61. In FIG. 61, the horizontal axis indicates the absorption coefficient, and the vertical axis indicates the photon energy. The bottom of the conduction band and the top of the valence band of the oxide semiconductor film are set to 0 eV and 3.15 eV, respectively, on the vertical axis in FIG. 61. A curve in FIG. 61 represents a relation between the absorption coefficient and photon energy, which corresponds to defect levels.

In the curve in FIG. 61, an absorption coefficient due to defect levels is $5.86 \times 10^{-4}$ cm$^{-1}$. That is, in the CAAC-OS film, the absorption coefficient due to defect levels is less than $1 \times 10^{-3}$/cm, preferably less than $1 \times 10^{-4}$/cm; thus the CAAC-OS film is a film having a low density of defect levels.

The film density of the oxide semiconductor film is measured by X-ray reflectometry (XRR). The film density of the oxide semiconductor film is 6.3 g/cm$^3$. That is, the CAAC-OS film is a film having a high film density.

Next, Table 1 shows comparison between oxide semiconductors (represented by OS) having crystal structures and silicon semiconductors (represented by Si) having crystal structures. Note that an In—Ga—Zn-oxide is used as the oxide semiconductor.

TABLE 1

|  | Amorphous | Micro-crystal | Poly-crystal | Continuous crystal | Single crystal |
|---|---|---|---|---|---|
| OS | a-OS<br>a-OS:H | nc-OS<br>μc-OS | Poly-crystalline OS | CAAC-OS | Single crystal OS |

TABLE 1-continued

|  | Amorphous | Micro-crystal | Poly-crystal | Continuous crystal | Single crystal |
|---|---|---|---|---|---|
| Nanobeam electron diffraction | Halo | Ring + Spot | Spot | Spot | Spot |
| Crystal part | — | nm-μm | Discontinuous | Continuously connected | — |
| DOS | High | Slightly low | — | Low | Extremely low |
| Density | Low | Medium | — | High | — |
| Si | a-Si<br>a-Si:H | nc-Si<br>μc-Si | Poly-crystalline Si | CG silicon | Single crystal Si |

As shown in Table 1, examples of oxide semiconductors having crystal structures include an amorphous oxide semiconductor (a-OS and a-OS:H), a microcrystalline oxide semiconductor (nc-OS and μc-OS), a polycrystalline oxide semiconductor (polycrystalline OS), a continuous crystal oxide semiconductor (CAAC-OS), and a single crystal oxide semiconductor (single crystal OS). Note that examples of the crystal state of silicon include, as shown in Table 1, amorphous silicon (a-Si and a-Si:H), microcrystalline silicon (nc-Si and μc-Si), polycrystalline silicon (polycrystalline Si), continuous crystal silicon (continuous grain (CG) silicon), and single crystal silicon (single crystal Si).

When the oxide semiconductors in the above crystal states are subjected to electron diffraction (nanobeam electron diffraction) using an electron beam whose diameter is reduced to less than or equal to 10 nmφ, the following electron diffraction patterns (nanobeam electron diffraction patterns) can be observed. A halo pattern (also referred to as a halo ring or a halo) is observed in the amorphous oxide semiconductor. Spots and/or a ring pattern are/is observed in the microcrystalline oxide semiconductor. Spots are observed in the polycrystalline oxide semiconductor. Spots are observed in the continuous crystal oxide semiconductor. Spots are observed in the single crystal oxide semiconductor.

According to the nanobeam electron diffraction pattern, a crystal part in the microcrystalline oxide semiconductor has a diameter of nanometers (nm) to micrometers (μm). The polycrystalline oxide semiconductor has grain boundaries between crystal parts; thus, the crystal parts are discontinuous. No grain boundary is observed between crystal parts in the continuous crystal oxide semiconductor and the crystal parts are connected continuously.

The density of the oxide semiconductor in each crystal state is described. The amorphous oxide semiconductor has a low density. The microcrystalline oxide semiconductor has a medium density. The continuous crystal oxide semiconductor has a high density. That is, the density of the continuous crystal oxide semiconductor is higher than that of the microcrystalline oxide semiconductor, and the density of the microcrystalline oxide semiconductor is higher than that of the amorphous oxide semiconductor.

A feature of density of states (DOS) existing in the oxide semiconductor in each crystal state is described. The DOS of the amorphous oxide semiconductor is high. The DOS of the microcrystalline oxide semiconductor is slightly low. The DOS of the continuous crystal oxide semiconductor is low. The DOS of the single crystal oxide semiconductor is extremely low. That is, the DOS of the single crystal oxide semiconductor is lower than that of the continuous crystal oxide semiconductor, the DOS of the continuous crystal oxide semiconductor is lower than that of the microcrystalline oxide semiconductor, and the DOS of the microcrystalline oxide semiconductor is lower than that of the amorphous oxide semiconductor.

Figure 13A:
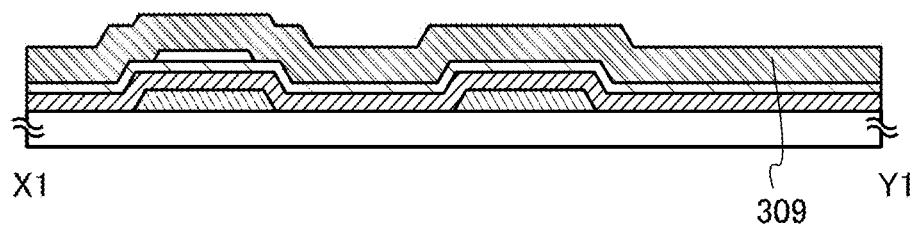
FIGS. 13A to 13C are cross-sectional views illustrating a method for manufacturing the display device.
Figure 13B:
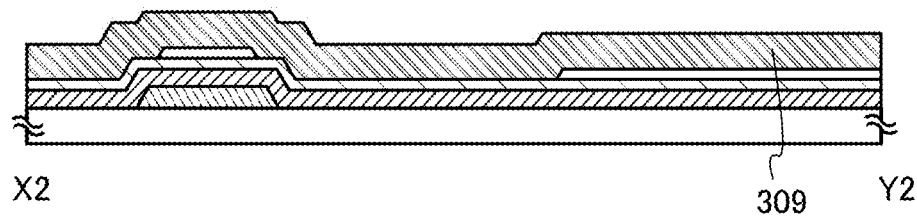
Figure 13C:
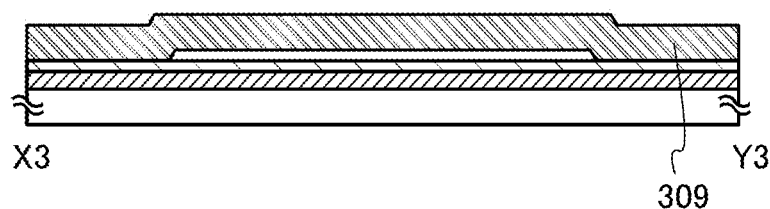
Figure 14A:
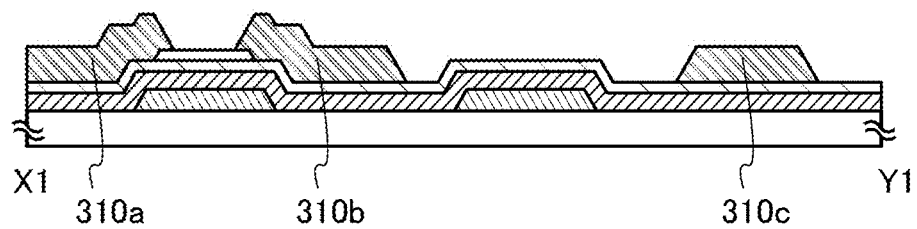
FIGS. 14A to 14C are cross-sectional views illustrating a method for manufacturing the display device.
Figure 14B:
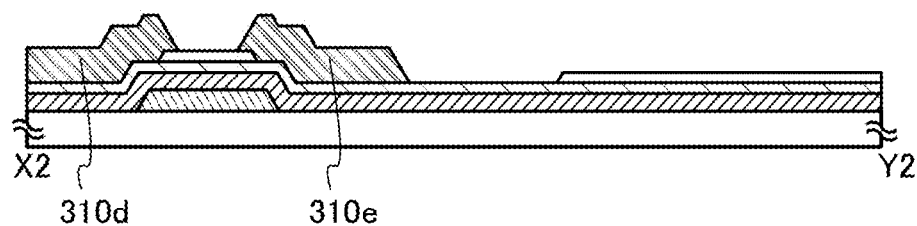
Figure 14C:
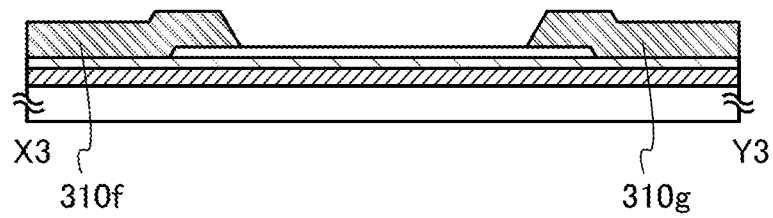

Next, a conductive layer 309 is formed over the insulating layer 306 and the semiconductor layers 308a, 308b, 308c, and 308d (see FIGS. 13A to 13C).

The conductive layer 309 is formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component as a conductive material. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. In addition, the conductive layer 309 can be formed by a sputtering method, for example.

Next, the conductive layer 309 is processed into desired regions so that the conductive layers 310a, 310b, 310c, 310d, 310e, 310f, and 310g are formed. Note that the conductive layers 310a, 310b, 310c, 310d, 310e, 310f, and 310g can be formed in such a manner that a mask is formed in a desired region by third patterning and regions not covered with the mask are etched (see FIGS. 14A to 14C).

In this embodiment, the conductive layers 310a, 310b, 310d, 310e, 310f, and 310g are formed over the semiconductor layers 308a, 308b, and 308d, but can be formed between the insulating layer 306 and the semiconductor layers 308a, 308b, and 308d.

Figure 15A:
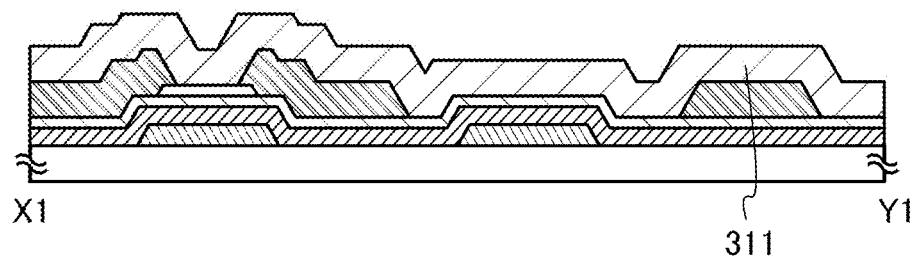
FIGS. 15A to 15C are cross-sectional views illustrating a method for manufacturing the display device.
Figure 15B:
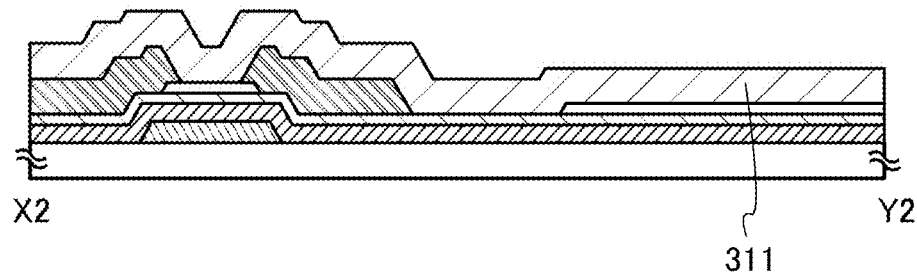
Figure 15C:
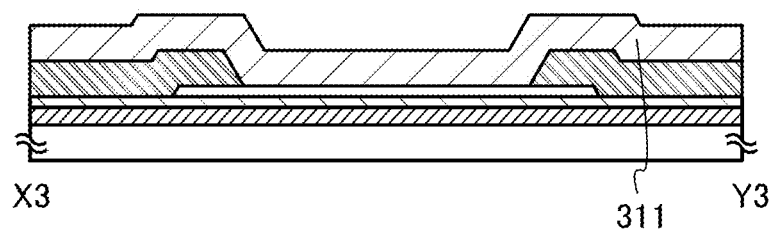
Figure 16A:
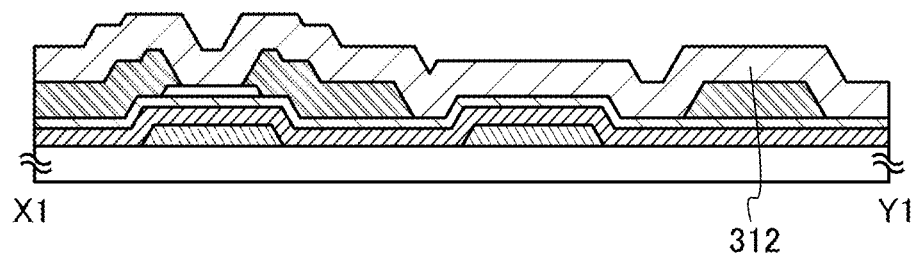
FIGS. 16A to 16C are cross-sectional views illustrating a method for manufacturing the display device.
Figure 16B:
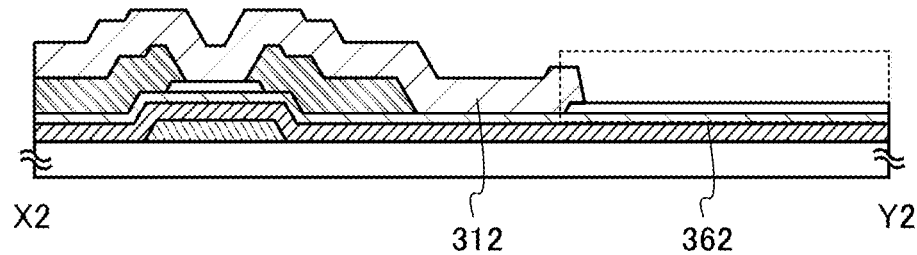
Figure 16C:
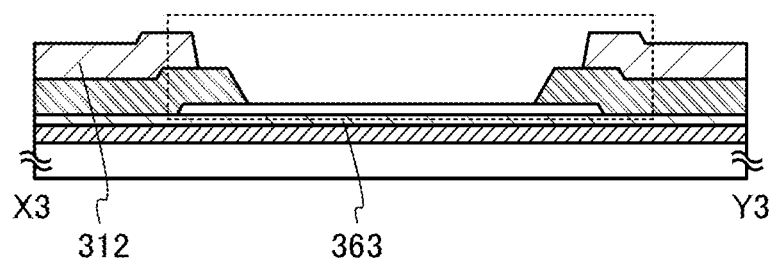

Next, an insulating layer 311 is formed to cover the insulating layer 306, the semiconductor layers 308a, 308b, 308c, and 308d, and the conductive layers 310a, 310b, 310c, 310d, 310e, 310f, and 310g (see FIGS. 15A to 15C).

For the insulating layer 311, an inorganic insulating material containing oxygen can be used in order to improve the characteristics of the interface with the oxide semiconductor used for the semiconductor layers 308a, 308b, 308c, and 308d. The insulating layer 311 can be formed by a PE-CVD method, for example.

As an example of the insulating layer 311, a silicon oxide film, a silicon oxynitride film, an aluminum oxide film, or the like having a thickness of from 150 nm to 400 nm can be used. In this embodiment, a 300-nm-thick silicon oxynitride film is used as the insulating layer 311.

Then, the insulating layer 311 is processed into desired regions so that opening portions 362 and 363 are formed. In addition, the insulating layer 311 serves as the insulating layer 312 where the opening portion 362 is formed. The insulating layer 312 and the opening portion 362 can be formed in such a manner that a mask is formed in a desired region by fourth patterning and regions not covered by the mask are etched (see FIGS. 16A to 16C).

The opening portions 362 and 363 are formed so as to expose the semiconductor layers 308c and 308d. An example of a formation method of the opening portions 362 and 363 includes, but not limited to, a dry etching method. Alternatively, a wet etching method or a combination of dry etching and wet etching can be employed for formation of the opening portions 362 and 363.

Figure 17A:
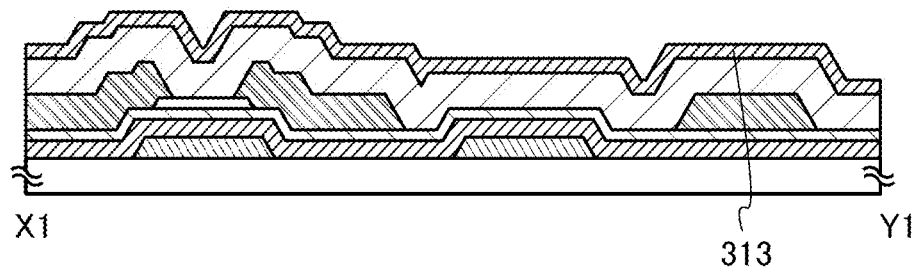
FIGS. 17A to 17C are cross-sectional views illustrating a method for manufacturing the display device.
Figure 17B:
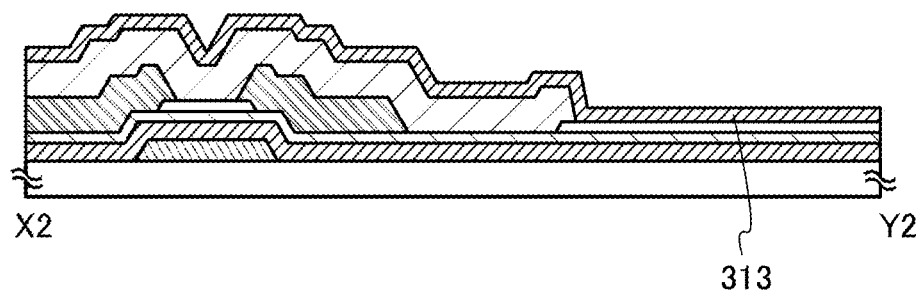
Figure 17C:
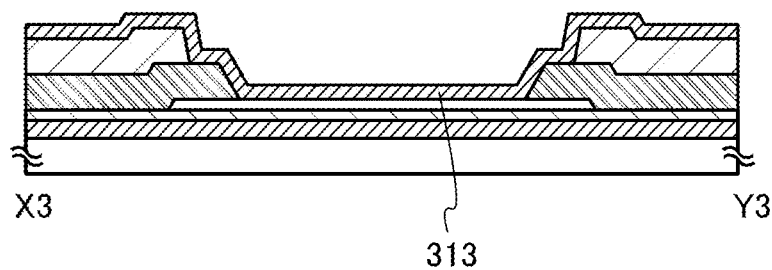

Next, an insulating layer 313 is formed over the insulating layer 312 and the semiconductor layers 308c and 308d (see FIGS. 17A to 17C).

The insulating layer 313 is a film formed using a material that can prevent an external impurity such as moisture, alkali metal, or alkaline earth metal, from diffusing into the oxide semiconductor layer, and further that contains hydrogen. Thus, when hydrogen contained in the insulating layer 313 diffuses into the semiconductor layers 308c and 308d, hydrogen is bonded to oxygen in the semiconductor layers 308c and 308d, thereby producing an electron serving as a carrier. As a result, the conductivity of the semiconductor layers 308c and 308d is increased, so that the semiconductor layers 308c and 308d become conductive layers having a light-transmitting property.

In this embodiment, the process in which hydrogen is supplied from the insulating layer 313 in contact with the semiconductor layers 308c and 308d is described, but the present invention is not limited to this process. For example, a mask is formed in a region to serve as a channel formation region of a transistor, and a region not covered with the mask can be supplied with hydrogen, boron, phosphorus, or nitrogen. For example, an ion implantation method, an ion doping method, a plasma immersion ion implantation method, or the like may be employed to supply hydrogen, boron, phosphorus, or nitrogen into the semiconductor layers 308c and 308d. In addition, a conductive film having a light-transmitting property, for example, an ITO or the like, can be formed in advance over the semiconductor layers 308c and 308d.

For example, a silicon nitride film, a silicon nitride oxide film, or the like having a thickness of from 150 nm to 400 nm can be used as the insulating layer 313. In this embodiment, a silicon nitride film having a thickness of 150 nm is used as the insulating layer 313.

The silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the semiconductor layers 308a and 308b and the carrier density is increased is caused in some cases; therefore, the upper limit of the temperature is a temperature at which the phenomenon is not caused.

Then, the insulating layer 313 is processed into desired regions so that the opening portions 364a, 364b, and 364c are formed. In addition, the insulating layer 313 serves as the insulating layer 314 where the opening portions 364a, 364b, and 364c are formed. The insulating layer 314 and the opening portions 364a, 364b, and 364c can be formed in such a manner that a mask is formed in a desired region by fifth patterning and regions not covered by the mask are etched (see FIGS. 18A to 18C).

The opening portion 364a is formed so as to expose the conductive layer 304b. The opening portion 364b is formed so as to expose the conductive layer 310c. The opening portion 364c is formed so as to expose the conductive layer 310e.

An example of a formation method of the opening portions 364a, 364b, and 364c includes, but not limited to, a dry etching method. Alternatively, a wet etching method or a combination of dry etching and wet etching can be employed for formation of the opening portions 364a, 364b, and 364c.

Figure 19A:
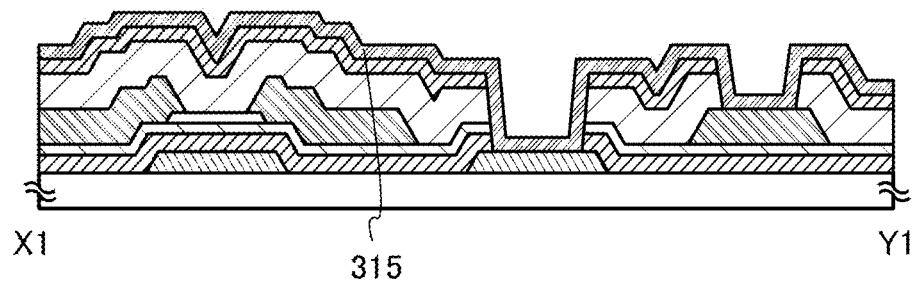
FIGS. 19A to 19C are cross-sectional views illustrating a method for manufacturing the display device.
Figure 19B:
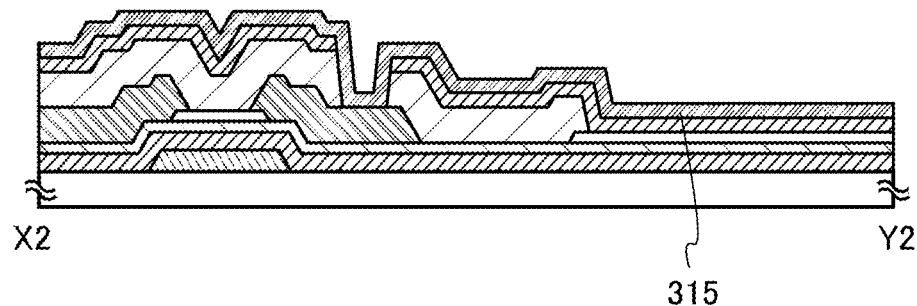
Figure 19C:
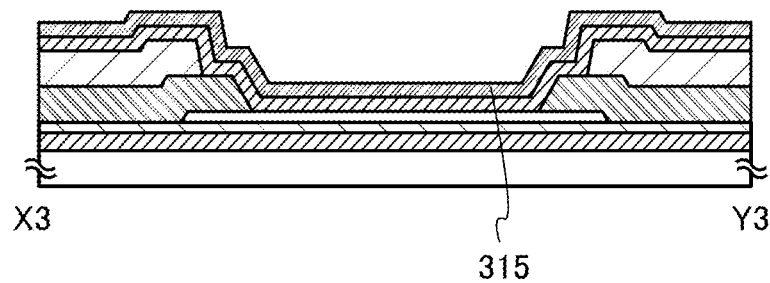
Figure 20A:
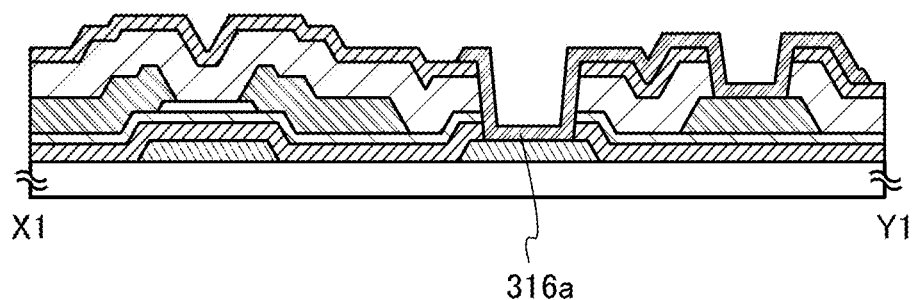
FIGS. 20A to 20C are cross-sectional views illustrating a method for manufacturing the display device.
Figure 20B:
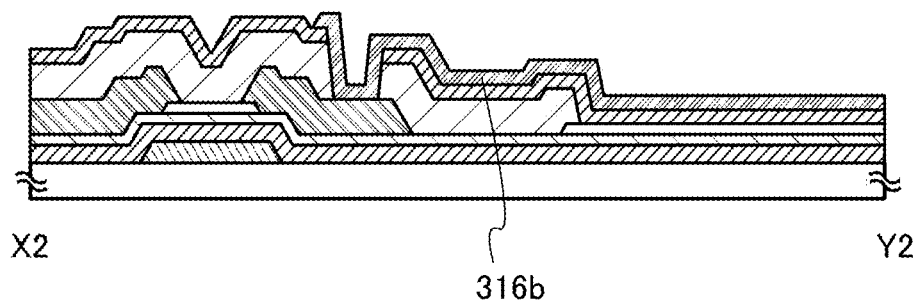
Figure 20C:
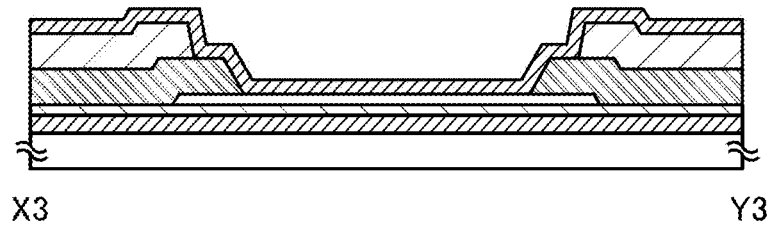
Figure 21A:
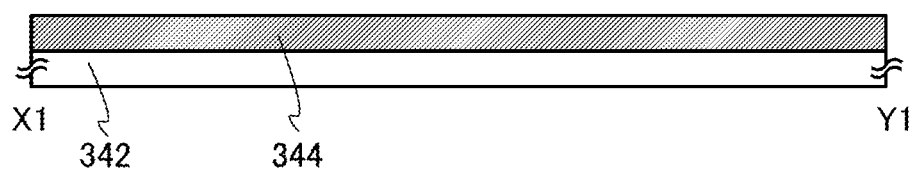
FIGS. 21A to 21C are cross-sectional views illustrating a method for manufacturing the display device.
Figure 21B:
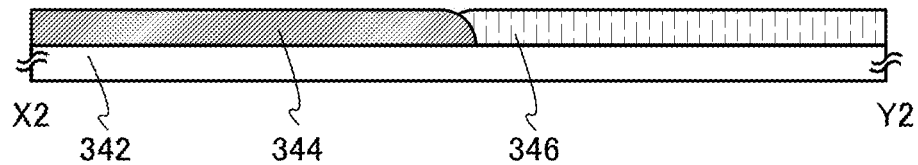
Figure 21C:
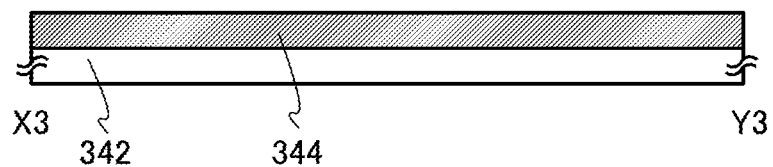

Then, the conductive layer 315 is formed over the insulating layer 314 so as to cover the opening portions 364a, 364b, and 364c (see FIGS. 19A to 19C).

For the conductive layer 315, a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used. In addition, the conductive layer 315 can be formed by a sputtering method, for example.

Then, the conductive layer 315 is processed into desired regions so that the conductive layers 316a and 316b are formed. The conductive layers 316a and 316b can be formed in such a manner that a masks is formed in a desired region by sixth patterning and regions not covered by the mask are etched (see FIGS. 20A to 20C).

Through the above process, the driver circuit portion 104 including transistors, the pixel circuit portion 108 including transistors, and the resistor 114 can be formed over the same substrate. In the fabrication process described in this embodiment, the transistors, the capacitor, and the resistor can be formed at the same time by the first to sixth patterning, that is, with the six masks.

Next, a structure that is formed over the substrate 342 provided so as to face the substrate 302 will be described below.

First, the substrate 342 is prepared. For materials of the substrate 342, the materials that can be used for the substrate 302 can be referred to. Then, the light-shielding layer 344 and the coloring layer 346 are formed over the substrate 342 (see FIGS. 21A to 21C).

The light-shielding layer 344 preferably has a function of shielding light in a particular wavelength region, and can be a metal film or an organic insulating film including a black pigment.

The coloring layer 346 is a coloring layer that transmits light in a particular wavelength region. For example, a red (R) color filter for transmitting light in a red wavelength range, a green (G) color filter for transmitting light in a green wavelength range, a blue B color filter for transmitting light in a blue wavelength range, or the like can be used. Each color filter is formed in a desired position with any of various materials by a printing method, an inkjet method, an etching method using a photolithography technique, or the like.

Figure 22A:
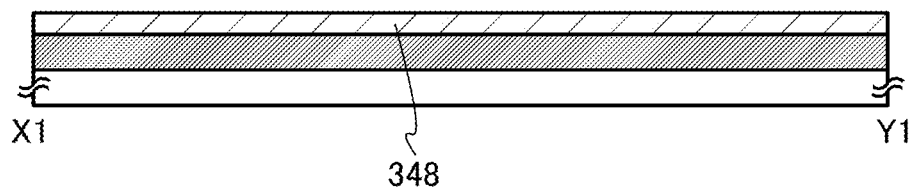
FIGS. 22A to 22C are cross-sectional views illustrating a method for manufacturing the display device.
Figure 22B:
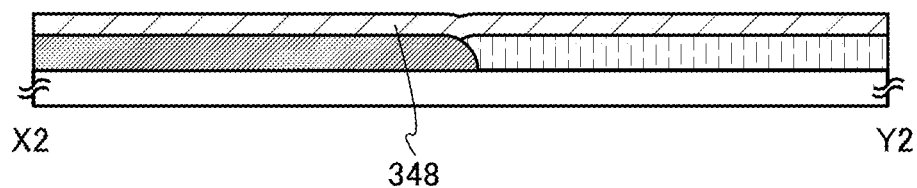
Figure 22C:
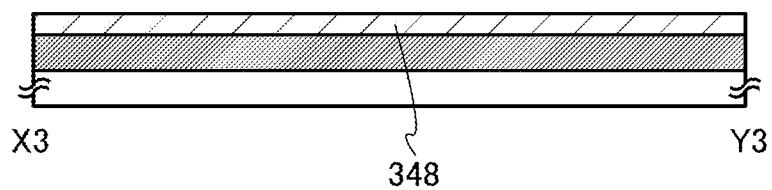

Then, the insulating layer 348 is formed over the light-shielding layer 344 and the coloring layer 346 (see FIGS. 22A to 22C).

For the insulating layer 348, an organic insulating film of an acrylic resin or the like can be used. With the insulating layer 348, an impurity or the like contained in the coloring layer 346 can be prevented from diffusing into the liquid crystal layer 320, for example. Note that the insulating layer 348 is not necessarily formed.

Figure 23A:
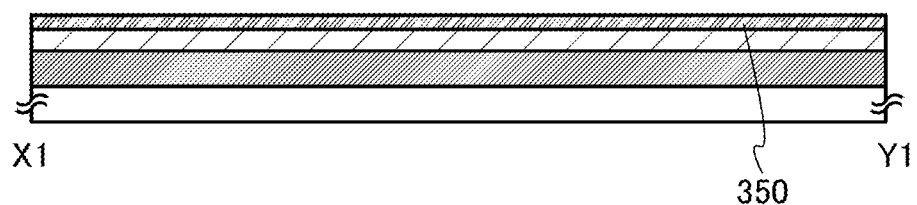
FIGS. 23A to 23C are cross-sectional views illustrating a method for manufacturing the display device.
Figure 23B:
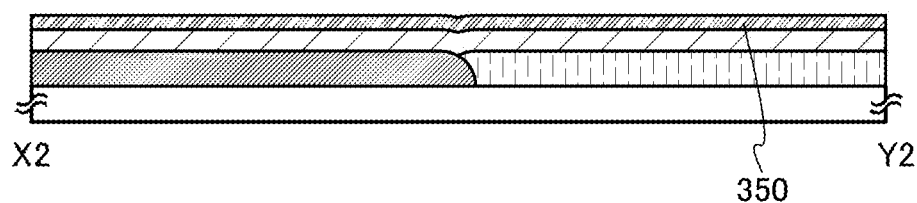
Figure 23C:
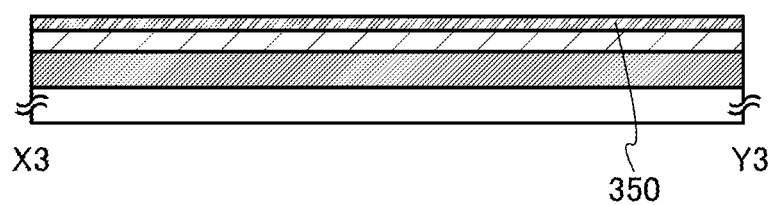

Then, the conductive layer 350 is formed over the insulating layer 348 (FIGS. 23A to 23C). As the conductive layer 350, a material that can be used for the conductive layer 315 can be used.

Through the above process, the structure formed over the substrate 342 can be formed.

Next, the alignment film 318 and the alignment film 352 are formed over the substrate 302 and the substrate 342 respectively, specifically, over the insulating layer 314 and the conductive layers 316a and 316b formed over the substrate 302 and over the conductive layer 350 formed over the substrate 342. The alignment films 318 and 352 can be formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the display device illustrated in FIGS. 9A to 9C can be manufactured.

This embodiment can be combined with another embodiment in this specification as appropriate.

Embodiment 4

In this embodiment, a display device of one embodiment of the present invention will be described with reference to FIGS. 24A to 24C, FIGS. 25A to 25C, FIGS. 26A to 26C, FIGS. 27A to 27C, FIGS. 28A to 28C, and FIGS. 29A to 29C.

Figure 24A:
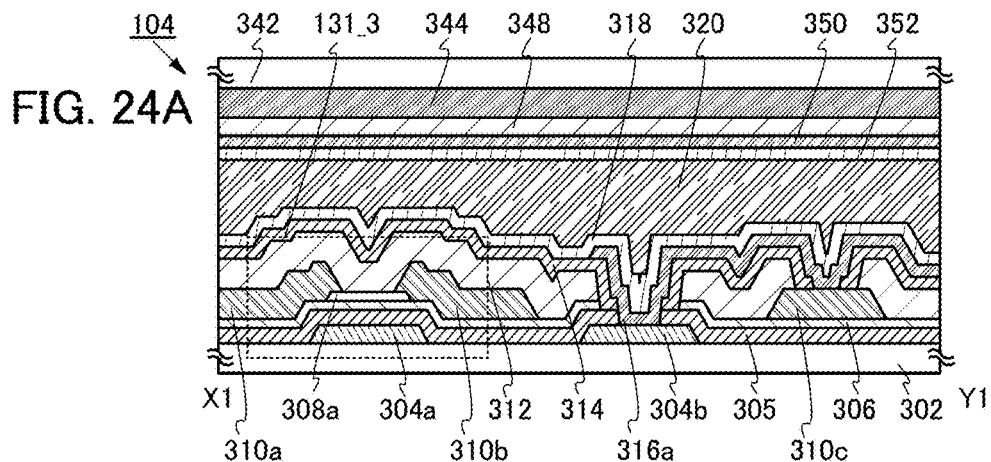
FIGS. 24A to 24C are cross-sectional views of a display device.
Figure 24B:
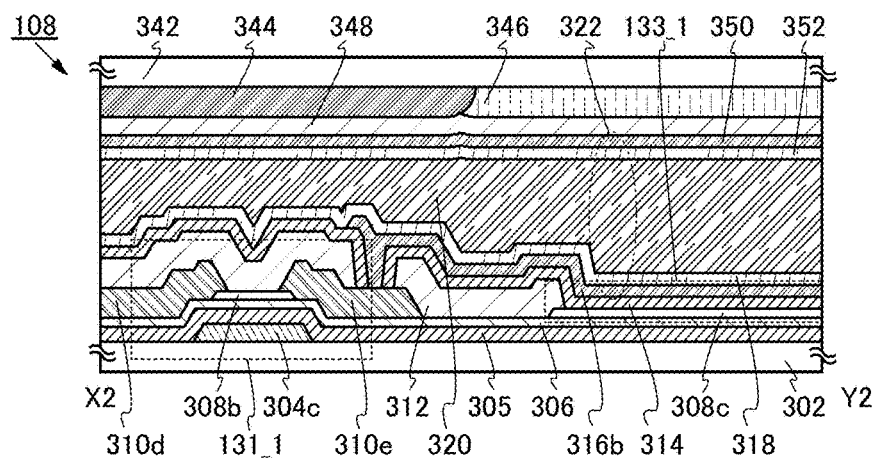
Figure 24C:
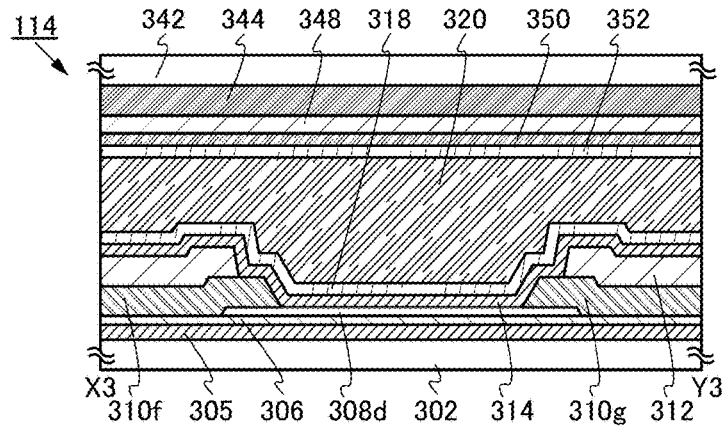

A display device illustrated in FIGS. 24A to 24C is a variation of the display device illustrated in FIGS. 9A to 9C, and FIGS. 25A to 25C, FIGS. 26A to 26C, FIGS. 27A to 27C, FIGS. 28A to 28C, and FIGS. 29A to 29C are cross-sectional views illustrating a method for manufacturing the display device illustrated in FIGS. 24A to 24C.

In FIGS. 24A to 24C, FIGS. 25A to 25C, FIGS. 26A to 26C, FIGS. 27A to 27C, FIGS. 28A to 28C, and FIGS. 29A to 29C, portions similar to those in the above embodiments and portions having functions similar to those in above embodiments are given the same reference numerals, and detailed description thereof is omitted.

The display device illustrated in FIGS. 24A to 24C includes the driver circuit portion 104, the pixel circuit portion 108, and the resistor 114. The display device illustrated in FIGS. 24A to 24C is described below.

(Driver Circuit Portion)

The driver circuit portion 104 includes the substrate 302; the conductive layers 304a and 304b formed over the substrate 302; the insulating layer 305 formed over the substrate 302 and the conductive layers 304a and 304b; the insulating layer 306 formed over the insulating layer 305; the semiconductor layer 308a formed over the insulating layer 306 and overlapping with the conductive layer 304a; the conductive layers 310a and 310b formed over the insulating layer 306 and the semiconductor layer 308a; the conductive layer 310c formed over the insulating layer 306; the insulating layer 312 formed so as to cover the semiconductor layer 308a and the conductive layers 310a, 310b, and 310c; the insulating layer 314 formed over the insulating layer 312; and the conductive layer 316a formed over the insulating layer 314.

Note that the conductive layer 316a serves as a wiring that connects the conductive layer 304b to the conductive layer 310c. The conductive layer 304b is connected to the conductive layer 316a in the opening portion formed in the insulating layers 305, 306, 312, and 314, and the conductive layer 310c is connected to the conductive layer 316a in the opening portion formed in the insulating layers 312 and 314.

(Pixel Circuit Portion)

The pixel circuit portion 108 includes the substrate 302; the conductive layer 304c formed over the substrate 302; the insulating layer 305 formed over the substrate 302 and the conductive layer 304c; the insulating layer 306 formed over the insulating layer 305; the semiconductor layer 308b formed over the insulating layer 306 and overlapping with the conductive layer 304c; the semiconductor layer 308c formed over the insulating layer 306; the conductive layers 310d and 310e formed over the insulating layer 306 and semiconductor layer 308b; the insulating layer 312 formed so as to cover the semiconductor layer 308b, the conductive layers 310d and 310e, and a part of the semiconductor layer 308c; the insulating layer 314 formed over the insulating layer 312 and the semiconductor layer 308c; and the conductive layer 316b formed over the insulating layer 314 and connected to the conductive layer 310e.

The conductive layer 316b is connected to the conductive layer 310e in the opening portion formed in the insulating layers 312 and 314.

(Resistor)

The resistor 114 includes the substrate 302; the insulating layer 305 formed over the substrate 302; the insulating layer 306 formed over the insulating layer 305; the semiconductor layer 308d formed over the insulating layer 306; the conductive layers 310f and 310g formed over the insulating layer 306 and the semiconductor layer 308d; the insulating layer 312 formed over the conductive layers 310f and 310g; and the insulating layer 314 formed over the insulating layer 312, the conductive layers 310f and 310g, and the semiconductor layer 308d.

The display device in this embodiment has opening portions having shapes different from those in the display device illustrated in FIGS. 9A to 9C in the above embodiment. Specifically, opening portions over the conductive layers 304b, 310c, and 310e are formed by two etching steps.

Because the shapes of the opening portions are changed as illustrated in FIGS. 24A to 24C, the effects described next can be obtained.

The insulating layer 314 is formed in the inner side of the opening portions that have been formed by a first etching step of the conductive layers 304b, 310c, and 310e, and can inhibit an impurity that is likely to gain entry through the opening portions, such as moisture, alkali metal, or alkaline earth metal, from diffusing into the inside.

In the display device in this embodiment, the resistor 114 and transistors included in the driver circuit portion 104 and the pixel circuit portion 108 can be formed at the same time. Thus, the resistor 114 can be formed without increasing the manufacturing cost and the like.

Next, the method for manufacturing the display device illustrated in FIGS. 24A to 24C is described below with reference to FIGS. 25A to 25C, FIGS. 26A to 26C, FIGS. 27A to 27C, FIGS. 28A to 28C, and FIGS. 29A to 29C.

The method for forming the driver circuit portion 104 is illustrated in FIG. 25A, FIG. 26A, FIG. 27A, FIG. 28A, and FIG. 29A; the method for forming the pixel circuit portion 108 is illustrated in FIG. 25B, FIG. 26B, FIG. 27B, FIG. 28B, and FIG. 29B; and the method for forming the resistor 114 is illustrated in FIG. 25C, FIG. 26C, FIG. 27C, FIG. 28C, and FIG. 29C.

The structure illustrated in FIGS. 15A to 15C described in the above embodiment is formed. In other words, the substrate that is subjected to patterning and etching with the use of three masks is formed.

Then, the insulating layer 311 is processed into desired regions so that the opening portions 372a, 372b, 372c, 372d, and 372e are formed. In addition, the insulating layer 311 serves as the insulating layer 312 where the opening portions 372a, 372b, 372c, 372d, and 372e are formed. The insulating layer 312 and the opening portions 372a, 372b, 372c, 372d, and 372e can be formed in such a manner that a mask is formed in a desired region by fourth patterning and regions not covered by the mask are etched (see FIGS. 25A to 25C).

The opening portion 372a is formed so as to expose the insulating layer 305. The opening portions 372b and 372c are formed so as to expose the conductive layers 310c and 310e. The opening portions 372d and 372e are formed so as to expose the semiconductor layers 308c and 308d. An example of a formation method of the opening portions 372a, 372b, 372c, 372d, and 372e includes, but not limited to, a dry etching method. Alternatively, a wet etching method or a combination of dry etching and wet etching can be employed for formation of the opening portions 372a, 372b, 372c, 372d, and 372e.

Figure 26A:
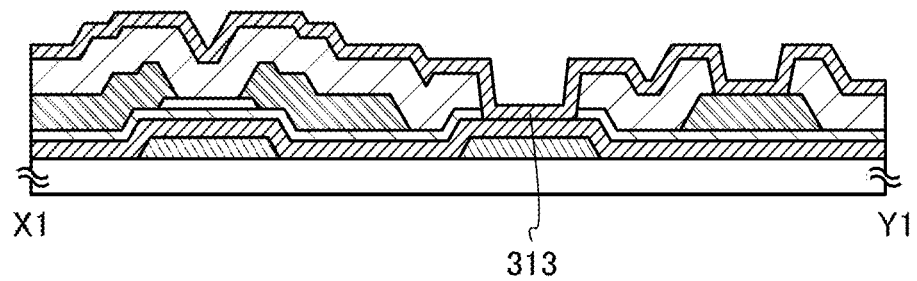
FIGS. 26A to 26C are cross-sectional views illustrating a method for manufacturing the display device.
Figure 26B:
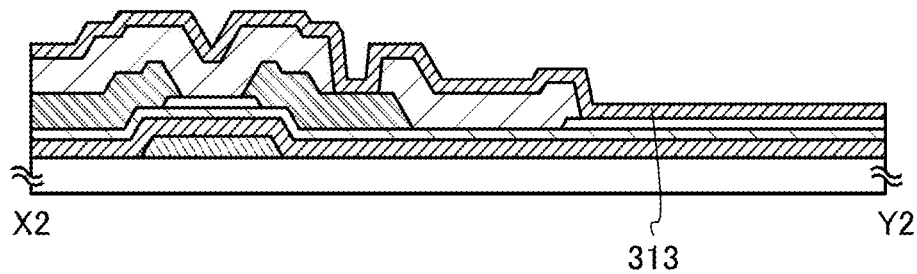
Figure 26C:
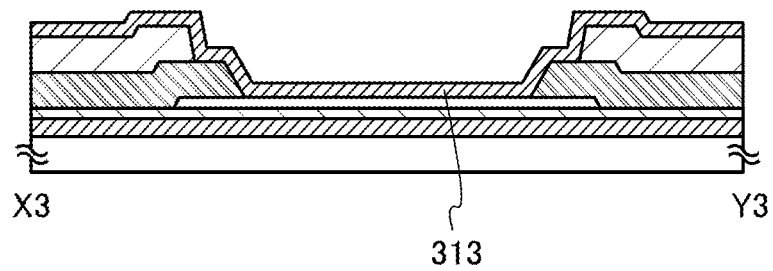

Then, the insulating layer 313 is formed over the insulating layers 305 and 312 and the semiconductor layers 308c and 308d so as to cover the opening portions 372a, 372b, 372c, 372d, and 372e (FIGS. 26A to 26C).

The insulating layer 313 is a film formed using a material that can prevent an external impurity such as moisture, alkali metal, or alkaline earth metal, from diffusing into the oxide semiconductor layer, and further that contains hydrogen. Thus, when hydrogen contained in the insulating layer 313 diffuses into the semiconductor layers 308c and 308d, hydrogen is bonded to oxygen in the semiconductor layers 308c and 308d, thereby producing an electron serving as a carrier. As a result, the conductivity of the semiconductor layers 308c and 308d is increased, so that the semiconductor layers 308c and 308d become conductive layers having a light-transmitting property.

Then, the insulating layer 313 is processed into desired regions so that the opening portions 374a, 374b, and 374c are formed. In addition, the insulating layer 313 serves as the insulating layer 314 where opening portions 374a, 374b, and 374c are formed. The insulating layer 314 and the opening portions 374a, 374b, and 374c can be formed in such a manner that a mask is formed in a desired region by fifth patterning and regions not covered by the mask are etched (see FIGS. 27A to 27C).

The opening portion 374a is formed so as to expose the conductive layer 304b. The opening portion 374b is formed so as to expose the conductive layer 310c. The opening portion 374c is formed so as to expose the conductive layer 310e.

An example of a formation method of the opening portions 374a, 374b, and 374c includes, but not limited to, a dry etching method. Alternatively, a wet etching method or a combination of dry etching and wet etching can be employed for formation of the opening portions 374a, 374b, and 374c.

Figure 28A:
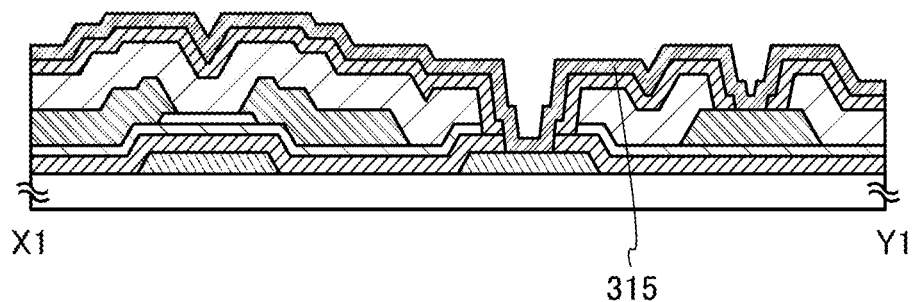
FIGS. 28A to 28C are cross-sectional views illustrating a method for manufacturing the display device.
Figure 28B:
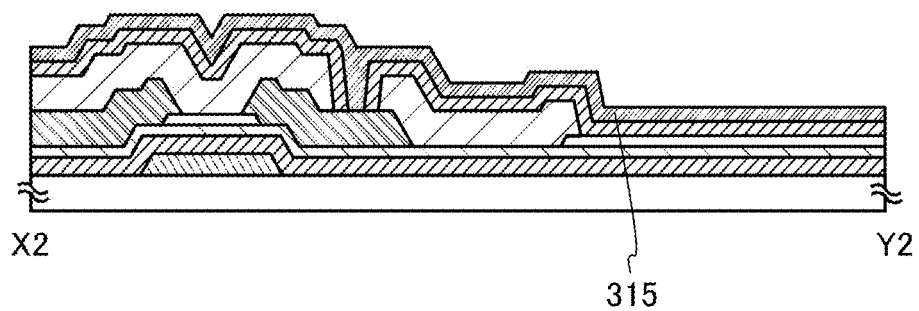
Figure 28C:
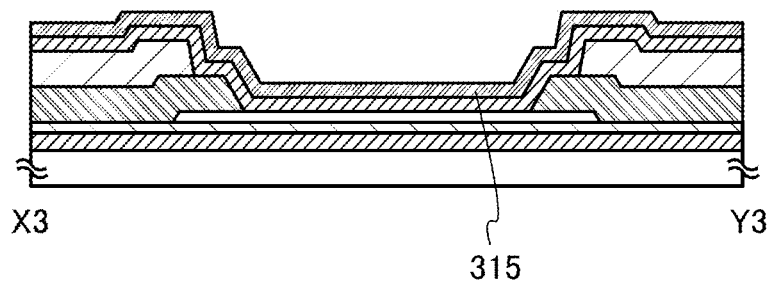
Figure 29A:
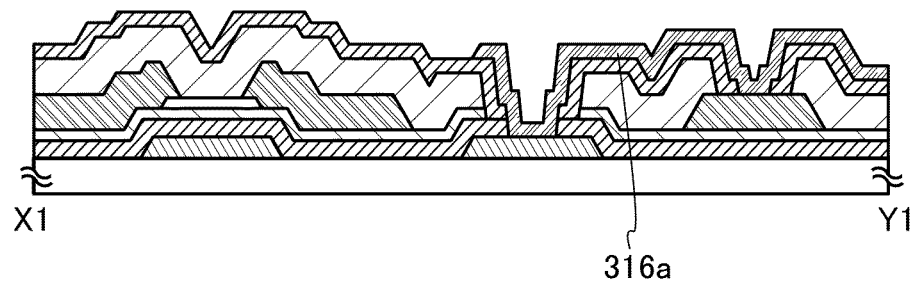
FIGS. 29A to 29C are cross-sectional views illustrating a method for manufacturing the display device.
Figure 29B:
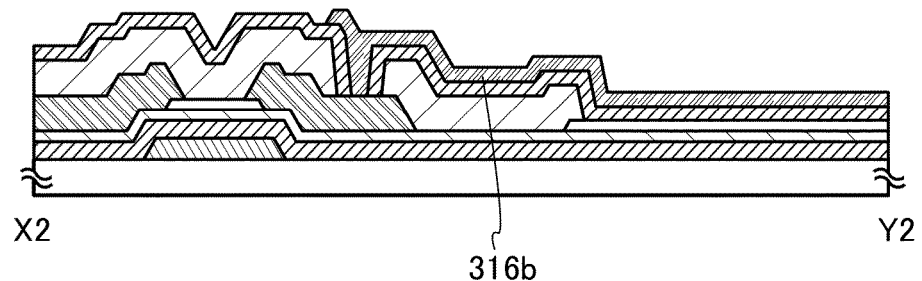
Figure 29C:
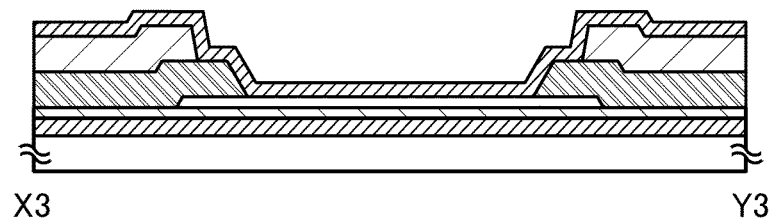

Then, the conductive layer 315 is formed over the insulating layer 314 so as to cover the opening portions 374a, 374b, and 374 (FIGS. 28A to 28C).

Then, the conductive layer 315 is processed into desired regions so that the conductive layers 316a and 316b are formed. The conductive layers 316a and 316b can be formed in such a manner that a mask is formed in a desired region by sixth patterning and regions not covered by the mask are etched (see FIGS. 29A to 29C).

Through the above process, the driver circuit portion 104 including transistors, the pixel circuit portion 108 including transistors, and the resistor 114 can be formed over the same substrate. In the fabrication process described in this embodiment, the transistors, the capacitor, and the resistor can be formed at the same time by the first to sixth patterning, that is, with the six masks.

The structure described in this embodiment can be used in appropriate combination with any structure in the other embodiments.

Embodiment 5

In this embodiment, a display device of one embodiment of the present invention will be described with reference to FIGS. 30A to 30C, FIGS. 31A to 31C, FIGS. 32A to 32C, FIGS. 33A to 33C, FIGS. 34A to 34C, and FIGS. 35A to 35C.

Figure 30A:
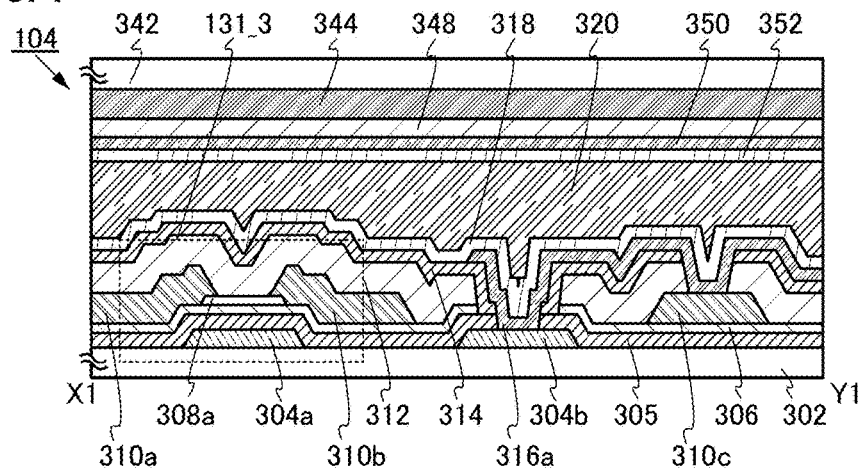
FIGS. 30A to 30C are cross-sectional views of a display device.
Figure 30B:
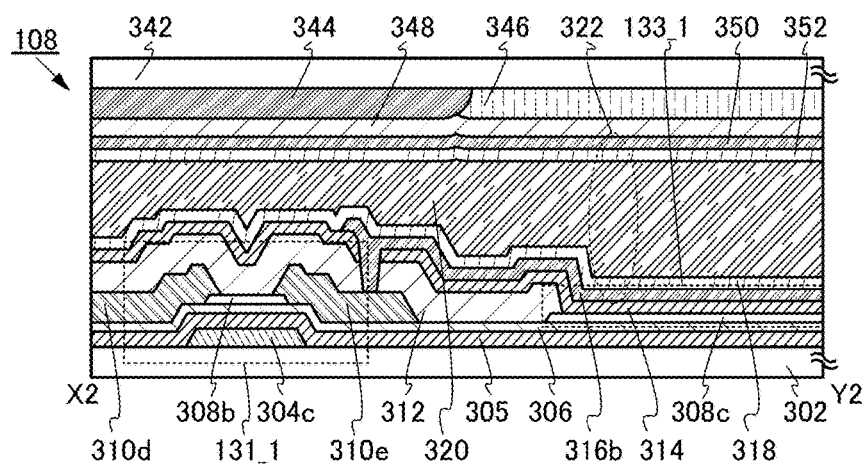
Figure 30C:
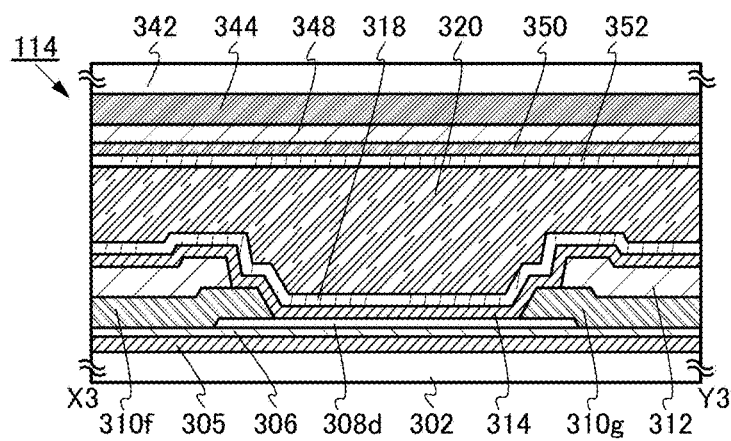
Figure 31A:
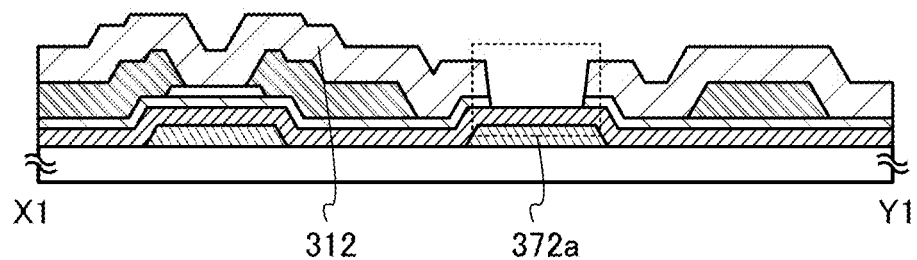
FIGS. 31A to 31C are cross-sectional views illustrating a method for manufacturing a display device.
Figure 31B:
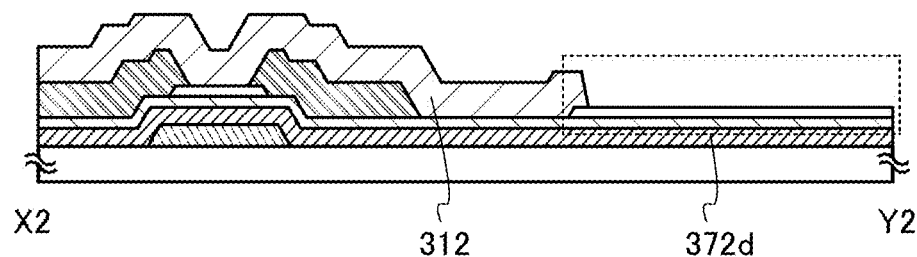
Figure 31C:
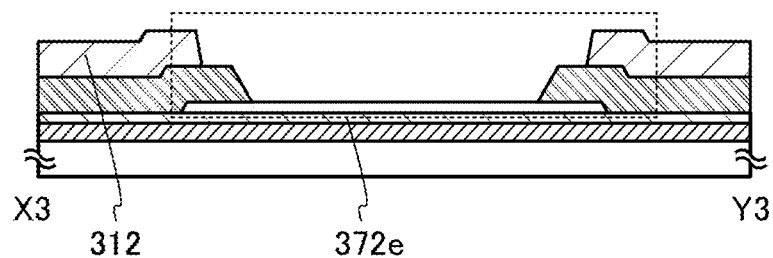

A display device illustrated in FIGS. 30A to 30C is a variation of the display device illustrated in FIGS. 9A to 9C, and FIGS. 31A to 31C, FIGS. 32A to 32C, FIGS. 33A to 33C, FIGS. 34A to 34C, and FIGS. 35A to 35C are cross-sectional views illustrating a method for manufacturing the display device illustrated in FIGS. 30A to 30C.

In FIGS. 30A to 30C, FIGS. 31A to 31C, FIGS. 32A to 32C, FIGS. 33A to 33C, FIGS. 34A to 34C, and FIGS. 35A to 35C, portions similar to those in the above embodiments and portions having functions similar to those in above embodiments are given the same reference numerals, and detailed description thereof is omitted.

The display device illustrated in FIGS. 30A to 30C includes the driver circuit portion 104, the pixel circuit portion 108, and the resistor 114. The display device illustrated in FIGS. 30A to 30C is described below.

(Driver Circuit Portion)

The driver circuit portion 104 includes the substrate 302; the conductive layers 304a and 304b formed over the substrate 302; the insulating layer 305 formed over the substrate 302 and the conductive layers 304a and 304b; the insulating layer 306 formed over the insulating layer 305; the semiconductor layer 308a formed over the insulating layer 306 and overlapping with the conductive layer 304a; the conductive layers 310a and 310b formed over the insulating layer 306 and the semiconductor layer 308a; the conductive layer 310c formed over the insulating layer 306; the insulating layer 312 formed so as to cover the semiconductor layer 308a and the conductive layer 310a, 310b, and 310c; the insulating layer 314 formed over the insulating layer 312; and the conductive layer 316a formed over the insulating layer 314.

Note that the conductive layer 316a serves as a wiring that connects the conductive layer 304b to the conductive layer 310c. The conductive layer 304b is connected to the conductive layer 316a in the opening portion formed in the insulating layers 305, 306, 312, and 314, and the conductive layer 310c is connected to the conductive layer 316a in the opening portion formed in the insulating layers 312 and 314.

(Pixel Circuit Portion)

The pixel circuit portion 108 includes the substrate 302; the conductive layer 304c formed over the substrate 302; the insulating layer 305 formed over the substrate 302 and the conductive layer 304c; the insulating layer 306 formed over the insulating layer 305; the semiconductor layer 308b formed over the insulating layer 306 and overlapping with the conductive layer 304c; the semiconductor layer 308c formed over the insulating layer 306; the conductive layers 310d and 310e formed over the insulating layer 306 and the semiconductor layer 308b; the insulating layer 312 formed so as to cover the semiconductor layer 308b, the conductive layers 310d and 310e, and a part of the semiconductor layer 308c; the insulating layer 314 formed over the insulating layer 312 and the semiconductor layer 308c; and the conductive layer 316b formed over the insulating layer 314 and connected to the conductive layer 310e.

The conductive layer 316b is connected to the conductive layer 310e in the opening portion formed in the insulating layers 312 and 314.

(Resistor)

The resistor 114 includes the substrate 302; the insulating layer 305 formed over the substrate 302; the insulating layer 306 formed over the insulating layer 305; the semiconductor layer 308d formed over the insulating layer 306; the conductive layers 310f and 310g formed over the insulating layer 306 and the semiconductor layer 308d; the insulating layer 312 formed over the conductive layers 310f and 310g; and the insulating layer 314 formed over the insulating layer 312, the conductive layers 310f and 310g, and the semiconductor layer 308d.

The display device illustrated in this embodiment has opening portions with shapes different from those in the display device illustrated in FIGS. 24A to 24C in the above embodiment. Specifically, the opening portions formed over the conductive layers 310c, and 310e are formed by one etching step, as in the display device illustrated in FIGS. 9A to 9C, whereas the opening portion formed over the conductive layer 304b is formed by two etching steps.

With the shape of the opening portions as illustrated in FIGS. 30A to 30C, the effects described next can be obtained.

Because the thickness of the insulating layer is adjusted in the first etching step, the insulating layer with a different depth direction can be etched favorably at the time of the second etching step.

In the display device in this embodiment, transistors included in the driver circuit portion 104 and the pixel circuit portion 108 and the resistor 114 can be formed at the same time. Thus, the resistor 114 can be formed without increasing the manufacturing cost and the like.

Next, the method for manufacturing the display device illustrated in FIGS. 30A to 30C is described below with reference to FIGS. 31A to 31C, FIGS. 32A to 32C, FIGS. 33A to 33C, FIGS. 34A to 34C, and FIGS. 35A to 35C.

The method for forming the driver circuit portion 104 is illustrated in FIG. 31A, FIG. 32A, FIG. 33A, FIG. 34A, and FIG. 35A; the method for forming the pixel circuit portion 108 is illustrated in FIG. 31B, FIG. 32B, FIG. 33B, FIG. 34B, and FIG. 35B; and the method for forming the resistor 114 is illustrated in FIG. 31C, FIG. 32C, FIG. 33C, FIG. 34C, and FIG. 35C.

The structure illustrated in FIGS. 15A to 15C described in the above embodiment is formed. In other words, the substrate that is subjected to patterning and etching with use of three masks is formed Then, the insulating layer 311 is processed into desired regions so that the opening portions 372a, 372d, and 372e are formed. In addition, the insulating layer 311 serves as the insulating layer 312 where the opening portions 372a, 372d, and 372e are formed. The insulating layer 312 and the opening portions 372a, 372d, and 372e can be formed in such a manner that a mask is formed in a desired region by fourth patterning and regions not covered by the mask are etched (see FIGS. 31A to 31C).

The opening portion 372a is formed so as to expose the insulating layer 305. The opening portions 372d and 372e are formed so as to expose the semiconductor layers 308c and 308d. An example of a formation method of the opening portions 372a, 372d, and 372e includes, but not limited to, a dry etching method. Alternatively, a wet etching method or a combination of dry etching and wet etching can be employed for formation of the opening portions 372a, 372d, and 372e.

Figure 32A:
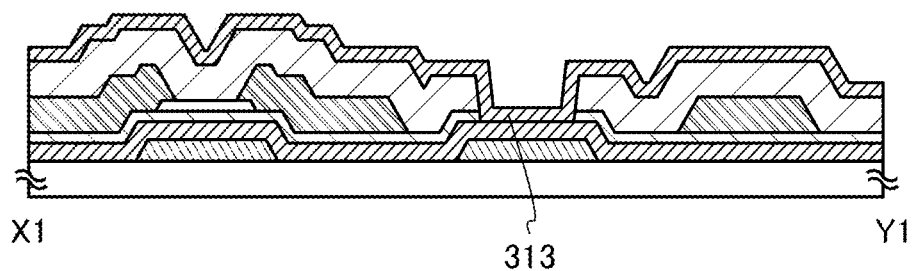
FIGS. 32A to 32C are cross-sectional views illustrating a method for manufacturing the display device.
Figure 32B:
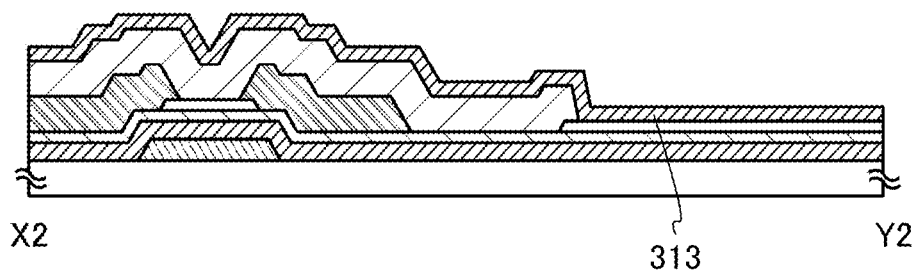
Figure 32C:
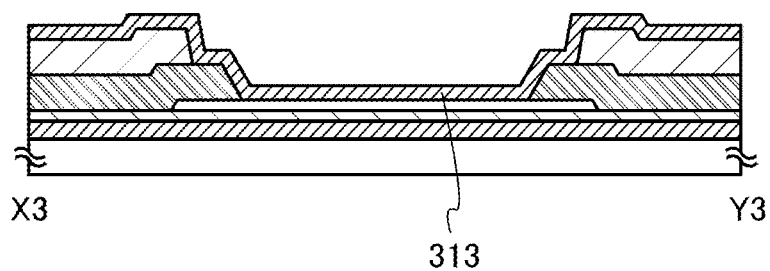
Figure 33A:
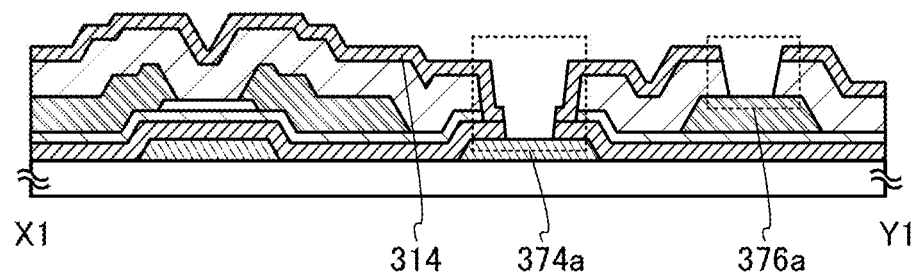
FIGS. 33A to 33C are cross-sectional views illustrating a method for manufacturing the display device.
Figure 33B:
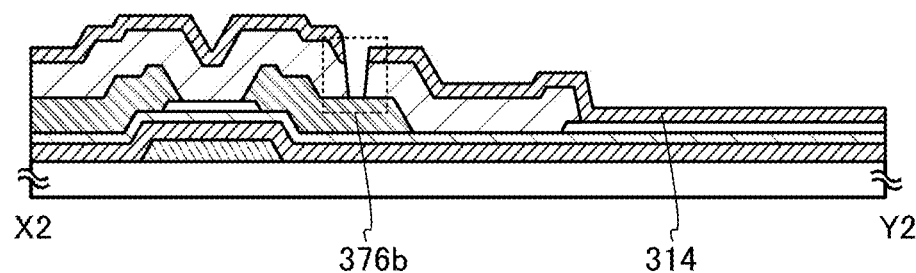
Figure 33C:
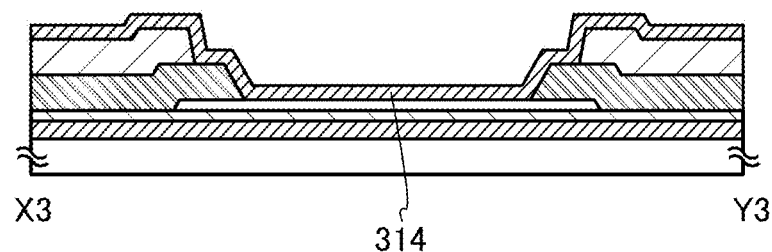

Then, the insulating layer 313 is formed over the insulating layers 305 and 312 and the semiconductor layers 308c and 308d so as to cover the opening portions 372a, 372d, and 372e (FIGS. 32A to 32C).

The insulating layer 313 is a film formed using a material that can prevent an external impurity such as moisture, alkali metal, or alkaline earth metal, from diffusing into the oxide semiconductor layer, and that further contains hydrogen. Thus, when hydrogen contained in the insulating layer 313 diffuses into the semiconductor layers 308c and 308d, hydrogen is bonded to oxygen in the semiconductor layers 308c and 308d, thereby producing an electron serving as a carrier. As a result, the conductivity of the semiconductor layers 308c and 308d is increased, so that the semiconductor layers 308c and 308d become conductive layers having a light-transmitting property.

Then, the insulating layer 313 is processed into desired regions so that the opening portions 374a, 376a, and 376b are formed. In addition, the insulating layer 313 serves as an insulating layer 314 where the opening portions 374a, 376a, and 376b are formed. The insulating layer 314 and the opening portions 374a, 376a, and 376b can be formed in such a manner that a mask is formed in a desired region by fifth patterning and regions not covered by the mask are etched (see FIGS. 33A to 33C).

The opening portion 374a is formed so as to expose the conductive layer 304b. The opening portion 376a is formed so as to expose the conductive layer 310c. The opening portion 376b is formed so as to expose the conductive layer 310e.

An example of a formation method of the opening portions 374a, 376a, and 376b includes, but not limited to, a dry etching method. Alternatively, a wet etching method or a combination of dry etching and wet etching can be employed for formation of the opening portions 374a, 376a, and 376b.

Figure 34A:
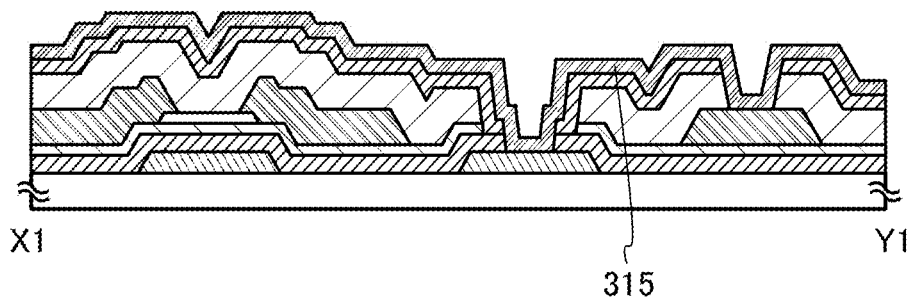
FIGS. 34A to 34C are cross-sectional views illustrating a method for manufacturing the display device.
Figure 34B:
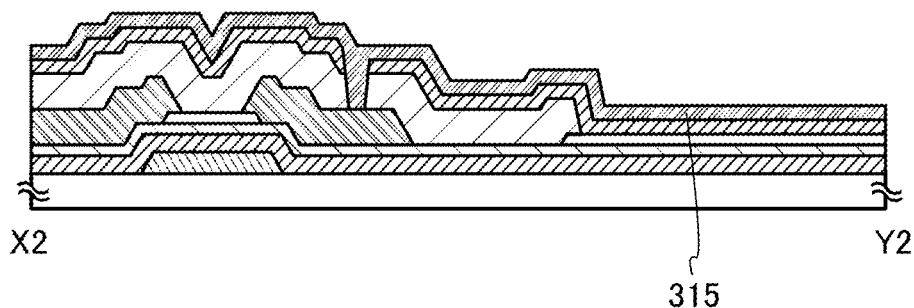
Figure 34C:
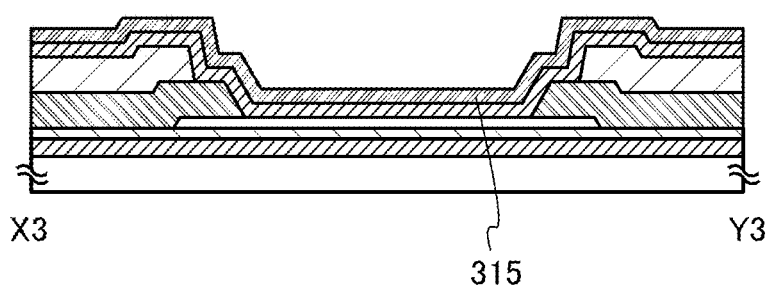
Figure 35A:
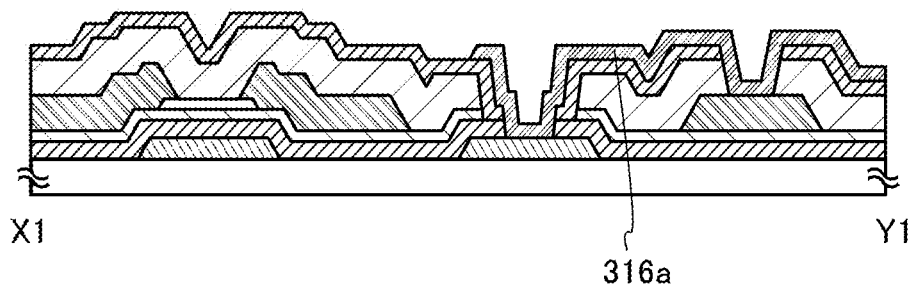
FIGS. 35A to 35C are cross-sectional views illustrating a method for manufacturing the display device.
Figure 35B:
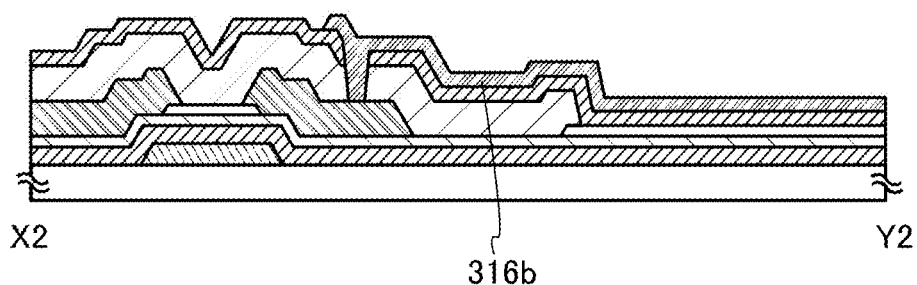
Figure 35C:
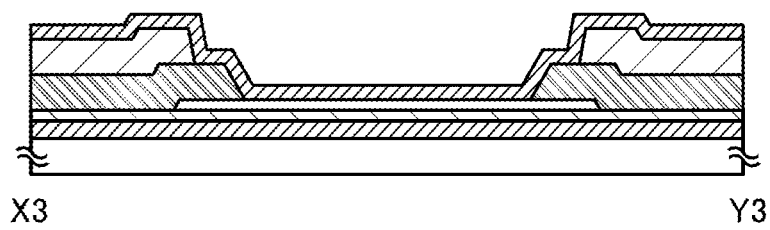

Then, the conductive layer 315 is formed over the insulating layer 314 so as to cover the opening portions 374a, 376a, and 376b (FIGS. 34A to 34C).

Then, the conductive layer 315 is processed into desired regions so that the conductive layers 316a and 316b are formed. The conductive layers 316a and 316b can be formed in such a manner that a mask is formed in a desired region by sixth patterning and regions not covered by the mask are etched (see FIGS. 35A to 35C).

Through the above process, the driver circuit portion 104 including transistors, the pixel circuit portion 108 including transistors, and the resistor 114 can be formed over the same substrate. In the fabrication process described in this embodiment, the transistors, the capacitor, and the resistor can be formed at the same time by the first to sixth patterning, that is, with the six masks.

The structure described in this embodiment can be used in appropriate combination with any structure in the other embodiments.

Embodiment 6

In this embodiment, a display device of one embodiment of the present invention will be described with reference to FIGS. 36A to 36C, FIGS. 37A to 37C, FIGS. 38A to 38C, FIGS. 39A to 39C, FIGS. 40A to 40C, and FIGS. 41A to 41C.

Figure 36A:
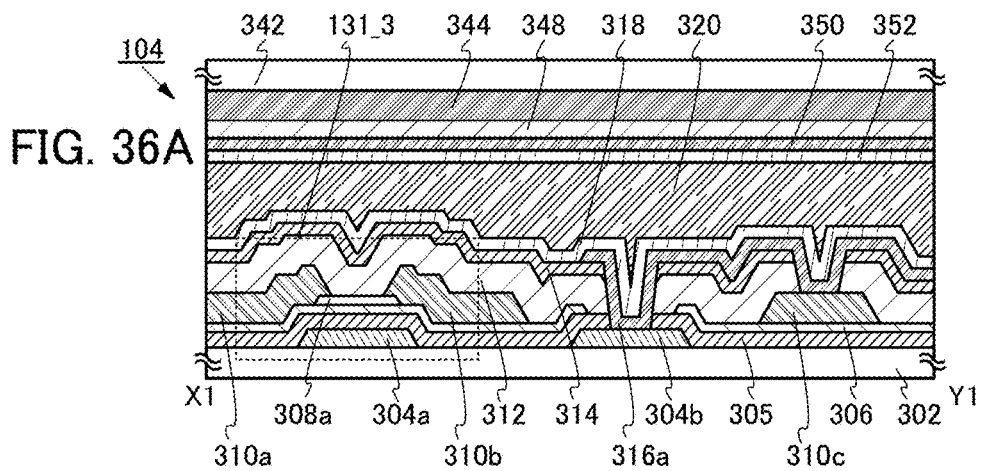
FIGS. 36A to 36C are cross-sectional views of a display device.
Figure 36B:
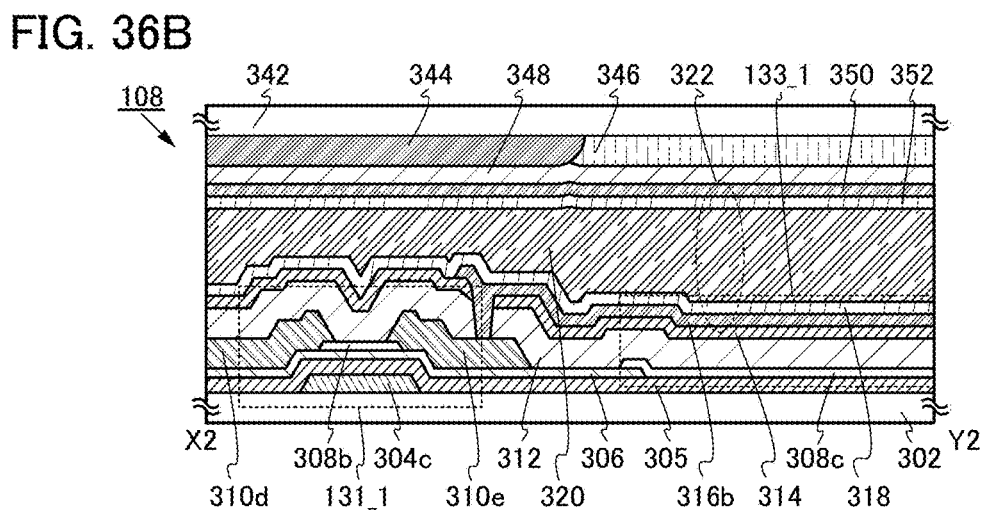
Figure 36C:
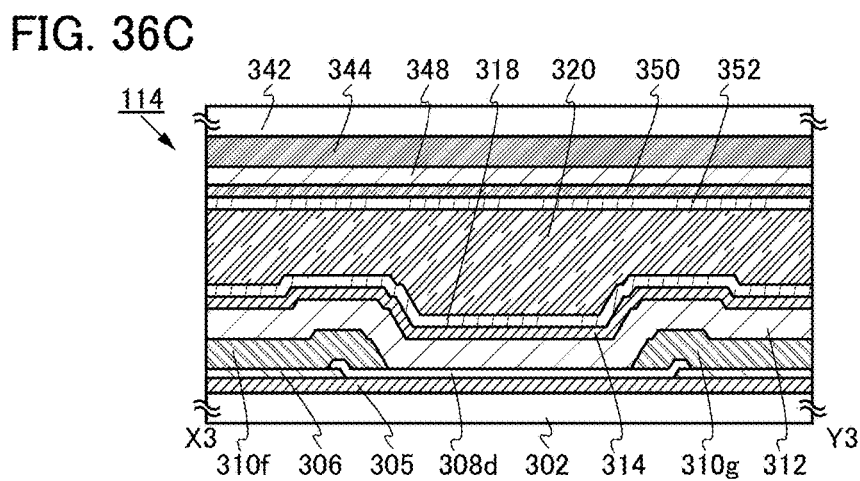
Figure 37A:
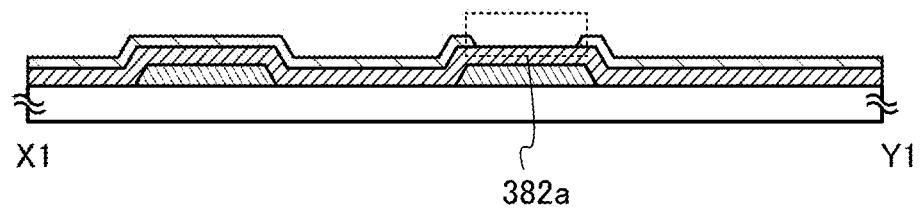
FIGS. 37A to 37C are cross-sectional views illustrating a method for manufacturing a display device.
Figure 37B:
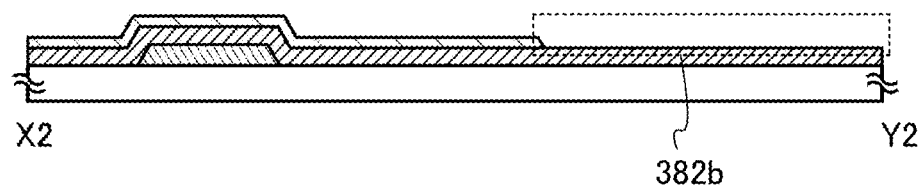
Figure 37C:
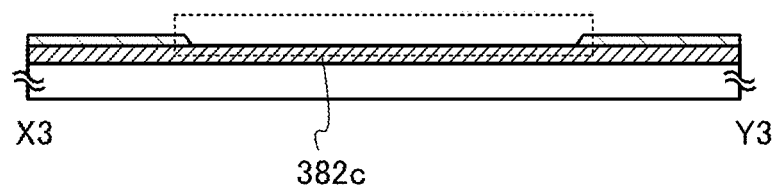
Figure 38A:
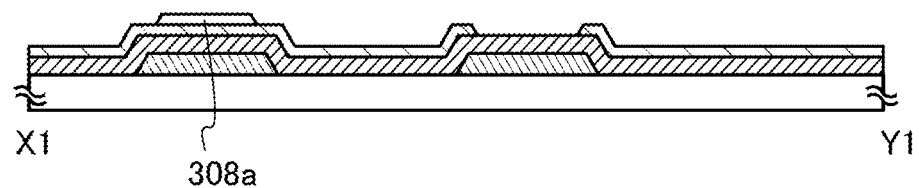
FIGS. 38A to 38C are cross-sectional views illustrating a method for manufacturing the display device.
Figure 38B:
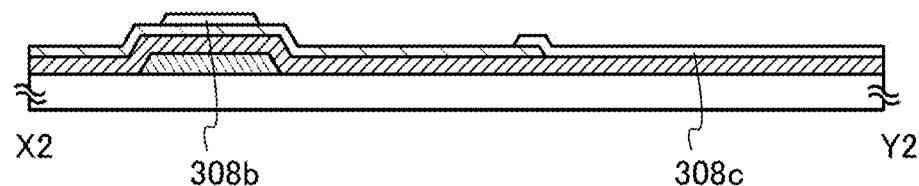
Figure 38C:
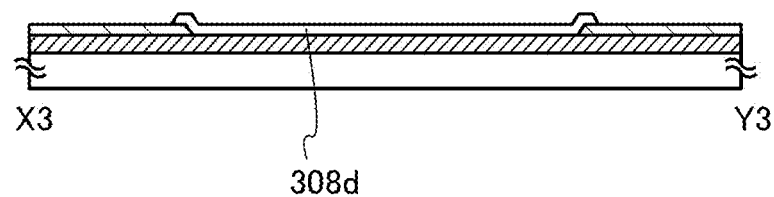

A display device illustrated in FIGS. 36A to 36C is a variation of the display device illustrated in FIGS. 9A to 9C, and FIGS. 37A to 37C, FIGS. 38A to 38C, FIGS. 39A to 39C, FIGS. 40A to 40C, and FIGS. 41A to 41C are cross-sectional views illustrating a method for manufacturing the display device illustrated in FIGS. 36A to 36C.

In FIGS. 36A to 36C, FIGS. 37A to 37C, FIGS. 38A to 38C, FIGS. 39A to 39C, FIGS. 40A to 40C, and FIGS. 41A to 41C, portions similar to those in the above embodiments and portions having functions similar to those in above embodiments are given the same reference numerals, and detailed description thereof is omitted.

The display device illustrated in FIGS. 36A to 36C includes the driver circuit portion 104, the pixel circuit portion 108, and the resistor 114. The display device illustrated in FIGS. 36A to 36C is described below.

(Driver Circuit Portion)

The driver circuit portion 104 includes the substrate 302; the conductive layers 304a and 304b formed over the substrate 302; the insulating layer 305 formed over the substrate 302 and the conductive layers 304a and 304b; the insulating layer 306 formed over the insulating layer 305; the semiconductor layer 308a formed over the insulating layer 306 and overlapping with the conductive layer 304a; the conductive layers 310a and 310b formed over the insulating layer 306 and the semiconductor layer 308a; the conductive layer 310c formed over the insulating layer 306; the insulating layer 312 formed so as to cover the semiconductor layer 308a and the conductive layer 310a, 310b; and 310c, the insulating layer 314 formed over the insulating layer 312; and the conductive layer 316a formed over the insulating layer 314.

Note that the conductive layer 316a serves as a wiring that connects the conductive layer 304b to the conductive layer 310c. The conductive layer 304b is connected to the conductive layer 316a in an opening portion formed in the insulating layers 305, 306, 312, and 314, and the conductive layer 310c is connected to the conductive layer 316a in an opening portion formed in the insulating layers 312 and 314.

(Pixel Circuit Portion)

The pixel circuit portion 108 includes the substrate 302; the conductive layer 304c formed over the substrate 302; the insulating layer 305 formed over the substrate 302 and the conductive layer 304c; the insulating layer 306 formed over the insulating layer 305; the semiconductor layer 308b formed over the insulating layer 306 and overlapping with the conductive layer 304c; the semiconductor layer 308c formed over the insulating layer 305; the conductive layers 310d and 310e formed over the insulating layer 306 and the semiconductor layer 308b; the insulating layer 312 formed so as to cover the semiconductor layers 308b and 308c and the conductive layers 310d and 310e; the insulating layer 314 formed over the insulating layer 312; and the conductive layer 316b formed over the insulating layer 314 and connected to the conductive layer 310e.

The conductive layer 316b is connected to the conductive layer 310e in the opening portion formed in the insulating layers 312 and 314.

(Resistor 114)

The resistor 114 includes the substrate 302; the insulating layer 305 formed over the substrate 302; the insulating layer 306 formed over the insulating layer 305; the semiconductor layer 308d formed over the insulating layer 305; the conductive layers 310f and 310g formed over the insulating layer 306 and the semiconductor layer 308d; the insulating layer 312 formed over the semiconductor layer 308d and the conductive layers 310f and 310g; and the insulating layer 314 formed over the insulating layer 312.

The display device illustrated in this embodiment has opening portions with shapes different from those in the display device illustrated in FIGS. 9A to 9C in the above embodiment. Specifically, in the display device illustrated in FIGS. 36A to 36C, the opening portion formed over the conductive layer 304b has a first opening portion formed in the insulating layer 306 and a second opening portion formed in the insulating layers 314, 312, 306, and 305. Further, in the display device illustrated in FIGS. 36A to 36C, the opening portions formed over the semiconductor layers 308c and 308d each have an opening portion formed in the insulating layer 306.

The display device described in this embodiment is different from the display device described in the above embodiment with reference to FIGS. 9A to 9C in the structures of the insulating layers in contact with the upper portions and the lower portions of the semiconductor layers 308c and 308d. Specifically, the semiconductor layers 308c and 308d are formed in contact with the insulating layer 305 and the insulating layer 312.

In the display device in this embodiment, transistors included in the driver circuit portion 104 and the pixel circuit portion 108, and the resistor 114 can be formed at the same time. Thus, the resistor 114 can be formed without increasing the manufacturing cost and the like.

Next, the method for manufacturing the display device illustrated in FIGS. 36A to 36C is described below with reference to FIGS. 37A to 37C, FIGS. 38A to 38C, FIGS. 39A to 39C, FIGS. 40A to 40C, and FIGS. 41A to 41C.

The method for forming the driver circuit portion 104 is illustrated in FIG. 37A, FIG. 38A, FIG. 39A, FIG. 40A, and FIG. 41A; the method for forming the pixel circuit portion 108 is illustrated in FIG. 37B, FIG. 38B, FIG. 39B, FIG. 40B, and FIG. 41B; and the method for forming the resistor 114 is illustrated in FIG. 37C, FIG. 38C, FIG. 39C, FIG. 40C, and FIG. 41C.

The structure illustrated in FIGS. 10A to 10C described in the above embodiment is formed. In other words, the substrate that is subjected to patterning and etching with use of one mask is formed Then, the insulating layer 306 is processed into desired regions so that the opening portions 382a, 382d, and 382c are formed. The opening portions 382a, 382d, and 382c can be formed in such a manner that a mask is formed in a desired region by second patterning and regions not covered by the mask are etched (see FIGS. 37A to 37C).

The opening portions 382a, 382b, and 382c are formed so as to expose the insulating layer 305. An example of a formation method of the opening portions opening portions 382a, 382b, and 382c includes, but not limited to, a dry etching method. Alternatively, a wet etching method or a combination of dry etching and wet etching can be employed for formation of the opening portions opening portions 382a, 382b, and 382c.

Then, a semiconductor layer is formed over the insulating layers 305 and 306 and is processed into desired regions, so that the semiconductor layers 308a, 308b, 308c, and 308d are formed. The semiconductor layers 308a, 308b, 308c, and 308d can be formed in such a manner that a mask is formed in a desired region by third patterning and regions not covered with the masks are etched (see FIGS. 38A to 38C).

Note that the semiconductor layers 308a and 308b are formed over the insulating layer 306, and the semiconductor layers 308c and 308d are formed over the insulating layer 305. In addition, parts of the semiconductor layers 308c and 308d, specifically, peripheral regions of the opening portions 382b and 382c are formed over the insulating layer 306.

The insulating layer 305 is a film formed using a material that can prevent an external impurity such as moisture, alkali metal, or alkaline earth metal, from diffusing into the oxide semiconductor layer, and that further contains hydrogen. Thus, when hydrogen contained in the insulating layer 305 diffuses into the semiconductor layers 308c and 308d, hydrogen is bonded to oxygen in the semiconductor layers 308c and 308d, thereby producing an electron serving as a carrier. As a result, the conductivity of the semiconductor layers 308c and 308d is increased, so that the semiconductor layers 308c and 308d become conductive layers having a light-transmitting property.

Figure 39A:
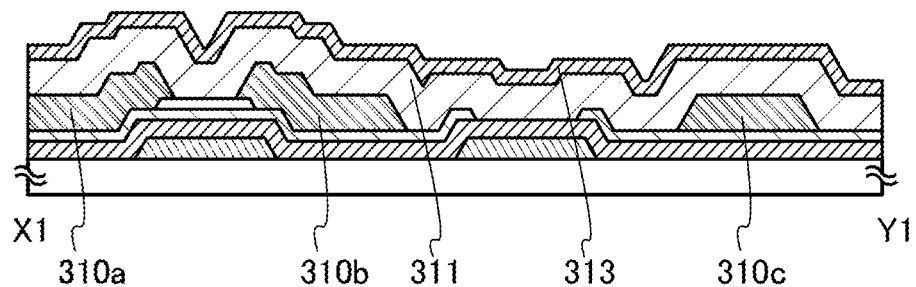
FIGS. 39A to 39C are cross-sectional views illustrating a method for manufacturing the display device.
Figure 39B:
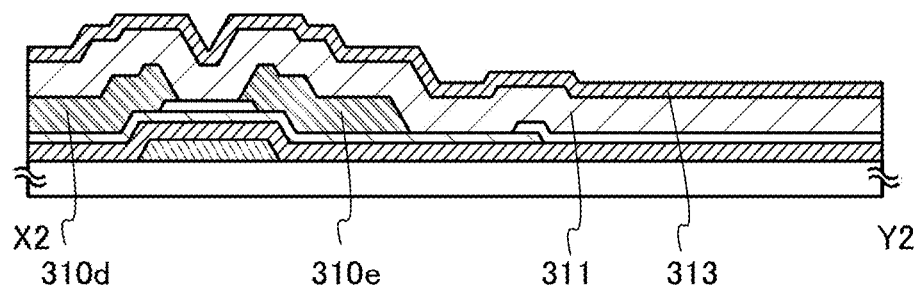
Figure 39C:
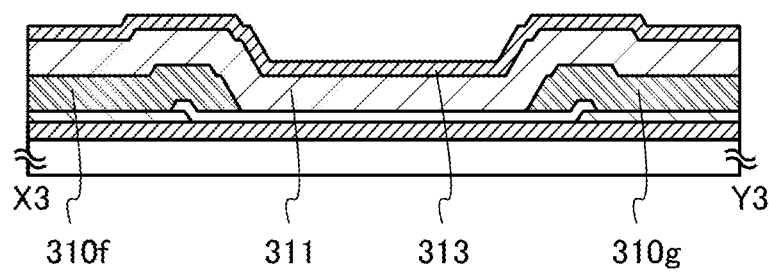
Figure 40A:
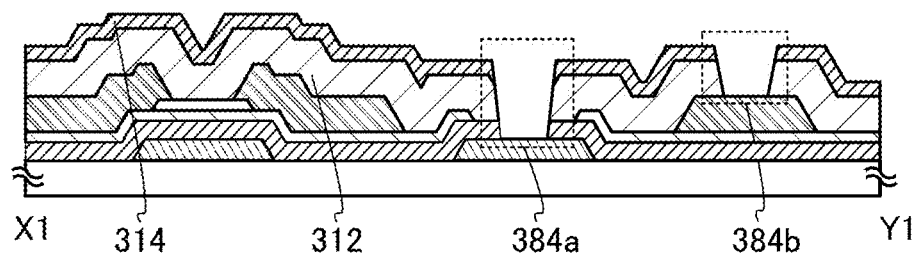
FIGS. 40A to 40C are cross-sectional views illustrating a method for manufacturing the display device.
Figure 40B:
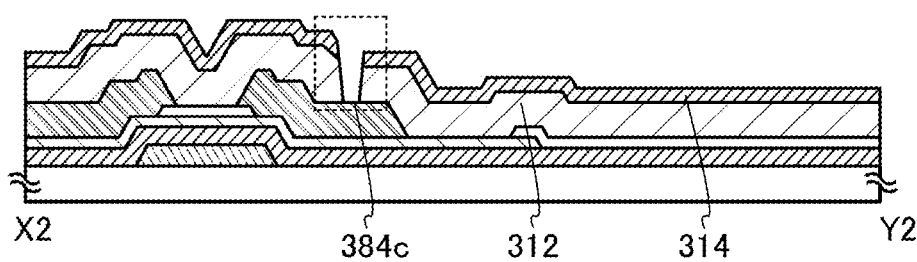
Figure 40C:
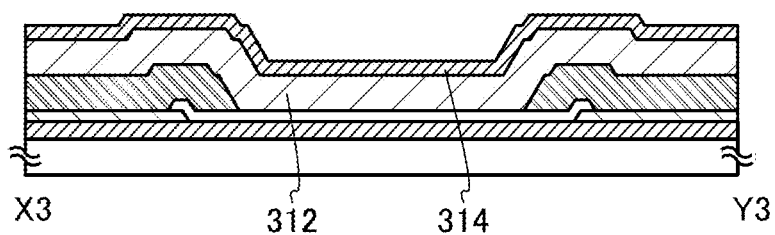

Then, the conductive layers 310a, 310b, 310c, 310d, 310e, 310f, and 310g, and the insulating layers 311 and 313 are formed over the insulating layers 305 and 306 and the semiconductor layers 308a, 308b, 308c, and 308d (see FIG. 39A to 39C).

For the formation methods of the conductive layers 310a, 310b, 310c, 310d, 310e, 310f, and 310g and the insulating layers 311 and 313, the formation methods described in the above embodiment can be referred to.

The conductive layers 310a, 310b, 310c, 310d, 310e, 310f, and 310g are formed in such a manner that a mask is formed in a desired region by fourth patterning and regions not covered with the masks are etched.

Then, the insulating layers 311 and 313 are processed into desired regions so that the opening portions 384a, 384b, and 384c are formed. In addition, the insulating layer 311 serves as the insulating layer 312 where opening portions 384a, 384b, and 384c are formed. The insulating layer 313 serves as an insulating layer 314 where the opening portions 384a, 384b, and 384c are formed. The insulating layers 312 and 314 and the opening portions 384a, 384b, and 384c can be formed in such a manner that a mask is formed in a desired region by fifth patterning and regions not covered by the mask are etched (see FIGS. 40A to 40C).

The opening portion 384a is formed so as to expose the conductive layer 304b. The opening portions 384b and 384c are formed so as to expose the conductive layers 310c and 310e respectively. An example of a formation method of the opening portions 384a, 384b, and 384c includes, but not limited to, a dry etching method. Alternatively, a wet etching method or a combination of dry etching and wet etching can be employed for formation of the opening portions 384a, 384b, and 384c.

Figure 41A:
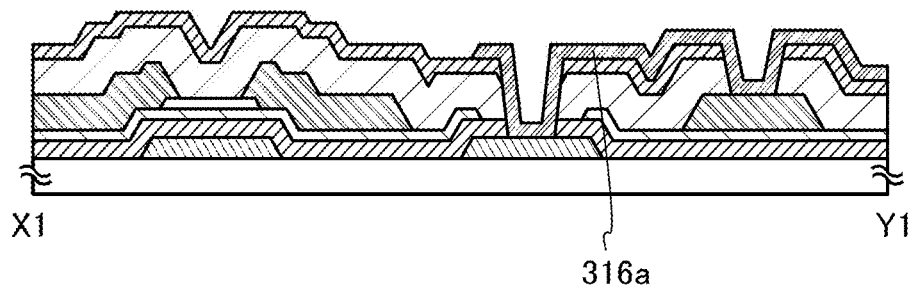
FIGS. 41A to 41C are cross-sectional views illustrating a method for manufacturing the display device.
Figure 41B:
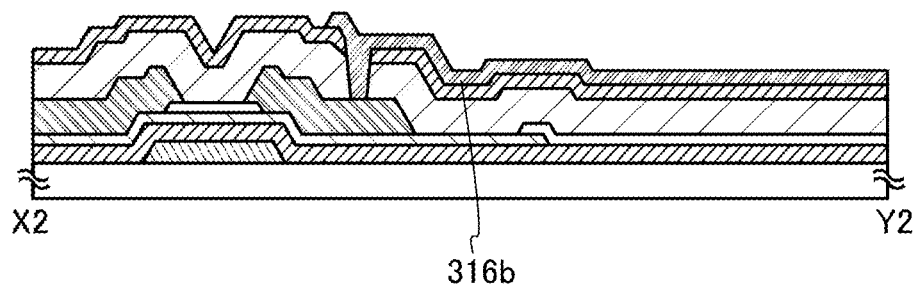
Figure 41C:
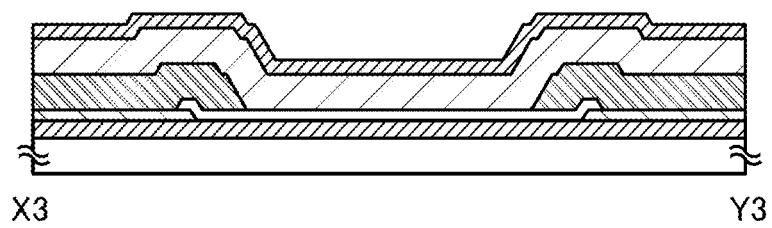

Then, the conductive layers 316a and 316b are formed over the insulating layer 314 so as to cover the opening portions 384a, 384b, and 384c (FIGS. 41A to 41C).

For the formation method of the conductive layers 316a and 316b, the formation method described in the above embodiment can be referred to.

The conductive layers 316a and 316b can be formed in such a manner that a mask is formed in a desired region by sixth patterning and regions not covered by the mask are etched.

Through the above process, the driver circuit portion 104 including transistors, the pixel circuit portion 108 including transistors, and the resistor 114 can be formed over the same substrate. In the fabrication process described in this embodiment, the transistors, the capacitor, and the resistor can be formed at the same time by the first to sixth patterning, that is, with the six masks.

The structure described in this embodiment can be used in appropriate combination with any structure in the other embodiments.

Embodiment 7

In this embodiment, a display device of one embodiment of the present invention will be described with reference to FIGS. 42A to 42C, FIGS. 43A to 43C, and FIGS. 44A to 44C.

Display devices illustrated in FIGS. 42A to 42C, FIGS. 43A to 43C, and FIGS. 44A to 44C are cross-sectional views illustrating variations of the display device illustrated in FIGS. 9A to 9C.

In FIGS. 42A to 42C, FIGS. 43A to 43C, and FIGS. 44A to 44C, portions similar to those in the above embodiments and portions having functions similar to those in above embodiments are given the same reference numerals and detailed description thereof is omitted.

Figure 42A:
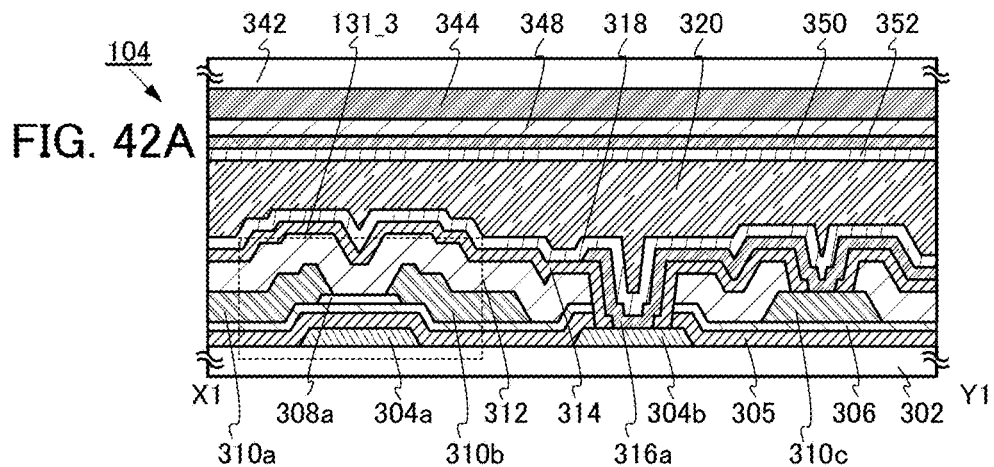
FIGS. 42A to 42C are cross-sectional views of a display device.
Figure 42B:
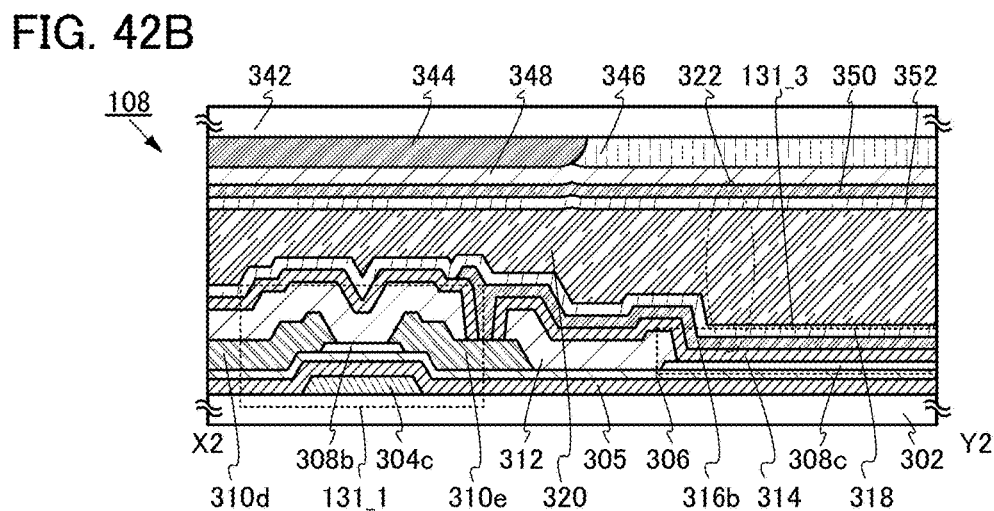
Figure 42C:
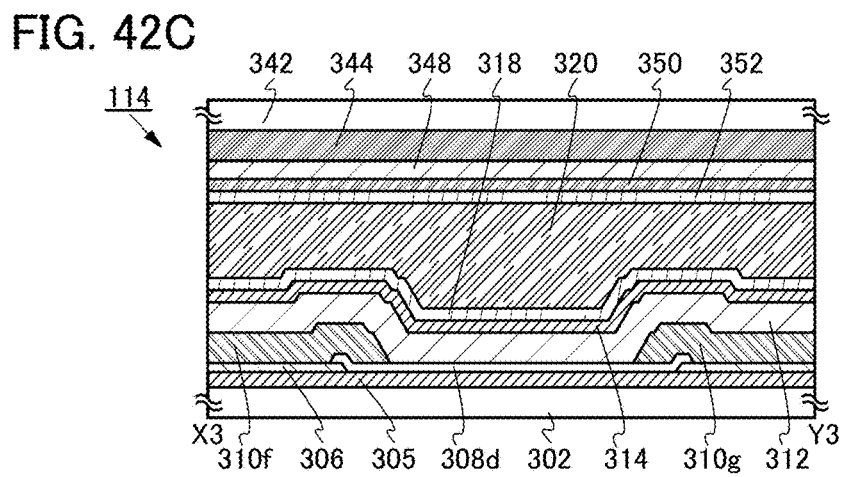

The display device illustrated in FIGS. 42A to 42C is described first.

The display device illustrated in FIGS. 42A to 42C includes the driver circuit portion 104, the pixel circuit portion 108, and the resistor 114. The display device illustrated in FIGS. 42A to 42C is described in detail below.

(Driver Circuit Portion)

The driver circuit portion 104 includes the substrate 302; the conductive layers 304a and 304b formed over the substrate 302; the insulating layer 305 formed over the substrate 302 and the conductive layers 304a and 304b; the insulating layer 306 formed over the insulating layer 305; the semiconductor layer 308a formed over the insulating layer 306 and overlapping with the conductive layer 304a; the conductive layers 310a and 310b formed over the insulating layer 306 and the semiconductor layer 308a; the conductive layer 310c formed over the insulating layer 306; the insulating layer 312 formed so as to cover the semiconductor layer 308a and the conductive layer 310a, 310b, and 310c; the insulating layer 314 formed over the insulating layer 312; and the conductive layer 316a formed over the insulating layer 314.

Note that the conductive layer 316a serves as a wiring that connects the conductive layer 304b to the conductive layer 310c. The conductive layer 304b is connected to the conductive layer 316a in an opening portion formed in the insulating layers 305, 306, 312, and 314, and the conductive layer 310c is connected to the conductive layer 316a in an opening portion formed in the insulating layers 312 and 314.

(Pixel Circuit Portion)

The pixel circuit portion 108 includes the substrate 302; the conductive layer 304c formed over the substrate 302; the insulating layer 305 formed over the substrate 302 and the conductive layer 304c; the insulating layer 306 formed over the insulating layer 305; the semiconductor layer 308b formed over the insulating layer 306 and overlapping with the conductive layer 304c; the semiconductor layer 308c formed over the insulating layer 305; the conductive layers 310d and 310e formed over the insulating layer 306 and semiconductor layer 308b; the insulating layer 312 formed so as to cover the semiconductor layers 308b and 308c and the conductive layers 310d and 310e; the insulating layer 314 formed over the insulating layer 312; and the conductive layer 316b formed over the insulating layer 314 and connected to the conductive layer 310e.

The conductive layer 316b is connected to the conductive layer 310e in the opening portion formed in the insulating layers 312 and 314.

(Resistor)

The resistor 114 includes the substrate 302; the insulating layer 305 formed over the substrate 302; the insulating layer 306 formed over the insulating layer 305; the semiconductor layer 308d formed over the insulating layer 305; the conductive layers 310f and 310g formed over the insulating layer 306 and the semiconductor layer 308d; the insulating layer 312 formed over the semiconductor layer 308d and the conductive layers 310f and 310g; and the insulating layer 314 formed over the insulating layer 312.

The display device illustrated in FIGS. 42A to 42C has opening portions with shapes different from those in the display device illustrated in FIGS. 36A to 36C. Specifically, opening portions formed over the conductive layers 304b, 310c, and 310e are formed by two etching steps.

With the shape of the opening portions as illustrated in FIGS. 42A to 42C, the effects described next can be obtained.

The insulating layer 314 is formed in the inner side of the opening portions conductive layers 304b, 310c, and 310e that have been formed by a first etching step, and can inhibit an impurity that can gain entry through the opening portions, such as moisture, alkali metal, or alkaline earth metal, from diffusing into the inside.

Figure 43A:
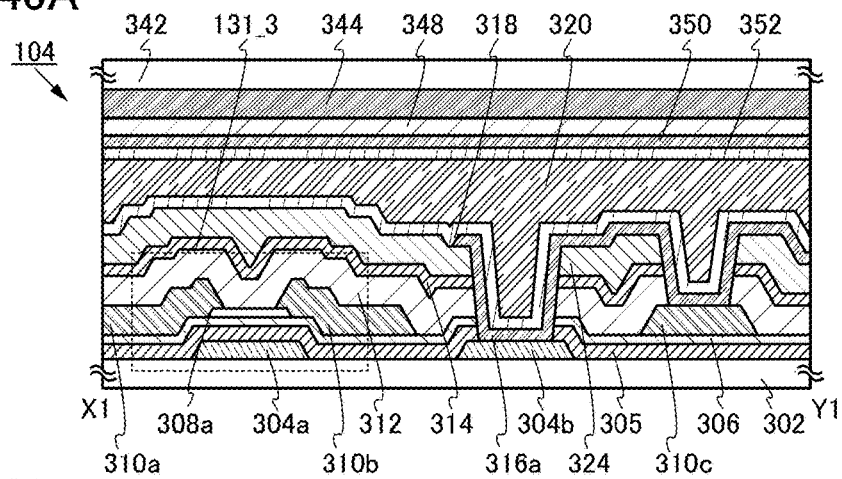
FIGS. 43A to 43C are cross-sectional views of a display device.
Figure 43B:
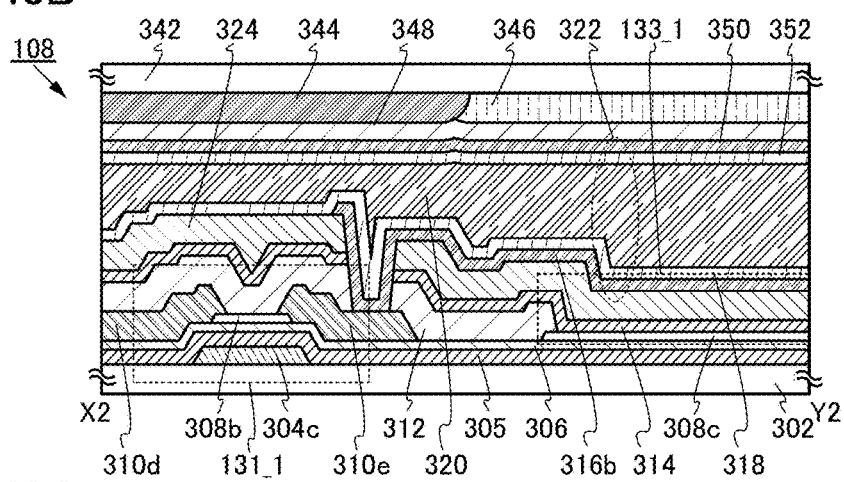
Figure 43C:
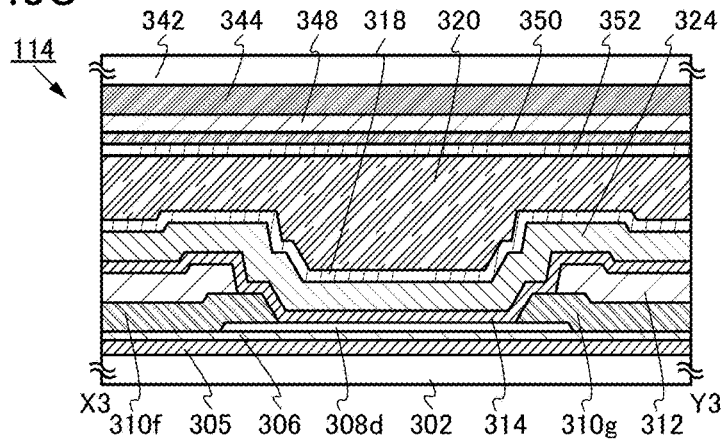

Next, the display device illustrated in FIGS. 43A to 43C is described.

The display device illustrated in FIGS. 43A to 43C includes the driver circuit portion 104, the pixel circuit portion 108, and the protection circuit portion 106. The display device illustrated in FIGS. 43A to 43C is described in detail below.

(Driver Circuit Portion)

The driver circuit portion 104 includes the substrate 302; the conductive layers 304a and 304b formed over the substrate 302; the insulating layer 305 formed over the substrate 302 and the conductive layers 304a and 304b; the insulating layer 306 formed over the insulating layer 305; the semiconductor layer 308a formed over the insulating layer 306 and overlapping with the conductive layer 304a; the conductive layers 310a and 310b formed over the insulating layer 306 and the semiconductor layer 308a; the conductive layer 310c formed over the insulating layer 306; the insulating layer 312 formed so as to cover the semiconductor layer 308a and the conductive layer 310a, 310b, and 310c; the insulating layer 314 formed over the insulating layer 312; an insulating layer 324 formed over the insulating layer 314; and the conductive layer 316a formed over the insulating layer 324.

Note that the conductive layer 316a serves as a wiring that connects the conductive layer 304b to the conductive layer 310c. The conductive layer 304b is connected to the conductive layer 316a in an opening portion formed in the insulating layers 305, 306, 312, 314, and 324 and the conductive layer 310c is connected to the conductive layer 316a in an opening portion formed in the insulating layers 312, 314, and 324.

(Pixel Circuit Portion)

The pixel circuit portion 108 includes the substrate 302; the conductive layer 304c formed over the substrate 302; the insulating layer 305 formed over the substrate 302 and the conductive layer 304c; the insulating layer 306 formed over the insulating layer 305; the semiconductor layer 308b formed over the insulating layer 306 and overlapping with the conductive layer 304c; the semiconductor layer 308c formed over the insulating layer 305; the conductive layers 310d and 310e formed over the insulating layer 306 and the semiconductor layer 308b; the insulating layer 312 formed so as to cover the semiconductor layers 308b and 308c and the conductive layers 310d and 310e; the insulating layer 314 formed over the insulating layer 312; the insulating layer 324 formed over the insulating layer 314; and the conductive layer 316b formed over the insulating layer 324 and connected to the conductive layer 310e.

The conductive layer 316b is connected to the conductive layer 310e in an opening portion formed in the insulating layers 312, 314, and 324.

(Resistor)

The resistor 114 includes the substrate 302; the insulating layer 305 formed over the substrate 302; the insulating layer 306 formed over the insulating layer 305; the semiconductor layer 308d formed over the insulating layer 305; the conductive layers 310f and 310g formed over the insulating layer 306 and the semiconductor layer 308d; the insulating layer 312 formed over the semiconductor layer 308d and the conductive layers 310f and 310g; the insulating layer 314 formed over the insulating layer 312; and the insulating layer 324 formed over the insulating layer 314.

The display device illustrated in FIGS. 43A to 43C is different from the display device illustrated in FIGS. 9A to 9C in the above embodiment in that the insulating layer 324 is formed over the insulating layer 314.

Because the insulating layer 324 is formed over the insulating layer 314, unevenness and the like due to transistors can be planarized. As the insulating layer 324, a silicon oxide film formed using an organosilane gas by a PE-CVD method can be used for example. The silicon oxide film can be formed to a thickness of from 300 nm to 600 nm. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like.

The insulating layer 324 is formed using an organosilane gas and oxygen by a CVD method at a substrate temperature of from 200° C. to 550° C., preferably from 220° C. to 500° C., further preferably from 300° C. to 450° C.

For the insulating layer 324, a photosensitive organic resin or a non-photosensitive organic resin can be used; for example, an acrylic resin, a benzocyclobutene resin, an epoxy resin, a siloxane resin, or the like can be used. Because a photosensitive organic resin is used, the side surface of the opening portion can be curved and the step in the opening portion can be gentle.

When the insulating layer 324 is formed over the insulating layer 314, the insulating layer 314 serves as a dielectric film of the capacitor 133_1 and is formed of a nitride insulating film, and the nitride insulating film tends to have a higher dielectric constant and a larger internal stress than those of an oxide insulating film such as a silicon oxide film. Thus, if the insulating layer 314 is used alone as the dielectric film of the capacitor 133_1 without the insulating layer 324 and the thickness of the insulating layer 314 is small, the capacitance value of the capacitor 133_1 becomes too large, which makes it difficult to increase the speed of writing a video signal to a pixel with low power consumption. In reverse, when the thickness of the insulating layer 314 is large, internal stress is too large and degradation of electrical characteristics, such as a change in threshold voltage of a transistor, might occur. Further, when the internal stress of the insulating layer 314 is too large, the insulating layer 314 tends to be peeled off from the substrate 302, so that the yield is reduced. The insulating layer 324 that has a relative dielectric constant lower than that of the insulating layer 314 is used together with the insulating layer 314 as the dielectric film of the capacitor included in the pixel, so that the dielectric constant of the dielectric film can be adjusted to a desirable value without increasing the thickness of the insulating layer 314.

Figure 44A:
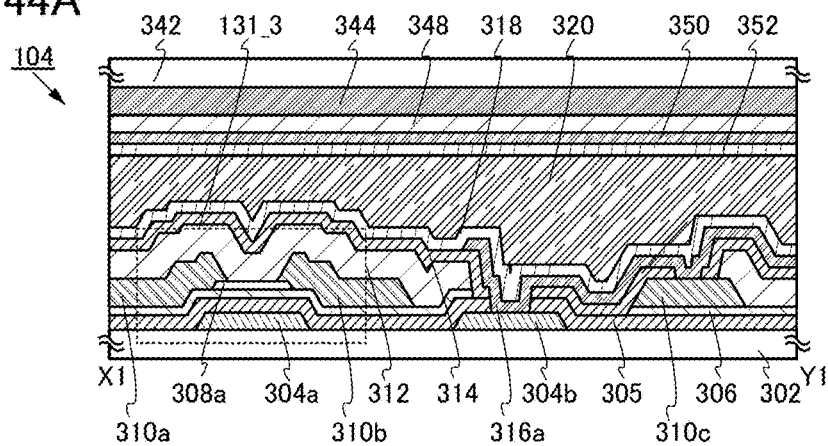
FIGS. 44A to 44C are cross-sectional views of a display device.
Figure 44B:
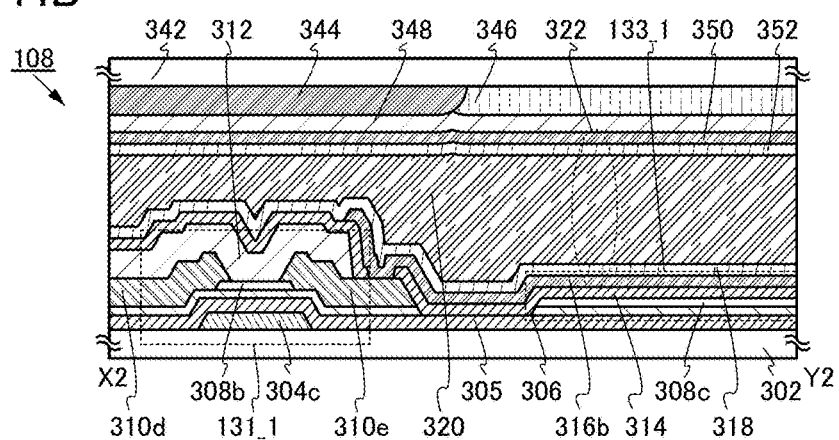
Figure 44C:
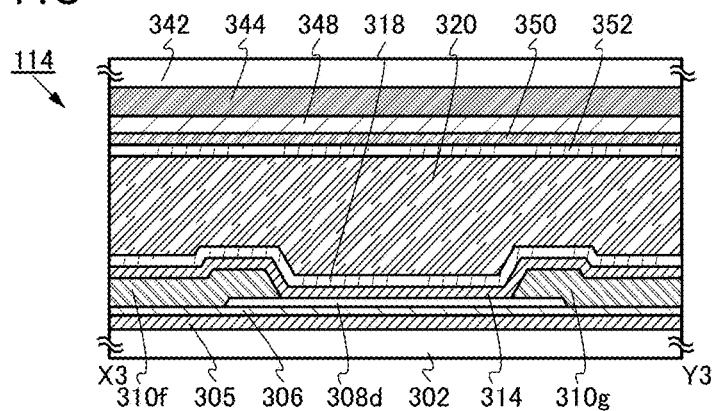

The display device illustrated in FIGS. 44A to 44C is described next.

The display device illustrated in FIGS. 44A to 44C includes the driver circuit portion 104, the pixel circuit portion 108, and the protection circuit portion 106. The display device illustrated in FIGS. 44A to 44C is described in detail below.

(Driver Circuit Portion)

The driver circuit portion 104 includes the substrate 30; the conductive layers 304a and 304b formed over the substrate 302; the insulating layer 305 formed over the substrate 302 and the conductive layers 304a and 304b; the insulating layer 306 formed over the insulating layer 305; the semiconductor layer 308a formed over the insulating layer 306 and overlapping with the conductive layer 304a; the conductive layers 310a and 310b formed over the insulating layer 306 and the semiconductor layer 308a; the conductive layer 310c formed over the insulating layer 306; the insulating layer 312 formed so as to cover the semiconductor layer 308a and the conductive layer 310a, 310b, and 310c; the insulating layer 314 formed over the insulating layer 312; and the conductive layer 316a formed over the insulating layer 314.

Note that the conductive layer 316a serves as a wiring that connects the conductive layer 304b to the conductive layer 310c. The conductive layer 304b is connected to the conductive layer 316a in an opening portion formed in the insulating layers 305 and 306 and the conductive layer 310c is connected to the conductive layer 316a in an opening portion formed in the insulating layers 312 and 314.

(Pixel Circuit Portion)

The pixel circuit portion 108 includes the substrate 302; the conductive layer 304c formed over the substrate 302; the insulating layer 305 formed over the substrate 302 and the conductive layer 304c; the insulating layer 306 formed over the insulating layer 305; the semiconductor layer 308b formed over the insulating layer 306 and overlapping with the conductive layer 304c; the semiconductor layer 308c formed over the insulating layer 305; the conductive layers 310d and 310e formed over the insulating layer 306 and the semiconductor layer 308b; the insulating layer 312 formed so as to cover the semiconductor layers 308b and 308c and conductive layers 310d and 310e; the insulating layer 314 formed over the insulating layer 312; and the conductive layer 316b formed over the insulating layer 314 and connected to the conductive layer 310e.

The conductive layer 316b is connected to the conductive layer 310e in an opening portion formed in the insulating layers 312 and 314.

(Resistor)

The resistor 114 includes the substrate 302; the insulating layer 305 formed over the substrate 302; the insulating layer 306 formed over the insulating layer 305; the semiconductor layer 308d formed over the insulating layer 305; the conductive layers 310f and 310g formed over the insulating layer 306 and the semiconductor layer 308d; the insulating layer 312 formed over the semiconductor layer 308d and the conductive layers 310f and 310g; and the insulating layer 314 formed over the insulating layer 312.

The display device illustrated in FIGS. 44A to 44C has opening portions with shapes different from those in the display device illustrated in FIGS. 9A to 9C. Specifically, no insulating layer 312 is formed below the conductive layers 316a and 316b in the display device illustrated in FIGS. 44A to 44C.

In the display device in this embodiment, transistors included in the driver circuit portion 104 and the pixel circuit portion 108 and the resistor 114 can be formed at the same time. Thus, the resistor 114 can be formed without increasing the manufacturing cost and the like.

The structure described in this embodiment can be used in appropriate combination with any structure in the other embodiments.

Embodiment 8

In this embodiment, a structure of a transistor that can be used in the pixel circuit portion 108 and the driver circuit portion 104 of the display device illustrated in FIG. 1A of Embodiment 1 will be described below with reference to FIGS. 45A to 45D.

Figure 45A:
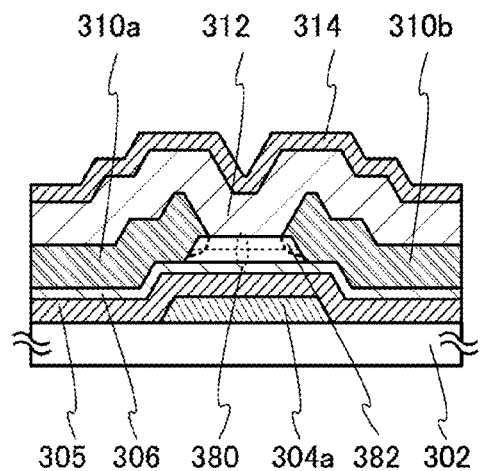
FIG. 45A is a cross-sectional view of a transistor.

The transistor illustrated in FIG. 45A includes the conductive layer 304a over the substrate 302, the insulating layers 305 and 306 over the substrate 302 and the conductive layer 304a, an oxide stack 380 over the insulating layer 306, and the conductive layers 310a and 310b over the insulating layer 306 and the oxide stack 380. The transistor illustrated in FIG. 45A can further be provided with the insulating layers 312 and 314 over the transistor, specifically, over the oxide stack 380 and the conductive layers 310a and 310b.

For the substrate 302, the conductive layer 304a, the insulating layers 305 and 306, and the conductive layers 310a and 310b, the description in the above embodiments can be referred to.

Note that depending on the kind of conductive films used for the conductive layers 310a and 310b, oxygen is removed from part of the oxide stack 380 or a mixed layer is formed so that a pair of n-type regions 382 are formed in the oxide stack 380 in some cases. In FIG. 45A, the n-type regions 382 can be formed in regions of the oxide stack 380 which are in the vicinity of the interface with the conductive layers 310a and 310b. The n-type regions 382 can function as source and drain regions.

In the transistor illustrated in FIG. 45A, the conductive layer 304a functions as a gate electrode, the conductive layer 310a functions as one of a source electrode and a drain electrode, and the conductive layer 310b functions as the other of the source electrode and the drain electrode.

In the transistor illustrated in FIG. 45A, the distance in a region of the oxide stack 380 that overlaps with the conductive layer 304a and that is between the conductive layer 310a and the conductive layer 310b is referred to as a channel length. A channel formation region refers to a region of the oxide stack 380 that overlaps with the conductive layer 304a and that is sandwiched between the conductive layer 310a and the conductive layer 310b. A channel is a main current path in the channel formation region. In addition, the channel formation region includes a channel region and corresponds to the oxide stack 380 here.

Here, the oxide stack 380 will be described in detail with reference to FIG. 45B.

Figure 45B:
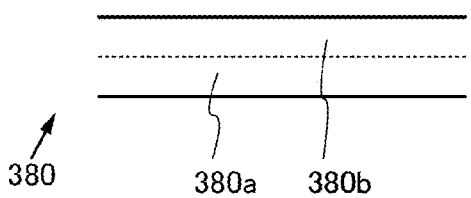
FIGS. 45B to 45D are diagrams illustrating an oxide stack.

FIG. 45B is an enlarged view of a region of the oxide stack 380 which is surrounded by the broken line in FIG. 45A. The oxide stack 380 includes an oxide semiconductor layer 380a and an oxide layer 380b.

The oxide semiconductor layer 380a preferably includes a layer represented by an In-M-Zn oxide that contains at least indium (In), zinc (Zn), and M (M is a metal such as Al, Ga, Ge, Y, Zr, Sn, La, Ce, or Hf). The oxide semiconductor materials, the formation method, and the like that can be used for the semiconductor layers 308a, 308b, 308c, and 308d described in the above embodiments can be referred to for those of the oxide semiconductor layer 380a.

The oxide layer 380b contains one or more kinds of elements contained in the oxide semiconductor layer 380a. The energy at the bottom of the conduction band of the oxide layer 380b is located closer to the vacuum level than that of the oxide semiconductor layer 380a by 0.05 eV or more, 0.07 eV or more, 0.1 eV or more, or 0.15 eV or more and 2 eV or less, 1 eV or less, 0.5 eV or less, or 0.4 eV or less. In this case, when an electric field is applied to the conductive layer 304a functioning as a gate electrode, a channel is formed in the oxide semiconductor layer 380a having the lowest energy at the bottom of the conduction band in the oxide stack 380. In other words, the oxide layer 380b is placed between the oxide semiconductor layer 380a and the insulating layer 306, whereby the channel of the transistor can be formed in the oxide semiconductor layer 380a not in contact with the insulating layer 312.

Since the oxide layer 380b contains one or more elements contained in the oxide semiconductor layer 380a, interface scattering is unlikely to occur at the interface between the oxide semiconductor layer 380a and the oxide layer 380b. Thus, transfer of carriers is not inhibited between the oxide semiconductor layer 380a and the oxide layer 380b, resulting in an increase in the field-effect mobility of the transistor. Moreover, an interface state is unlikely to be formed between the oxide semiconductor layer 380a and the oxide layer 380b. If an interface state is formed at an interface between the oxide layer 380b and the oxide semiconductor layer 380a, a second transistor in which the interface serves as a channel and which has a different threshold voltage might be formed and the apparent threshold voltage of the transistor might vary. Thus, with the oxide layer 380b, fluctuation in the electrical characteristics of the transistors, such as threshold voltage, can be reduced.

As the oxide layer 380b, an oxide layer that is represented by an In-M-Zn-based oxide (M is a metal such as Al, Ti, Ga, Ge, Y, Zr, Sn, La, Ce, or Hf) and contains a larger amount of M in an atomic ratio than that in the oxide semiconductor layer 380a is used. Specifically, the amount of any of the above elements in the oxide layer 380b in an atomic ratio is one and a half times or more, preferably two times or more, more preferably three times or more as large as that in the oxide semiconductor layer 380a in an atomic ratio. Any of the above elements is more strongly bonded to oxygen than indium is, and thus can suppress generation of an oxygen vacancy in the oxide layer. In other words, the oxide layer 380b is an oxide layer in which oxygen vacancies are less likely to be generated than in the oxide semiconductor layer 380a.

That is to say, when each of the oxide semiconductor layer 380a and the oxide layer 380b is an In-M-Zn-based oxide containing at least indium, zinc, and M (M is a metal such as Al, Ti, Ga, Ge, Y, Zr, Sn, La, Ce, or Hf), the atomic ratio of In to M and Zn in the oxide layer 380b is $x_1:y_1:z_1$, and the atomic ratio of In to M and Zn in the oxide semiconductor layer 380a is $x_2:y_2:z_2$, $y_1/x_1$ is preferably larger than $y_2/x_2$. $y_1/x_1$ is one and a half times or more, preferably two times or more, more preferably three times or more as large as $y_2/x_2$. At this time, when $y_2$ is greater than or equal to $x_2$ in the oxide semiconductor layer 380a, a transistor can have stable electrical characteristics. However, when $y_2$ is three times or more as large as $x_2$, the field-effect mobility of the transistor is reduced; accordingly, $y_2$ is preferably smaller than 3 times $x_2$.

When the oxide semiconductor layer 380a is an In-M-Zn-based oxide, the atomic ratio of In to M is preferably as follows: the proportion of In is 25 atomic % or higher and the proportion of M is lower than 75 atomic %; more preferably, the proportion of In is 34 atomic % or higher and the proportion of M is lower than 66 atomic %. When the oxide layer 380b is an In-M-Zn oxide, it is preferable that, in the atomic ratio of In and M, the proportion of In be lower than 50 atomic % and the proportion of M be 50 atomic % or higher, and it is more preferable that, in the atomic ratio of In and M, the proportion of In be lower than 25 atomic % and the proportion of M be 75 atomic % or higher.

For the oxide semiconductor layer 380a and the oxide layer 380b, oxide semiconductors containing indium, zinc, and gallium can be used. Specifically, the oxide semiconductor layer 380a can be formed using an In—Ga—Zn-based oxide whose atomic ratio of In to Ga and Zn is 1:1:1, an In—Ga—Zn-based oxide whose atomic ratio of In to Ga and Zn is 3:1:2, or a metal oxide target having a composition in the neighborhood of any of the above atomic ratios. The oxide layer 380b can be formed using an In—Ga—Zn-based oxide whose atomic ratio of In to Ga and Zn is 1:3:2, an In—Ga—Zn-based oxide whose atomic ratio of In to Ga and Zn is 1:3:4, an In—Ga—Zn-based oxide whose atomic ratio of In to Ga and Zn is 1:6:2, an In—Ga—Zn-based oxide whose atomic ratio of In to Ga and Zn is 1:6:4, an In—Ga—Zn-based oxide whose atomic ratio of In to Ga and Zn is 1:6:10, an In—Ga—Zn-based oxide whose atomic ratio of In to Ga and Zn is 1:9:6, or a metal oxide target having a composition in the neighborhood of any of the above atomic ratios.

The thickness of the oxide semiconductor layer 380a is from 3 nm to 200 nm, preferably from 3 nm to 100 nm, more preferably from 3 nm to 50 nm. The thickness of the oxide layer 380b is from 3 nm to 100 nm, preferably from 3 nm to 50 nm.

Next, the band structure of the oxide stack 380 will be described with reference to FIGS. 45C and 45D.

For example, the oxide semiconductor layer 380a is formed using an In—Ga—Zn-based oxide having an energy gap of 3.15 eV, and the oxide layer 380b is formed using an In—Ga—Zn-based oxide having an energy gap of 3.5 eV. Note that the energy gap can be measured using a spectroscopic ellipsometer (UT-300 manufactured by HORIBA JOBIN YVON S.A.S.).

The energy gaps between the vacuum levels and the tops of the valence bands (also called ionization potential) of the oxide semiconductor layer 380a and the oxide layer 380b are 8 eV and 8.2 eV, respectively. Note that the energy difference between the vacuum level and the top of the valence band can be measured using an ultraviolet photoelectron spectroscopy (UPS) device (VersaProbe manufactured by ULVAC-PHI, Inc.).

Thus, the energy gaps between the vacuum levels and the bottoms of the conduction bands (also called electron affinity) of the oxide semiconductor layer 380a and the oxide layer 380b are 4.85 eV and 4.7 eV, respectively.

Figure 45C:
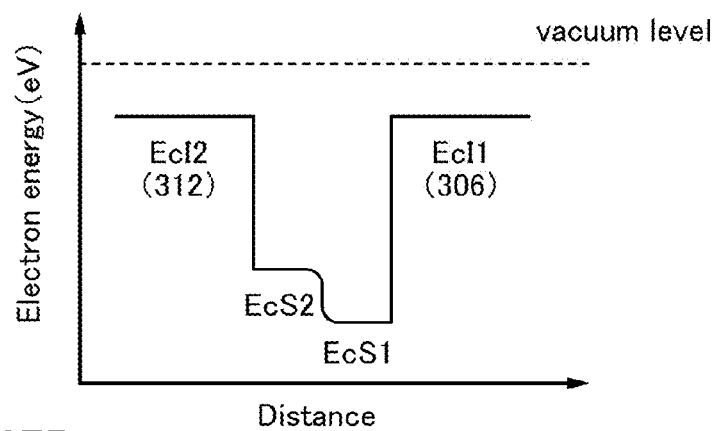

FIG. 45C schematically illustrates a part of the band structure of the oxide stack 380. Here, a structure where silicon oxide films are provided in contact with the oxide stack 380 will be described. In FIG. 45C, EcI1 denotes the energy of the bottom of the conduction band in the silicon oxide film; EcS1 denotes the energy of the bottom of the conduction band in the oxide semiconductor layer 380a; EcS2 denotes the energy of the bottom of the conduction band in the oxide layer 380b; and EcI2 denotes the energy of the bottom of the conduction band in the silicon oxide film. Further, EcI1 corresponds to the insulating layer 306 in FIG. 45A, and EcI2 corresponds to the insulating layer 312 in FIG. 45A.

As illustrated in FIG. 45C, there is no barrier at the interface between the oxide semiconductor layer 380a and the oxide layer 380b, and the energy of the bottom of the conduction band is changed smoothly, or continuously. This is because the oxide layer 380b contains an element contained in the oxide semiconductor layer 380a and oxygen is transferred between the oxide semiconductor layer 380a and the oxide layer 380b, so that a mixed layer is formed.

As shown in FIG. 45C, the oxide semiconductor layer 380a in the oxide stack 380 serves as a well and a channel region of the transistor including the oxide stack 380 is formed in the oxide semiconductor layer 380a. Note that since the energy of the bottom of the conduction band of the oxide stack 380 is continuously changed, it can be said that the oxide semiconductor layer 380a and the oxide layer 380b are continuous.

Although trap levels due to impurities or defects might be formed in the vicinity of the interface between the oxide layer 380b and the insulating layer 312 as shown in FIG. 45C, the oxide semiconductor layer 380a can be distanced from the trap levels owing to existence of the oxide layer 380b. However, when the energy difference between EcS1 and EcS2 is small, an electron in the oxide semiconductor layer 380a might reach the trap level by passing over the energy difference. Since an electron is captured by the trap level to produce a negative charge at interface with the insulating layer, the threshold voltage of the transistor is shifted to the positive side. Therefore, it is preferable that the energy difference between EcS1 and EcS2 be 0.1 eV or more, more preferably 0.15 eV or more, because a change in the threshold voltage of the transistor is prevented and stable electrical characteristics are obtained.

Figure 45D:
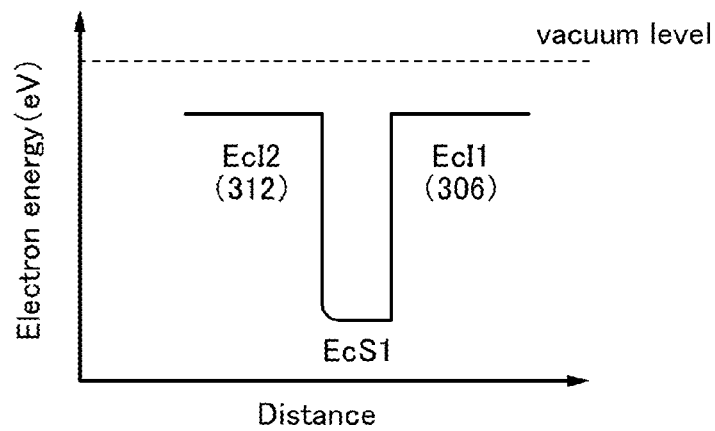

FIG. 45D schematically illustrates a part of the band structure of the oxide stack 380, which is a variation of the band structure shown in FIG. 45C. Here, a structure where silicon oxide films provided in contact with the oxide stack 380 will be described. In FIG. 45D, EcI1 denotes the energy of the bottom of the conduction band in the silicon oxide film; EcS1 denotes the energy of the bottom of the conduction band in the oxide semiconductor layer 380a; and EcI2 denotes the energy of the bottom of the conduction band in the silicon oxide film. Further, EcI1 corresponds to the insulating layer 306 in FIG. 45A, and EcI2 corresponds to the insulating layer 312 in FIG. 45A.

In the transistor illustrated in FIG. 45A, an upper portion of the oxide stack 380, that is, the oxide layer 380b might be etched s in formation of the conductive layers 310a and 310b. However, a mixed layer of the oxide semiconductor layer 380a and the oxide layer 380b is likely to be formed on the top surface of the oxide semiconductor layer 380a in formation of the oxide layer 380b.

For example, when the oxide semiconductor layer 380a is an In—Ga—Zn-based oxide formed with use of a metal oxide target whose atomic ratio of In to Ga and Zn is 1:1:1 or an In—Ga—Zn-based oxide whose atomic ratio of In to Ga and Zn is 3:1:2, and the oxide layer 380b is an In—Ga—Zn-based oxide formed with a metal oxide target whose atomic ratio of In to Ga and Zn is 1:3:2 or an In—Ga—Zn-based oxide whose atomic ratio of In to Ga and Zn is 1:6:4, the Ga content in the oxide layer 380b is higher than that in the oxide semiconductor layer 380a. Thus, a GaOx layer or a mixed layer whose Ga content is higher than that in the oxide semiconductor layer 380a can be formed on the top surface of the oxide semiconductor layer 380a.

For that reason, even if the oxide layer 380b is etched, the energy of the bottom of the conduction band of EcS1 on the EcI2 side is increased and thus the band structure shown in FIG. 45D can be obtained.

As in the band structure illustrated in FIG. 45D, in observation of a cross section of a channel region, only the oxide semiconductor layer 380a in the oxide stack 380 is apparently observed in some cases. However, a mixed layer that contains Ga more than the oxide semiconductor layer 380a does is formed over the oxide semiconductor layer 380a in fact, and thus the mixed layer can be regarded as a 1.5-th layer. Note that the mixed layer can be confirmed by analyzing a composition in the upper portion of the oxide semiconductor layer 380a, when the elements contained in the oxide stack 380 are measured by an EDX analysis, for example. The mixed layer can be confirmed, for example, in such a manner that the Ga content in the composition in the upper portion of the oxide semiconductor layer 380a is larger than the Ga content in the oxide semiconductor layer 380a.

In this embodiment, the oxide stack 380 has a two-layer structure where the oxide semiconductor layer 380a and the oxide layer 380b are stacked as an example, but this example does not limit the present invention and a stacked structure of three or more layers can be employed. For example, as a three-layer structure, another layer may be provided under the oxide stack 380, i.e., under the oxide semiconductor layer 380a. As a film under the oxide semiconductor layer 380a, a film similar to the oxide layer 380b can be applied for example.

The structure described in this embodiment can be used in appropriate combination with any structure in the other embodiments.

Embodiment 9

In this embodiment, an oxide semiconductor film which can be used in one embodiment of the present invention will be described with reference to observation results of electron diffraction patterns.

A CAAC-OS film as an example of an oxide semiconductor film is described below with reference to FIG. 62, FIGS. 63A to 63D, FIG. 64, FIGS. 65A and 65B, FIGS. 66A to 66D, FIGS. 67A and 67B, FIGS. 68A to 68D, FIGS. 69A and 69B, and FIGS. 70A to 70D.

The CAAC-OS film used in this embodiment is an In—Ga—Zn-based oxide film which is formed by a sputtering method using a deposition gas containing oxygen and a metal oxide target of an In—Ga—Zn oxide (having an atomic ratio of In:Ga:Zn=1:1:1). For the detail description of the CAAC-OS film, description in the above embodiment can be referred to.

Figure 62:
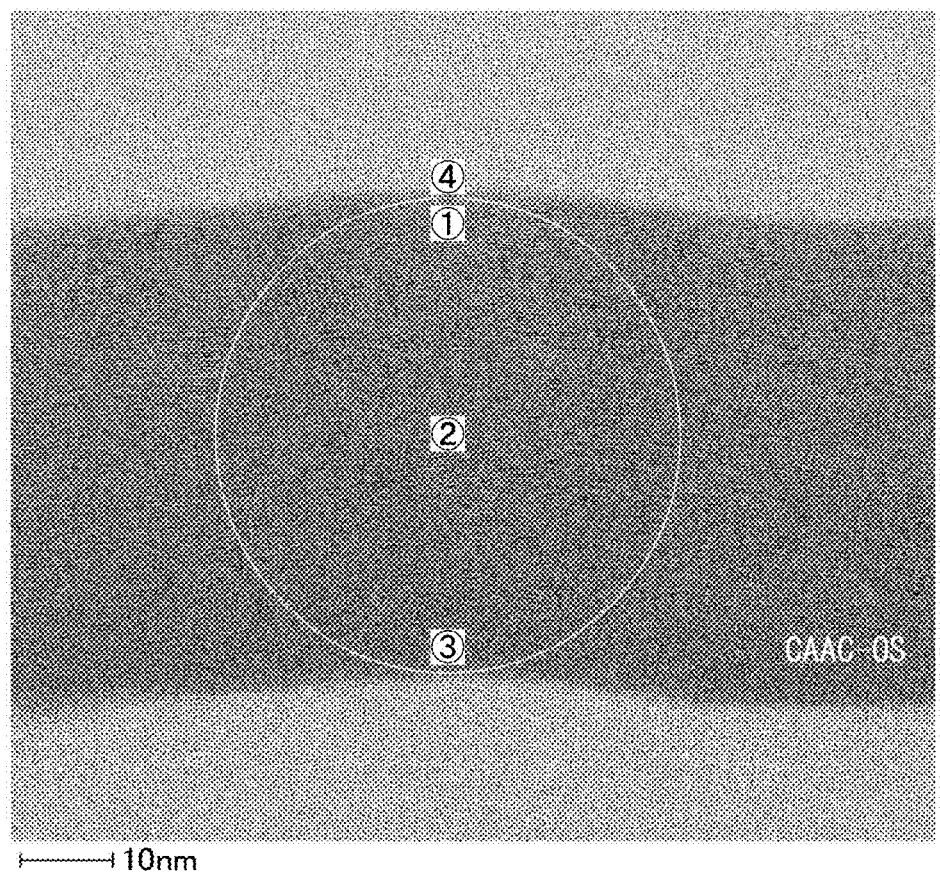
FIG. 62 shows a cross-sectional TEM image of a CAAC-OS film.

FIG. 62 is a cross-sectional transmission electron microscopy (TEM) image of the CAAC-OS film. FIGS. 63A to 63D show electron diffraction patterns of Points 1 to 4 in FIG. 62 which are obtained by measurement using electron diffraction.

The cross-sectional TEM image shown in FIG. 62 is taken with a transmission electron microscope ("H-9000NAR" manufactured by Hitachi High-Technologies Corporation) at an acceleration voltage of 300 kV and a magnification of 2,000,000 times. The electron diffraction patterns shown in FIGS. 63A to 63D are obtained with a transmission electron microscope ("HF-2000" manufactured by Hitachi High-Technologies Corporation) at an acceleration voltage of 200 kV and beam diameters of about 1 nmφ and about 50 nmφ. Note that electron diffraction with a beam diameter of 10 nmφ or less is particularly referred to as nanobeam electron diffraction hereinafter. Further, a measurement area of the electron diffraction with a beam diameter of about 1 nmφ is from 5 nmφ to 10 nmφ.

Figure 63A:
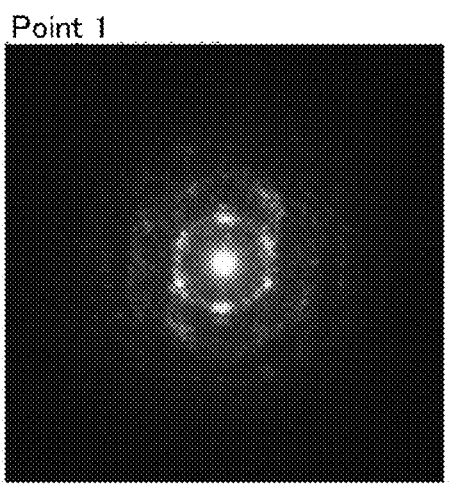
FIGS. 63A to 63D are electron diffraction patterns of the CAAC-OS film.
Figure 63B:
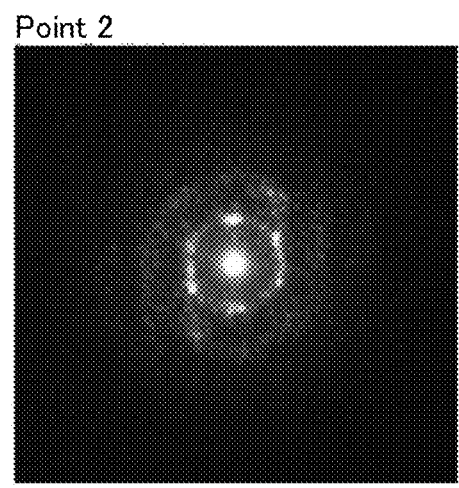
Figure 63C:
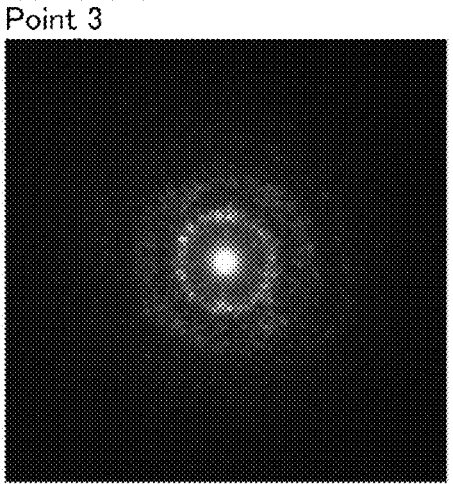
Figure 63D:
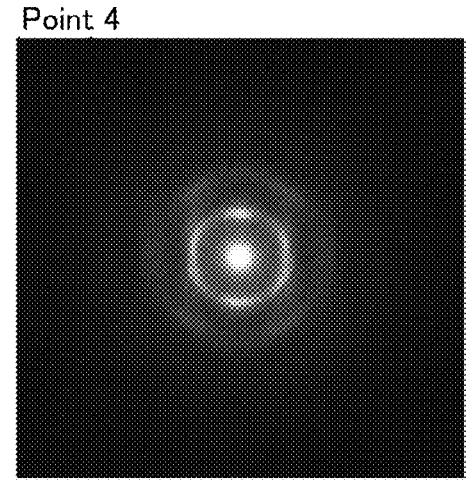

Electron diffraction patterns of Point 1 (the surface side of the film), Point 2 (the center of the film), and Point 3 (the base side of the film) shown in FIG. 62 correspond to FIGS. 63A, 63B, and 63C, respectively and are obtained with an electron-beam diameter of about 1 nmφ. An electron diffraction pattern in Point 4 (the whole film) shown in FIG. 62 corresponds to FIG. 63D and is obtained with an electron-beam diameter of about 50 nmφ.

A pattern formed by spots (bright points) is observed in each of the electron diffraction patterns of Point 1 (on the surface side of the film) and Point 2 (the center of the film), and a slightly broken pattern is observed in Point 3 (on the base side of the film). This indicates that the crystal state varies in the thickness direction in the CAAC-OS film. Note that a pattern formed by spots (bright points) is observed in Point 4 (the whole film), which indicates that the whole film is a CAAC-OS film or a film including a CAAC-OS film.

Figure 64:
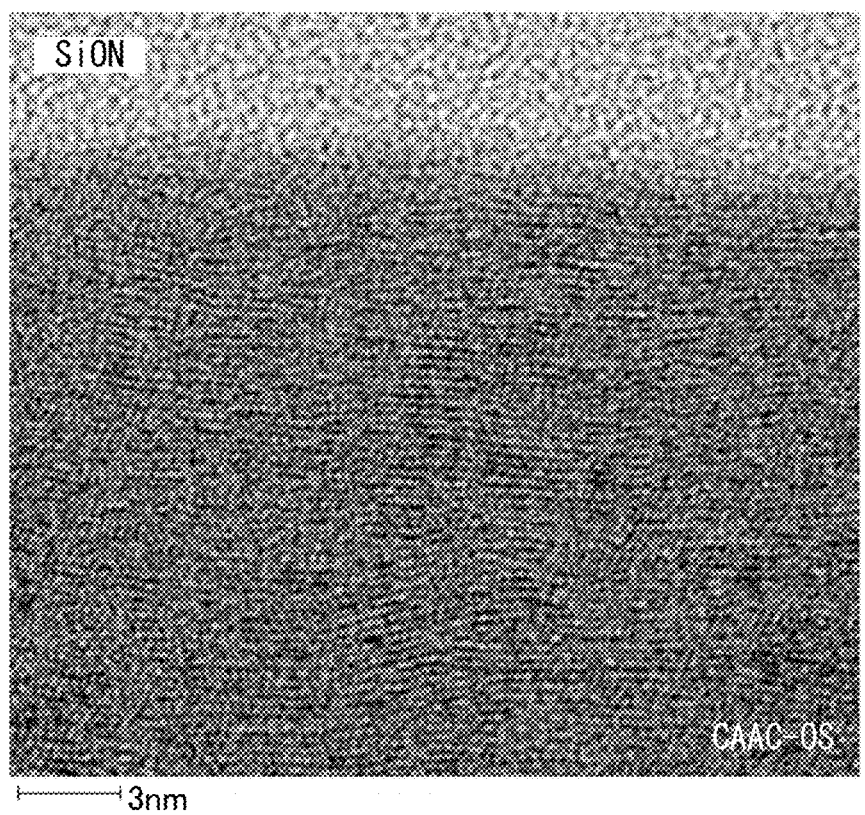
FIG. 64 shows a cross-sectional TEM image of the CAAC-OS film.

FIG. 64 is an enlarged view of a portion in the vicinity of Point 1 (on the surface side of the film) in FIG. 62. In FIG. 64, a clear lattice image which shows alignment of the CAAC-OS film extends to the interface with an SiON film that is an interlayer insulating film.

Figure 65A:
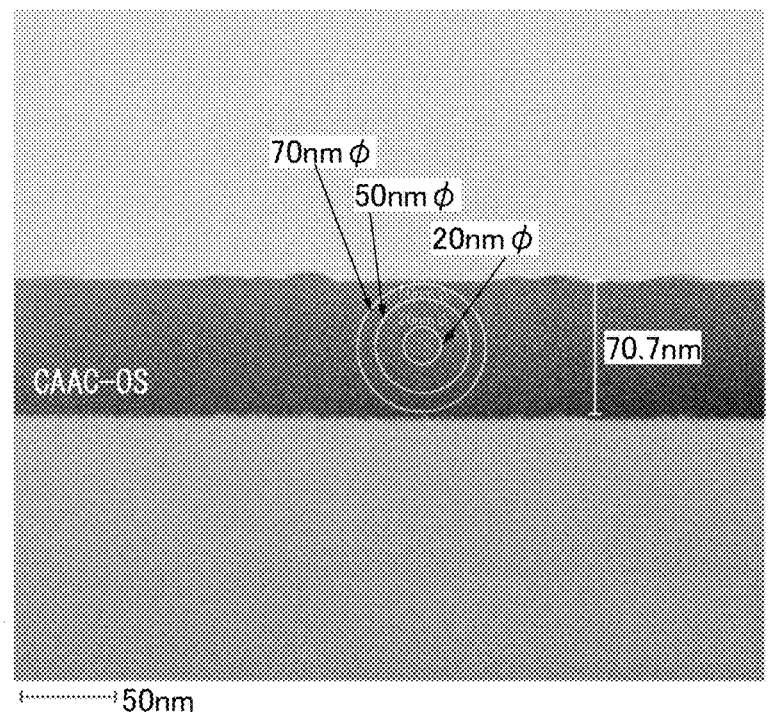
FIGS. 65A and 65B are a cross-sectional TEM pattern and an X-ray diffraction spectrum, respectively, of a CAAC-OS film.
Figure 65B:
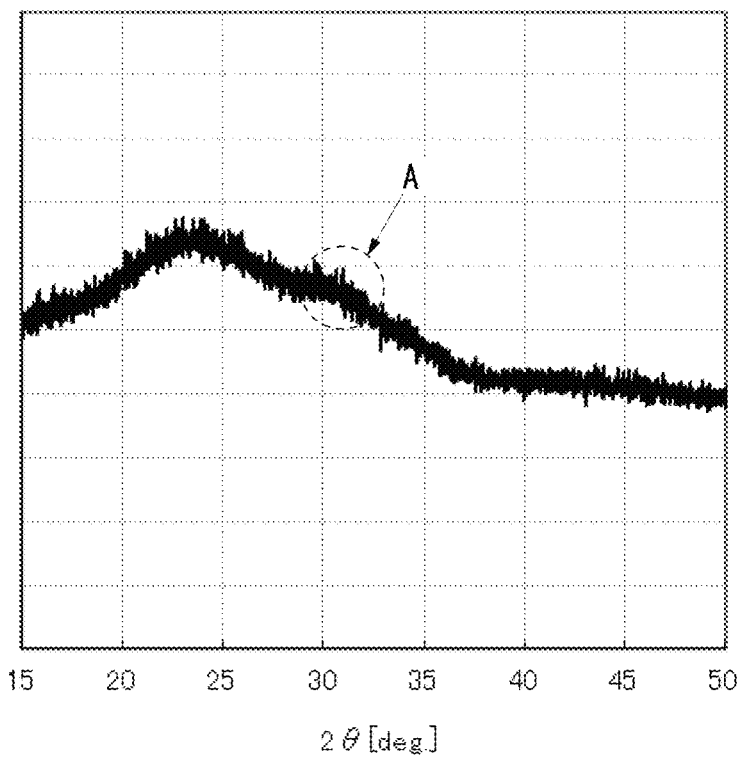
Figure 66A:
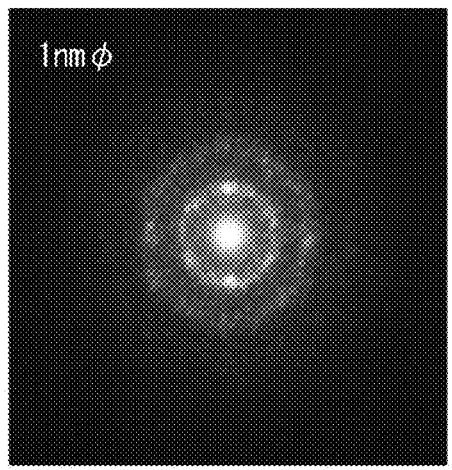
FIGS. 66A to 66D are electron diffraction patterns of the CAAC-OS film.
Figure 66B:
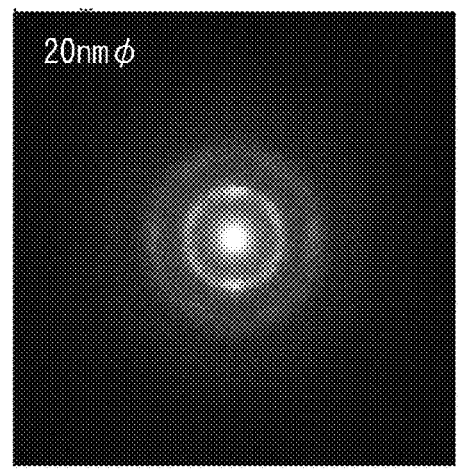
Figure 66C:
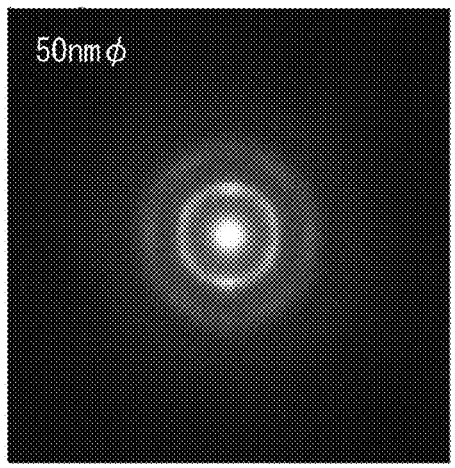
Figure 66D:
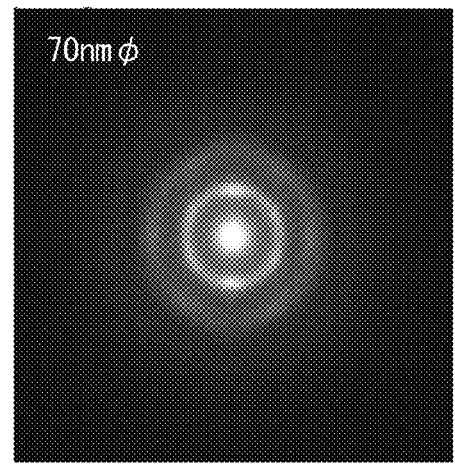

FIGS. 65A and 65B are a cross-sectional TEM photograph and an X-ray diffraction spectrum of a CAAC-OS film different from the CAAC-OS film used for the cross-sectional TEM image in FIG. 62. A CAAC-OS film may have a variety of forms, and Peak A which indicates a crystal component appears around 2θ=31° as shown in FIG. 65B, but the peak does not appear clearly in some cases.

FIGS. 66A to 66D show results of electron diffraction in regions in the CAAC-OS film with electron-beam diameters of 1 nmφ, 20 nmφ, 50 nmφ, and 70 nmφ. The regions are indicated by concentric circles in FIG. 65A. In the case of an electron-beam diameter of 1 nmφ, a pattern formed by clear spots (bright points) can be observed as in FIGS. 63A and 63B. As the electron-beam diameter is increased, the spots (bright points) become a bit unclear but a diffraction pattern can be observed; therefore, the whole film is a CAAC-OS film or a film including a CAAC-OS film.

Figure 67A:
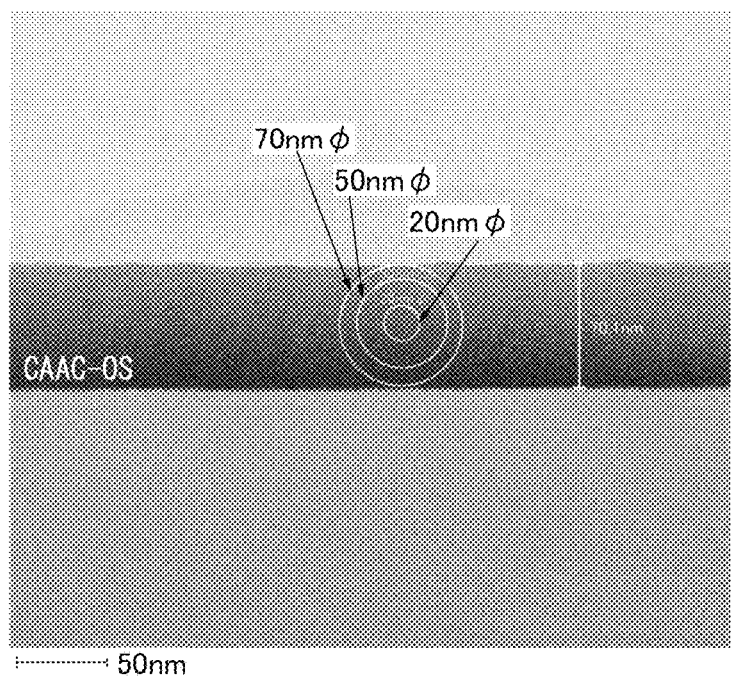
FIGS. 67A and 67B are a cross-sectional TEM image and an X-ray diffraction spectrum, respectively, of the CAAC-OS film.
Figure 67B:
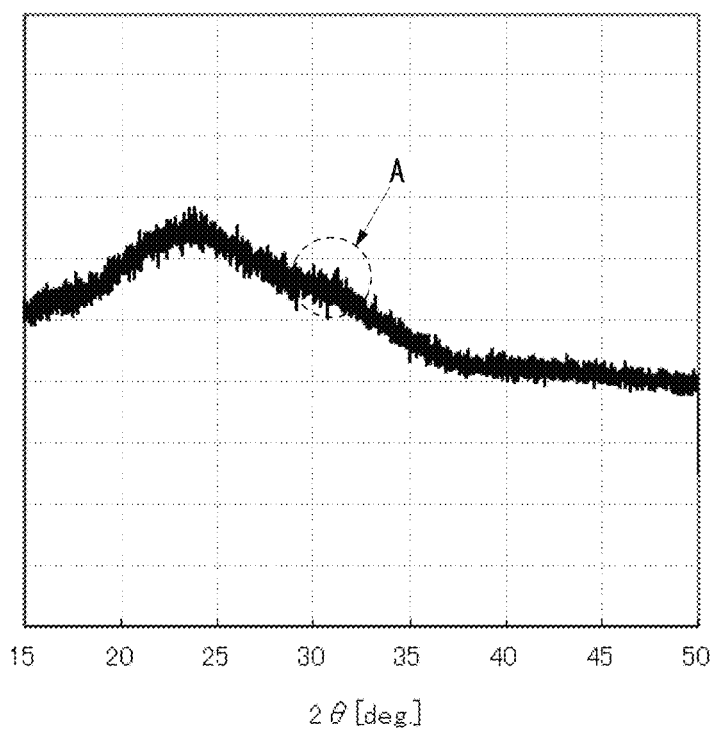
Figure 68A:
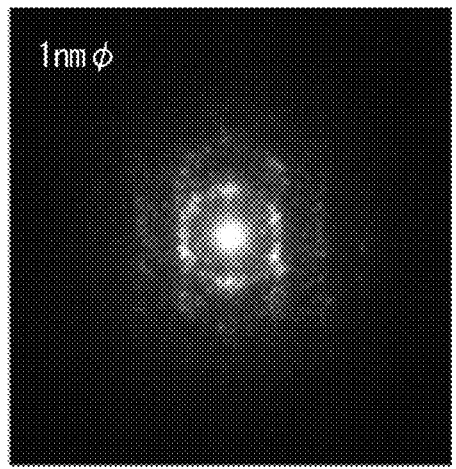
FIGS. 68A to 68D are electron diffraction patterns of the CAAC-OS film.
Figure 68B:
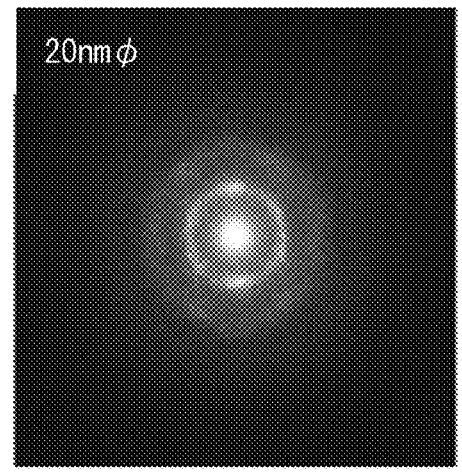
Figure 68C:
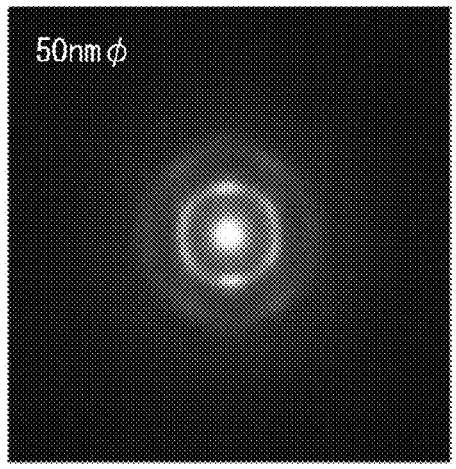
Figure 68D:
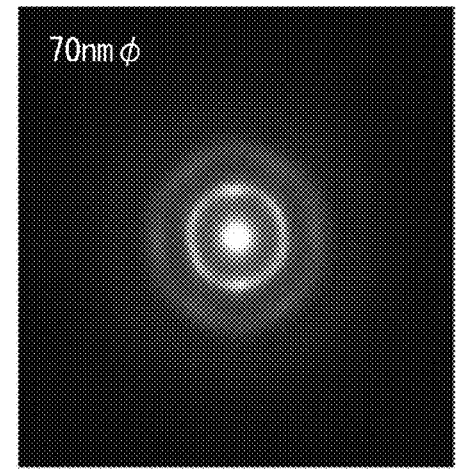

FIGS. 67A and 67B are a cross-sectional TEM image and an X-ray diffraction spectrum of the CAAC-OS film obtained by annealing the CAAC-OS film used for the cross-sectional TEM observation in FIG. 65A at 450° C.

FIGS. 68A to 68D show results of electron diffraction in regions in the CAAC-OS film with electron-beam diameters of 1 nmφ, 20 nmφ, 50 nmφ, and 70 nmφ. The regions are indicated by concentric circles in FIG. 67A. In the case of an electron-beam diameter of 1 nmφ, a pattern formed by clear spots (bright points) can be observed as in the results shown in FIGS. 66A to 66D. As the electron-beam diameter is increased, the spots (bright points) become a bit unclear but a diffraction pattern can be observed; therefore, the whole film is a CAAC-OS film or a film including a CAAC-OS film.

Figure 69A:
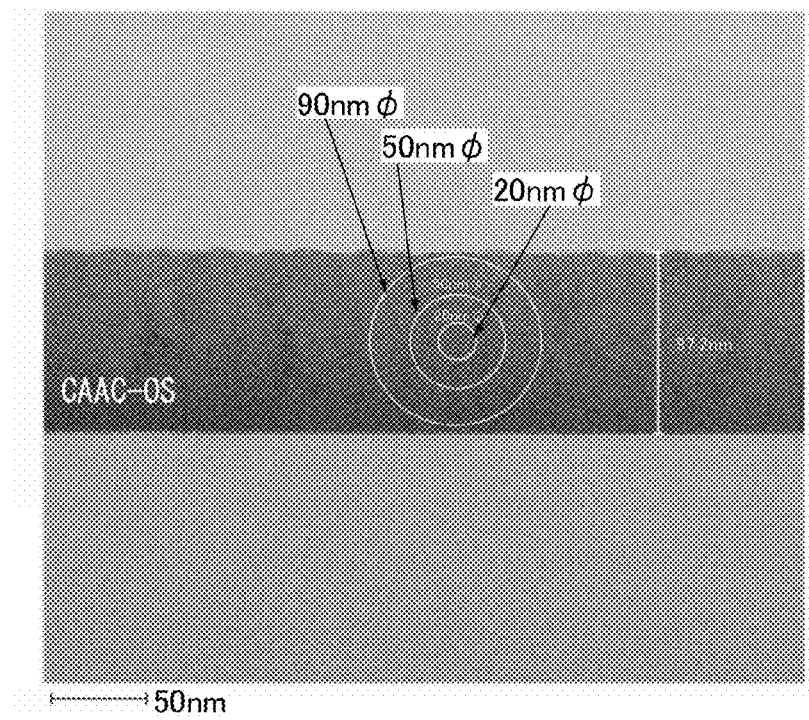
FIGS. 69A and 69B are a cross-sectional TEM pattern and an X-ray diffraction spectrum, respectively, of a CAAC-OS film.
Figure 69B:
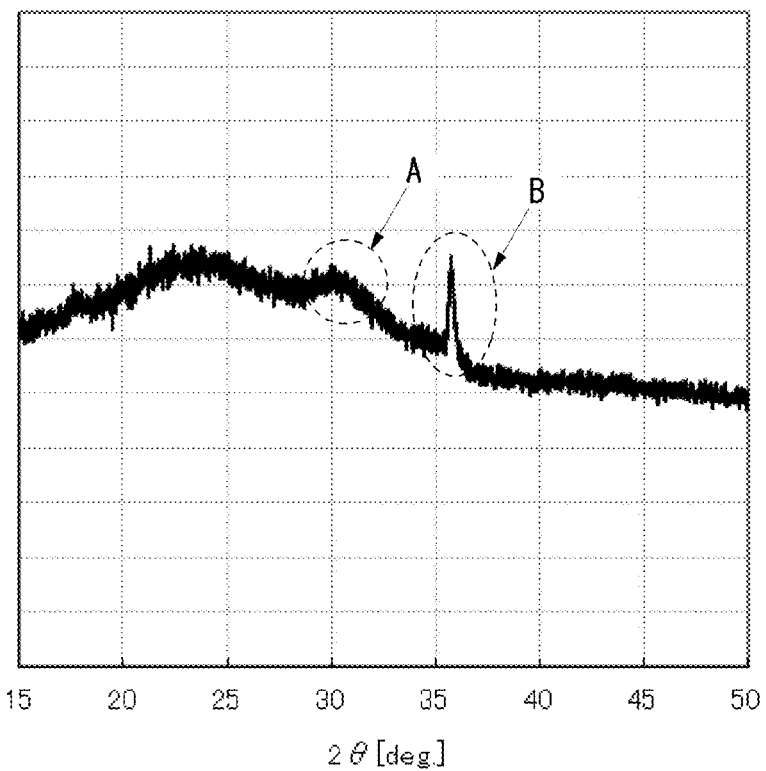
Figure 70A:
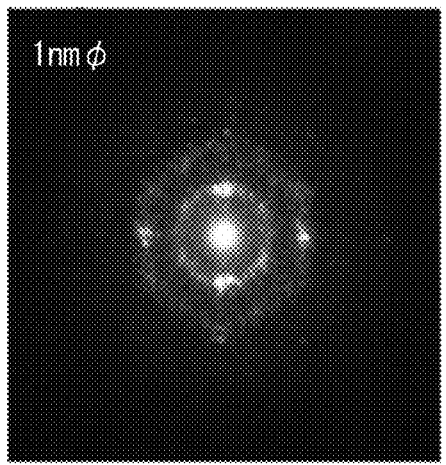
FIGS. 70A to 70D are electron diffraction patterns of the CAAC-OS film.
Figure 70B:
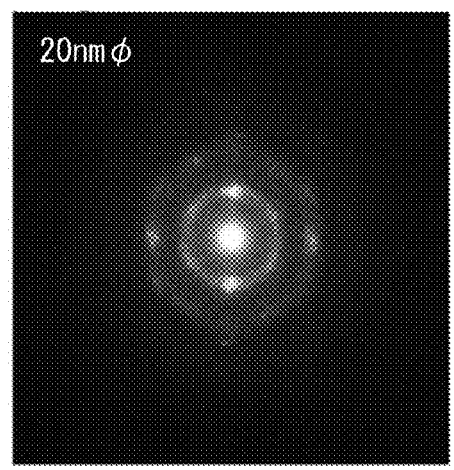
Figure 70C:
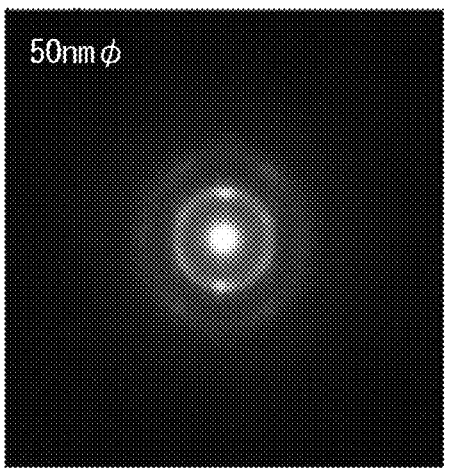
Figure 70D:
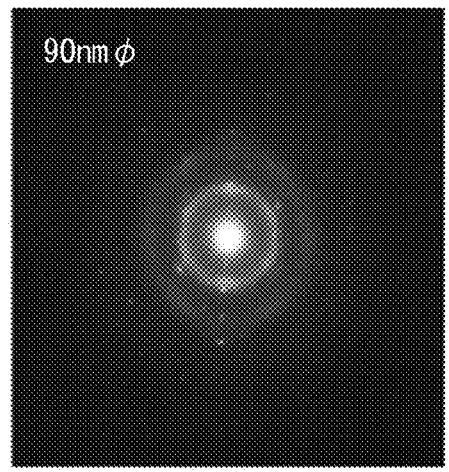

FIGS. 69A and 69B are a cross-sectional TEM image and an X-ray diffraction spectrum of a CAAC-OS film different from the CAAC-OS film used for the cross-sectional TEM image of FIG. 62. The CAAC-OS film has a variety of forms, and as shown in FIG. 69B, as well as Peak A indicating a crystal component around 2θ=31°, Peak B which is derived from a spinel crystal structure appears in some cases.

FIGS. 70A to 70D show results of electron diffraction in regions in the CAAC-OS film with electron-beam diameters of 1 nmφ, 20 nmφ, 50 nmφ, and 90 nmφ. The regions are indicated by concentric circles in FIG. 69A. In the case of an electron-beam diameter of 1 nmφ, a pattern formed by clear spots (bright points) can be observed. As the electron-beam diameter is increased, the spots (bright points) become a bit unclear but a diffraction pattern can be observed. Further, in the case of a beam diameter of 90 nmφ, clearer spots (bright points) can be observed. Accordingly, the whole film is a CAAC-OS film or a film including a CAAC-OS film.

Nanocrystalline oxide semiconductor films as examples of oxide semiconductor layers are described with reference to FIGS. 71A to 71D, FIGS. 72A and 72B, FIGS. 73A to 73C, FIG. 74, FIG. 75, FIGS. 76A and 76B, and FIG. 77.

An electron diffraction pattern obtained by electron diffraction with a beam diameter of 10 nmφ or less (nanobeam electron diffraction) of a nanocrystalline oxide semiconductor film is neither a halo pattern indicating an amorphous state nor a pattern with spots having regularity indicating a crystalline state in which crystals are aligned with a specific plane. That is, the nanocrystalline oxide semiconductor film is an oxide semiconductor film whose electron diffraction pattern has spots not having directionality.

Figure 71A:
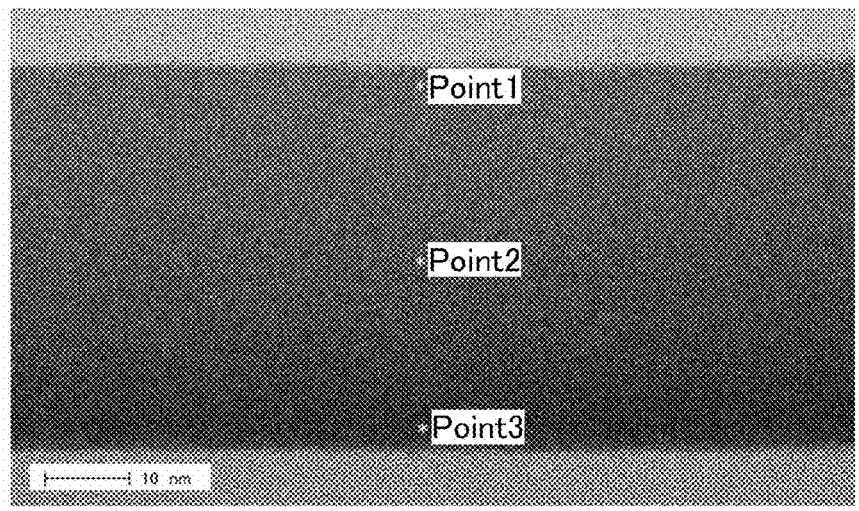
FIG. 71A is a cross-sectional TEM image of a nanocrystal oxide semiconductor film and FIGS. 71B to 71D are nanobeam electron diffraction patterns thereof.
Figure 71B:
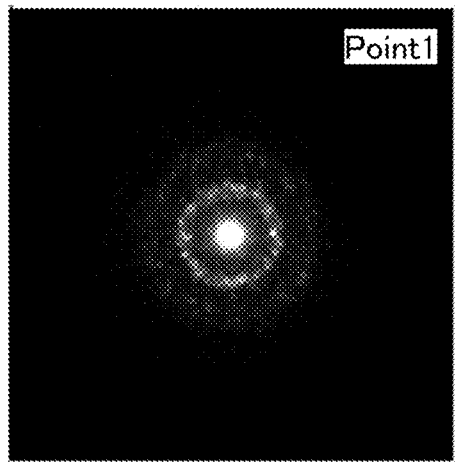
Figure 71C:
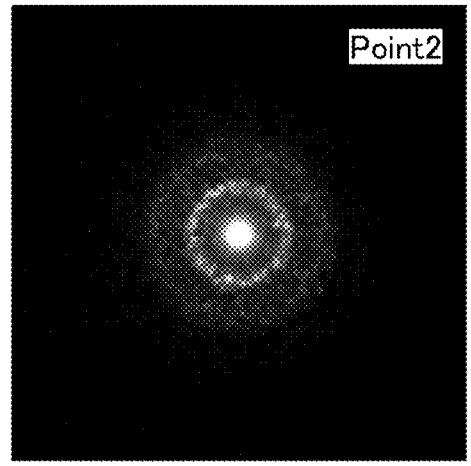
Figure 71D:
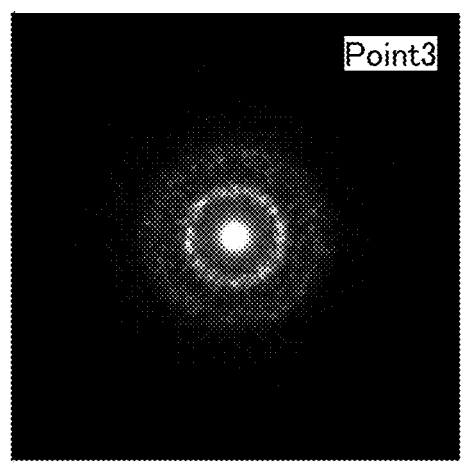

FIG. 71A is a cross-sectional transmission electron microscopy (TEM) image of a nanocrystalline oxide semiconductor film. FIGS. 71B, 71C, and 71D show electron diffraction patterns obtained by nanobeam electron diffraction performed on Points 1, 2, 3 in FIG. 71A, respectively.

A sample in which an In—Ga—Zn-based oxide film is formed, as an example of the nanocrystalline oxide semiconductor film in FIGS. 71A to 71D, over a quartz glass substrate to a thickness of 50 nm is used. The nanocrystalline oxide semiconductor film shown in FIGS. 71A to 71D is formed under the following conditions: an oxide target containing In, Ga, and Zn at an atomic ratio of 1:1:1 is used, the atmosphere is an oxygen atmosphere (flow rate of 45 sccm), the pressure is 0.4 Pa, a direct current (DC) power is 0.5 kW, and the substrate temperature is room temperature. Then, the width of the formed nanocrystalline oxide semiconductor film is reduced to 100 nm or less (e.g., 40 nm±10 nm), and a cross-sectional TEM image and nanobeam electron diffraction patterns are obtained.

FIG. 71A is the cross-sectional TEM image of the nanocrystalline oxide semiconductor film which is taken with a transmission electron microscope ("H-9000NAR" manufactured by Hitachi High-Technologies Corporation) at an acceleration voltage of 300 kV and at a magnification of 2,000,000 times. FIGS. 71B to 71D show the electron diffraction patterns obtained by nanobeam electron diffraction with a beam diameter of about 1 nmφ, with a transmission electron microscope ("HF-2000" manufactured by Hitachi High-Technologies Corporation) at an acceleration voltage of 200 kV. Note that the measurement area of the nanobeam electron diffraction with a beam diameter of about 1 nmφ is from 5 nmφ to 10 nmφ.

As shown in FIG. 71B, in the nanobeam electron diffraction pattern of the nanocrystalline oxide semiconductor film, a plurality of circumferentially arranged spots (bright points) are observed. In other words, in the pattern of the nanocrystalline oxide semiconductor film, a plurality of circumferentially (concentrically) distributed spots are observed, or a plurality of circumferentially distributed spots form a plurality of concentric circles.

In FIG. 71C showing the central portion of the nanocrystalline oxide semiconductor film in the thickness direction and in FIG. 71D showing the vicinity of an interface between the nanocrystalline oxide semiconductor film and the quartz glass substrate, a plurality of circumferentially distributed spots are observed as in FIG. 71B. In FIG. 71C, the distance from a main spot to each of the circumferentially distributed spots is in a range from 3.88/nm to 4.93/nm, or from 0.203 nm to 0.257 nm when converted into interplanar spacing.

The nanobeam electron diffraction patterns shown in FIGS. 71B to 71D indicate that the nanocrystalline oxide semiconductor film includes a plurality of crystal parts whose surface orientations are random and whose sizes are different from each other.

Figure 72A:
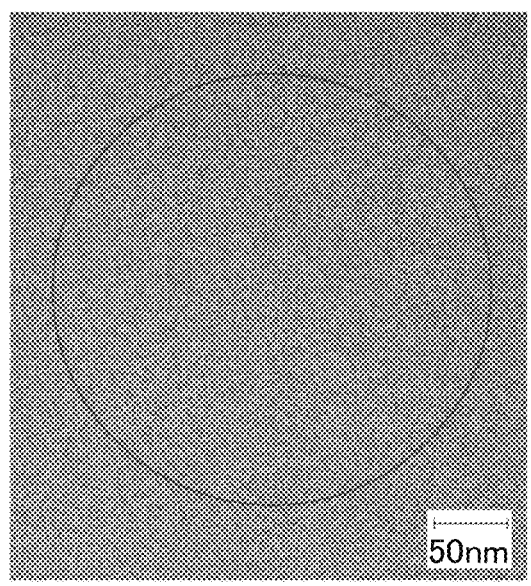
FIG. 72A is a plane TEM image of the nanocrystal oxide semiconductor film and FIG. 72B is a selected-area electron diffraction pattern thereof.
Figure 72B:
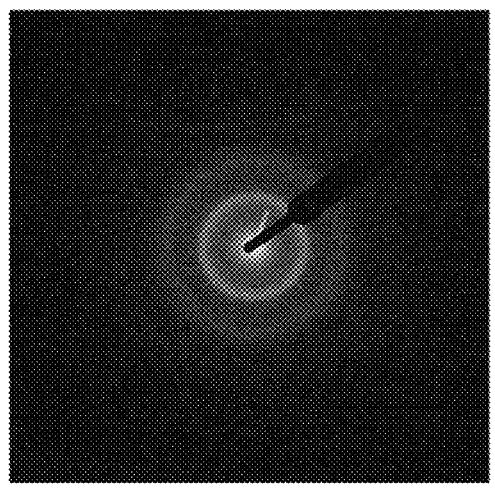

FIG. 72A is a plane TEM image of a nanocrystalline oxide semiconductor film. FIG. 72B shows an electron diffraction pattern obtained by selected-area electron diffraction performed on a region surrounded by a circle in FIG. 72A.

A sample in which an In—Ga—Zn-based oxide film is formed, as an example of the nanocrystalline oxide semiconductor film shown in FIGS. 72A and 72B, over a quartz glass substrate to a thickness of 30 nm is used. The nanocrystalline oxide semiconductor film shown in FIGS. 72A and 72B is formed under the following conditions: an oxide target containing In, Ga, and Zn at an atomic ratio of 1:1:1 is used, the atmosphere is an oxygen atmosphere (flow rate of 45 sccm), the pressure is 0.4 Pa, a direct current (DC) power is 0.5 kW, and the substrate temperature is room temperature. Then, the sample is thinned, and the plane TEM image and the selected-area electron diffraction pattern of the nanocrystalline oxide semiconductor film are obtained.

FIG. 72A is the plane TEM image of the nanocrystalline oxide semiconductor film which is taken with a transmission electron microscope ("H-9000NAR" manufactured by Hitachi High-Technologies Corporation) at an acceleration voltage of 300 kV and at a magnification of 500,000 times. FIG. 72B is the electron diffraction pattern obtained by electron diffraction with a selected area of 300 nmφ. Note that the measurement area is 300 nmφ or larger in consideration of electron beam expansion.

As shown in FIG. 72B, the electron diffraction pattern of the nanocrystalline oxide semiconductor film which is obtained by selected-area electron diffraction the measurement area of which is wider than that of the nanobeam electron diffraction is a halo pattern, in which the plurality of spots observed by the nanobeam electron diffraction are not observed.

Figure 73A:
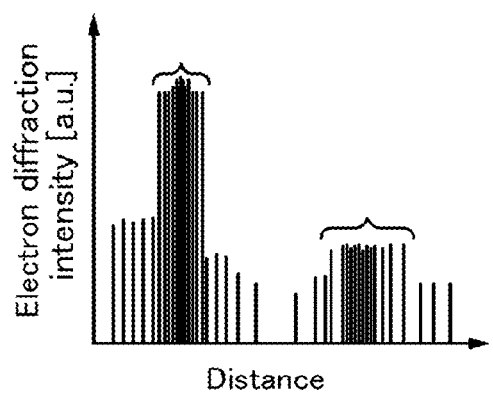
FIGS. 73A to 73C are conceptual diagrams of electron diffraction intensity distribution.
Figure 73B:
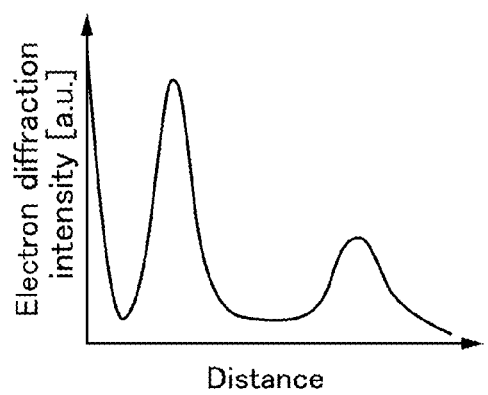
Figure 73C:
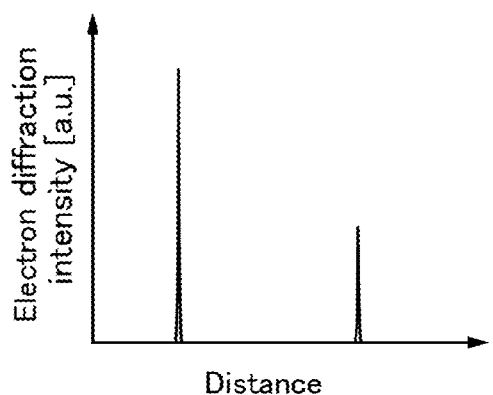

FIGS. 73A to 73C conceptually show diffraction intensity distribution in the electron diffraction patterns shown in FIGS. 71B to 71D and FIG. 72B. FIG. 73A is a conceptual diagram showing diffraction intensity distribution in the nanobeam electron diffraction patterns shown in FIGS. 71B to 71D. FIG. 73B is a conceptual diagram showing diffraction intensity distribution in the selected-area electron diffraction pattern shown in FIG. 72B. FIG. 73C is a conceptual diagram showing diffraction intensity distribution in an electron diffraction pattern of a single crystal structure or a polycrystalline structure.

In each of FIGS. 73A to 73C, the vertical axis represents the electron diffraction intensity (arbitrary unit) indicating distribution of spots or the like and the horizontal axis represents the distance from a main spot.

In FIG. 73C for the single crystal structure or the polycrystalline structure, spots are each observed at a specific distance from the main spot, which is based on interplanar spacing (d value) between planes with which crystal parts are aligned.

As shown in each of FIGS. 71B to 71D, a circumferential region formed by the plurality of spots observed in the nanobeam electron diffraction pattern of the nanocrystalline oxide semiconductor film has a relatively large width. Thus, FIG. 73A shows discrete distribution. Further, in the nanobeam electron diffraction pattern, a region with high luminance formed by spots which are not clear is observed in a region between concentric circles.

Further, the electron diffraction intensity distribution in the selected-area electron diffraction pattern of the nanocrystalline oxide semiconductor film is continuous as shown in FIG. 73B. Since FIG. 73B can approximate a result obtained by widely observing the electron diffraction intensity distribution shown in FIG. 73A, the continuous intensity distribution can be considered to result from the overlapping and connection of the plurality of spots.

FIGS. 73A to 73C indicate that the nanocrystalline oxide semiconductor film includes a plurality of crystal parts whose surface orientations are random and whose sizes are different from each other and that the crystal parts are so minute that spots are not observed in the selected-area electron diffraction pattern.

In FIGS. 71B to 71D in which the plurality of spots are observed, the nanocrystalline oxide semiconductor film is thinned to 50 nm or less. Further, since the diameter of the electron beam is reduced to 1 nmφ, the measurement area is from 5 nm to 10 nm. Thus, it is assumed that the crystal part included in the nanocrystalline oxide semiconductor film is 50 nm or less, for example, 10 nm or less or 5 nm or less.

Figure 74:
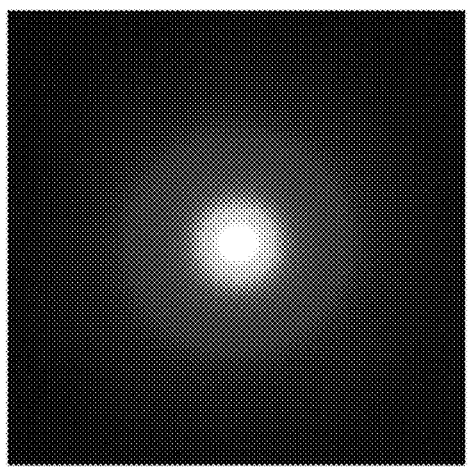
FIG. 74 is a nanobeam electron diffraction pattern of a quartz glass substrate.

FIG. 74 shows a nanobeam electron diffraction pattern of a quartz glass substrate. The measurement conditions for FIG. 74 are similar to those for the electron diffraction patterns in FIGS. 71B to 71D.

As shown in FIG. 74, the nanobeam electron diffraction pattern of the quartz glass substrate having an amorphous structure is a halo pattern without specific spots in which the luminance is gradually changed form a main spot. This means that a plurality of circumferentially distributed spots like those observed in the pattern of the nanocrystalline oxide semiconductor film are not observed in the pattern of a film having an amorphous structure even when electron diffraction is performed on a minute region. This indicates that the plurality of circumferentially distributed spots observed in FIGS. 71B to 71D are peculiar to the nanocrystalline oxide semiconductor film.

Figure 75:
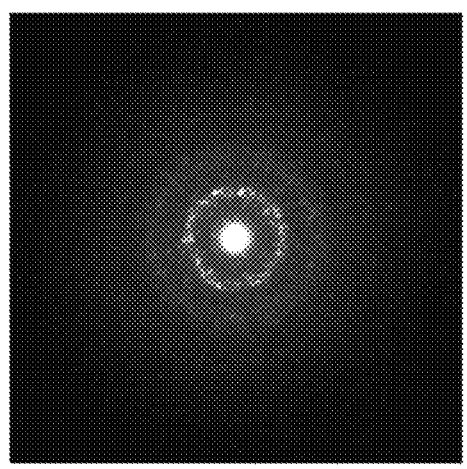
FIG. 75 is a nanobeam electron diffraction pattern of the nanocrystal oxide semiconductor film.

FIG. 75 shows an electron diffraction pattern obtained after one-minute irradiation of Point 2 in FIG. 71A with an electron beam whose diameter is reduced to about 1 nmφ.

As in the electron diffraction pattern shown in FIG. 71C, a plurality of circumferentially distributed spots are observed in the electron diffraction pattern shown in FIG. 75, and there is no significant difference from FIG. 71C. This means that the crystal part observed in the electron diffraction pattern shown in FIG. 71C have existed since the time of the formation of the oxide semiconductor film and have not resulted from irradiation with the electron beam with the reduced diameter.

Figure 76A:
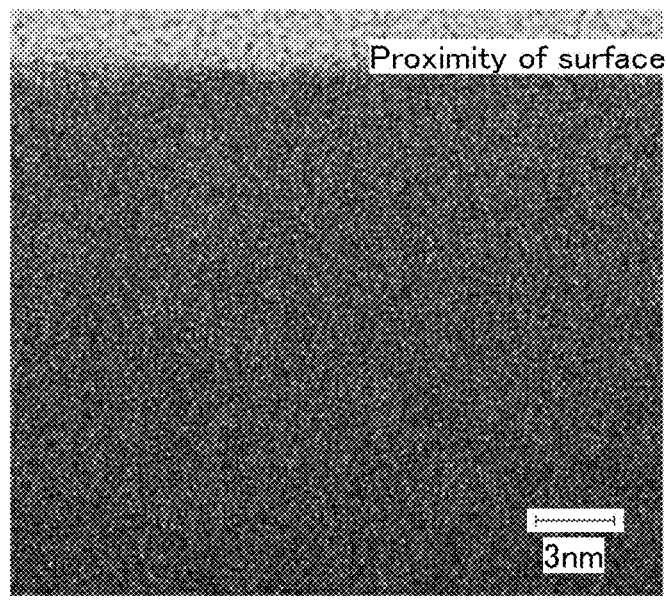
FIGS. 76A and 76B are cross-sectional TEM images of the nanocrystal oxide semiconductor film.
Figure 76B:
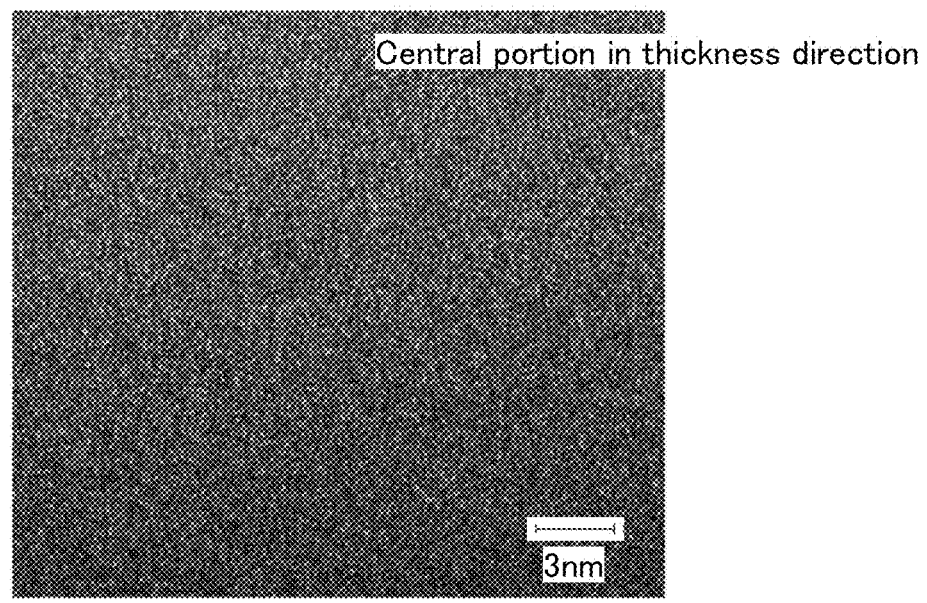

FIGS. 76A and 76B are enlarged images of portions in the cross-sectional TEM image of FIG. 71A. FIG. 76A is a cross-sectional TEM image of the vicinity of Point 1 (the surface of the nanocrystalline oxide semiconductor film) in FIG. 71A, which is observed at an observation magnification of 8,000,000 times. FIG. 76B is a cross-sectional TEM image of the vicinity of Point 2 (the central portion of the nanocrystalline oxide semiconductor film in the thickness direction) in FIG. 71A, which is observed at an observation magnification of 8,000,000 times.

According to each of the TEM images of FIGS. 76A and 76B, a crystalline structure cannot be clearly observed in the nanocrystalline oxide semiconductor film.

Figure 77:
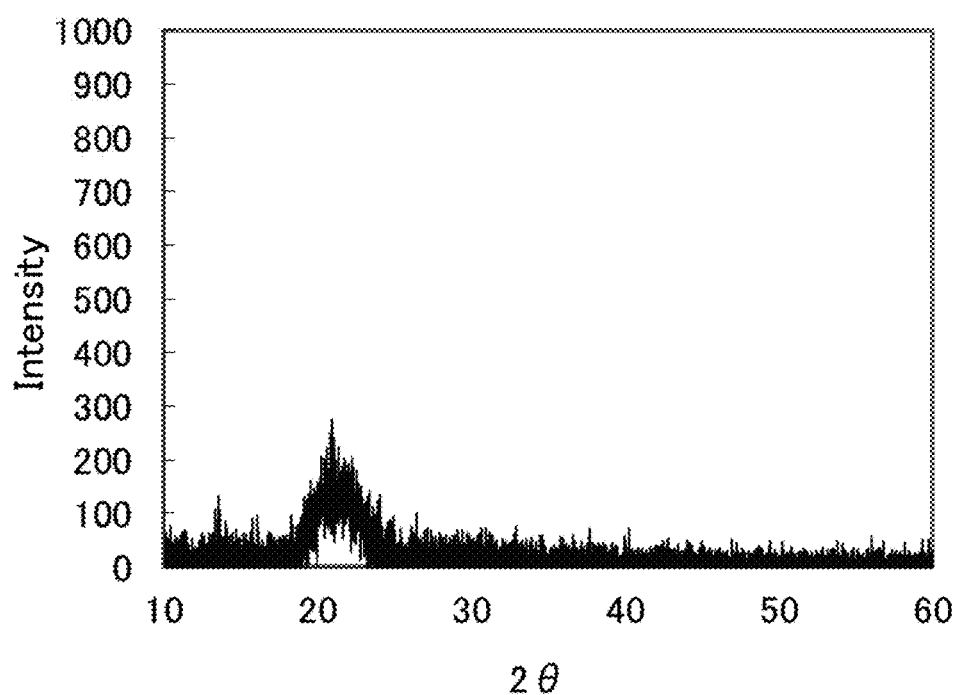
FIG. 77 shows an analysis result by an X-ray diffraction of the nanocrystal oxide semiconductor film.

The samples used for observation in FIGS. 71A to 71D and FIGS. 72A and 72B, in each of which the nanocrystalline oxide semiconductor film of this embodiment is formed over the quartz glass substrate, are analyzed by X-ray diffraction (XRD). FIG. 77 shows an XRD spectrum of the samples measured by an out-of-plane method.

In FIG. 77, the vertical axis represents the X-ray diffraction intensity (arbitrary unit) and the horizontal axis represents the diffraction angle 2θ (degree). Note that the XRD spectrum is measured with an X-ray diffractometer, D8 ADVANCE manufactured by Bruker AXS.

As shown in FIG. 77, a peak corresponding to quartz is observed at around 2θ=20° to 23°; however, a peak corresponding to the crystal part included in the nanocrystalline oxide semiconductor film cannot be observed.

The results in FIGS. 76A and 76B and FIG. 77 also indicate that the crystal part included in the nanocrystalline oxide semiconductor film is minute.

As described above, in the case of the nanocrystalline oxide semiconductor film of this embodiment, a peak indicating an orientation is not observed by X-ray diffraction (XRD) analysis the measurement area of which is wide and the electron diffraction pattern obtained by selected-area electron diffraction the measurement area of which is wide is a halo pattern. This indicates that the nanocrystalline oxide semiconductor film of this embodiment is macroscopically equivalent to a film having disordered atomic arrangement. However, spots (bright points) can be observed in the nanobeam electron diffraction pattern of the nanocrystalline oxide semiconductor film which is obtained by nanobeam electron diffraction in which the diameter of an electron beam is sufficiently small (e.g., 10 nmφ or less). Thus, it can be assumed that the nanocrystalline oxide semiconductor film of this embodiment is a film in which minute crystal parts having random surface orientations (e.g., crystal parts each with a diameter of 10 nm or less, 5 nm or less, or 3 nm or less) cohere. A nanocrystal region including the minute crystal parts is included in the entire region of the nanocrystalline oxide semiconductor film in the thickness direction.

This embodiment can be combined with another embodiment in this specification as appropriate.

Embodiment 10

Examples of formation methods of metal films, semiconductor films, and inorganic insulating films described in the above embodiments are described in this embodiment.

Although various films such as metal films, semiconductor films, and inorganic insulating films described in the above embodiments can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for deposition of a film.

Deposition by a thermal CVD method may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, in order to prevent plural source gases from being mixed, a first source gas is introduced and an inert gas (e.g., argon or nitrogen) or the like is introduced at the same time as or after the introduction of the first gas, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

Various films such as metal films, semiconductor films, and inorganic insulating films described in the above embodiment can be formed by a thermal CVD method such as a MOCVD method or an ALD method. For example, in the case where an InGaZnO$_X$ (X>0) film is formed, trimethylindium, trimethylgallium, and diethylzinc are used. Note that the chemical formula of trimethylindium is In(CH$_3$)$_3$. The chemical formula of trimethylgallium is Ga(CH$_3$)$_3$. The chemical formula of diethylzinc is Zn(CH$_3$)$_2$. Without limitation to the above combination, triethylgallium (chemical formula: Ga(C$_2$H$_5$)$_3$) can be used instead of trimethylgallium and dimethylzinc (chemical formula: Zn(C$_2$H$_5$)$_2$) can be used instead of diethylzinc.

For example, when a hafnium oxide film is formed, two kinds of gases, i.e., ozone (O$_3$) as an oxidizer and a source gas which is obtained by vaporizing a liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, when an aluminum oxide film is formed, two kinds of gases, e.g., H$_2$O as an oxidizer and a source gas which is obtained by vaporizing a liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, when a silicon oxide film is formed, hexadichlorosilane is adsorbed on a surface, chlorine contained in the adsorbate is removed, and radicals of an oxidizing gas (e.g., O$_2$ or dinitrogen monoxide) are supplied to react with the adsorbate.

For example, when a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at the same time, so that a tungsten film is formed. Note that an SiH$_4$ gas may be used instead of a B$_2$H$_6$ gas.

For example, when an oxide semiconductor film, e.g., an InGaZnO$_X$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at the same time to form a GaO layer, and then a Zn(CH$_3$)$_2$ gas and an O$_3$ gas are introduced at the same time to form a ZnO layer. Note that the order of these layers is not limited to this example. A mixed compound layer such as an InGaO$_2$ layer, an InZnO$_2$ layer, a GaInO layer, a ZnInO layer or a GaZnO layer can be formed by mixing of these gases. Note that although an H$_2$O gas which is bubbled with an inert gas such as Ar may be used instead of an O$_3$ gas, it is preferable to use an O$_3$ gas that does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Further, instead of an In(CH$_3$)$_3$ gas, an In(C$_2$H$_5$)$_3$ gas may be used. Furthermore, a Zn(CH$_3$)$_2$ gas may be used.

This embodiment can be combined with another embodiment in this specification as appropriate.

Embodiment 11

In this embodiment, an example of an apparatus for deposition and heating an oxide semiconductor is described with reference to FIG. 46, FIGS. 47A and 47B, and FIGS. 48A and 48B.

Figure 46:
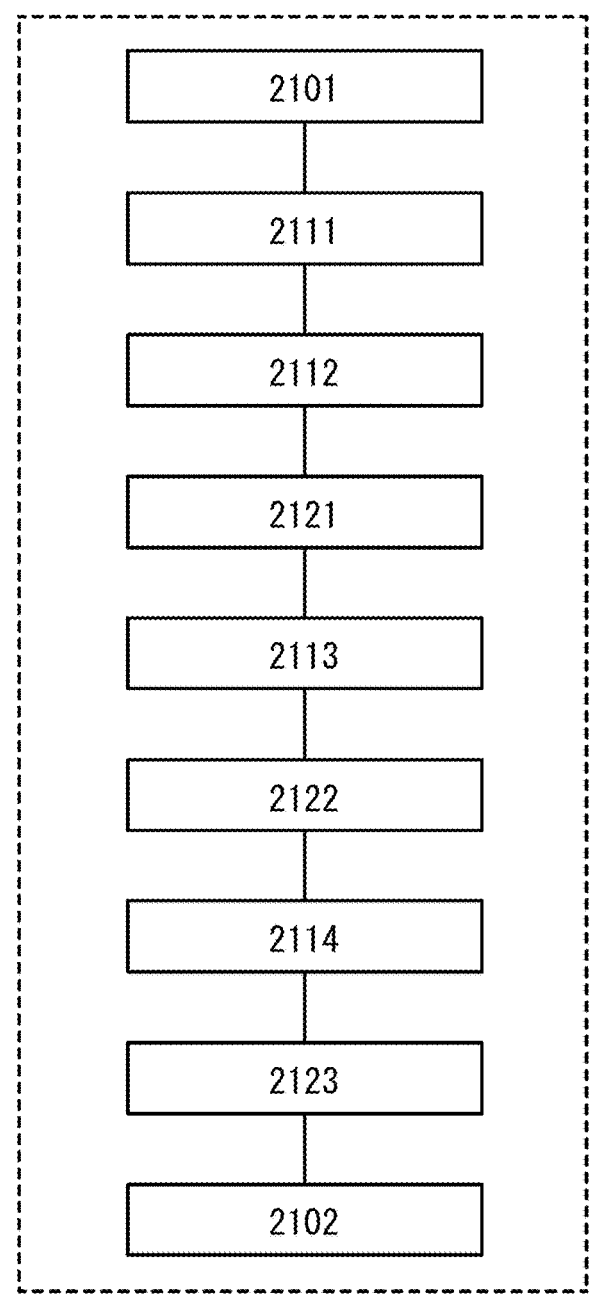
FIG. 46 is a schematic diagram illustrating a deposition apparatus and a substrate heating apparatus.

FIG. 46 is a block diagram illustrating a structure of an apparatus 2000 described in this embodiment.

In the deposition apparatus 2000, a load chamber 2101, a first deposition chamber 2111, a second deposition chamber 2112, a first heating chamber 2121, a third deposition chamber 2113, a second heating chamber 2122, a fourth deposition chamber 2114, a third heating chamber 2123, and an unload chamber 2102 are connected in this order. Note that hereinafter, except for the load chamber 2101 and the unload chamber 2102, each deposition chamber and each heating chamber may be collectively referred to as a treatment chamber when there is no need to distinguish them from each other.

A substrate carried into the load chamber 2101 is transferred to the first deposition chamber 2111, the second deposition chamber 2112, the first heating chamber 2121, the third deposition chamber 2113, the second heating chamber 2122, the fourth deposition chamber 2114, the third heating chamber 2123 in this order by a moving unit and then transferred to the unload chamber 2102. Treatment is not necessarily performed in each treatment chamber, and the substrate can be transferred to the next treatment chamber as appropriate without being processed if a step is omitted.

The load chamber 2101 in the apparatus 2000 has a function of receiving the substrate from the outside. The substrate put in a horizontal state is carried into the load chamber 2101, and then the substrate is made to stand in a vertical state with respect to a horizontal plane by a mechanism provided in the load chamber 2101. Note that in the case where a unit for receiving the substrate, such as a robot, has a mechanism for making the substrate stand up in the vertical state, the load chamber 2101 does not necessarily have the mechanism for making the substrate stand up in the vertical state. Note that the "horizontal state" means a horizontal state with a margin of −10° to +10°, preferably −5° to +5°, and the "vertical state" means a vertical state with a margin of 80° to 100°, preferably 85° to 95°.

The unload chamber 2102 has a function of setting the substrate in the vertical state to in the horizontal state. After being processed, the substrate is carried into the unload chamber 2102 by the moving unit. The substrate in the vertical state is set to be in the horizontal state in the unload chamber 2102, and then carried out of the apparatus.

The load chamber 2101 and the unload chamber 2102 each have an evacuation unit for evacuating the chamber to vacuum and a gas introduction unit which is used when the vacuum state is changed to the atmospheric pressure. As a gas introduced by the gas introduction unit, air or an inert gas such as nitrogen or a rare gas can be used as appropriate.

The load chamber 2101 may have a heating unit for preheating the substrate. By preheating the substrate in parallel with the evacuation step, impurities such as a gas (including water, a hydroxyl group, and the like) adsorbed to the substrate can be eliminated, which is preferable. As the evacuation unit, for example, an entrapment vacuum pump such as a cryopump, an ion pump, or a titanium sublimation pump or a turbo molecular pump provided with a cold trap may be used.

The load chamber 2101, the unload chamber 2102, and the treatment chambers are connected via gate valves. Therefore, when the substrate is transferred to the next treatment chamber after being processed, the gate valve is opened so that the substrate is carried thereinto. Note that this gate valve is not necessarily provided between the treatment chambers. Each treatment chamber has an evacuation unit, a pressure adjusting unit, a gas introduction unit, and the like; thus, the treatment chamber can always be under reduced pressure even when treatment is not performed therein. A treatment chamber is isolated with the use of the gate valve and thus can be prevented from being contaminated by another treatment chamber.

In addition, the load chamber 2101, the unload chamber 2102, and the treatment chambers are not necessarily arranged in one line; for example, a transfer chamber can be provided between adjacent treatment chambers and chambers can be arranged in two lines may be employed. The transfer chamber includes a turntable, so that the substrate carried into the transfer chamber can make a 180-degree turn and the path of the substrate can be turned.

Next, a structure common to the first deposition chamber 2111, the second deposition chamber 2112, the third deposition chamber 2113, and the fourth deposition chamber 2114 will be described.

In the first deposition chamber, a sputtering apparatus or a CVD apparatus is provided. In each of the second deposition chamber, the third deposition chamber, and the fourth deposition chamber, a sputtering apparatus is provided.

As the sputtering apparatus used in the above deposition chambers, for example, a sputtering apparatus for a microwave sputtering method, an RF plasma sputtering method, an AC sputtering method, a DC sputtering method, or the like can be used.

Figure 47A:
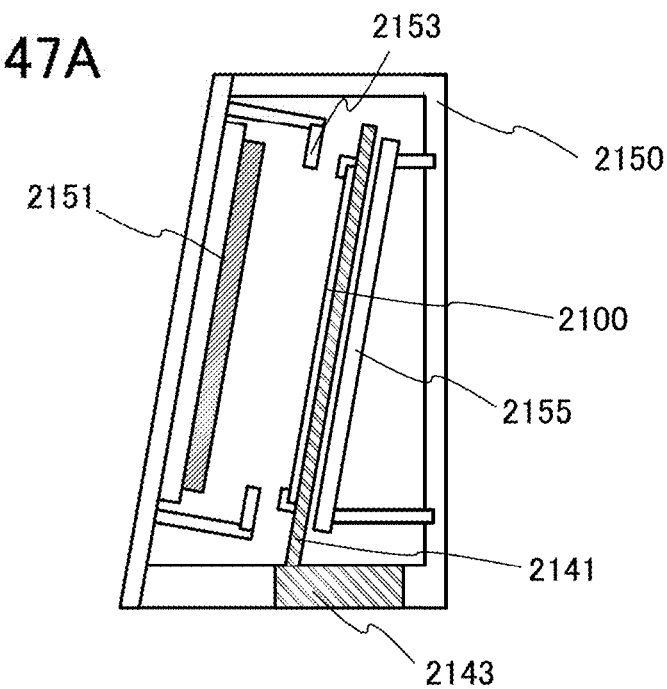
FIGS. 47A and 47B are cross-sectional views illustrating a sputtering apparatus using a DC power source.
Figure 47B:
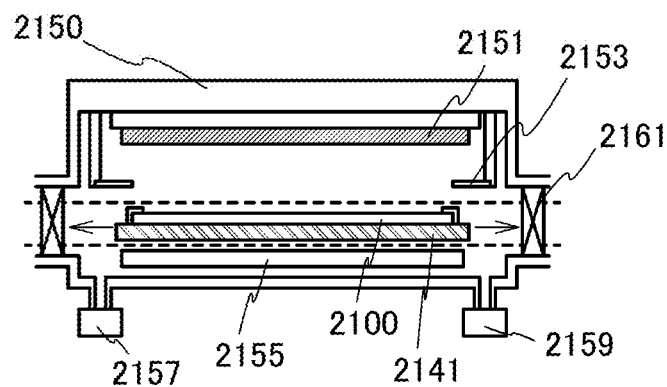

Here, an example of a deposition chamber using a DC sputtering method will be described with reference to FIGS. 47A and 47B. FIG. 47A is a schematic cross-sectional view of a deposition chamber, which is taken perpendicularly to the direction in which the substrate moves. FIG. 47B is a schematic cross-sectional view illustrating a cross section, which is taken horizontally to the direction in which the substrate moves.

First, the substrate 2100 is fixed by a substrate supporting portion 2141 such that an angle between a deposition surface and the vertical direction is at least in the range from 1° to 30°, preferably from 5° to 15°. The substrate supporting portion 2141 is fixed to a moving unit 2143. The moving unit 2143 has a function of fixing the substrate supporting portion 2141 so as to prevent the substrate from moving during treatment. Moreover, the moving unit 2143 can move the substrate 2100, and has a function of carrying the substrate 2100 into and out of the load chamber 2101, the unload chamber 2102, and each treatment chamber as well.

In the deposition chamber 2150, a target 2151 and an attachment prevention plate 2153 are arranged in parallel with the substrate 2100. By arranging the target 2151 and the substrate 2100 in parallel, variation in the thickness of a film formed by sputtering, variation in the step coverage with the film formed by sputtering, and the like, which result from variation in the distance between the target and the substrate, can be prevented.

Further, the deposition chamber 2150 may have a substrate heating unit 2155 positioned behind the substrate supporting portion 2141. With the substrate heating unit 2155, deposition treatment can be performed while the substrate is being heated. As the substrate heating unit 2155, for example, a resistance heater, a lamp heater, or the like can be used. Note that the substrate heating unit 2155 is not necessarily provided.

The deposition chamber 2150 has a pressure adjusting unit 2157, and the pressure in the deposition chamber 2150 can be reduced to a desired pressure. As an evacuation apparatus used for the pressure adjusting unit 2157, for example, an entrapment vacuum pump such as a cryopump, an ion pump, or a titanium sublimation pump or a turbo molecular pump provided with a cold trap may be used.

Further, the deposition chamber 2150 has a gas introduction unit 2159 for introducing a deposition gas or the like. For example, an oxide film can be formed in such a manner that a gas which includes a rare gas as a main component and to which oxygen is added is introduced, and deposition is performed by a reactive sputtering method. As the gas introduced by the gas introduction unit 2159, a high-purity gas in which impurities such as hydrogen, water, and hydride are reduced can be used. For example, oxygen, nitrogen, a rare gas (typically argon), or a mixed gas of any of these can be introduced.

In the deposition chamber 2150 having the pressure adjusting unit 2157 and the gas introduction unit 2159, a hydrogen molecule, a compound including hydrogen such as water ($H_2O$), (preferably, also a compound including a carbon atom), and the like are removed. Accordingly, the concentration of impurities in a film formed in the deposition chamber 2150 can be reduced.

The deposition chamber 2150 and an adjacent chamber are separated by a gate valve 2161. The chamber is isolated using the gate valve 2161, so that impurities in the chamber can be easily eliminated and a clean deposition atmosphere can be maintained. Moreover, the gate valve 2161 is opened and the substrate is carried out of the chamber after the chamber is made clean, whereby contamination of an adjacent treatment chamber can be inhibited. Note that the gate valve 2161 is not necessarily provided.

Then, a portion common to the first heating chamber 2121, the second heating chamber 2122, and the third heating chamber 2123 will be described.

In the first heating chamber 2121, the second heating chamber 2122, and the third heating chamber 2123, heat treatment can be performed on the substrate 2100. An apparatus using a resistance heater, a lamp, a heated gas, or the like may be provided as a heating apparatus.

Figure 48A:
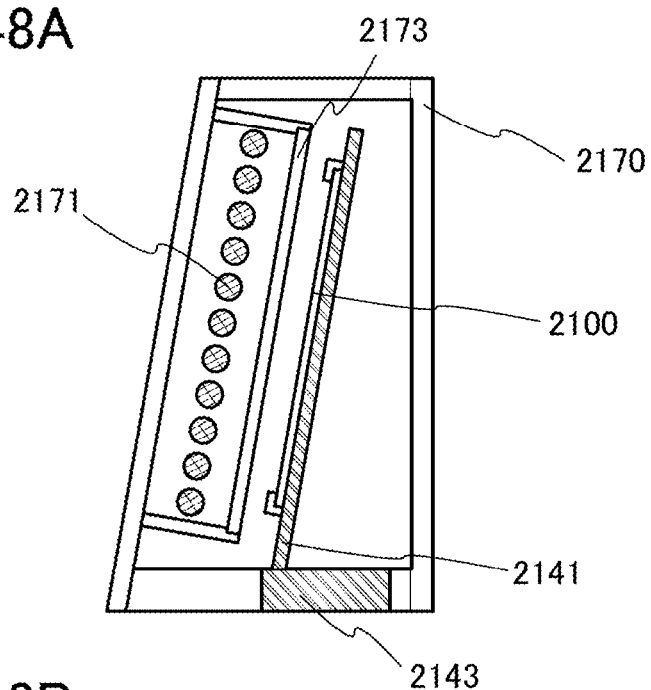
FIGS. 48A and 48B are cross-sectional views illustrating a substrate heating apparatus.
Figure 48B:
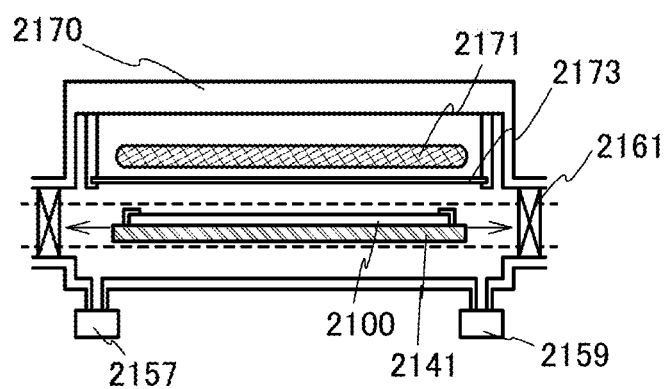

FIGS. 48A and 48B illustrate an example of a heating chamber to which a heating apparatus using a rod-shaped heater is applied. FIG. 48A is a schematic cross-sectional view of the heating chamber, which is taken perpendicularly to the direction in which the substrate moves. FIG. 48B is a schematic cross-sectional view of the heating chamber, which is taken horizontally to the direction in which the substrate moves.

As in the deposition chamber 2150, the substrate 2100 supported by the substrate supporting portion 2141 can be carried into and out of a heating chamber 2170 by the moving unit 2143.

In the heating chamber 2170, rod-shaped heaters 2171 are arranged in parallel with the substrate 2100. FIG. 48A schematically illustrates the shape of a cross section of the rod-shaped heater 2171. A resistance heater or a lamp heater can be used as the rod-shaped heater 2171. The resistance heater includes one using introduction heating. Further, a lamp that emits light having a center wavelength in the infrared region is preferred for a lamp used for the lamp heater. By arranging the rod-shaped heaters 2171 in parallel with the substrate 2100, the distance therebetween can be uniform and heating can be performed uniformly. In addition, it is preferable that the temperature of the rod-shaped heaters 2171 be individually controlled. For example, when a heater in a lower portion is set at a temperature higher than that of a heater in an upper portion, the substrate can be heated at a uniform temperature.

The heating mechanism provided in the heating chamber 2170 is not limited to the mechanism described above, and can be, for example, a heating mechanism utilizing a resistance heater or the like or a heating mechanism utilizing heat conduction or heat radiation from a medium such as a heated gas, such as rapid thermal annealing (RTA) such as gas rapid thermal annealing (GRTA) or lamp rapid thermal annealing (LRTA), without no particular limitations. The LRTA treatment is treatment for heating an object by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. An inert gas is used as a gas. With the RTA apparatus, the process time can be shortened and thus the RTA apparatus is preferred for mass production.

In the heating chamber 2170, a protection plate 2173 is provided between the rod-shaped heaters 2171 and the substrate 2100. The protection plate 2173 is provided in order to protect the rod-shaped heaters 2171 and the substrate 2100 and can be formed using quartz or the like, for example. The protection plate 2173 is not necessarily provided.

Further, the heating chamber 2170 has the pressure adjusting unit 2157 and the gas introduction unit 2159, like the deposition chamber 2150. Therefore, the heating chamber 2170 can always be kept under reduced pressure during heat treatment and even when treatment is not performed therein. In the heating chamber 2170, a hydrogen molecule, a compound including hydrogen such as water ($H_2O$), (preferably, also a compound including a carbon atom), and the like are removed, whereby the concentration of impurities in a film processed in the heating chamber, impurities at an interface of the film, or impurities included in or adsorbed to a surface of the film can be reduced.

With the pressure adjusting unit 2157 and the gas introduction unit 2159, heat treatment in an inert gas atmosphere or an atmosphere including oxygen can be performed. Note that as the inert gas atmosphere, an atmosphere that contains nitrogen or a rare gas (e.g., helium, neon, or argon) as its main component and does not contain water, hydrogen, or the like is preferred. For example, the purity of nitrogen or a rare gas such as helium, neon, or argon introduced into the heating chamber 2170 is 6N (99.9999%) or higher, preferably 7N (99.99999%) or higher (i.e., the impurity concentration is 1 ppm or lower, preferably 0.1 ppm or lower).

Next, an example of a structure of each treatment chamber is described.

In the first deposition chamber 2111, an oxide insulating film is formed over the substrate. A deposition apparatus may be either a sputtering apparatus or a PE-CVD apparatus without no particular limitation. A film that can be formed in the first deposition chamber 2111 may be any film functioning as a base layer or a gate insulating layer of a transistor or the like; for example, a film of silicon oxide, silicon oxynitride, silicon nitride oxide, aluminum oxide, gallium oxide, aluminum oxynitride, aluminum nitride oxide, hafnium oxide, or the like, a mixed film of any of these, and the like can be given.

In the case of a sputtering apparatus, for example, a proper target can be used in accordance with the kind of the film. In the case of a PE-CVD apparatus, a deposition gas is selected as appropriate.

In the second deposition chamber 2112, an oxide film can be formed by a sputtering method. As the oxide film formed here, for example, a film of an oxide of zinc and gallium, and the like can be given. As a deposition method, a microwave plasma sputtering method, an RF plasma sputtering method, an AC sputtering method, or a DC sputtering method can be used.

In the second deposition chamber 2112, deposition can be performed while the substrate is being heated by the substrate heating unit 2155 at a temperature of 600° C. or lower, preferably 450° C. or lower, further preferably 300° C. or lower.

In the first heating chamber 2121, the substrate can be heated at a temperature higher than or equal to 200° C. and lower than or equal to 700° C. Furthermore, with the pressure adjusting unit 2157 and the gas introduction unit 2159, heat treatment can be performed in an oxygen atmosphere, a nitrogen atmosphere, or a mixed atmosphere of oxygen and nitrogen, whose pressure is set to 10 Pa to 1 normal atmospheric pressure, for example.

In the third deposition chamber 2113, an oxide semiconductor film is formed over the substrate 2100. An example of the oxide semiconductor is an oxide semiconductor including at least Zn, and an oxide semiconductor described in the above embodiments, such as an In—Ga—Zn-based oxide semiconductor given above can be deposited.

Deposition can be performed while the substrate is being heated by the substrate heating unit 2155 at a deposition temperature higher than or equal to 200° C. and lower than or equal to 600° C.

In the second heating chamber 2122, the substrate 2100 can be heated at a temperature higher than or equal to 200° C. and lower than or equal to 700° C. Furthermore, with the pressure adjusting unit 2157 and the gas introduction unit 2159, heat treatment can be performed in an atmosphere where oxygen or nitrogen is included and impurities such as hydrogen, water, and a hydroxyl group are extremely reduced under a pressure higher than or equal to 10 Pa and lower than or equal to 1 normal atmospheric pressure.

In the fourth deposition chamber 2114, an oxide semiconductor film is formed over the substrate 2100, as in the third deposition chamber 2113. For example, an In—Ga—Zn-based oxide semiconductor film can be formed using a target for an In—Ga—Zn-based oxide semiconductor. In addition, deposition can be performed while the substrate is being heated at a temperature higher than or equal to 200° C. and lower than or equal to 600° C.

Finally, in the third heating chamber, heat treatment can be performed on the substrate 2100 at a temperature higher than or equal to 200° C. and lower than or equal to 700° C.

Furthermore, with the pressure adjusting unit 2157 and the gas introduction unit 2159, the heat treatment can be performed in a nitrogen atmosphere, an oxygen atmosphere, or a mixed atmosphere of nitrogen and oxygen.

The heating temperature in the first heating chamber 2121, the second heating chamber 2122, and the third heating chamber 2123 is preferably 450° C. or lower, further preferably 350° C. or lower, in view of mass production, strain of a substrate, and energy efficiency.

In addition, the deposition apparatus described in this embodiment has a structure in which exposure to the air is thoroughly prevented, from the load chamber through each treatment chamber to the unload chamber, and the substrate can always be transferred under reduced-pressure environment. Therefore, entry of an impurity into an interface of a film formed in this deposition apparatus can be inhibited, so that a film with extremely favorable interfacial state can be formed.

This embodiment have described the example where the load chamber, the deposition chambers, the heating chambers and the unload chamber are continuous; however, for example, an apparatus including a load chamber, a deposition chamber, and an unload chamber (a so-called deposition apparatus) and an apparatus including a load chamber, a heating chamber, and an unload chamber (a so-called heating apparatus) can be provided independently, without being limited to the example in this embodiment.

This embodiment can be combined with another embodiment in this specification.

Embodiment 12

In this embodiment, a touch sensor that can be combined with a display device of one embodiment of the present invention and a display module will be described with reference to FIGS. 49A and 49B, FIG. 50, and FIG. 51.

Figure 49A:
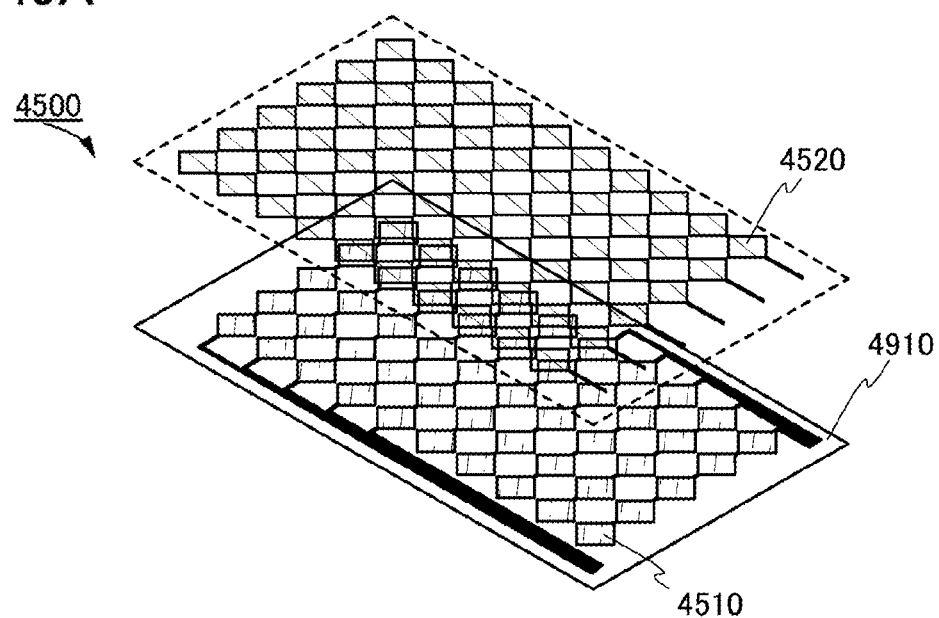
FIGS. 49A and 49B illustrate a touch sensor.
Figure 49B:
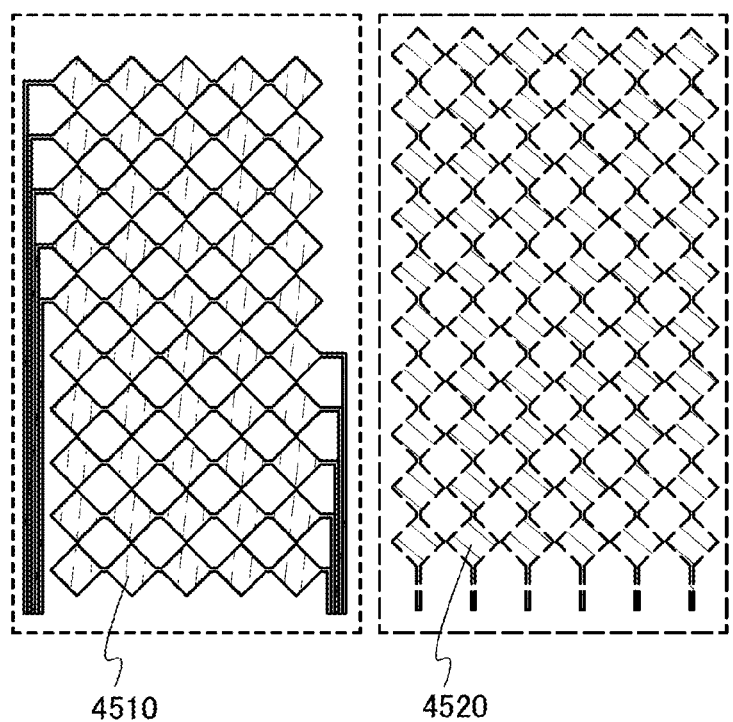
Figure 50:
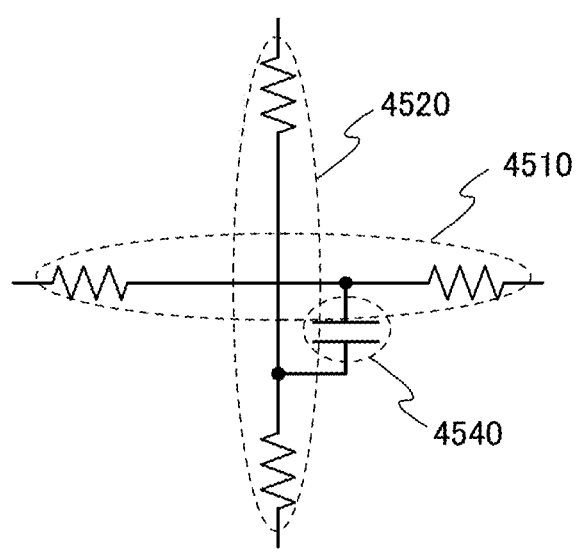
FIG. 50 is a circuit diagram of the touch sensor.

FIG. 49A is an exploded perspective view of a structural example of a touch sensor 4500. FIG. 49B is a plan view of a structural example of an electrode of the touch sensor 4500. FIG. 50 is a cross-sectional view of a structural example of the touch sensor 4500.

The touch sensor 4500 illustrated in FIGS. 49A and 49B includes, over a substrate 4910, a plurality of conductive layers 4510 arranged in the X-axis direction and a plurality of conductive layers 4520 arranged in the Y-axis direction intersecting with the X-axis direction. In FIGS. 49A and 49B, a plan view of the plurality of conductive layers 4510 of the touch sensor 4500 and a plan view of the plurality of conductive layers 4520 of the touch sensor 4500 are separately illustrated.

FIG. 50 is an equivalent circuit diagram of an intersection portion of the conductive layer 4510 and the conductive layer 4520 of the touch sensor 4500 illustrated in FIGS. 49A and 49B. As illustrated in FIG. 50, a capacitor 4540 is formed at the intersection portion of the conductive layer 4510 and the conductive layer 4520.

The plurality of conductive layers 4510 and the plurality of conductive layers 4520 have structures in each of which a plurality of quadrangular conductive films are connected to each other. The plurality of conductive layers 4510 and the plurality of conductive layers 4520 are provided so that the quadrangular conductive films of the plurality of conductive layers 4510 do not overlap with the quadrangular conductive films of the plurality of conductive layers 4520. At the intersection portion of the conductive layer 4510 and the conductive layer 4520, an insulating film is provided between the conductive layer 4510 and the conductive layer 4520 to prevent the conductive layers 4510 and 4520 from being in contact with each other.

Figure 51:
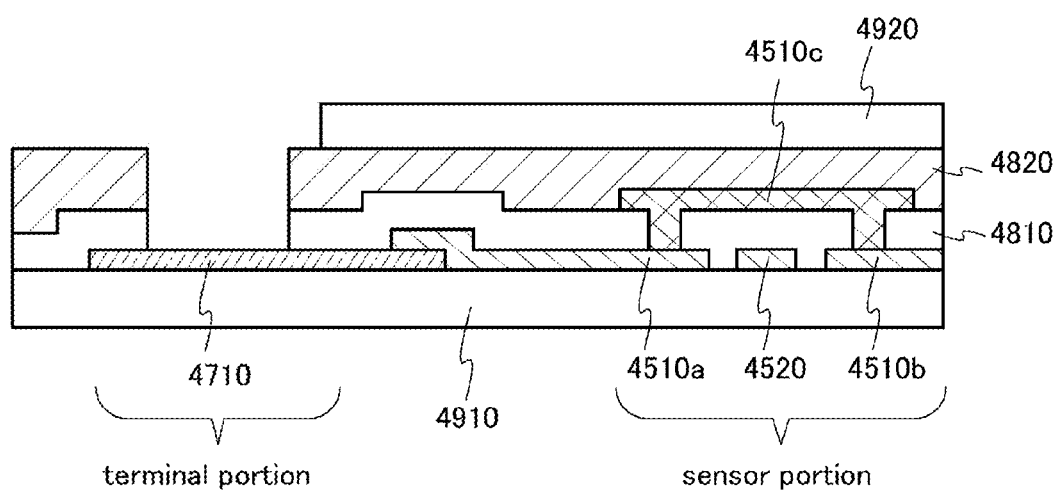
FIG. 51 is a cross-sectional view of the touch sensor.

FIG. 51 is a cross-sectional view illustrating an example of a connection structure of the conductive layers 4510 and the conductive layer 4520 of the touch sensor 4500 in FIGS. 49A and 49B. FIG. 51 illustrates, as an example, a cross-sectional view of a portion where the conductive layers 4510 (conductive layers 4510a, 4510b, and 4510c) intersects with the conductive layer 4520.

As illustrated in FIG. 51, the conductive layers 4510 include the conductive layer 4510a and the conductive layer 4510b in the first layer and the conductive layer 4510c in the second layer over an insulating layer 4810. The conductive layer 4510a and the conductive layer 4510b are connected by the conductive layer 4510c. The conductive layer 4520 is formed using the conductive film in the first layer. An insulating layer 4820 is formed so as to cover the conductive layers 4510 and 4520 and an electrode 4710. As the insulating layers 4810 and 4820, silicon oxynitride films may be formed, for example. A base film formed using an insulating film may be provided between the substrate 4910, and the conductive layers 4510 and the electrode 4710. As the base film, for example, a silicon oxynitride film can be formed.

The conductive layers 4510 and the conductive layer 4520 are formed using conductive materials that transmit visible light, such as indium tin oxide containing silicon oxide, indium tin oxide, zinc oxide, indium zinc oxide, or zinc oxide to which gallium is added.

The conductive layer 4510a is connected to the electrode 4710. A terminal for connection to an FPC is formed using the electrode 4710. Like the conductive layers 4510, the conductive layer 4520 is connected to the electrode 4710. The electrode 4710 can be formed of a tungsten film, for example.

An insulating layer 4820 is formed so as to cover the conductive layers 4510, 4520 and the electrode 4710. An opening portion is formed in the insulating layers 4810 and 4820 over the electrode 4710 to electrically connect the electrode 4710 and the FPC. A substrate 4920 is attached to the insulating layer 4820 using an adhesive, an adhesive film, or the like. The substrate 4910 side is bonded to a color filter substrate of a display panel with an adhesive or an adhesive film, so that a touch panel is formed.

Next, a display module that can be formed using a display device of one embodiment of the present invention will be described with reference to FIG. 52.

Figure 52:
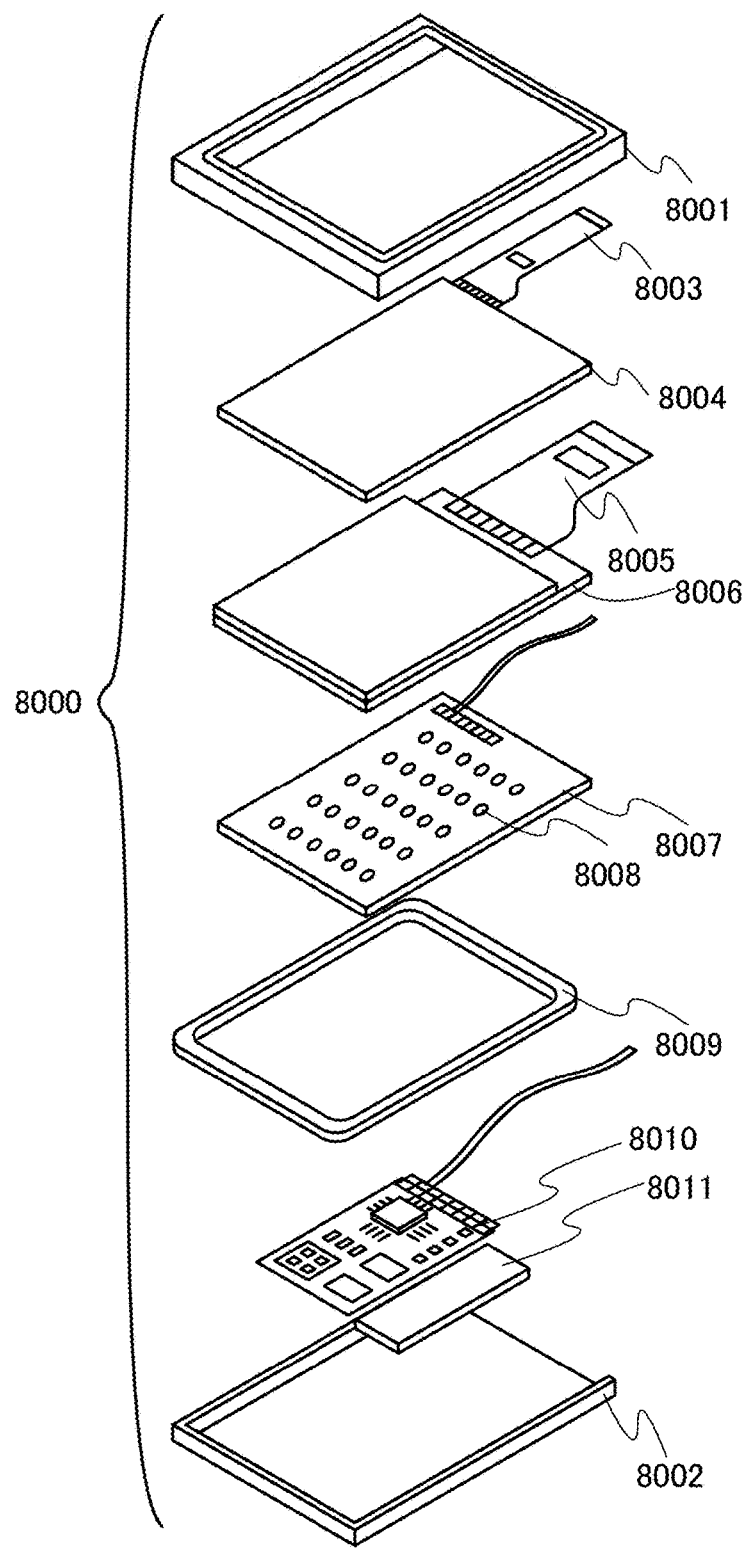
FIG. 52 illustrates a display module including a display device of one embodiment of the present invention.

In a display module 8000 in FIG. 52, a touch panel 8004 connected to an FPC 8003, a display panel cell 8006 connected to an FPC 8005, a backlight unit 8007, a frame

8009, a printed board 8010, and a battery 8011 are provided between an upper cover 8001 and a lower cover 8002.

The shapes and sizes of the upper cover 8001 and the lower cover 8002 can be freely changed depending on the sizes of the touch panel 8004 and the display panel cell 8006.

The touch panel 8004 can be a resistive touch panel or a capacitive touch panel and can be formed to overlap with the display panel cell 8006. A counter substrate (sealing substrate) of the display panel cell 8006 can have a touch panel function. A photosensor may be provided in each pixel of the display panel cell 8006 to make an optical touch panel.

The backlight unit 8007 includes a light source 8008. The light source 8008 may be provided at an end portion of the backlight unit 8007 and a light diffusing plate may be used.

The frame 8009 protects the display panel cell 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 may be omitted in the case of using a commercial power source.

The display module 8000 can be additionally provided with a member such as a polarizing plate, a retardation plate, or a prism sheet The structure and the like in this embodiment can be combined with any structure in the other embodiments as appropriate.

Embodiment 13

In this embodiment, examples of electronic devices will be described.

FIGS. 53A to 53H and FIGS. 54A to 54D each illustrate an electronic device. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 53A:
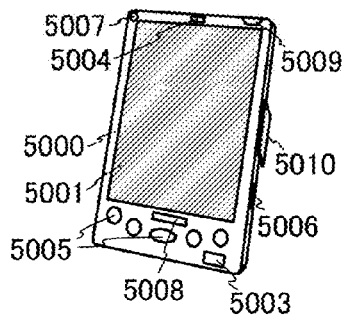
FIGS. 53A to 53H each illustrate an electronic device including a display device of one embodiment of the present invention.
Figure 53B:
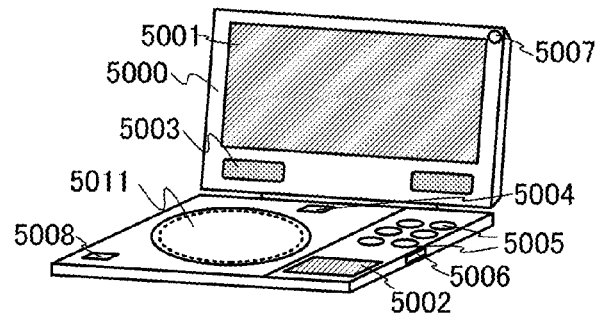
Figure 53C:
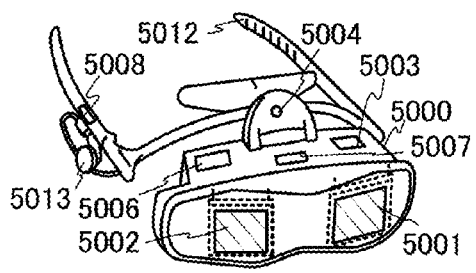
Figure 53D:
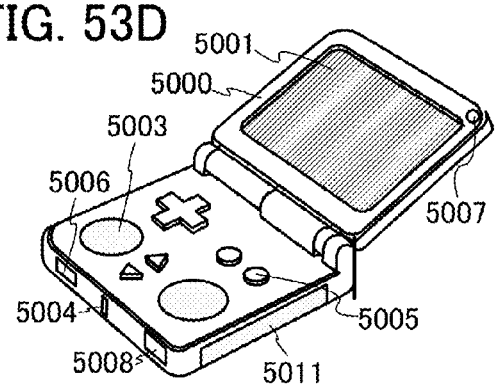
Figure 53E:
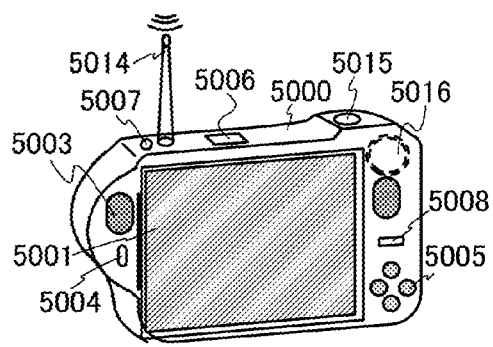
Figure 53F:
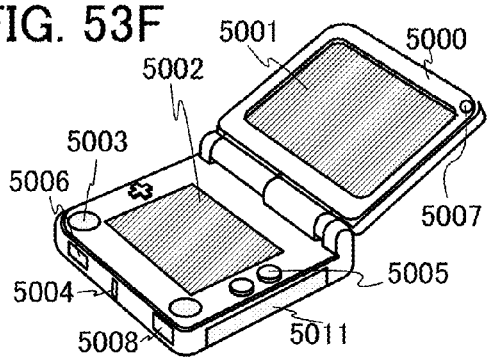
Figure 53G:
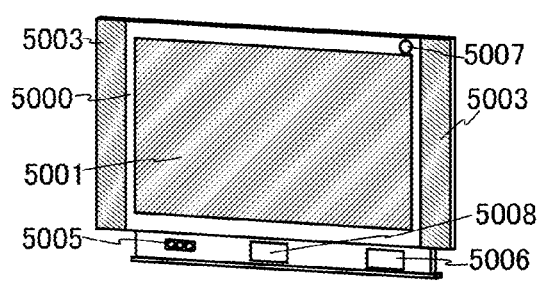
Figure 53H:
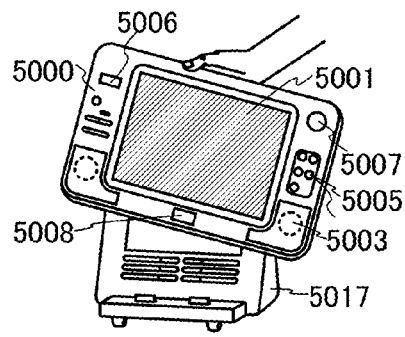
Figure 54A:
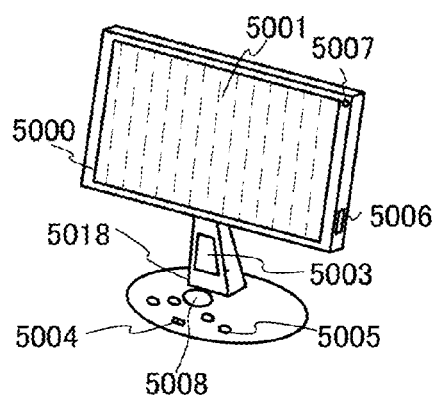
FIGS. 54A to 54H each illustrate an electronic device including a display device of one embodiment of the present invention.
Figure 54B:
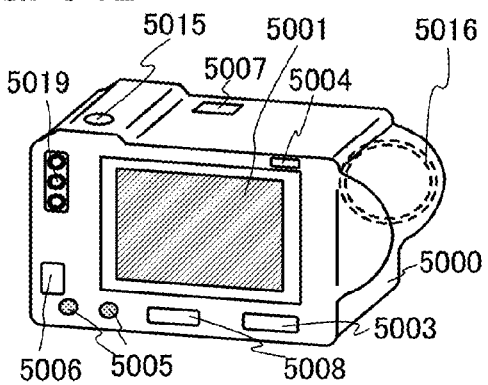
Figure 54C:
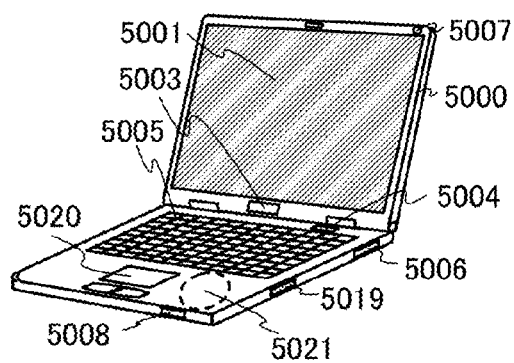
Figure 54D:
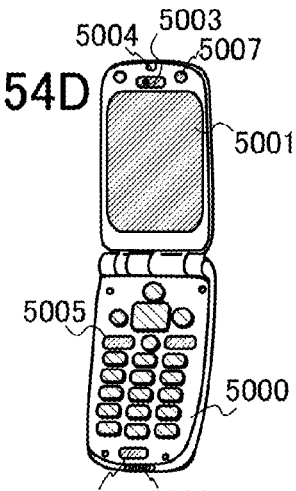

FIG. 53A illustrates a mobile computer which can include a switch 5009, an infrared port 5010, and the like in addition to the above components. FIG. 53B illustrates a portable image reproducing device (e.g., a DVD player) provided with a memory medium, and the image reproducing device can include a second display portion 5002, a memory medium reading portion 5011, and the like in addition to the above components. FIG. 53C illustrates a goggle-type display which can include the second display portion 5002, a support 5012, an earphone 5013, and the like in addition to the above components. FIG. 53D illustrates a portable game machine which can include the recording medium reading portion 5011 and the like in addition to the above objects. FIG. 53E illustrates a digital camera with a television reception function which can include an antenna 5014, a shutter button 5015, an image reception portion 5016, and the like in addition to the above objects. FIG. 53F illustrates a portable game machine which can include the second display portion 5002, the memory medium reading portion 5011, and the like in addition to the above objects. FIG. 53G illustrates a television receiver which can include a tuner, an image processing portion, and the like in addition to the above objects. FIG. 53H illustrates a portable television receiver which can include a charger 5017 capable of transmitting and receiving signals and the like in addition to the above objects. FIG. 54A illustrates a display which can include a support base 5018 and the like in addition to the above objects. FIG. 54B illustrates a camera which can include an external connection port 5019, a shutter button 5015, an image reception portion 5016, and the like in addition to the above components. FIG. 54C illustrates a computer which can include a pointing device 5020, the external connecting port 5019, a reader/writer 5021, and the like in addition to the above objects. FIG. 54D illustrates a mobile phone which can include a transmitter, a receiver, a tuner of one-segment partial reception service for mobile phones and mobile terminals, and the like in addition to the above components.

The electronic devices illustrated in FIGS. 53A to 53H and FIGS. 54A to 54D can have a variety of functions. For example, a function of displaying a variety of information (a still image, a moving image, a text image, and the like) on a display portion, a touch panel function, a function of displaying a calendar, date, time, and the like, a function for controlling a process with a variety of software (programs), a wireless communication function, a function of connecting to a variety of computer networks with a wireless communication function, a function of transmitting and receiving a variety of data with a wireless communication function, a function of reading program or data stored in a memory medium and displaying the program or data on a display portion, and the like can be given. Further, an electronic device including a plurality of display portions can have a function of displaying image information mainly on one display portion while displaying text information on another display portion, a function of displaying a three-dimensional image by displaying images on a plurality of display portions with a parallax taken into account, or the like. Furthermore, an electronic device including an image receiver portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on the display portion, or the like. Note that functions which can be provided for the electronic devices illustrated in FIGS. 53A to 53H and FIGS. 54A to 54D are not limited to the above-described functions, and the electronic devices can have a variety of functions.

The electronic devices described in this embodiment each include the display portion for displaying some sort of information.

Next, applications of a display device are described.

Figure 54E:
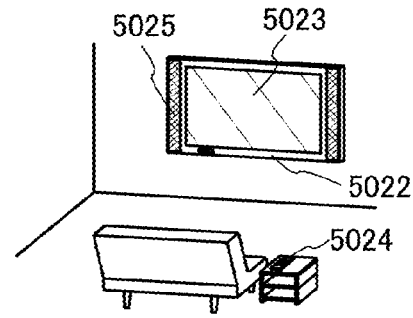

FIG. 54E illustrates an example in which the display device is set up so as to be unified with a building structure. FIG. 54E illustrates a housing 5022, a display portion 5023, a remote controller 5024 as an operation portion, a speaker 5025, and the like. The display device is incorporated in the building as a wall-hanging type, so that the display device can be provided without requiring a wide space.

Figure 54F:
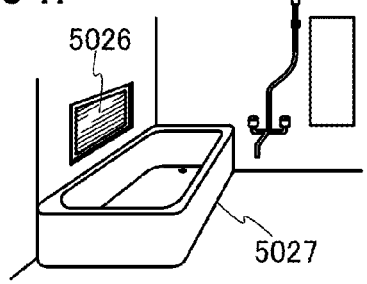

FIG. 54F illustrates another example in which a display device is set up so as to be unified with a building structure.

A display module 5026 is incorporated in a prefabricated bath unit 5027, so that a bather can view the display module 5026.

Note that although the wall and the prefabricated bath are given as examples of the building structure in this embodiment, the display device can be provided in a variety of building structures without being limited to the example in this embodiment.

Next, examples in which the display device is set up so as to be unified with moving objects are described.

Figure 54G:
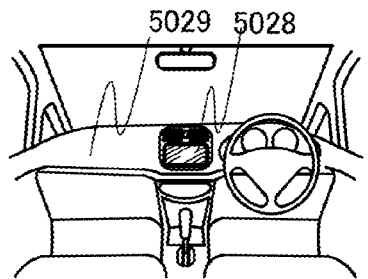

FIG. 54G illustrates an example in which the display device is incorporated in a car. A display module 5028 is attached to a body 5029 of the car and can display information on the operation of the car or information input from the inside or outside of the car on demand. Note that a navigation function may be provided.

Figure 54H:
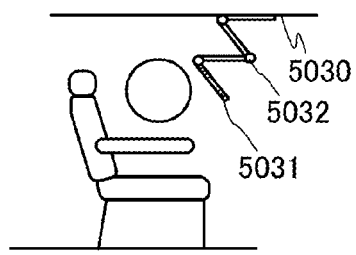

FIG. 54H illustrates an example in which the display device is set up so as to be unified with a passenger airplane. FIG. 54H illustrates a usage pattern in the case where a display module 5031 is provided for a ceiling 5030 above a seat of the passenger airplane. The display module 5031 is unified with the ceiling 5030 by a hinge portion 5032, and a passenger can view the display module 5031 by stretching of the hinge portion 5032. The display module 5031 has a function of displaying information by the operation of the passenger.

Note that although this embodiment gives the body of the vehicle and the body of the plane as non-limiting examples of the moving body, the display device can be provided for a variety of moving bodies such as a two-wheel motor vehicle, a four-wheel vehicle (including a car, bus, and the like), a train (including a monorail, a railway, and the like), and a ship.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Thus, for example, in a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like, it is possible to take out part of the diagram or the text and constitute one embodiment of the invention. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted.

The structure and the like in this embodiment can be combined with any structure in the other embodiments as appropriate.

Example 1

In this example, the resistances of an oxide semiconductor layer and an oxide stack will be described with reference to FIGS. 55A to 55D and FIG. 56.

First, the structure of a sample is described with reference to FIGS. 55A to 55D.

Figure 55A:
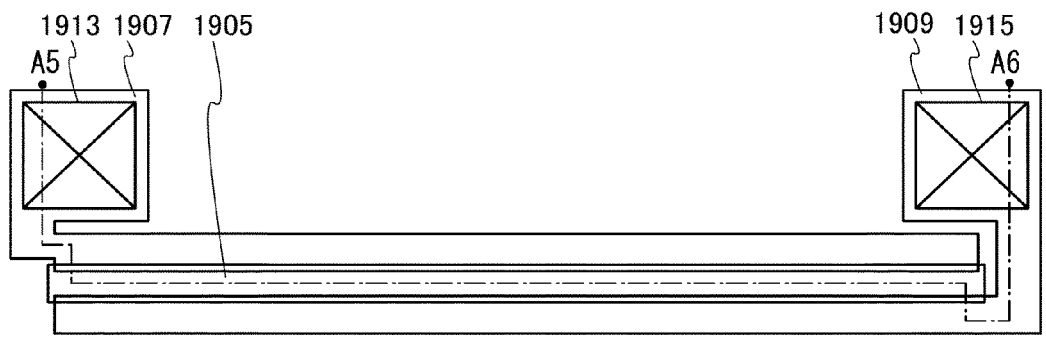
FIGS. 55A to 55D are a top view and cross-sectional views illustrating samples used in Example 1.
Figure 55B:
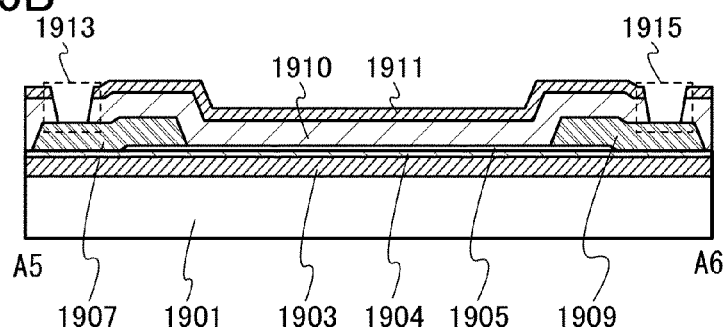
Figure 55C:
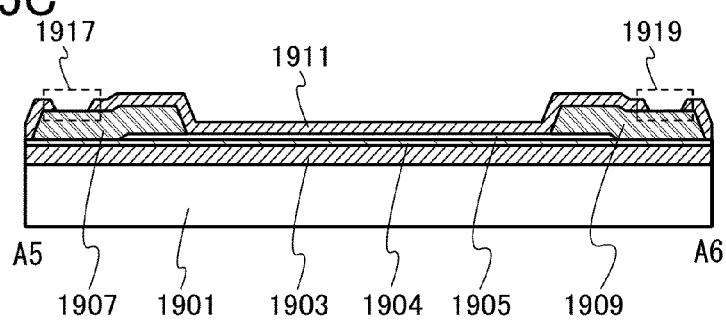
Figure 55D:
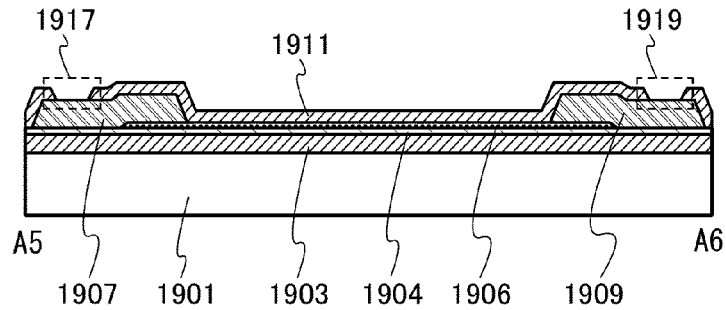

FIG. 55A is a top view of a sample 1, a sample 2, a sample 3, and a sample 4, and FIGS. 55B to 55D are cross-sectional views taken along the dashed-and-dotted line A5-A6 in FIG. 55A. Note that the top views of the samples 1 to 4 are identical but the cross-sectional views thereof are different because the stacked-layer structures in the cross sections are different. The cross-sectional views of the sample 1, the sample 2, and the samples 3 and 4 are illustrated in FIG. 55B, FIG. 55C, and FIG. 55D, respectively.

In the sample 1, an insulating layer 1903 is formed over a glass substrate 1901, an insulating layer 1904 is formed over the insulating layer 1903, and a semiconductor layer 1905 is formed over the insulating layer 1904. The both ends of the semiconductor layer 1905 are covered with a conductive layer 1907 and a conductive layer 1909 each serving as an electrode, and the semiconductor layer 1905 and the conductive layers 1907 and 1909 are covered with an insulating layer 1910 and an insulating layer 1911. Note that an opening 1913 and an opening 1915 are provided in the insulating layers 1910 and 1911, and the conductive layer 1907 and the conductive layer 1909 are exposed in the opening 1913 and the opening 1915, respectively.

In the sample 2, the insulating layer 1903 is formed over the glass substrate 1901, the insulating layer 1904 is formed over the insulating layer 1903, and the semiconductor layer 1905 is formed over the insulating layer 1904. The both ends of the semiconductor layer 1905 are covered with the conductive layers 1907 and 1909 each serving as an electrode, and the semiconductor layer 1905 and the conductive layers 1907 and 1909 are covered with the insulating layer 1911. Note that an opening portion 1917 and an opening portion 1919 are provided in the insulating layer 1911, and the conductive layer 1907 and the conductive layer 1909 are exposed in the opening portion 1917 and the opening portion 1919, respectively.

In each of the samples 3 and 4, the insulating layer 1903 is formed over the glass substrate 1901, the insulating layer 1904 is formed over the insulating layer 1903, and an oxide stack 1906 is formed over the insulating layer 1904. The both ends of the oxide stack 1906 are covered with the conductive layers 1907 and 1909 each serving as an electrode, and the oxide stack 1906 and the conductive layers 1907 and 1909 are covered with the insulating layer 1911. Note that the opening portion 1917 and the opening portion 1919 are provided in the insulating layer 1911, and the conductive layer 1907 and the conductive layer 1909 are exposed through the opening portion 1917 and the opening portion 1919, respectively.

As described above, the structures of the insulating layers in contact with the top surface of the semiconductor layer 1905 or the oxide stack 1906 are different in the samples 1 to 4. In the sample 1, the semiconductor layer 1905 and the insulating layer 1910 are in contact with each other; in the sample 2, the semiconductor layer 1905 and the insulating layer 1911 are in contact with each other; and in the samples 3 and 4, the oxide stack 1906 and the insulating layer 1911 are in contact with each other.

Next, fabrication methods of the samples are described.

First, a fabrication method of the sample 1 is described.

A 400-nm-thick silicon nitride film was formed as the insulating layer 1903 over the glass substrate 1901 by a PE-CVD method.

Next, a 50-nm-thick silicon oxynitride layer was formed as the insulating layer 1904 over the insulating layer 1903 by a PE-CVD method.

Next, a 35-nm-thick In—Ga—Zn oxide film (hereinafter also referred to as an IGZO film) was formed as the semiconductor layer 1905 over the insulating layer 1904 by a sputtering method using a metal oxide target containing In, Ga, and Zn at an atomic ratio of 1:1:1. Then, etching treatment was performed on the IGZO film with a mask formed through a photolithography process, so that the semiconductor layer 1905 was formed.

Next, the conductive layers 1907 and 1909 were formed over the insulating layer 1904 and the semiconductor layer 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating layer 1910 over the insulating layer 1904, the semiconductor layer 1905, the conductive layer 1907, and the conductive layer 1909 by a PE-CVD method, and then heat treatment was performed at 350° C. under a mixed atmosphere of nitrogen and oxygen for one hour.

Next, a 50-nm-thick silicon nitride film was formed as the insulating layer 1911 over the insulating layer 1910 by a PE-CVD method.

Next, a mask was formed over the insulating layer 1911 through a photolithography process and then etching treatment was performed on the insulating layer 1911, so that the openings 1913 and 1915 were formed in the insulating layers 1910 and 1911.

Through the above process, the sample 1 was fabricated.

Next, a fabrication method of the sample 2 is described.

Next, a 450-nm-thick silicon oxynitride film was formed as the insulating layer 1910 over the insulating layer 1903, the semiconductor layer 1905, the conductive layer 1907, and the conductive layer 1909 of the sample 1 by a PE-CVD method, and then heat treatment was performed at 350° C. under a mixed atmosphere of nitrogen and oxygen for one hour. After that, the insulating layer 1910 was removed.

Next, a 50-nm-thick silicon nitride film was formed as the insulating layer 1911 over the insulating layer 1904, the semiconductor layer 1905, the conductive layer 1907, and the conductive layer 1909 by a PE-CVD method.

Next, a mask is formed over the insulating layer 1911 through a photolithography process and then etching treatment was performed on the insulating layer 1911, so that the opening portions 1917 and 1919 were formed in the insulating layer 1911.

Through the above process, the sample 2 was fabricated.

Next, a fabrication method of the sample 3 is described.

In the sample 3, the oxide stack 1906 was used instead of the semiconductor layer 1905 of the sample 2. The oxide stack 1906 was formed over the insulating layer 1904 in such a manner that a 10-nm-thick IGZO film was formed by sputtering with a metal oxide target containing In, Ga, and Zn at an atomic ratio of 1:3:2, a 10-nm-thick IGZO film was formed by sputtering with a metal oxide target containing In, Ga, and Zn at an atomic ratio of 1:1:1, and then a 10-nm-thick IGZO film was formed by sputtering with a metal oxide target containing In, Ga, and Zn at an atomic ratio of 1:3:2. After that, etching treatment was performed with a mask formed through a photolithography process, and the oxide stack 1906 was formed.

Through the above process, the sample 3 was fabricated.

Next, a fabrication method of the sample 4 is described.

As for the sample 4, the oxide stack 1906 was used instead of the semiconductor layer 1905 of the sample 2. The oxide stack 1906 was formed over the insulating layer 1904 in such a manner that a 20-nm-thick IGZO film was formed by sputtering with a metal oxide target containing In, Ga, and Zn at an atomic ratio of 1:3:2, a 15-nm-thick IGZO film was formed by sputtering with a metal oxide target containing In, Ga, and Zn at an atomic ratio of 1:1:1, and then a 10-nm-thick IGZO film was formed by sputtering using a metal oxide target containing In, Ga, and Zn at an atomic ratio of 1:3:2. Then, etching treatment was performed on the stacked IGZO films with a mask formed through a photolithography process, so that the separated oxide stack 1906 was formed.

Through the above process, the sample 4 was fabricated.

Next, the sheet resistance of the semiconductor layer 1905 provided in each of the samples 1 and 2 and the sheet resistance of the oxide stack 1906 provided in each of the samples 3 and 4 were measured. In the sample 1, a probe was made contact with the openings 1913 and 1915 to measure the sheet resistance of the semiconductor layer 1905. In each of the samples 2 to 4, a probe was made contact with the opening portions 1917 and 1919 to measure the sheet resistance of the semiconductor layer 1905 or the oxide stack 1906. Note that in the semiconductor layer 1905 in each of the samples 1 and 2 and the oxide stack 1906 in each of the samples 3 and 4, the widths of the conductive layers 1907 and 1909 facing each other were each 1 mm and the distance between the conductive layers 1907 and 1909 was 10 μm. Further, in each of the samples 1 to 4, the potential of the conductive layer 1907 was a ground potential, and 1 V was applied to the conductive layer 1909.

Figure 56:
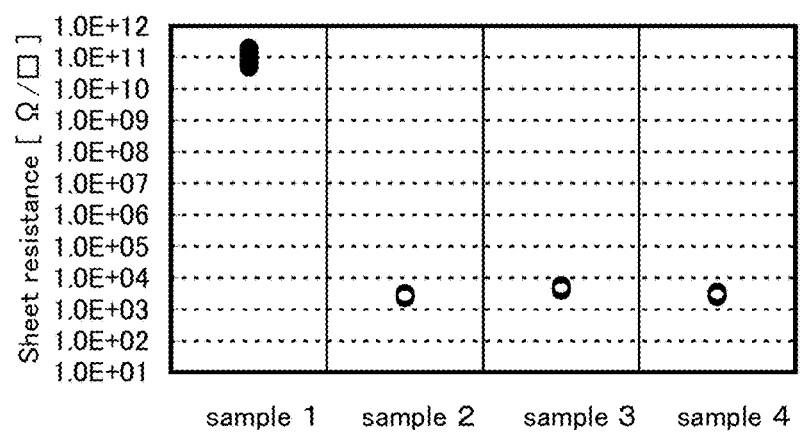
FIG. 56 is a graph showing measurement results of sheet resistances in Example 1.

FIG. 56 shows the sheet resistance of the samples 1 to 4.

The sheet resistance of the sample 1 was about $1 \times 10^{11}$ Ω/sq. The sheet resistance of the sample 2 was about 2620 Ω/sq. The sheet resistance of the sample 3 was about 4410 Ω/sq. The sheet resistance of the sample 4 was about 2930 Ω/sq.

In the above manner, the semiconductor layers 1905 and the oxide stacks 1906 have different values of sheet resistance because the insulating layers in contact with the semiconductor layer 1905 and the insulating layers in contact with the oxide stack 1906 are different.

Note that when the above sheet resistances of the samples 1 to 4 were converted into resistivities, the resistivities of the sample 1, the sample 2, the sample 3, and the sample 4 were $3.9 \times 10^5$ Ωcm, $9.3 \times 10^{-3}$ Ωcm, $1.3 \times 10^{-2}$ Ωcm, and $1.3 \times 10^{-2}$ Ωcm, respectively.

In the sample 1, the silicon oxynitride film used as the insulating layer 1910 was formed in contact with the top surface of the semiconductor layer 1905 and thus the semiconductor layer 1905 was apart from the silicon nitride film used as the insulating layer 1911. On the other hand, the silicon nitride film used as the insulating layer 1911 was formed in contact with the top surface of the semiconductor layer 1905 in the sample 2 and was formed in contact with the top surface of the oxide stack 1906 in each of the samples 3 and 4. When the semiconductor layer 1905 or the oxide stack 1906 is thus provided in contact with the silicon nitride film used as the insulating layer 1911, defects typified by oxygen vacancies are generated in the semiconductor layer 1905 or the oxide stack 1906, and hydrogen contained in the silicon nitride film is transferred to or diffused into the semiconductor layer 1905 or the oxide stack 1906, so that the conductivity is increased.

For example, in the case where an oxide semiconductor layer is used for a channel formation region of a transistor, it is preferable to form a silicon oxynitride film in contact with the oxide semiconductor layer as shown in the sample 1. Further, as a semiconductor layer used for an electrode of a resistor or a capacitor, it is preferable to form a silicon nitride film in contact with an oxide semiconductor layer or an oxide stack as shown in the samples 2 to 4. With such a structure, even when an oxide semiconductor layer or an oxide stack which is used for a channel formation region of a transistor and an oxide semiconductor layer or an oxide stack which is used for an electrode of a resistor or a capacitor are formed through the same process, the resistivity of the oxide semiconductor layer and the resistivity of the oxide stack can be made different from each other.

According to the above-described measurement results of the samples 1 to 4, when the oxide semiconductor layer or the oxide stack is used as a resistor, the resistivity of the oxide semiconductor layer or the oxide stack used as the resistor is lower than the resistivity of an oxide semiconductor layer or an oxide stack used for a channel formation region of a transistor, the resistivity of the oxide semiconductor layer or the oxide stack used for the resistor is preferably $1 \times 10^{-3}$ Ωcm or higher and lower than $1 \times 10^4$ Ωcm, further preferably, $1 \times 10^{-3}$ Ωcm or higher and lower than $1 \times 10^{-1}$ Ωcm.

The structure and the like in this example can be combined with any structure in the other embodiments and the other examples as appropriate.

Example 2

In this example, analysis of impurities in an oxide semiconductor layer and an insulating layer formed over the oxide semiconductor layer will be described with reference to FIGS. 57A and 57B.

In this example, two kinds of samples (hereinafter a sample 5 and a sample 6) were formed as samples for impurity analysis.

First, a fabrication method of the sample 5 is described below.

As for the sample 5, an IGZO film was formed over a glass substrate and a silicon nitride film was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that for the IGZO film, a 100-nm-thick IGZO film was formed by a sputtering method using a metal oxide target containing In, Ga, and Zn at an atomic ratio of 1:1:1 under the following conditions: an Ar gas flow rate was 100 sccm and an $O_2$ gas flow rate was 100 sccm (the proportion of the $O_2$ gas was 50%); the pressure was 0.6 Pa; the film formation power was 5000 W; and the substrate temperature was 170° C.

In addition, for the silicon nitride film, a 100-nm-thick silicon nitride film was formed by a PE-CVD method under the following conditions: a $SiH_4$ gas flow rate was 50 sccm, a $N_2$ gas flow rate was 5000 sccm, and a $NH_3$ gas flow rate was 100 sccm; the pressure was 100 Pa; the film formation power was 1000 W; and the substrate temperature was 220° C.

Next, a fabrication method of the sample 6 is described below.

An IGZO film was formed over a glass substrate and a stacked film where a silicon oxynitride film and a silicon nitride film were stacked was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that the film formation conditions of the IGZO film and the silicon nitride film were similar to those of the sample 5. In addition, as for the silicon oxynitride film, a 50-nm-thick silicon oxynitride film was formed by a PE-CVD method under the following conditions: a $SiH_4$ gas flow rate was 30 sccm and a $N_2O$ gas flow rate was 4000 sccm; the pressure was 40 Pa; the film formation power was 150 W; and the substrate temperature was 220° C. After that, a 400-nm-thick silicon oxynitride film was formed by a PE-CVD method under the following conditions: a $SiH_4$ gas flow rate was 160 sccm and a $N_2O$ gas flow rate was 4000 sccm; the pressure was 200 Pa; the film formation power was 1500 W; and the substrate temperature was 220° C.

Figure 57A:
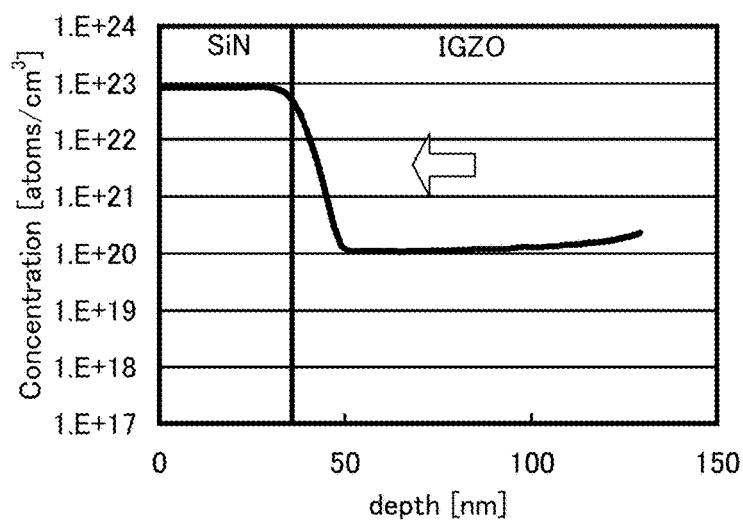
FIGS. 57A and 57B are graphs showing hydrogen (H) concentration profiles in Example 2.
Figure 57B:
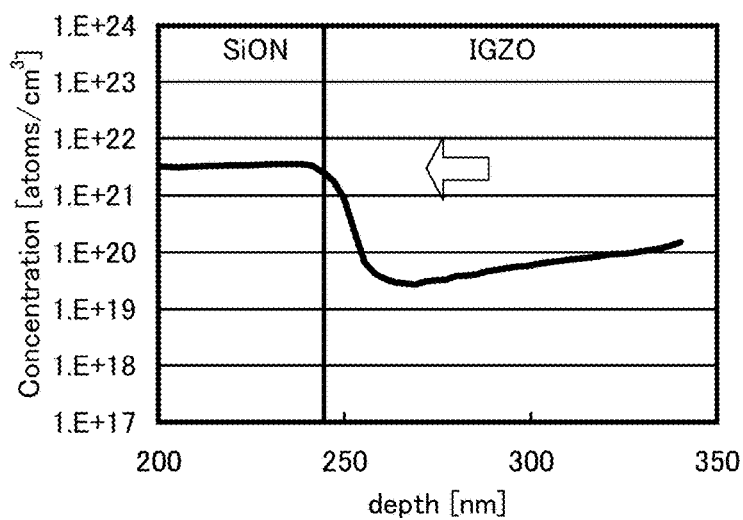

FIGS. 57A and 57B show the results of the impurity analysis of the samples 5 and 6.

Note that the impurity analysis was performed in the direction shown by the arrow in each of FIGS. 57A and 57B by secondary ion mass spectrometry (SIMS). That is, the measurement was performed from the glass substrate side.

FIG. 57A shows the concentration profile of hydrogen (H) which was obtained by measurement of the sample 5. FIG. 57B shows the concentration profile of hydrogen (H) which was obtained by measurement of the sample 6.

FIG. 57A shows that the concentration of hydrogen (H) in the IGZO film is $1.0 \times 10^{20}$ atoms/cm$^3$ and that the concentration of hydrogen (H) in the silicon nitride film is $1.0 \times 10^{23}$ atoms/cm$^3$. In addition, FIG. 57B shows that the concentration of hydrogen (H) in the IGZO film is $5.0 \times 10^{19}$ atoms/cm$^3$ and that the concentration of hydrogen (H) in the silicon oxynitride film is $3.0 \times 10^{21}$ atoms/cm$^3$.

It is known that it is difficult to obtain accurate data in the proximity of a surface of a sample or in the proximity of an interface between stacked layers formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference between the IGZO films in the concentration of hydrogen (H) was found by changing the structure of the insulating layer in contact with the IGZO film in this manner.

For example, in the case where any of the above IGZO films is formed for a channel formation region of a transistor, it is preferable to form a silicon oxynitride film in contact with the IGZO film as shown in the sample 6. As a semiconductor layer used for an electrode of a resistor or a capacitor, it is preferable to form a silicon nitride film in contact with the IGZO film as shown in the sample 5. With such a structure, even when an IGZO film which is used for a channel formation region of a transistor and an IGZO film which is used for an electrode of a resistor or a capacitor are formed through the same process, the hydrogen concentrations of the IGZO films can be made different from each other.

The structure and the like in this example can be combined with any structure in the other embodiments and the other examples as appropriate.

Example 3

In this example, the amounts of defects in an oxide semiconductor film and an oxide stack will be described with reference to FIGS. 58A to 58C and FIG. 59.

First, the structure of each sample is described.

A sample 7 includes a 35-nm-thick oxide semiconductor film formed over a quartz substrate and a 100-nm-thick nitride insulating film formed over the oxide semiconductor film.

A sample 8 and a sample 9 each include a 30-nm-thick oxide stack formed over a quartz substrate and a 100-nm-thick nitride insulating film formed over the oxide stack. Note that in the oxide stack of the sample 8, a 10-nm-thick first oxide film, a 10-nm-thick oxide semiconductor film, and a 10-nm-thick second oxide film are stacked in this order. In the oxide stack of the sample 9, a 20-nm-thick first oxide film, a 15-nm-thick oxide semiconductor film, and a 10-nm-thick second oxide film are stacked in this order. The samples 8 and 9 are different from the sample 7 in that the oxide stack is included instead of the oxide semiconductor film.

A sample 10 includes a 100-nm-thick oxide semiconductor film formed over a quartz substrate, a 250-nm-thick oxide insulating film formed over the oxide semiconductor film, and a 100-nm-thick nitride insulating film formed over the oxide insulating film. The sample 10 is different from the samples 7 to 9 in that the oxide semiconductor film is not in contact with the nitride insulating film but in contact with the oxide insulating film.

Next, fabrication methods of the samples are described.

First, a fabrication method of the sample 7 is described.

A 35-nm-thick IGZO film was formed as the oxide semiconductor film over the quartz substrate. As for the IGZO film, the 35-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

Next, as first heat treatment, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Next, a 100-nm-thick silicon nitride film was formed as the nitride insulating film over the oxide semiconductor film. As for the silicon nitride film, the 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 350° C.

Next, as second heat treatment, heat treatment was performed at 250° C. under a nitrogen atmosphere for one hour.

Through the above process, the sample 7 was fabricated.

Next, a fabrication method of the sample 8 is described.

As for the sample 8, the oxide stack was formed instead of the oxide semiconductor film of the sample 7. As for the oxide stack, the 10-nm-thick first oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C. Then, the 10-nm-thick oxide semiconductor film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C. Then, the 10-nm-thick second oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C.

The other steps are similar to those of the sample 7. Through the above process, the sample 8 was fabricated.

Next, a fabrication method of the sample 9 is described.

As for the sample 9, the oxide stack was formed instead of the oxide semiconductor film of the sample 7. As for the oxide stack, the 20-nm-thick first oxide film was formed over the quartz substrate under the same conditions as those of the first oxide film of the sample 8. Then, the 15-nm-thick oxide semiconductor film was formed by a sputtering method under the same conditions as those of the oxide semiconductor film of the sample 8. Then, the 10-nm-thick second oxide film was formed under the same conditions as those of the second oxide film of the sample 8.

The other steps are similar to those of the sample 7. Through the above process, the sample 9 was fabricated.

Next, a fabrication method of the sample 10 is described.

As for the sample 10, the 100-nm-thick oxide semiconductor film was formed over the quartz substrate under the same conditions as those of the sample 7.

Next, first heat treatment was performed under conditions similar to those of the sample 7.

Next, a 50-nm-thick first silicon oxynitride film and a 200-nm-thick second silicon oxynitride film were stacked over the oxide semiconductor film as the oxide insulating film. Here, the 50-nm-thick first silicon oxynitride film was formed by a PE-CVD method under the following conditions: a $SiH_4$ gas flow rate was 30 sccm and a $N_2O$ gas flow rate was 4000 sccm; the pressure was 40 Pa; the film formation power was 150 W; and the substrate temperature was 220° C. After that, the 200-nm-thick second silicon oxynitride film was formed by a PE-CVD method under the following conditions: a SiH$_4$ gas flow rate was 160 sccm and a N$_2$O gas flow rate was 4000 sccm; the pressure was 200 Pa; the film formation power was 1500 W; and the substrate temperature was 220° C. Note that the second silicon oxynitride film is a film containing oxygen at a higher proportion than oxygen in the stoichiometric composition.

Next, a 100-nm-thick silicon nitride film was formed over the oxide insulating film under the same conditions as those of the sample 7.

Next, second heat treatment was performed under conditions similar to those of the sample 7.

Through the above process, the sample 10 was fabricated.

Next, the samples 7 to 10 were measured by ESR. In the ESR measurement performed at a predetermined temperature, a value of a magnetic field (H$_0$) where a microwave is absorbed is substituted into an equation g=hv/βH$_0$, so that a parameter of a g-factor can be obtained. Note that the frequency of the microwave is denoted by v. Note that h and β represent the Planck constant and the Bohr magneton, respectively, and are both constants.

Here, the ESR measurement was performed under the following conditions: the measurement temperature was room temperature (25° C.), the high-frequency power (power of microwaves) of 8.92 GHz was 20 mW, and the direction of a magnetic field was parallel to a surface of each sample.

FIG. 58A shows a first derivative curve obtained by ESR measurement of the oxide semiconductor film in the sample 7; and FIGS. 58B and 58C show first derivative curves obtained by ESR measurement of the oxide stacks in the samples 8 and 9. FIG. 58A shows the measurement result of the sample 7, FIG. 58B shows the measurement result of the sample 8, and FIG. 58C shows the measurement result of the sample 9.

Figure 59:
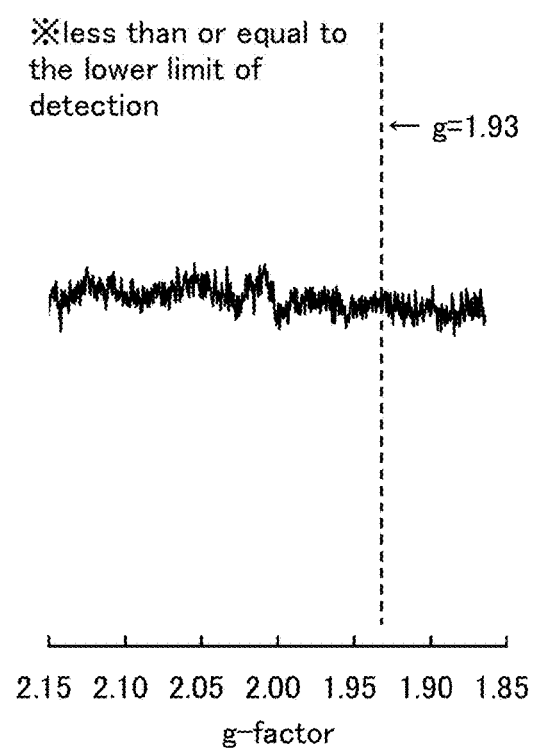
FIG. 59 is a graph showing an ESR measurement result in Example 3.

FIG. 59 shows a first derivative curve obtained by ESR measurement of the oxide semiconductor film in the sample 10.

In FIGS. 58A to 58C, the sample 7 has signal symmetry due to a defect in the oxide semiconductor film when a g-factor was 1.93. The samples 8 and 9 each have signal symmetry due to a defect in the oxide stack when a g-factor was 1.95. As for the sample 7, the spin density when a g-factor was 1.93 was $2.5\times10^{19}$ spins/cm$^3$, in the sample 8, the total spin densities when g-factors were 1.93 and 1.95 were $1.6\times10^{19}$ spins/cm$^3$, and in the sample 9, the total spin densities when g-factors were 1.93 and 1.95 were $2.3\times10^{19}$ spins/cm$^3$. That is, it is found that the oxide semiconductor film and the oxide stack include defects. Note that an oxygen vacancy is an example of the defect in the oxide semiconductor film and the oxide stack.

Although, in FIG. 59, the thickness of the oxide semiconductor film of the sample 10 was thicker than those of the samples 7 to 9, signal symmetry due to a defect was not detected, i.e., the number of defects was less than or equal to the lower limit of detection (here, the lower limit of detection was $3.7\times10^{16}$ spins/cm$^3$). Accordingly, it is found that the number of defects in the oxide semiconductor film cannot be detected.

It is found that when a nitride insulating film, here the silicon nitride film formed by a PE-CVD method is in contact with an oxide semiconductor film or an oxide stack, defects, typically oxygen vacancies are generated in the oxide semiconductor film or the oxide stack. On the other hand, when an oxide insulating film, here the silicon oxynitride film is provided over an oxide semiconductor film, excess oxygen contained in the silicon oxynitride film, i.e., oxygen contained at a higher proportion than oxygen in the stoichiometric composition is diffused into the oxide semiconductor film and thus the number of defects in the oxide semiconductor film is not increased.

As described above, as shown in the samples 7 to 9, the oxide semiconductor film or the oxide stack which is in contact with the nitride insulating film has a number of defects, typically oxygen vacancies, and has a high conductivity and therefore can be used as an electrode of a resistor or a capacitor. On the other hand, as shown in the sample 10, the oxide semiconductor film or the oxide stack which is in contact with the oxide insulating film has a small number of oxygen vacancies and low conductivity and therefore can be used as a channel formation region of a transistor.

This application is based on Japanese Patent Application Serial No. 2012-281873 filed with Japan Patent Office on Dec. 25, 2012, the entire contents of which are hereby incorporated by reference.

What is claimed is:

1. A resistor comprising:
    a first insulating layer over a substrate;
    a second insulating layer over the first insulating layer;
    a semiconductor layer over the second insulating layer;
    a first electrode over the semiconductor layer;
    a second electrode over the semiconductor layer;
    a third insulating layer over the the first electrode and the second electrode; and
    a fourth insulating layer over the third insulating layer,
    wherein the semiconductor layer is an oxide comprising indium, zinc, and a metal selected from the group consisting of Al, Ga, Ge, Y, Zr, Sn, La, Ce, and Hf,
    wherein the third insulating layer comprises an opening,
    wherein the third insulating layer is in contact with a top surface of the first electrode and a top surface of the second electrode,
    wherein the fourth insulating layer comprises hydrogen, and
    wherein the fourth insulating layer is in contact with the semiconductor layer through the opening.

2. The resistor according to claim 1,
    wherein the semiconductor layer comprises a microcrystalline region,
    wherein a plurality of spots of an electron diffraction pattern are circumferentially observed from the microcrystalline region by a transmission electron microscope when a beam diameter is set larger than or equal to 5 nmφ and smaller than or equal to 10 nmφ, and
    wherein no spots of an electron diffraction pattern are observed from the microcrystalline region by the transmission electron microscope when a beam diameter is set larger than or equal to 300 nmφ.

3. The resistor according to claim 1, wherein the fourth insulating layer is a silicon nitride film.

4. The resistor according to claim 1, wherein a resistivity of the semiconductor layer is higher than or equal to $1\times10^{-3}$ Ωcm and lower than $1\times10^{4}$ Ωcm.

5. A display device comprising:
    a pixel portion;
    a driver circuit portion outside the pixel portion; and
    a protection circuit portion electrically connected to one or both of the pixel portion and the driver circuit portion,
    wherein the pixel portion comprises a pixel electrode and a first transistor electrically connected to the pixel electrode, wherein the driver circuit portion comprises a second transistor configured to control on state or off state of the first transistor, wherein each of the first transistor and the second transistor comprises a first oxide semiconductor layer in a channel formation region, wherein the protection circuit portion comprises an insulating layer and a second oxide semiconductor layer formed in the same process where the first oxide semiconductor layer is formed, wherein the first oxide semiconductor layer and the second oxide semiconductor layer are each an oxide comprising indium, zinc, and a metal selected from the group consisting of Al, Ga, Ge, Y, Zr, Sn, La, Ce, and Hf, wherein a concentration of hydrogen in the first oxide semiconductor layer is different from a concentration of hydrogen in the second oxide semiconductor layer, and wherein the insulating layer comprises hydrogen.

6. The display device according to claim 5, wherein the first oxide semiconductor layer and the second oxide semiconductor layer each comprise a microcrystalline region, wherein a plurality of spots of an electron diffraction pattern is circumferentially observed from the microcrystalline region by a transmission electron microscope when a beam diameter is set larger than or equal to 5 nmφ and smaller than or equal to 10 nmφ, and wherein no spots of an electron diffraction pattern are observed from the microcrystalline region by the transmission electron microscope when a beam diameter is set larger than or equal to 300 nmφ.

7. The display device according to claim 5, wherein the concentration of hydrogen contained in the second oxide semiconductor layer is higher than the concentration of hydrogen contained in the first oxide semiconductor layer.

8. The display device according to claim 5, wherein a resistivity of the second oxide semiconductor layer is lower than a resistivity of the first oxide semiconductor layer.

9. The display device according to claim 5, wherein a concentration of hydrogen contained in the insulating layer is $1 \times 10^{22}$ atoms/cm$^3$ or higher.

10. The display device according to claim 5, wherein the insulating layer is in contact with the second oxide semiconductor layer, and wherein the insulating layer is not in contact with the first oxide semiconductor layer.

11. An electronic device including the display device according to claim 5.

12. A display device comprising:
a pixel portion; and
a protection circuit portion electrically connected to the pixel portion, wherein the pixel portion comprises a pixel electrode and a first transistor electrically connected to the pixel electrode, wherein the first transistor comprises a first oxide semiconductor layer in a channel formation region, wherein the protection circuit portion comprises an insulating layer and a second oxide semiconductor layer formed in the same process where the first oxide semiconductor layer is formed, wherein the insulating layer is in contact with the second oxide semiconductor layer, wherein the insulating layer is not in contact with the first oxide semiconductor layer, wherein the first oxide semiconductor layer and the second oxide semiconductor layer are each an oxide comprising indium, zinc, and a metal selected from the group consisting of Al, Ga, Ge, Y, Zr, Sn, La, Ce, and Hf, and wherein the insulating layer comprises hydrogen.

13. The display device according to claim 12, wherein the first oxide semiconductor layer and the second oxide semiconductor layer each comprise a microcrystalline region, wherein a plurality of spots of an electron diffraction pattern is circumferentially observed from the microcrystalline region by a transmission electron microscope when a beam diameter is set larger than or equal to 5 nmφ and smaller than or equal to 10 nmφ, and wherein no spots of an electron diffraction pattern are observed from the microcrystalline region by the transmission electron microscope when a beam diameter is set larger than or equal to 300 nmφ.

14. The display device according to claim 12, wherein a concentration of hydrogen contained in the second oxide semiconductor layer is higher than a concentration of hydrogen contained in the first oxide semiconductor layer.

15. The display device according to claim 12, wherein a resistivity of the second oxide semiconductor layer is lower than a resistivity of the first oxide semiconductor layer.

16. The display device according to claim 12, wherein a concentration of hydrogen contained in the insulating layer is $1 \times 10^{22}$ atoms/cm$^3$ or higher.

17. The display device according to claim 12, wherein the insulating layer is a silicon nitride film.

18. An electronic device including the display device according to claim 12.

19. The resistor according to claim 1, wherein a concentration of hydrogen contained in the insulating layer is $1 \times 10^{22}$ atoms/cm$^3$ or higher.

20. The resistor according to claim 1, wherein the insulating layer is a silicon nitride film.

21. The resistor according to claim 1, wherein a resistivity of the semiconductor layer is higher than or equal to $1 \times 10^{-3}$ Ωcm and lower than $1 \times 10^{4}$ Ωcm.

* * * * *